US012685015B2

(12) United States Patent
Kim et al.

(10) Patent No.: US 12,685,015 B2
(45) **Date of Patent: *Jul. 14, 2026**

(54) PLURALITY OF HOST MATERIALS AND ORGANIC ELECTROLUMINESCENT DEVICE COMPRISING THE SAME

(71) Applicant: ROHM AND HAAS ELECTRONIC MATERIALS KOREA LTD., Chungcheongnam-do (KR)

(72) Inventors: Bitnari Kim, Gyeonggi-do (KR); Doo-Hyeon Moon, Gyeonggi-do (KR); Su-Hyun Lee, Gyeonggi-do (KR); Du-Yong Park, Gyeonggi-do (KR); So-Young Jung, Gyeonggi-do (KR); Hae-Yeon Kim, Gyeonggi-do (KR); Sang-Hee Cho, Gyeonggi-do (KR)

(73) Assignee: DuPont Specialty Materials Korea Ltd. (KR)

(*) Notice: Subject to any disclaimer, the term of this patent is extended or adjusted under 35 U.S.C. 154(b) by 108 days.

This patent is subject to a terminal disclaimer.

(21) Appl. No.: 18/056,342

(22) Filed: Nov. 17, 2022

(65) Prior Publication Data

US 2023/0345827 A1 Oct. 26, 2023

Related U.S. Application Data

(63) Continuation of application No. 16/886,820, filed on May 29, 2020, now Pat. No. 11,552,257.

(30) Foreign Application Priority Data

Jul. 15, 2019 (KR) ........................ 10-2019-0085360
May 13, 2020 (KR) ........................ 10-2020-0056948

(51) Int. Cl.
*H10K 85/60* (2023.01)

(52) U.S. Cl.
CPC ....... *H10K 85/6572* (2023.02); *H10K 85/633* (2023.02); *H10K 85/654* (2023.02); *H10K 85/6574* (2023.02); *H10K 85/6576* (2023.02); *H10K 85/615* (2023.02)

(58) Field of Classification Search
CPC ............. H10K 85/6572; H10K 85/633; H10K 85/654; H10K 85/6574; H10K 85/6576; H10K 85/615; H10K 50/15; H10K 71/164; H10K 85/631; C07D 209/56; C07D 209/80; C07D 209/86; C07D 241/38; C07D 241/42; C07D 251/24; C07D 403/04; C07D 403/10; C07D 403/14; C07D 405/04; C07D 405/10; C07D 405/12; C07D 405/14; C07D 409/04; C07D 409/10; C07D 409/12; C07D 409/14; C07D 487/04; C07D 487/16; C07D 491/048; C07D 495/04; C09K 2211/1007; C09K 2211/1029; C09K 2211/1033; C09K 2211/1037; C09K 2211/1044; C09K 2211/1088; C09K 2211/185; C09K 11/06

See application file for complete search history.

(56) References Cited

U.S. PATENT DOCUMENTS

| | | | | |
|---|---|---|---|---|
| 2017/0047527 | A1 | 2/2017 | Lee et al. | |
| 2019/0288222 | A1 | 9/2019 | Moon et al. | |
| 2019/0312212 | A1* | 10/2019 | Moon | H10K 85/654 |
| 2020/0212310 | A1 | 7/2020 | Kim et al. | |
| 2020/0308201 | A1* | 10/2020 | Lee | C09K 11/06 |
| 2021/0265569 | A1* | 8/2021 | Kim | H10K 85/633 |
| 2023/0139032 | A1* | 5/2023 | Cho | C07D 413/14 257/40 |
| 2024/0057475 | A1* | 2/2024 | Kang | C07D 209/88 |

FOREIGN PATENT DOCUMENTS

WO WO-2020013448 A1 * 1/2020 ......... H01L 51/0052

OTHER PUBLICATIONS

Request for the Submission of an Opinion from Korea Intellectual Patent Office for Korea patent application No. 10-2020-0056948; Application Date: May 13, 2020.
Request for the Submission of an Opinion from Korea Intellectual Property Office, Application No. 10-2020-0056948, Filing Date: May 13, 2020.

* cited by examiner

*Primary Examiner* — Mark Kopec
*Assistant Examiner* — Jaison P Thomas
(74) *Attorney, Agent, or Firm* — G. Creston Campbell

(57) ABSTRACT

The present disclosure relates to a plurality of host materials comprising a first host material having a compound represented by formula 1, and a second host material having a compound represented by formula 2, and an organic electroluminescent device comprising the same. By comprising a specific combination of compounds of the present disclosure as host materials, it is possible to provide an organic electroluminescent device having long lifetime properties while having an equivalent or improved level of power efficiency compared to conventional organic electroluminescent devices.

7 Claims, No Drawings

PLURALITY OF HOST MATERIALS AND ORGANIC ELECTROLUMINESCENT DEVICE COMPRISING THE SAME

CLAIM OF BENEFIT OF PRIOR APPLICATION

This application claims priority under 35 U.S.C. § 120 from U.S. patent application Ser. No. 16/886,820 filed May 29, 2020, which is the Convention Filing of KR10-2020-0056948, filed May 13, 2020 and KR10-2019-0085360, filed Jul. 15, 2019, all of which are incorporated by reference herein in their entirety.

TECHNICAL FIELD

The present disclosure relates to a plurality of host materials comprising a combination of specific compounds, and an organic electroluminescent device comprising the same.

BACKGROUND ART

An electroluminescent device (EL device) is a self-light-emitting display device which has advantages in that it provides a wider viewing angle, a greater contrast ratio, and a faster response time. The first organic EL device was developed by Eastman Kodak in 1987, by using small aromatic diamine molecules and aluminum complexes as materials for forming a light-emitting layer (see Appl. Phys. Lett. 51, 913, 1987).

An organic electroluminescent device (OLED) changes electric energy into light by applying electricity to an organic electroluminescent material, and commonly comprises an anode, a cathode, and an organic layer formed between the two electrodes. The organic layer of the OLED may comprise a hole injection layer, a hole transport layer, a hole auxiliary layer, a light-emitting auxiliary layer, an electron blocking layer, a light-emitting layer, an electron buffer layer, a hole blocking layer, an electron transport layer, an electron injection layer, etc. The materials used in the organic layer can be classified into a hole injection material, a hole transport material, a hole auxiliary material, a light-emitting auxiliary material, an electron blocking material, a light-emitting material (including a host material and a dopant material), an electron buffer material, a hole blocking material, an electron transport material, an electron injection material, etc., depending on their functions. In the OLED, holes from the anode and electrons from the cathode are injected into a light-emitting layer by the application of electric voltage and excitons having high energy are produced by the recombination of the holes and electrons. The organic light-emitting compound moves into an excited state by the energy and emits light as the organic light-emitting compound returns back to the ground state from the excited state.

The most important factor determining luminescent efficiency in an OLED is light-emitting materials. The light-emitting materials are required to have the following features: high quantum efficiency, high mobility of an electron and a hole, and uniformity and stability of the formed light-emitting material layer. The light-emitting material is classified into blue, green, and red light-emitting materials according to the light-emitting color, and further includes yellow or orange light-emitting materials. Furthermore, the light-emitting material may be classified into a host material and a dopant material in a functional aspect. Recently, an urgent task is the development of an OLED having high efficiency and long lifetime. In particular, the development of highly excellent light-emitting material over conventional materials is urgently required, considering the EL properties necessary for medium- and large-sized OLED panels. For this, as a solvent in a solid state and an energy transmitter, a host material should preferably have high purity and a suitable molecular weight in order to be deposited under vacuum. Furthermore, a host material is required to have high glass transition temperature and pyrolysis temperature to achieve thermal stability, high electrochemical stability to achieve a long lifespan, easy formability of an amorphous thin film, good adhesion with adjacent layers, and no movement between the layers.

At present, phosphorescent materials, which provide excellent luminous efficiency in realizing panels, are mainly used in organic electroluminescent devices. In many applications such as TVs and lightings, OLED lifetime is insufficient, and high efficiency of OLEDs is still required. Typically, the higher the luminance of an OLED, the shorter the lifetime of an OLED. Thus, a new luminescent material which shows high luminous efficiency and long lifetime is required for long time uses while maintaining high resolution of displays.

DISCLOSURE OF INVENTION

Technical Problem

The objective of the present disclosure is to provide improved host materials capable of providing an organic electroluminescent device having long lifetime properties while having an equivalent or improved level of power efficiency compared to conventional organic electroluminescent devices.

Solution to Problem

The present inventors found that the above objective can be achieved by a plurality of host materials comprising a first host material and a second host material, wherein the first host material comprises at least one compound represented by the following formula 1:

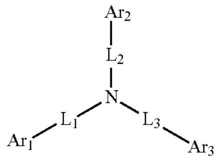

(1)

wherein, $L_1$ to $L_3$, each independently, represent a single bond, a substituted or unsubstituted (C6-C30)arylene, or a substituted or unsubstituted (3- to 30-membered)heteroarylene;

$Ar_1$ represents a substituted or unsubstituted nitrogen-containing (3- to 30-membered)heteroaryl;

$Ar_2$ and $Ar_3$, each independently, represent a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino; and the second host material comprises at least one compound represented by the following formula 2:

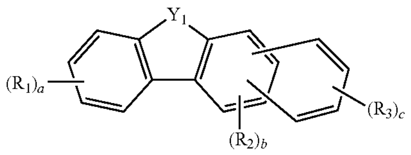

(2)

wherein, $Y_1$ represents O, S, $CR_{11}R_{12}$, or $NR_{13}$;

$R_{11}$ and $R_{12}$, each independently, represent hydrogen, deuterium, a halogen, a cyano, a substituted or unsubstituted (C1-C30)alkyl, a substituted or unsubstituted (C3-C30)cycloalkyl, a substituted or unsubstituted (C3-C30)cycloalkenyl, a substituted or unsubstituted (3- to 7-membered)heterocycloalkyl, a substituted or unsubstituted (C6-C30)aryl, or a substituted or unsubstituted (3- to 30-membered)heteroaryl; or $R_{11}$ and $R_{12}$ may be linked to each other to form a spiro ring;

$R_{13}$, each independently, represents $-L-(Ar)_d$, hydrogen, deuterium, a halogen, a cyano, a substituted or unsubstituted (C1-C30)alkyl, a substituted or unsubstituted (C3-C30)cycloalkyl, a substituted or unsubstituted (C3-C30)cycloalkenyl, a substituted or unsubstituted (3- to 7-membered)heterocycloalkyl, a substituted or unsubstituted (C6-C30)aryl, or a substituted or unsubstituted (3- to 30-membered)heteroaryl;

$R_1$, each independently, represents $-L-(Ar)_d$, hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino; or at least two of adjacent $R_1$'s may be linked to each other to form a ring(s);

$R_2$ and $R_3$, each independently, represent $-L-(Ar)_d$, hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino;

with the proviso that at least one of $R_{13}$, $R_1$, $R_2$ and $R_3$ represents $-L-(Ar)_d$;

L represents a single bond, a substituted or unsubstituted (C6-C30)arylene, or a substituted or unsubstituted (3- to 30-membered)heteroarylene;

Ar, each independently, represents a substituted or unsubstituted nitrogen-containing (3- to 30-membered)heteroaryl;

a, c and d, each independently, represent an integer of 1 to 4; where a, c and d, each independently, are an integer of 2 or more, each of $R_1$, each of $R_3$, and each of Ar may be the same or different; and b, independently, represents an integer of 1 or 2; where b is an integer of 2, each of $R_2$ may be the same or different.

Advantageous Effects of Invention

By comprising a specific combination of compounds of the present disclosure as host materials, it is possible to provide an organic electroluminescent device having long lifetime properties while having an equivalent or improved level of power efficiency compared to conventional organic electroluminescent devices, and to manufacture a display system or a light system using the same.

MODE FOR THE INVENTION

Hereinafter, the present disclosure will be described in detail. However, the following description is intended to explain the disclosure, and is not meant in any way to restrict the scope of the disclosure.

The term "organic electroluminescent material" in the present disclosure means a material that may be used in an organic electroluminescent device, and may comprise at least one compound. The organic electroluminescent material may be comprised in any layer constituting an organic electroluminescent device, as necessary. For example, the organic electroluminescent material may be a hole injection material, a hole transport material, a hole auxiliary material, a light-emitting auxiliary material, an electron blocking material, a light-emitting material (containing host and dopant materials), an electron buffer material, a hole blocking material, an electron transport material, an electron injection material, etc.

The term "a plurality of organic electroluminescent materials" in the present disclosure means an organic electroluminescent material(s) comprising a combination of at least two compounds, which may be comprised in any organic layer constituting an organic electroluminescent device. It may mean both a material before being comprised in an organic electroluminescent device (for example, before vapor deposition) and a material after being comprised in an organic electroluminescent device (for example, after vapor deposition). For example, a plurality of organic electroluminescent materials may be a combination of at least two compounds which may be comprised in at least one of a hole injection layer, a hole transport layer, a hole auxiliary layer, a light-emitting auxiliary layer, an electron blocking layer, a light-emitting layer, an electron buffer layer, a hole blocking layer, an electron transport layer, and an electron injection layer. At least two compounds may be comprised in the same layer or different layers by means of the methods used in the art, for example, they may be mixture-evaporated or co-evaporated, or may be individually deposited.

The term "a plurality of host materials" in the present disclosure means a host material(s) comprising a combination of at least two compounds, which may be comprised in any light-emitting layer constituting an organic electroluminescent device. It may mean both a material before being comprised in an organic electroluminescent device (for example, before vapor deposition) and a material after being comprised in an organic electroluminescent device (for example, after vapor deposition). For example, the plurality of host materials of the present disclosure may be a combination of two or more host materials, and may optionally further include a conventional material comprised in organic electroluminescent materials. The two or more compounds comprised in the plurality of host materials of the present disclosure may be included in one light-emitting layer or may be respectively included in different light-emitting layers. For example, the two or more host materials may be mixture-evaporated or co-evaporated, or individually deposited.

Herein, the term "(C1-C30)alkyl" is meant to be a linear or branched alkyl having 1 to 30 carbon atoms constituting the chain, in which the number of carbon atoms is preferably 1 to 10, and more preferably 1 to 6. The above alkyl may include methyl, ethyl, n-propyl, isopropyl, n-butyl, isobutyl, tert-butyl, etc. The term "(C3-C30)cycloalkyl" is meant to be a mono- or polycyclic hydrocarbon having 3 to 30 ring backbone carbon atoms, in which the number of carbon atoms is preferably 3 to 20, and more preferably 3 to 7. The above cycloalkyl may include cyclopropyl, cyclobutyl, cyclopentyl, cyclohexyl, etc. The term "(3- to 7-membered) heterocycloalkyl" is meant to be a cycloalkyl having 3 to 7 ring backbone atoms, and including at least one heteroatom selected from the group consisting of B, N, O, S, Si, and P, and preferably the group consisting of O, S, and N. The above heterocycloalkyl may include tetrahydrofuran, pyrrolidine, thiolan, tetrahydropyran, etc. The term "(C6-C30) aryl" or "(C6-C30)arylene" is meant to be a monocyclic or fused ring radical derived from an aromatic hydrocarbon having 6 to 30 ring backbone carbon atoms. The above aryl or arylene may be partially saturated, and may comprise a spiro structure. The above aryl may include phenyl, biphenyl, terphenyl, naphthyl, binaphthyl, phenylnaphthyl, naphthylphenyl, fluorenyl, phenylfluorenyl, benzofluorenyl, dibenzofluorenyl, phenanthrenyl, phenylphenanthrenyl, anthracenyl, indenyl, triphenylenyl, pyrenyl, tetracenyl, perylenyl, chrysenyl, naphthacenyl, fluoranthenyl, spirobifluorenyl, spiro[fluorene-benzofluorene]yl, etc. More specifically, the aryl may include phenyl, 1-naphthyl, 2-naphthyl, 1-anthryl, 2-anthryl, 9-anthryl, benzanthryl, 1-phenanthryl, 2-phenanthryl, 3-phenanthryl, 4-phenanthryl, 9-phenanthryl, naphthacenyl, pyrenyl, 1-chrysenyl, 2-chrysenyl, 3-chrysenyl, 4-chrysenyl, 5-chrysenyl, 6-chrysenyl, benzo[c]phenanthryl, benzo[g]chrysenyl, 1-triphenylenyl, 2-triphenylenyl, 3-triphenylenyl, 4-triphenylenyl, 1-fluorenyl, 2-fluorenyl, 3-fluorenyl, 4-fluorenyl, 9-fluorenyl, benzo[a]fluorenyl, benzo[b]fluorenyl, benzo[c]fluorenyl, dibenzofluorenyl, 2-biphenyl, 3-biphenyl, 4-biphenyl, o-terphenyl, m-terphenyl-4-yl, m-terphenyl-3-yl, m-terphenyl-2-yl, p-terphenyl-4-yl, p-terphenyl-3-yl, p-terphenyl-2-yl, m-quaterphenyl, 3-fluoranthenyl, 4-fluoranthenyl, 8-fluoranthenyl, 9-fluoranthenyl, benzofluoranthenyl, o-tolyl, m-tolyl, p-tolyl, 2,3-xylyl, 3,4-xylyl, 2,5-xylyl, mesityl, o-cumenyl, m-cumenyl, p-cumenyl, p-tert-butylphenyl, p-(2-phenylpropyl)phenyl, 4'-methylbiphenyl, 4"-tert-butyl-p-terphenyl-4-yl, 9,9-dimethyl-1-fluorenyl, 9,9-dimethyl-2-fluorenyl, 9,9-dimethyl-3-fluorenyl, 9,9-dimethyl-4-fluorenyl, 9,9-diphenyl-1-fluorenyl, 9,9-diphenyl-2-fluorenyl, 9,9-diphenyl-3-fluorenyl, 9,9-diphenyl-4-fluorenyl, 11,11-dimethyl-1-benzo[a]fluorenyl, 11,11-dimethyl-2-benzo[a]fluorenyl, 11,11-dimethyl-3-benzo[a]fluorenyl, 11,11-dimethyl-4-benzo[a]fluorenyl, 11,11-dimethyl-5-benzo[a]fluorenyl, 11,11-dimethyl-6-benzo[a]fluorenyl, 11,11-dimethyl-7-benzo[a]fluorenyl, 11,11-dimethyl-8-benzo[a]fluorenyl, 11,11-dimethyl-9-benzo[a]fluorenyl, 11,11-dimethyl-10-benzo[a]fluorenyl, 11,11-dimethyl-1-benzo[b]fluorenyl, 11,11-dimethyl-2-benzo[b]fluorenyl, 11,11-dimethyl-3-benzo[b]fluorenyl, 11,11-dimethyl-4-benzo[b]fluorenyl, 11,11-dimethyl-5-benzo[b]fluorenyl, 11,11-dimethyl-6-benzo[b]fluorenyl, 11,11-dimethyl-7-benzo[b]fluorenyl, 11,11-dimethyl-8-benzo[b]fluorenyl, 11,11-dimethyl-9-benzo[b]fluorenyl, 11,11-dimethyl-10-benzo[b]fluorenyl, 11,11-dimethyl-1-benzo[c]fluorenyl, 11,11-dimethyl-2-benzo[c]fluorenyl, 11,11-dimethyl-3-benzo[c]fluorenyl, 11,11-dimethyl-4-benzo[c]fluorenyl, 11,11-dimethyl-5-benzo[c]fluorenyl, 11,11-dimethyl-6-benzo[c]fluorenyl, 11,11-dimethyl-7-benzo[c]fluorenyl, 11,11-dimethyl-8-benzo[c]fluorenyl, 11,11-dimethyl-9-benzo[c]fluorenyl, 11,11-dimethyl-10-benzo[c]fluorenyl, 11,11-diphenyl-1-benzo[a]fluorenyl, 11,11-diphenyl-2-benzo[a]fluorenyl, 11,11-diphenyl-3-benzo[a]fluorenyl, 11,11-diphenyl-4-benzo[a]fluorenyl, 11,11-diphenyl-5-benzo[a]fluorenyl, 11,11-diphenyl-6-benzo[a]fluorenyl, 11,11-diphenyl-7-benzo[a]fluorenyl, 11,11-diphenyl-8-benzo[a]fluorenyl, 11,11-diphenyl-9-benzo[a]fluorenyl, 11,11-diphenyl-10-benzo[a]fluorenyl, 11,11-diphenyl-1-benzo[b]fluorenyl, 11,11-diphenyl-2-benzo[b]fluorenyl, 11,11-diphenyl-3-benzo[b]fluorenyl, 11,11-diphenyl-4-benzo[b]fluorenyl, 11,11-diphenyl-5-benzo[b]fluorenyl, 11,11-diphenyl-6-benzo[b]fluorenyl, 11,11-diphenyl-7-benzo[b]fluorenyl, 11,11-diphenyl-8-benzo[b]fluorenyl, 11,11-diphenyl-9-benzo[b]fluorenyl, 11,11-diphenyl-10-benzo[b]fluorenyl, 11,11-diphenyl-1-benzo[c]fluorenyl, 11,11-diphenyl-2-benzo[c]fluorenyl, 11,11-diphenyl-3-benzo[c]fluorenyl, 11,11-diphenyl-4-benzo[c]fluorenyl, 11,11-diphenyl-5-benzo[c]fluorenyl, 11,11-diphenyl-6-benzo[c]fluorenyl, 11,11-diphenyl-7-benzo[c]fluorenyl, 11,11-diphenyl-8-benzo[c]fluorenyl, 11,11-diphenyl-9-benzo[c]fluorenyl, 11,11-diphenyl-10-benzo[c]fluorenyl, etc.

The term "(3- to 30-membered)heteroaryl" or "(3- to 30-membered)heteroarylene" is meant to be an aryl or an arylene having 3 to 30 ring backbone atoms, and including at least one, preferably 1 to 4 heteroatoms selected from the group consisting of B, N, O, S, Si, and P, in which the number of ring backbone atoms is preferably 5 to 30. The above heteroaryl or heteroarylene may be a monocyclic ring, or a fused ring condensed with at least one benzene ring; may be partially saturated; may be one formed by linking at least one heteroaryl or aryl group to a heteroaryl group via a single bond(s); and may comprise a spiro structure. The above heteroaryl may include a monocyclic ring-type heteroaryl such as furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, pyridazinyl, etc., and a fused ring-type heteroaryl such as benzofuranyl, benzothiophenyl, isobenzofuranyl, dibenzofuranyl, dibenzothiophenyl, naphthobenzofuranyl, naphthobenzothiophenyl, benzimidazolyl, benzothiazolyl, benzoisothiazolyl, benzoisoxazolyl, benzoxazolyl, isoindolyl, indolyl, indazolyl, benzothiadiazolyl, quinolyl, isoquinolyl, cinnolinyl, quinazolinyl, quinoxalinyl, carbazolyl, benzocarbazolyl, dibenzocarbazolyl, phenoxazinyl, phenanthridinyl, benzodioxolyl, etc. More specifically, the heteroaryl may include 1-pyrrolyl, 2-pyrrolyl, 3-pyrrolyl, pyrazinyl, 2-pyridinyl, 2-pyrimidinyl, 4-pyrimidinyl, 5-pyrimidinyl, 6-pyrimidinyl, 1,2,3-triazin-4-yl, 1,2,4-triazin-3-yl, 1,3,5-triazin-2-yl, 1-imidazolyl, 2-imidazolyl, 1-pyrazolyl, 1-indolidinyl, 2-indolidinyl, 3-indolidinyl, 5-indolidinyl, 6-indolidinyl, 7-indolidinyl, 8-indolidinyl, 2-imidazopyridinyl, 3-imidazopyridinyl, 5-imidazopyridinyl, 6-imidazopyridinyl, 7-imidazopyridinyl, 8-imidazopyridinyl, 3-pyridinyl, 4-pyridinyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, azacarbazolyl-1-yl, azacarbazolyl-2-yl, azacarbazolyl-3-yl, azacarbazolyl-4-yl, azacarbazolyl-5-yl, azacarbazolyl-6-yl, azacarbazolyl-7-yl, azacarbazolyl-8-yl, azacarbazolyl-9-yl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthridinyl, 1-acridinyl, 2-acridinyl, 3-acridinyl, 4-acridinyl, 9-acridinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrol-1-yl, 2-methylpyrrol-3-yl, 2-methylpyrrol-4-yl, 2-methylpyrrol-5-yl, 3-methylpyrrol-1-yl, 3-methylpyrrol-2-yl, 3-methylpyrrol-4-yl, 3-methylpyrrol-5-yl, 2-tert-butylpyrrol-4-yl, 3-(2-phenylpropyl)pyrrol-1-yl, 2-methyl-1-indolyl, 4-methyl-1-indolyl, 2-methyl-3-indolyl, 4-methyl-3-indolyl, 2-tert-butyl-1-indolyl, 4-tert-butyl-1-indolyl, 2-tert-butyl-3-indolyl, 4-tert-butyl-3-indolyl, 1-dibenzofuranyl, 2-dibenzofuranyl, 3-dibenzofuranyl, 4-dibenzofuranyl, 1-dibenzothiophenyl, 2-dibenzothiophenyl, 3-dibenzothiophenyl, 4-dibenzothiophenyl, 1-naphtho-[1,2-b]-benzofuranyl, 2-naphtho-[1,2-b]-benzofuranyl, 3-naphtho-[1,2-b]-benzofuranyl, 4-naphtho-[1,2-b]-benzofuranyl, 5-naphtho-[1,2-b]-benzofuranyl, 6-naphtho-[1,2-b]-benzofuranyl, 7-naphtho-[1,2-b]-benzofuranyl, 8-naphtho-[1,2-b]-benzofuranyl, 9-naphtho-[1,2-b]-benzofuranyl, 10-naphtho-[1,2-b]-benzofuranyl, 1-naphtho-[2,3-b]-benzofuranyl, 2-naphtho-[2,3-b]-benzofuranyl, 3-naphtho-[2,3-b]-benzofuranyl, 4-naphtho-[2,3-b]-benzofuranyl, 5-naphtho-[2,3-b]-benzofuranyl, 6-naphtho-[2,3-b]-benzofuranyl, 7-naphtho-[2,3-b]-benzofuranyl, 8-naphtho-[2,3-b]-benzofuranyl, 9-naphtho-[2,3-b]-benzofuranyl, 10-naphtho-[2,3-b]-benzofuranyl, 1-naphtho-[2,1-b]-benzofuranyl, 2-naphtho-[2,1-b]-benzofuranyl, 3-naphtho-[2,1-b]-benzofuranyl, 4-naphtho-[2,1-b]-benzofuranyl, 5-naphtho-[2,1-b]-benzofuranyl, 6-naphtho-[2,1-b]-benzofuranyl, 7-naphtho-[2,1-b]-benzofuranyl, 8-naphtho-[2,1-b]-benzofuranyl, 9-naphtho-[2,1-b]-benzofuranyl, 10-naphtho-[2,1-b]-benzofuranyl, 1-naphtho-[1,2-b]-benzothiophenyl, 2-naphtho-[1,2-b]-benzothiophenyl, 3-naphtho-[1,2-b]-benzothiophenyl, 4-naphtho-[1,2-b]-benzothiophenyl, 5-naphtho-[1,2-b]-benzothiophenyl, 6-naphtho-[1,2-b]-benzothiophenyl, 7-naphtho-[1,2-b]-benzothiophenyl, 8-naphtho-[1,2-b]-benzothiophenyl, 9-naphtho-[1,2-b]-benzothiophenyl, 10-naphtho-[1,2-b]-benzothiophenyl, 1-naphtho-[2,3-b]-benzothiophenyl, 2-naphtho-[2,3-b]-benzothiophenyl, 3-naphtho-[2,3-b]-benzothiophenyl, 4-naphtho-[2,3-b]-benzothiophenyl, 5-naphtho-[2,3-b]-benzothiophenyl, 1-naphtho-[2,1-b]-benzothiophenyl, 2-naphtho-[2,1-b]-benzothiophenyl, 3-naphtho-[2,1-b]-benzothiophenyl, 4-naphtho-[2,1-b]-benzothiophenyl, 5-naphtho-[2,1-b]-benzothiophenyl, 6-naphtho-[2,1-b]-benzothiophenyl, 7-naphtho-[2,1-b]-benzothiophenyl, 8-naphtho-[2,1-b]-benzothiophenyl, 9-naphtho-[2,1-b]-benzothiophenyl, 10-naphtho-[2,1-b]-benzothiophenyl, 1-silafluorenyl, 2-silafluorenyl, 3-silafluorenyl, 4-silafluorenyl, 1-germafluorenyl, 2-germafluorenyl, 3-germafluorenyl, 4-germafluorenyl, etc. “Halogen” includes F, Cl, Br, and I.

Herein, “substituted” in the expression “substituted or unsubstituted” means that a hydrogen atom in a certain functional group is replaced with another atom or another functional group, i.e., a substituent. In the present disclosure, the substituents of the substituted alkyl, the substituted aryl, the substituted arylene, the substituted heteroaryl, the substituted heteroarylene, the substituted cycloalkyl, the substituted cycloalkenyl, the substituted heterocycloalkyl, the substituted alkoxy, the substituted trialkylsilyl, the substituted dialkylarylsilyl, the substituted alkyldiarylsilyl, the substituted triarylsilyl, the substituted mono- or di-alkylamino, the substituted mono- or di-arylamino, and the substituted alkylarylamino, each independently, are at least one selected from the group consisting of deuterium; a halogen; a cyano; a carboxyl; a nitro; a hydroxyl; a (C1-C30)alkyl; a halo(C1-C30)alkyl; a (C2-C30)alkenyl; a (C2-C30)alkynyl; a (C1-C30)alkoxy; a (C1-C30)alkylthio; a (C3-C30)cycloalkyl; a (C3-C30)cycloalkenyl; a (3- to 7-membered)heterocycloalkyl; a (C6-C30)aryloxy; a (C6-C30)arylthio; a (3- to 30-membered)heteroaryl unsubstituted or substituted with a (C6-C30)aryl(s); a (C6-C30)aryl unsubstituted or substituted with at least one of a (C1-C30) alkyl(s), a (C6-C30)aryl(s) and a (3- to 30-membered) heteroaryl(s); a tri(C1-C30)alkylsilyl; a tri(C6-C30)arylsilyl; a di(C1-C30)alkyl(C6-C30)arylsilyl; a (C1-C30)alkyldi(C6-C30)arylsilyl; an amino; a mono- or di-(C1-C30) alkylamino; a mono- or di-(C6-C30)arylamino; a (C1-C30) alkyl(C6-C30)arylamino; a (C1-C30)alkylcarbonyl; a (C1-C30)alkoxycarbonyl; a (C6-C30)arylcarbonyl; a di(C6-C30) arylboronyl; a di(C1-C30)alkylboronyl; a (C1-C30)alkyl (C6-C30)arylboronyl; a (C6-C30)aryl(C1-C30)alkyl; and a (C1-C30)alkyl(C6-C30)aryl. According to one embodiment of the present disclosure, the substituents, each independently, are at least one selected from the group consisting of deuterium; a (C1-C20)alkyl; a (5- to 25-membered)heteroaryl unsubstituted or substituted with a (C6-C25)aryl(s); a (C6-C25)aryl unsubstituted or substituted with at least one of a (C1-C20)alkyl(s) and a (C6-C25)aryl(s); an amino; and a mono- or di-(C6-C25)arylamino. According to another embodiment of the present disclosure, the substituents, each independently, are at least one selected from the group consisting of a (C1-C10)alkyl; a (5- to 20-membered)heteroaryl unsubstituted or substituted with a (C6-C18)aryl(s); a (C6-C25)aryl unsubstituted or substituted with at least one of a (C1-C10)alkyl(s) and a (C6-C18)aryl(s); and a di(C6-C18)arylamino. For example, the substituents, each independently, may be at least one selected from the group consisting of a methyl, a phenyl, a naphthyl, a biphenyl, a phenanthrenyl, a terphenyl, a triphenylenyl, a dimethylfluorenyl, a diphenylfluorenyl unsubstituted or substituted with a phenyl(s), a spirobifluorenyl, a dibenzofuranyl unsubstituted or substituted with a phenyl(s), a dibenzothiophenyl, a carbazolyl unsubstituted or substituted with a phenyl(s) or a biphenyl(s), a benzonaphthothiophenyl, a benzonaphthofuranyl, and a diphenylamino.

In the formulas of the present disclosure, a ring formed by a linkage of adjacent substituents means that at least two adjacent substituents are linked to or fused with each other to form a substituted or unsubstituted mono- or polycyclic (3- to 30-membered) alicyclic or aromatic ring, or the combination thereof. The ring may be preferably, a substituted or unsubstituted mono- or polycyclic (3- to 26-membered) alicyclic or aromatic ring, or the combination thereof, and more preferably, an unsubstituted mono- or polycyclic (5- to 10-membered) aromatic ring. For example, the ring may be a benzene ring. In addition, the ring may contain at least one heteroatom selected from B, N, O, S, Si, and P, and preferably at least one heteroatom selected from N, O, and S.

Herein, the heteroaryl, the heteroarylene, and the heterocycloalkyl, each independently, may contain at least one heteroatom selected from B, N, O, S, Si, and P. Also, the heteroatom may be bonded to at least one selected from the group consisting of hydrogen, deuterium, a halogen, a cyano, a substituted or unsubstituted (C1-C30)alkyl, a substituted or unsubstituted (C6-C30)aryl, a substituted or unsubstituted (5- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, and a substituted or unsubstituted (C1-C30)alkyl(C6-C30)arylamino.

In formula 1, $L_1$ to $L_3$, each independently, represent a single bond, a substituted or unsubstituted (C6-C30)arylene, or a substituted or unsubstituted (3- to 30-membered)heteroarylene. According to one embodiment of the present disclosure, $L_1$ to $L_3$, each independently, represent a single bond, or a substituted or unsubstituted (C6-C25)arylene. According to another embodiment of the present disclosure, $L_1$ may represent a (C6-C18)arylene unsubstituted or substituted with a (3- to 25-membered)heteroaryl(s) and/or a di(C6-C25)arylamino(s), and $L_2$ and $L_3$, each independently, may represent a single bond, or an unsubstituted (C6-C18) arylene. For example, $L_1$ may be a phenylene unsubstituted or substituted with a dibenzothiophenyl(s), a naphthylene, or a biphenylene unsubstituted or substituted with a diphenylamino(s), and $L_2$ and $L_3$, each independently, may be a single bond, or a phenylene.

In formula 1, $Ar_1$ represents a substituted or unsubstituted nitrogen-containing (3- to 30-membered)heteroaryl. According to one embodiment of the present disclosure, $Ar_1$ represents a substituted or unsubstituted nitrogen-containing (5- to 30-membered)heteroaryl. According to one embodiment of the present disclosure, $Ar_1$ represents a (5- to 30-membered)heteroaryl unsubstituted or substituted with at least one of a (C1-C10)alkyl(s) and a (C6-C25)aryl(s). For example, $Ar_1$ may be a carbazolyl unsubstituted or substituted with a phenyl(s) or a dibenzothiophenyl(s), a benzocarbazolyl, a dibenzocarbazolyl, a benzofurocarbazolyl, a benzothienocarbazolyl, an indenocarbazolyl substituted with a methyl(s), or a nitrogen-containing (23- to 30-membered)heteroaryl unsubstituted or substituted with a phenyl (s).

In formula 1, $Ar_2$ and $Ar_3$, each independently, represent a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30) alkylsilyl, a substituted or unsubstituted di(C1-C30)alkyl (C6-C30)arylsilyl, a substituted or unsubstituted (C1-C30) alkyldi(C6-C30)arylsilyl, a substituted or unsubstituted tri (C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino. According to one embodiment of the present disclosure, $Ar_2$ and $Ar_3$, each independently, represent a substituted or unsubstituted (C6-C25)aryl, or a substituted or unsubstituted (5- to 30-membered)heteroaryl. According to one embodiment of the present disclosure, $Ar_2$ and $Ar_3$, each independently, represent a (C6-C18)aryl unsubstituted or substituted with a (C1-C10) alkyl(s), or an unsubstituted (5- to 25-membered)heteroaryl. For example, $Ar_2$ and $Ar_3$, each independently, may be a phenyl, a biphenyl, a naphthyl, a dimethylfluorenyl, a dibenzofuranyl, or a dibenzothiophenyl.

According to one embodiment of the present disclosure, the formula 1 may be represented by at least one of the following formulas 1-1 to 1-11.

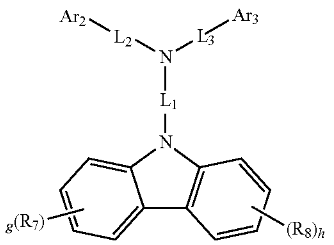
(1-1)

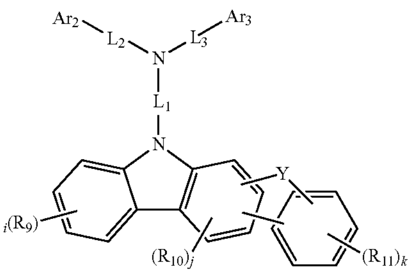
(1-2)

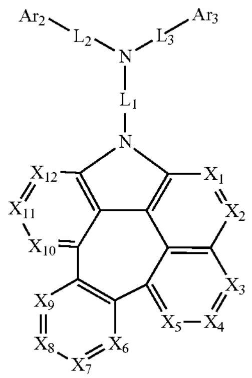
(1-3)

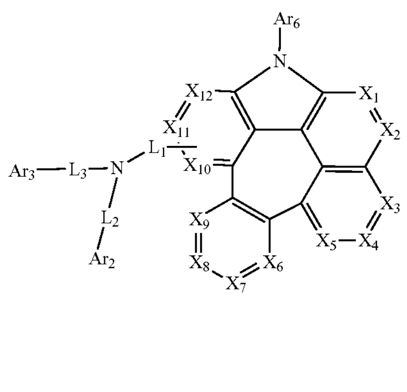
(1-4)

-continued (1-5)

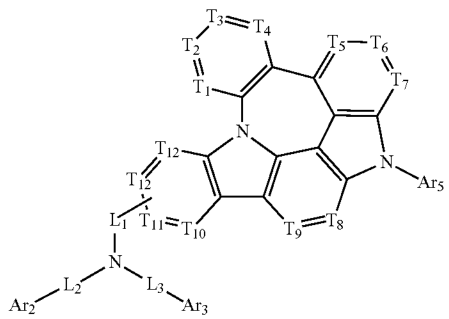

(1-6)

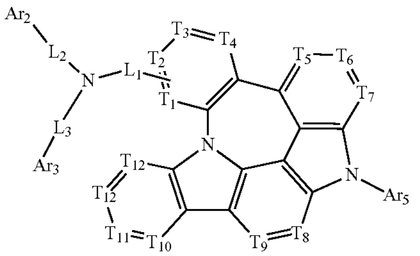

(1-7)

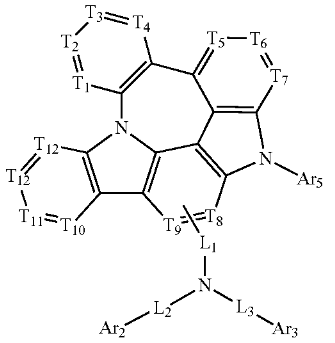

(1-8)

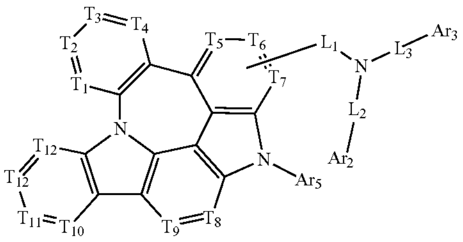

(1-9)

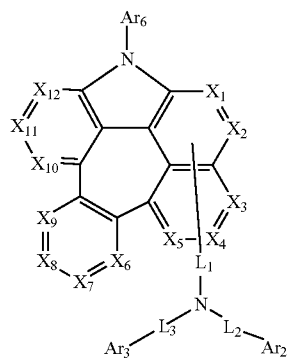

-continued (1-10)

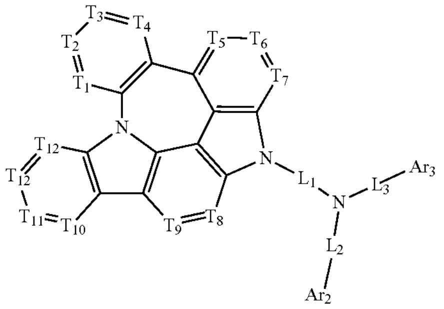

(1-11)

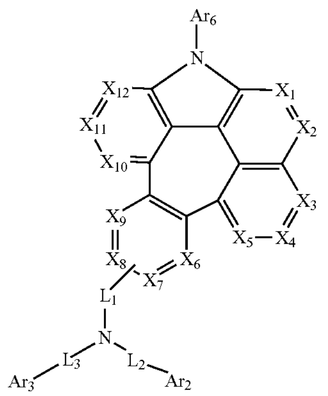

In formulas 1-1 to 1-11, $Ar_2$, $Ar_3$, and $L_1$ to $L_3$ are as defined in formula 1 above.

In formula 1-2, Y represents O, S, $CR_4R_5$, or $NR_6$.

In formulas 1-3 to 1-11, $T_1$ to $T_{13}$, and $X_1$ to $X_{12}$, each independently, represent N or $CV_1$. According to one embodiment of the present disclosure, $T_1$ to $T_{13}$, and $X_1$ to $X_{12}$, each independently, represent $CV_1$.

$R_4$ to $R_{11}$, and $V_1$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered) heteroaryl, a substituted or unsubstituted (C3-C30) cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30) arylamino, or a substituted or unsubstituted (C1-C30)alkyl (C6-C30)arylamino; or $R_4$ and $R_5$ may be linked to each other to form a ring(s); or at least two of adjacent $R_7$ to $R_{11}$ may be linked to each other to form a ring(s); or at least two of adjacent $V_1$'s may be linked to each other to form a ring(s). According to one embodiment of the present disclosure, $R_4$ to $R_{11}$, and $V_1$, each independently, represent hydrogen, deuterium, a substituted or unsubstituted (C1-C20)alkyl, a substituted or unsubstituted (C6-C25)aryl, or a substituted or unsubstituted (5- to 25-membered)heteroaryl; or at least two of adjacent $R_7$'s, at least two of adjacent $R_8$'s, and at least two of adjacent $R_{11}$'s, each independently, may be linked to each other to form a ring(s); or at least two of adjacent $V_1$'s may be linked to each other to form a ring(s). According to another embodiment of the present disclosure, $R_4$ and $R_5$, each independently, may represent an unsubstituted (C1-C10)alkyl, $R_4$ and $R_5$ may be the same; $R_6$ may represent an unsubstituted (C6-C18)aryl; and $R_7$ and $R_3$, each independently, may represent hydrogen, an unsubstituted (C6-C18)aryl, or an unsubstituted (5- to 20-membered) heteroaryl; or at least two of adjacent $R_7$'s and at least two of adjacent $R_3$'s, each independently, may be linked to each other to form a ring(s); $R_9$ and $R_{10}$, each independently, may represent hydrogen; $R_{11}$ may represent hydrogen, or at least two of adjacent $R_{11}$'s may be linked to each other to form a ring(s); $V_1$, each independently, may represent hydrogen or an unsubstituted (C6-C18)aryl, or at least two of adjacent $V_1$'s may be linked to each other to form a ring(s). For example, $R_4$ and $R_5$ may be a methyl; $R_6$ may be a phenyl; $R_7$ and $R_3$, each independently, may be hydrogen, a phenyl, or a dibenzothiophenyl; or two of adjacent $V_7$'s may be linked to each other to form a benzene ring, or two of adjacent $V_3$'s may be linked to each other to form a benzene ring; $R_9$ and $R_{10}$ may be hydrogen; $R_{11}$ may be hydrogen, or two of adjacent $V_1$'s may be linked to each other to form a benzene ring; $V_1$, each independently, may be hydrogen or a phenyl, or two of adjacent $V_1$'s may be linked to each other to form a benzene ring.

In formulas 1-4 to 1-11, $Ar_5$ and $Ar_6$, each independently, represent a substituted or unsubstituted (C6-C30)aryl, or a substituted or unsubstituted (3- to 30-membered)heteroaryl.

In formulas 1-1 to 1-11, g, h, i and k, each independently, represent an integer of 1 to 4, where g, h, i and k, each independently, are an integer of 2 or more, each of $R_7$, each of $R_3$, each of $R_9$ and each of $R_{11}$ may be the same or different; and j represents an integer of 1 or 2; where j represents an integer of 2, each of $R_{10}$ may be the same or different.

In formula 2, $Y_1$ represents O, S, $CR_{11}R_{12}$, or $NR_{13}$.

$R_{11}$ and $R_{12}$, each independently, represent hydrogen, deuterium, a halogen, a cyano, a substituted or unsubstituted (C1-C30)alkyl, a substituted or unsubstituted (C3-C30)cycloalkyl, a substituted or unsubstituted (C3-C30)cycloalkenyl, a substituted or unsubstituted (3- to 7-membered) heterocycloalkyl, a substituted or unsubstituted (C6-C30) aryl, or a substituted or unsubstituted (3- to 30-membered) heteroaryl; or $R_{11}$ and $R_{12}$ may be linked to each other to form a spiro ring. According to one embodiment of the present disclosure, $R_{11}$ and $R_{12}$, each independently, represent a substituted or unsubstituted (C1-C20)alkyl, a substituted or unsubstituted (C6-C25)aryl, or a substituted or unsubstituted (5- to 25-membered)heteroaryl; or $R_{11}$ and $R_{12}$ may be linked to each other to form a spiro ring. According to another embodiment of the present disclosure, $R_{11}$ and $R_{12}$, each independently, represent an unsubstituted (C1-C10)alkyl, or an unsubstituted (C6-C18)aryl; or $R_{11}$ and $R_{12}$ may be linked to each other to form a spiro ring. For example, $R_{11}$ and $R_{12}$, each independently, may be a methyl or a phenyl, or $R_{11}$ and $R_{12}$ may be linked to each other to form a spiro[fluorene-benzofluorene] ring. $R_{11}$ and $R_{12}$ may be the same or different, and according to one embodiment of the present disclosure, may be the same.

$R_{13}$, each independently, represents -L-$(Ar)_d$, hydrogen, deuterium, a halogen, a cyano, a substituted or unsubstituted (C1-C30)alkyl, a substituted or unsubstituted (C3-C30)cycloalkyl, a substituted or unsubstituted (C3-C30)cycloalkenyl, a substituted or unsubstituted (3- to 7-membered) heterocycloalkyl, a substituted or unsubstituted (C6-C30) aryl, or a substituted or unsubstituted (3- to 30-membered) heteroaryl. According to one embodiment of the present disclosure, $R_{13}$ represents a substituted or unsubstituted (C6-C25)aryl, or a substituted or unsubstituted (5- to 25-membered)heteroaryl. According to another embodiment of the present disclosure, $R_{13}$ represents a (C6-C18)aryl unsubstituted or substituted with a (C1-C6)alkyl(s), or an unsubstituted (5- to 20-membered)heteroaryl. For example, $R_{13}$ may be a phenyl, a naphthyl, a biphenyl, a dimethylfluorenyl, a phenanthrenyl, or a dibenzothiophenyl.

In formula 2, $R_1$, each independently, represents -L-$(Ar)_d$, hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted tri(C1-C30) alkylsilyl, a substituted or unsubstituted di(C1-C30)alkyl (C6-C30)arylsilyl, a substituted or unsubstituted (C1-C30) alkyldi(C6-C30)arylsilyl, a substituted or unsubstituted tri (C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino; or at least two of adjacent $R_1$'s may be linked to each other to form a ring(s). According to one embodiment of the present disclosure, $R_1$, each independently, represents hydrogen, deuterium, a substituted or unsubstituted (C6-C25)aryl, or a substituted or unsubstituted (5- to 25-membered)heteroaryl. According to another embodiment of the present disclosure, $R_1$, each independently, represents hydrogen, an unsubstituted (C6-C18)aryl, or a substituted or unsubstituted (5- to 25-membered)heteroaryl. For example, $R_1$, each independently, may be hydrogen, a phenyl, a naphthyl, a biphenyl, a phenanthrenyl, a carbazolyl substituted with a phenyl(s), a dibenzofuranyl, or a dibenzothiophenyl.

In formula 2, $R_2$ and $R_3$, each independently, represent -L-$(Ar)_d$, hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino. According to one embodiment of the present disclosure, $R_2$ and $R_3$, each independently, represent -L-$(Ar)_d$, hydrogen, deuterium, or a substituted or unsubstituted (C6-C25)aryl. According to another embodiment of the present disclosure, $R_2$ and $R_3$, each independently, represent -L-$(Ar)_d$, hydrogen, or an unsubstituted (C6-C18)aryl. For example, $R_2$ and $R_3$, each independently, may be -L-$(Ar)_d$, hydrogen, a phenyl, or a naphthyl.

However, at least one of $R_{13}$, $R_1$, $R_2$ and $R_3$ represents -L-$(Ar)_d$. According to one embodiment of the present disclosure, any one of $R_{13}$, $R_1$, $R_2$ and $R_3$ represents -L-$(Ar)_d$. According to another embodiment of the present disclosure, any one of $R_{13}$, $R_2$ and $R_3$ represents -L-$(Ar)_d$. For example, any one of $R_2$ and $R_3$ represents -L-$(Ar)_d$.

L represents a single bond, a substituted or unsubstituted (C6-C30)arylene, or a substituted or unsubstituted (3- to 30-membered)heteroarylene. According to one embodiment of the present disclosure, L represents a single bond, or a substituted or unsubstituted (C6-C25)arylene. According to another embodiment of the present disclosure, L represents a single bond, or an unsubstituted (C6-C18)arylene. For example, L represents a single bond, a phenylene, a naphthylene, or a biphenylene.

Ar, each independently, represents a substituted or unsubstituted nitrogen-containing (3- to 30-membered)heteroaryl. According to one embodiment of the present disclosure, Ar, each independently, represents a substituted nitrogen-containing (5- to 25-membered)heteroaryl. According to another embodiment of the present disclosure, Ar, each independently, represents a nitrogen-containing (5- to 25-membered)heteroaryl substituted with at least one of a (C6-C30)aryl(s) and a (3- to 30-membered)heteroaryl(s). For example, Ar may be a substituted triazinyl, a substituted quinoxalinyl, a substituted quinazolinyl, a substituted benzoquinoxalinyl, or a substituted benzoquinazolinyl, in which the substituents of the substituted triazinyl, the substituted quinoxalinyl, the substituted quinazolinyl, the substituted benzoquinoxalinyl and the substituted benzoquinazolinyl, each independently, may be at least one selected from the group consisting of a phenyl, a biphenyl, a naphthyl, a phenylnaphthyl, a naphthylphenyl, a terphenyl, a phenanthrenyl, a triphenylenyl, a spirobifluorenyl, dimethylfluorenyl, a diphenylfluorenyl unsubstituted or substituted with a phenyl(s), a carbazolyl unsubstituted or substituted with a phenyl(s) or a biphenyl(s), a dibenzofuranyl unsubstituted or substituted with a phenyl(s), a dibenzothiophenyl, a benzonaphthothiophenyl and a benzonaphthofuranyl.

In formula 2, a, c and d, each independently, represent an integer of 1 to 4; where a, c and d, each independently, are an integer of 2 or more, each of $R_1$, each of $R_3$ and each of Ar may be the same or different; and b, independently, represents an integer of 1 or 2; where b is an integer of 2, each of $R_2$ may be the same or different. For example, a to d, each independently, may be an integer of 1.

According to one embodiment of the present disclosure, the formula 2 may be represented by at least one of the following formulas 2-1 to 2-9.

(2-1)

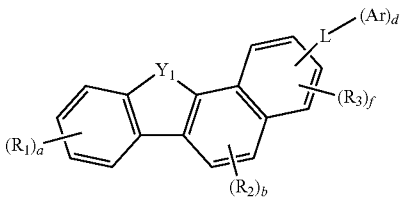

(2-2)

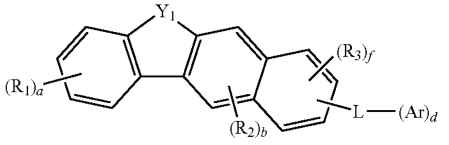

(2-3)

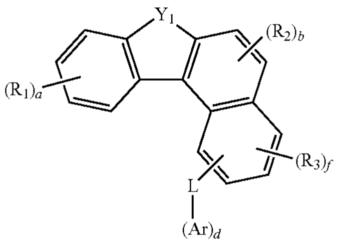

(2-4)

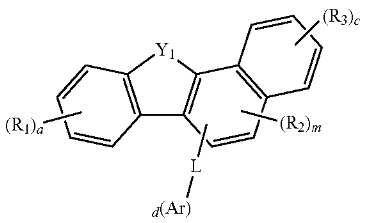

-continued (2-5)

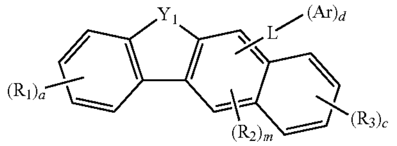

(2-6)

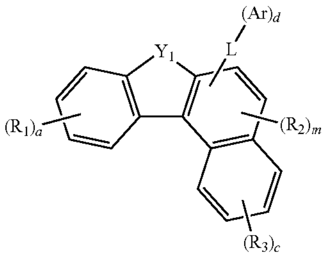

(2-7)

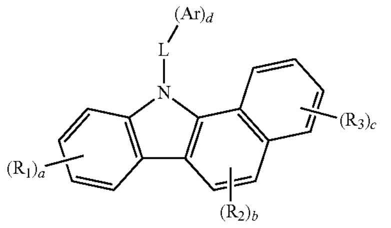

(2-8)

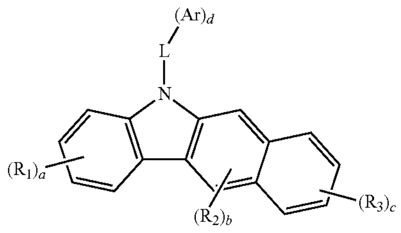

(2-9)

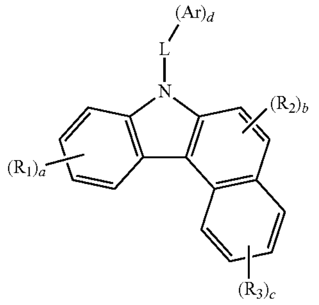

In formulas 2-1 to 2-9, $Y_1$, L, Ar, and a to d are as defined in formula 2 above.

In formulas 2-1 to 2-9, m represents an integer of 1; f represents an integer of 1 to 3, where f represents an integer of 2 or more, each of $R_3$ may be the same or different. According to one embodiment of the present disclosure, f may be an integer of 1.

In formulas 2-1 to 2-9, $R_1$ to $R_3$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino. Specific embodiments of $R_1$ to $R_3$ are as described in formula 2 above.
The compound represented by formula 1 may be specifically exemplified by the following compounds, but is not limited thereto.
H-1-1
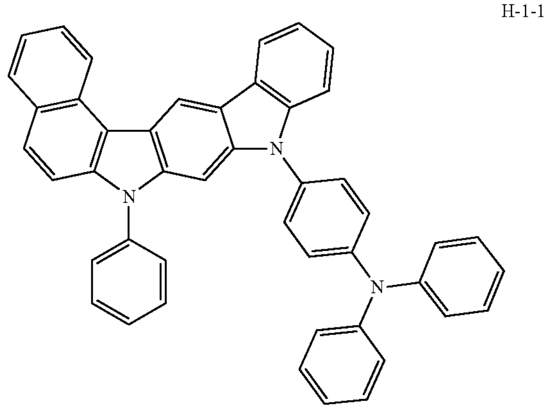
H-1-2
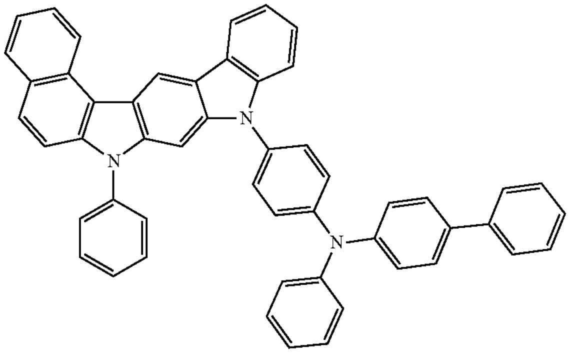
H-1-3
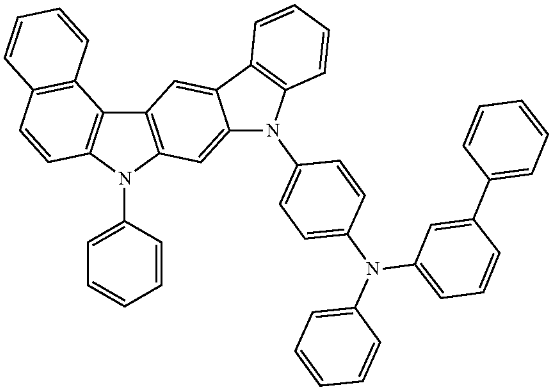
-continued
H-1-4
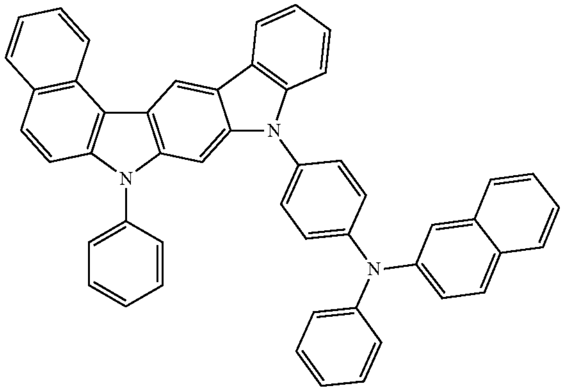
H-1-5
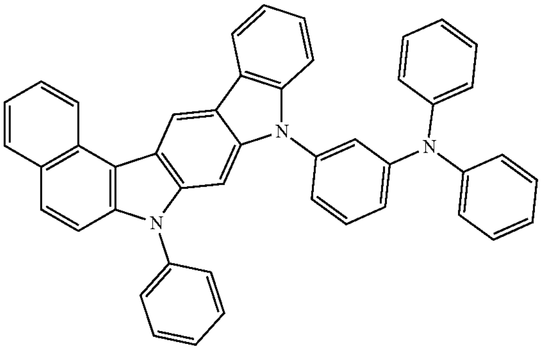
H-1-6
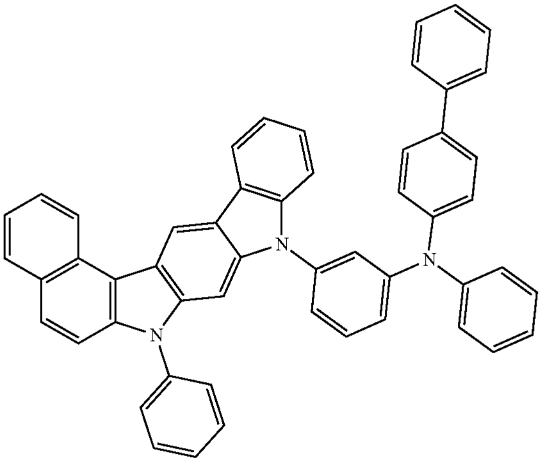

-continued
H-1-7
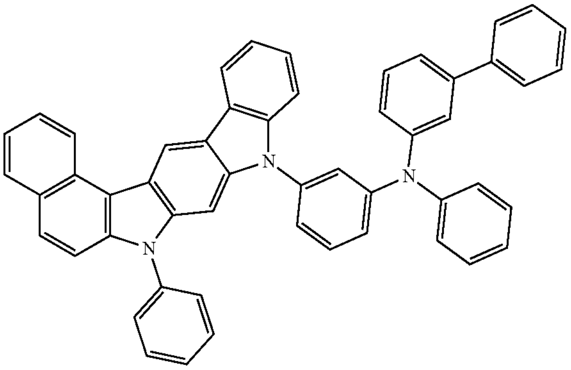
H-1-8
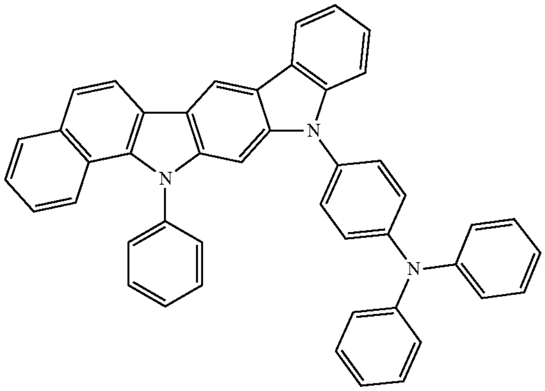
H-1-9
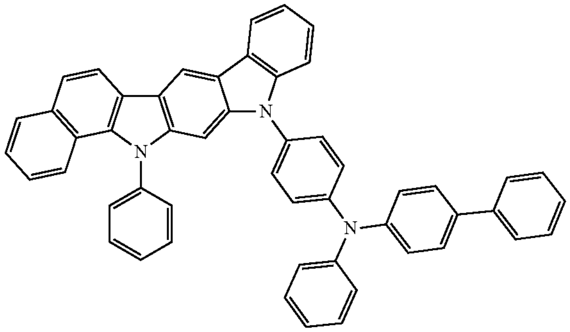
H-1-10
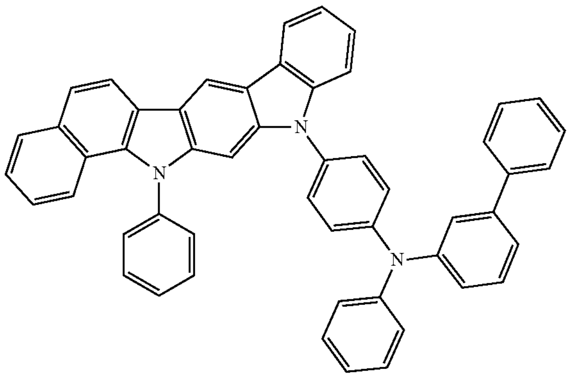
-continued
H-1-11
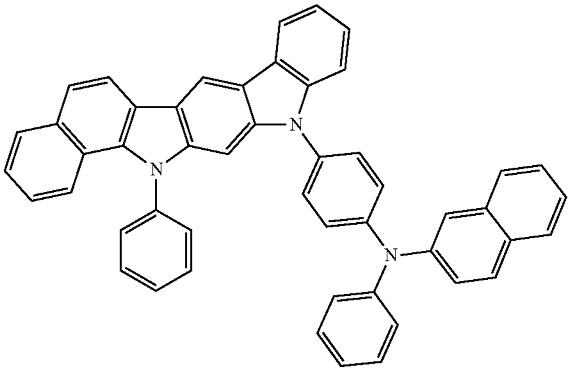
H-1-12
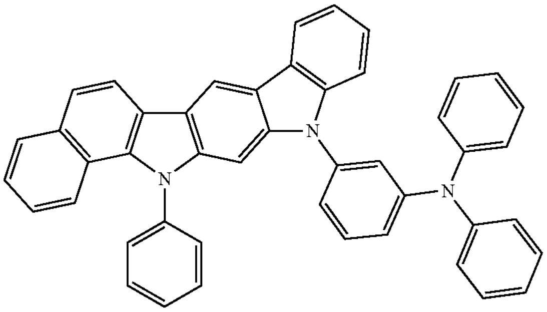
H-1-13
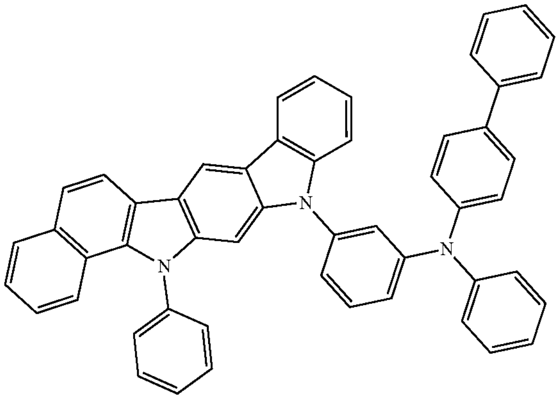
H-1-14
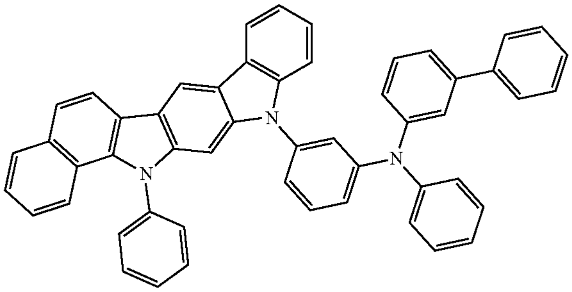

-continued
H-1-15
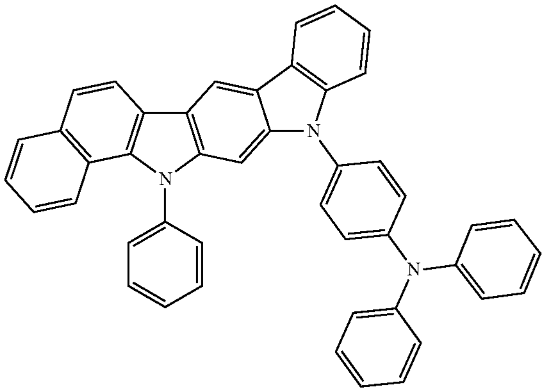
H-1-16
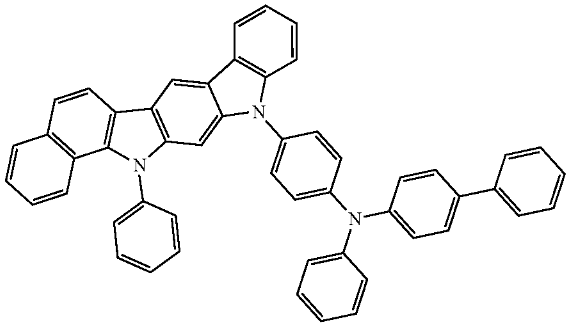
H-1-17
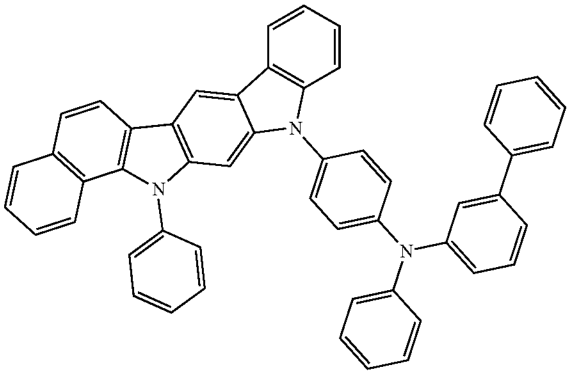
H-1-18
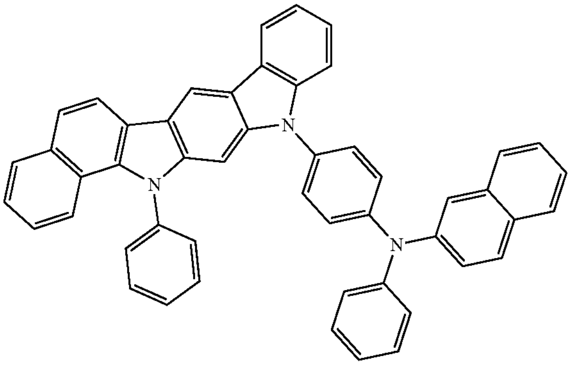
-continued
H-1-19
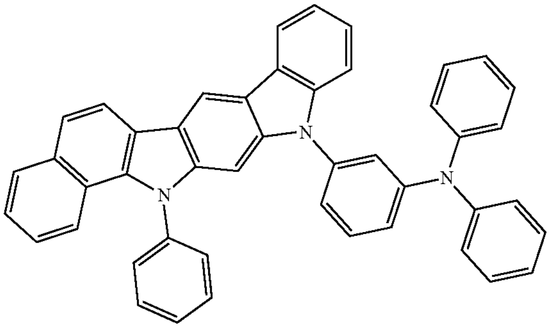
H-1-20
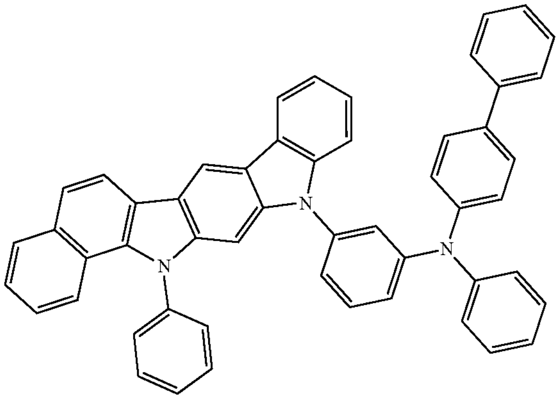
H-1-21
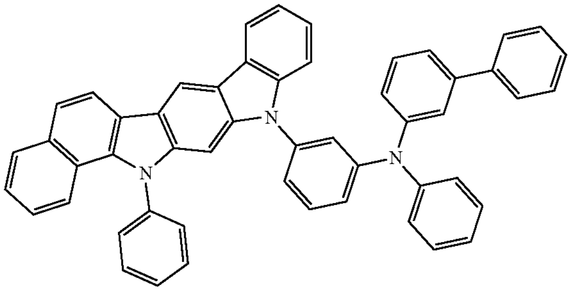
H-1-22
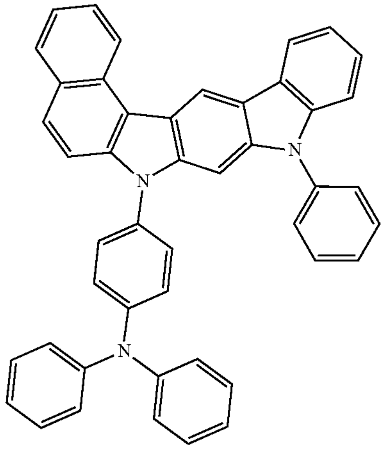

-continued
H-1-23
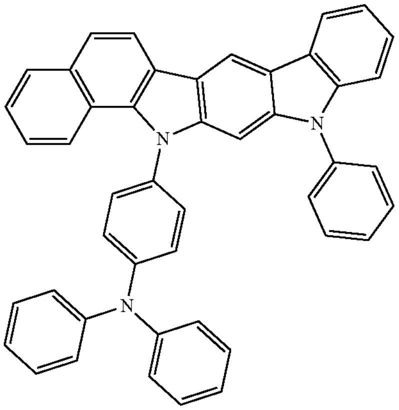
H-1-24
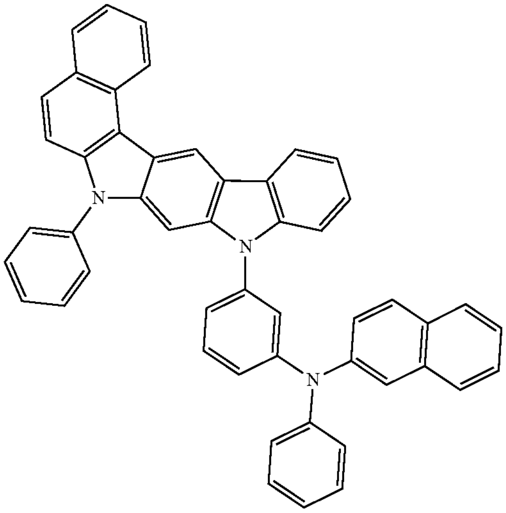
H-1-25
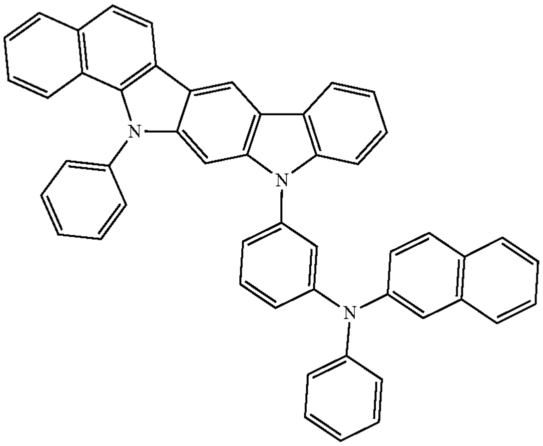
-continued
H-1-26
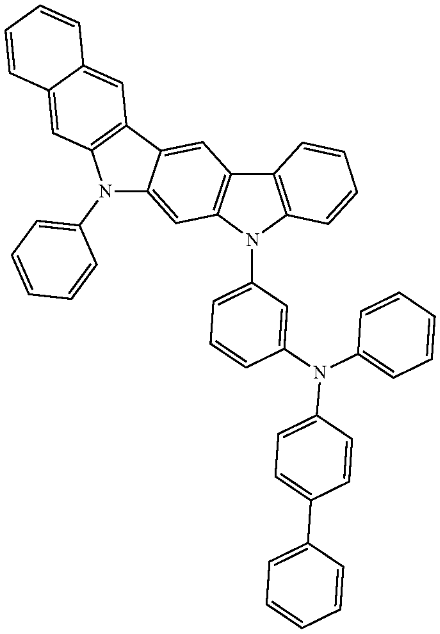
H-1-27
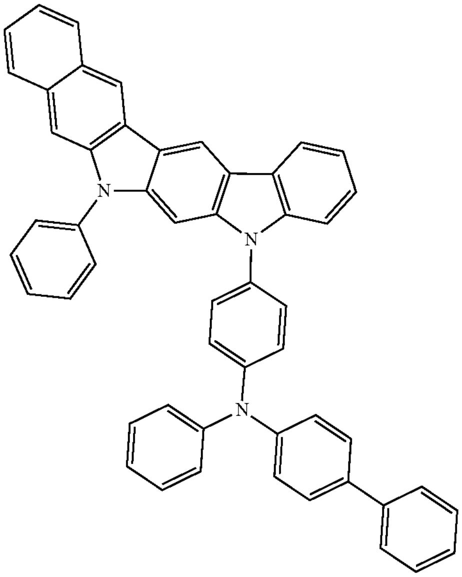

-continued
H-1-28
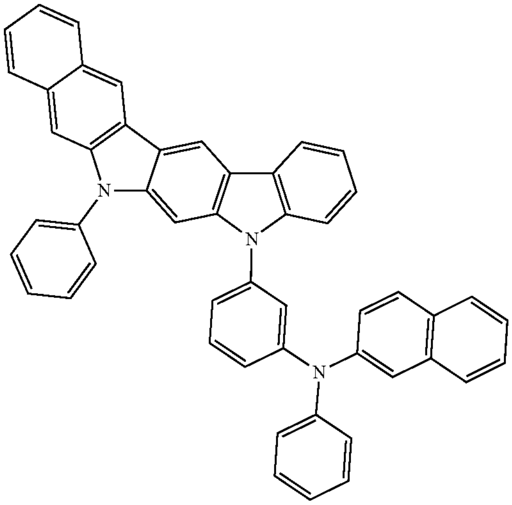
H-1-29
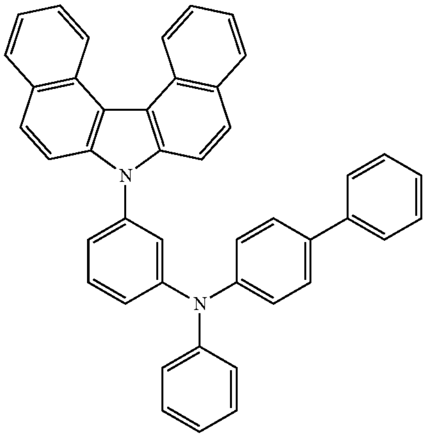
H-1-30
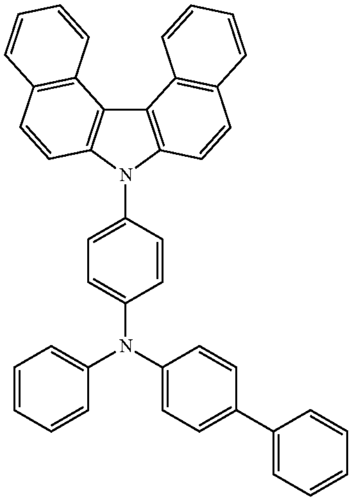
-continued
H-1-31
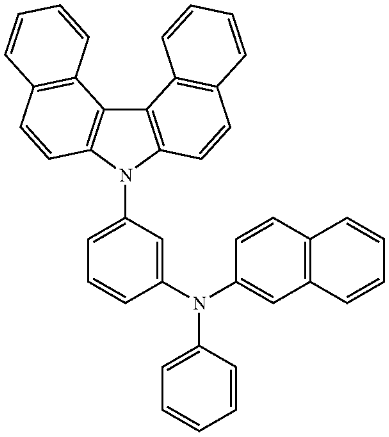
H-1-32
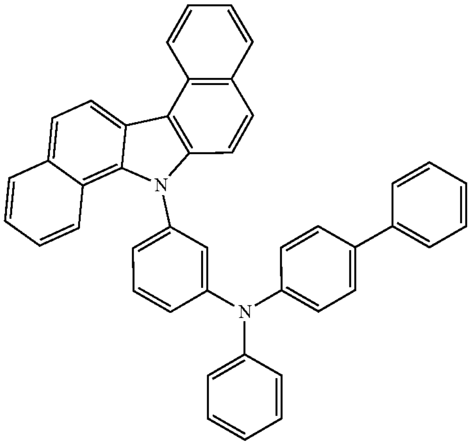
H-1-33
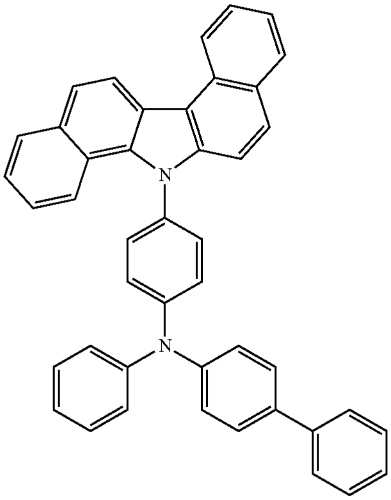

-continued
H-1-34
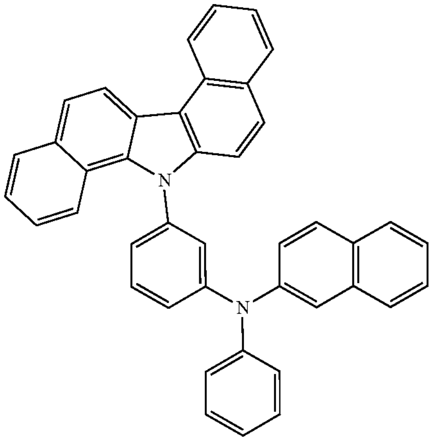
H-1-35
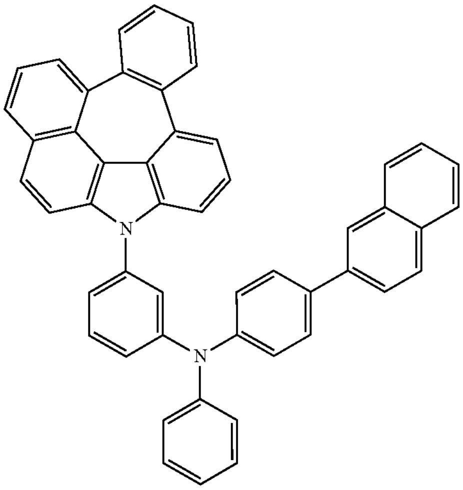
H-1-36
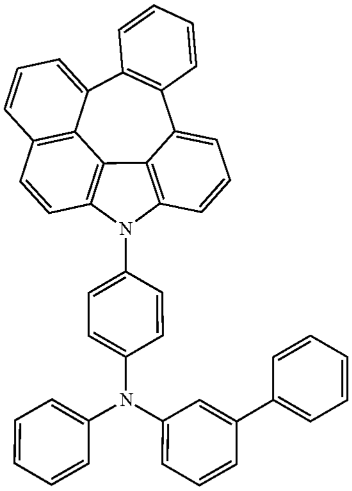
-continued
H-1-37
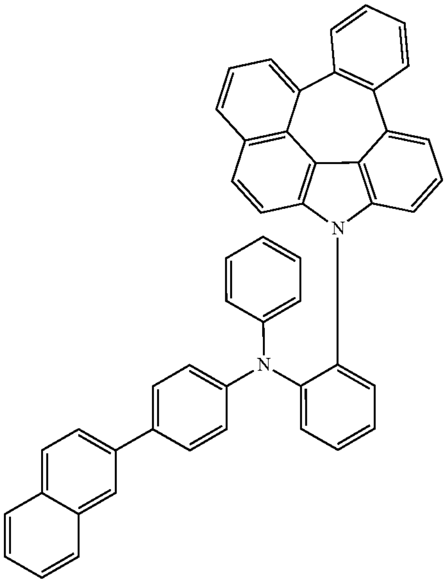
H-1-38
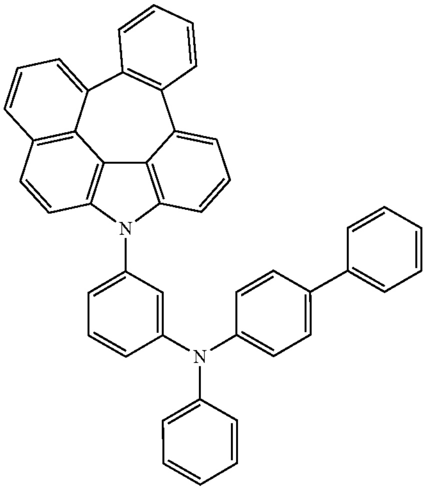
H-1-39
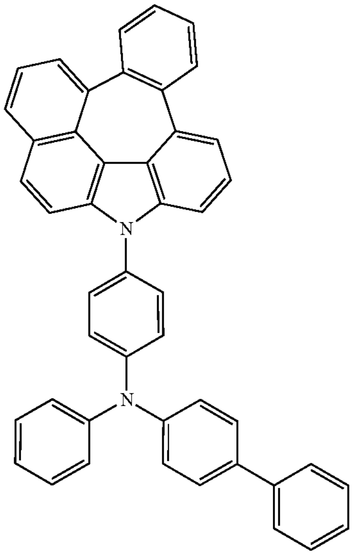

-continued
H-1-40
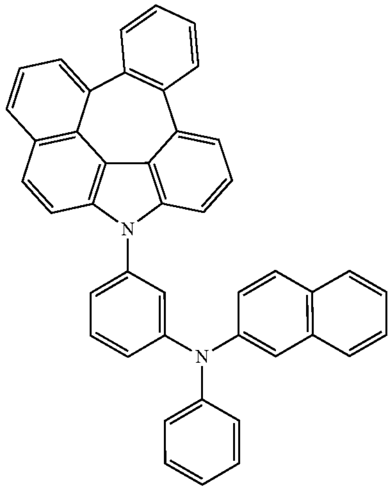
H-1-41
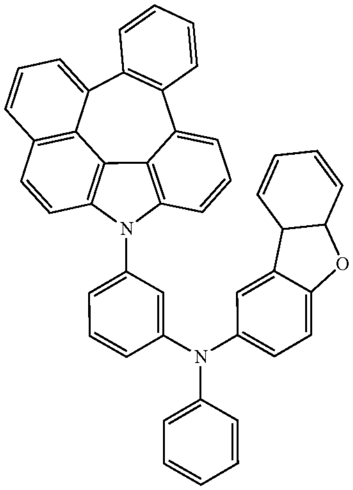
H-1-42
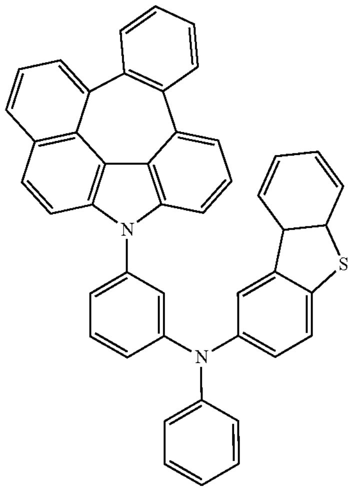
-continued
H-1-43
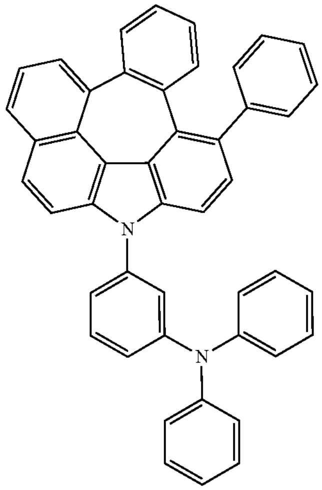
H-1-44
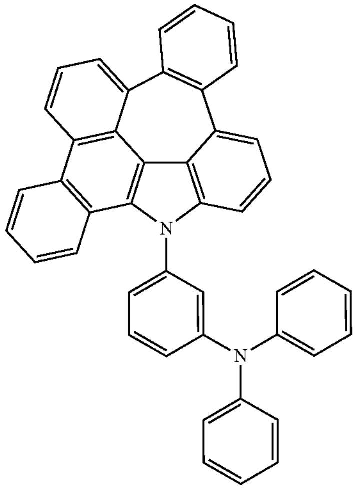
H-1-45
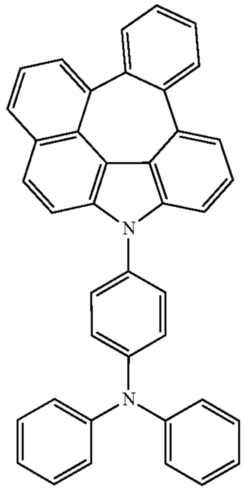

-continued
H-1-46
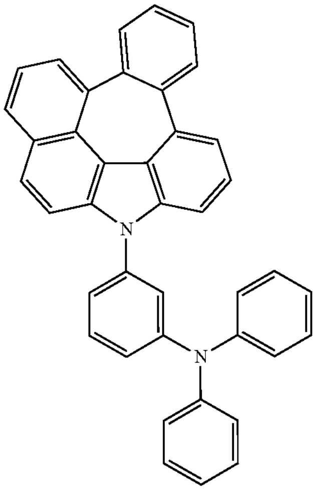
H-1-47
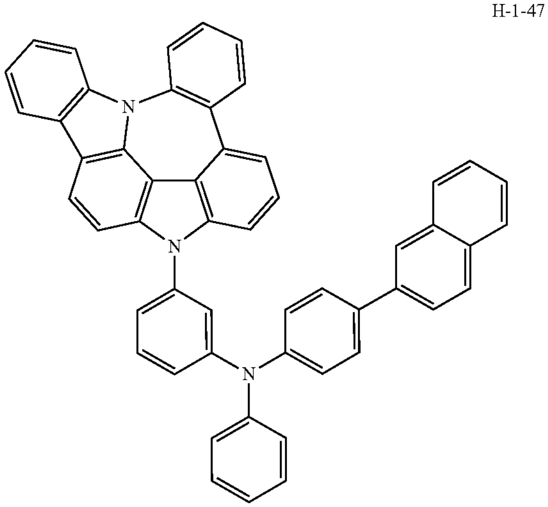
H-1-48
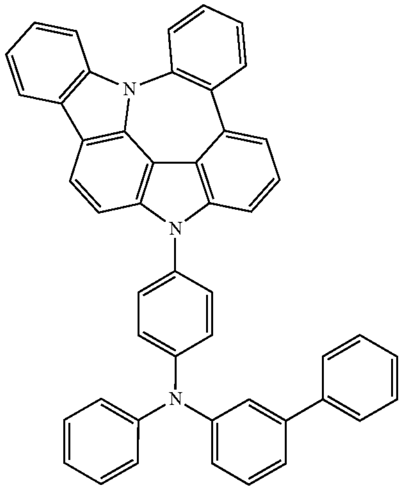
-continued
H-1-49
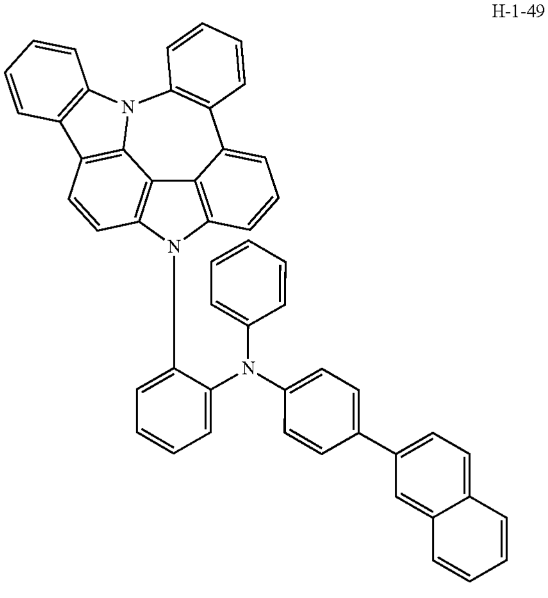
H-1-50
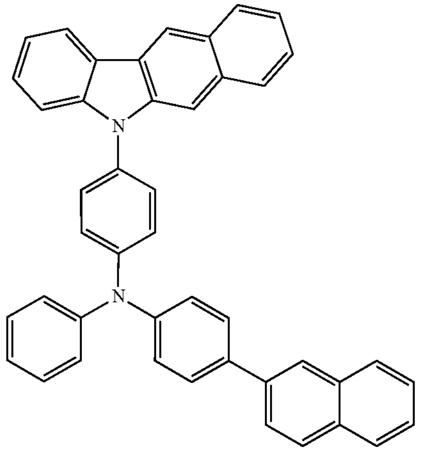
H-1-51
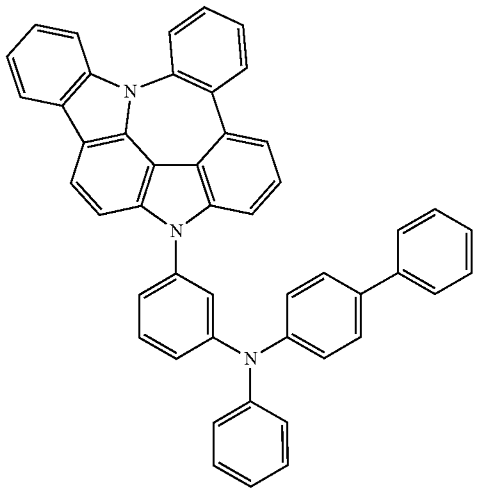

-continued
H-1-52
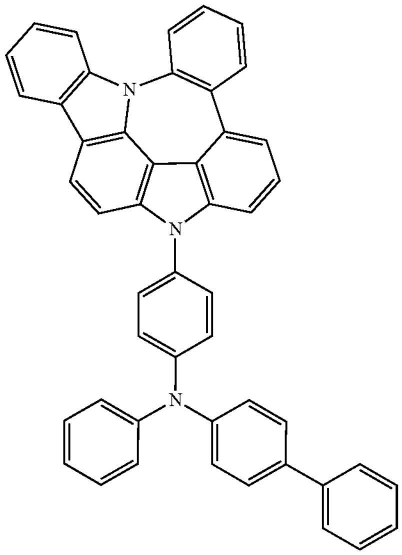
H-1-53
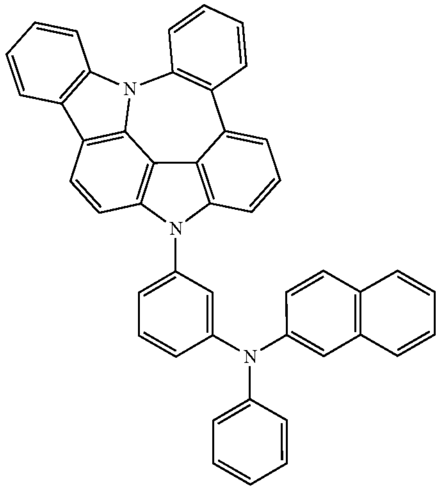
H-1-54
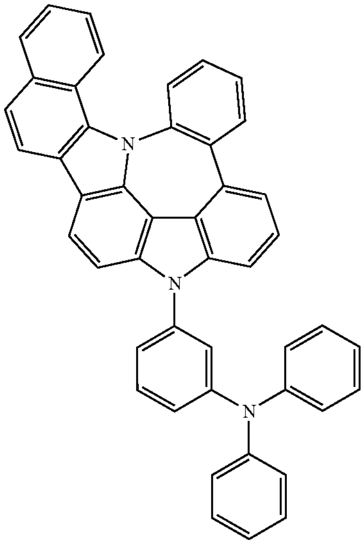
-continued
H-1-55
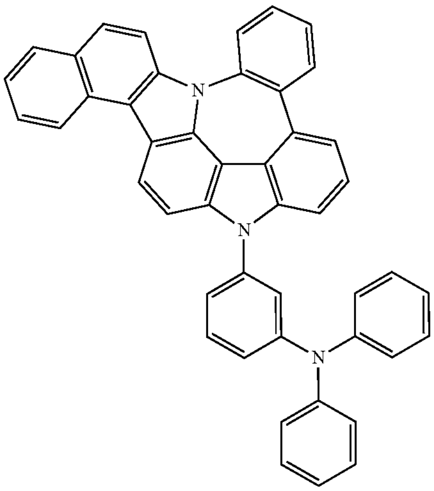
H-1-56
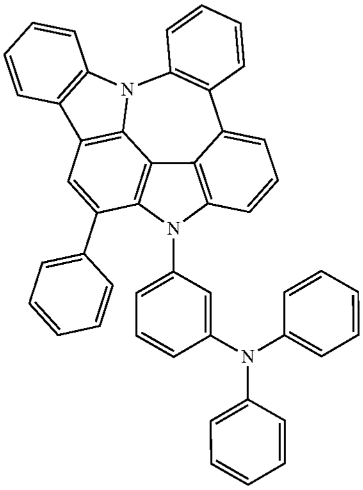
H-1-57
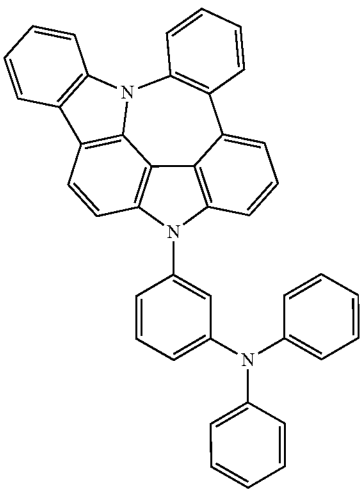

-continued
H-1-58
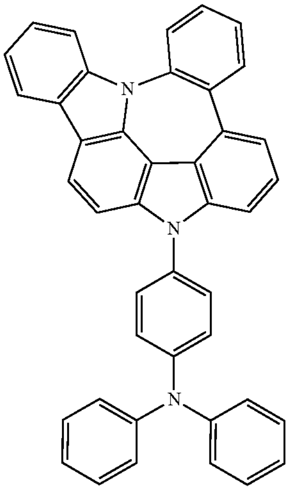
H-1-59
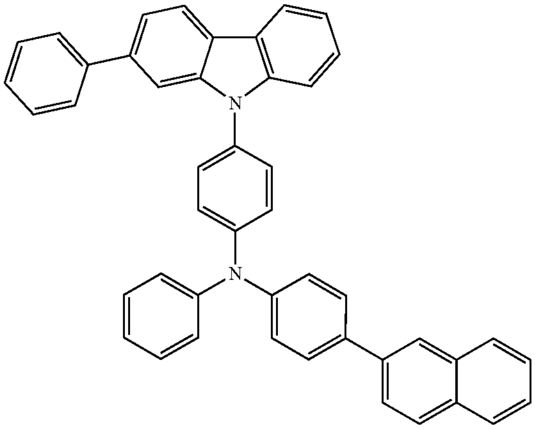
H-1-60
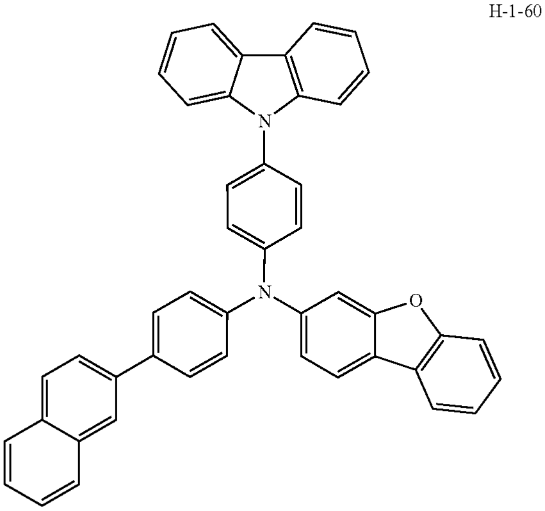
-continued
H-1-61
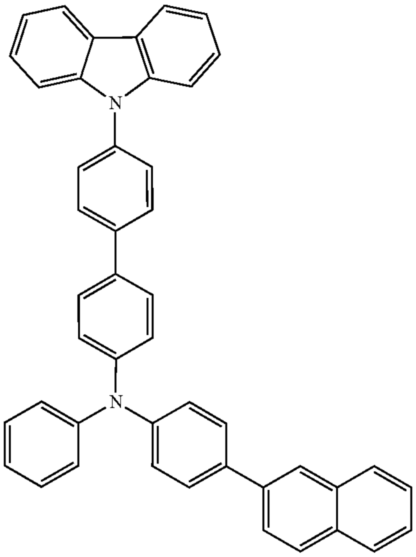
H-1-62
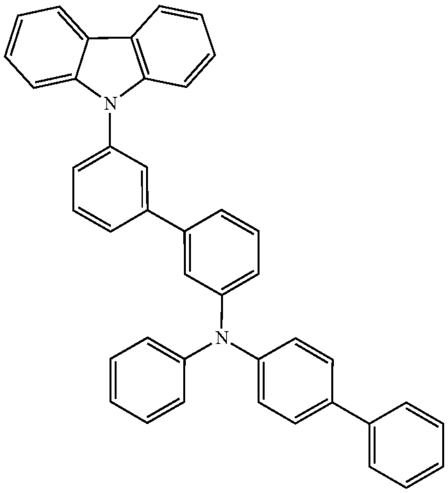
H-1-63
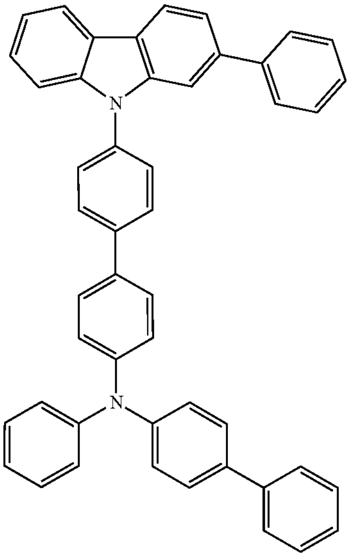

-continued
H-1-64
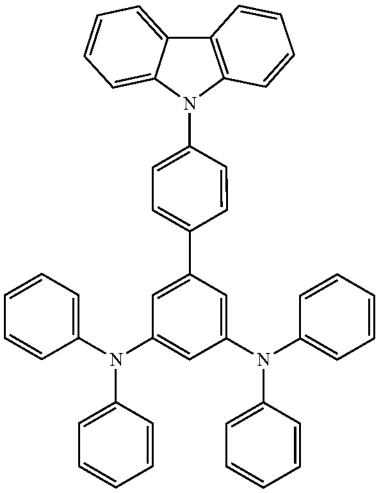
H-1-65
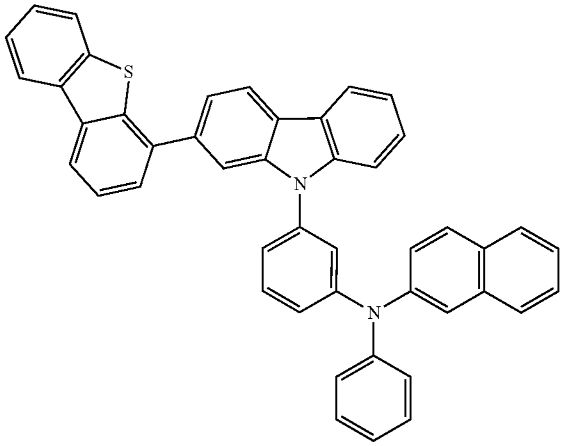
H-1-66
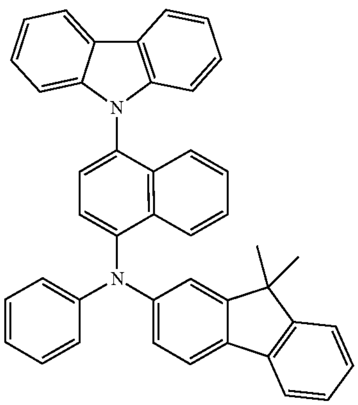
-continued
H-1-67
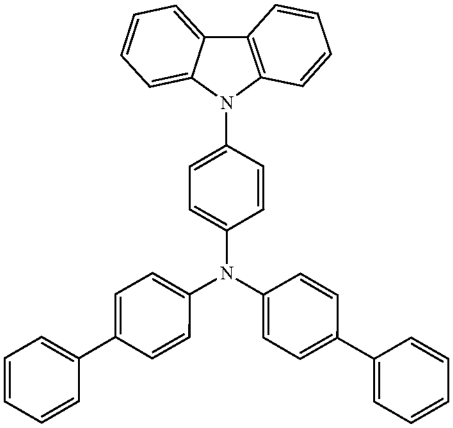
H-1-68
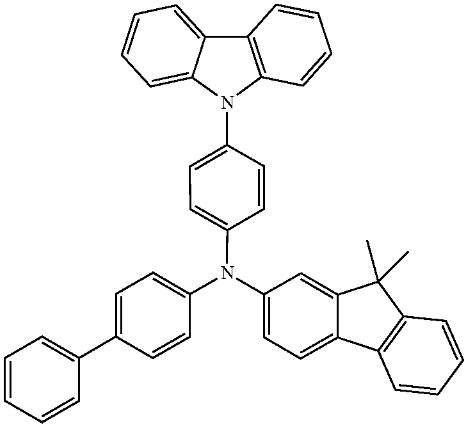
H-1-69
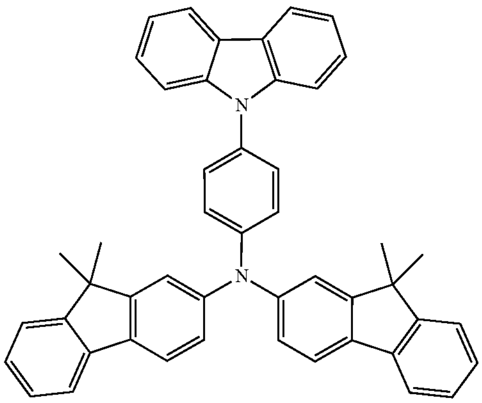

-continued
H-1-70
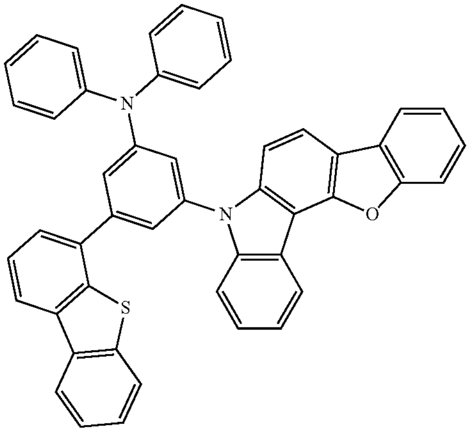
H-1-71
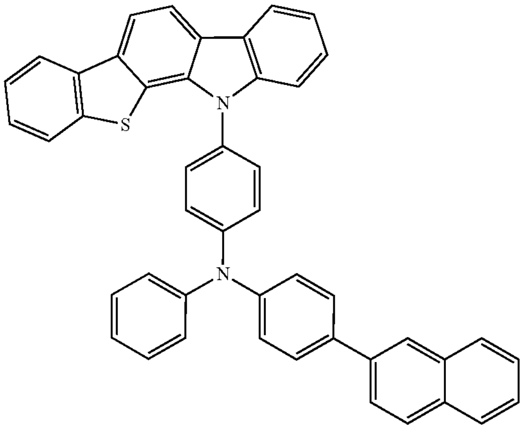
H-1-72
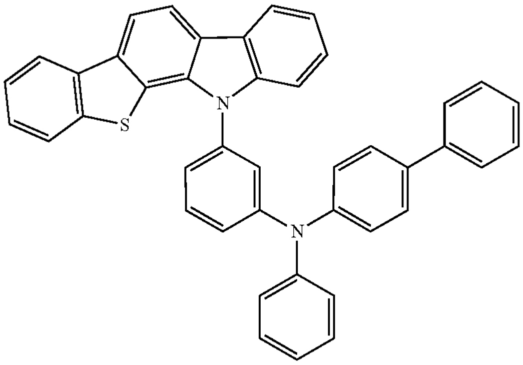
H-1-73
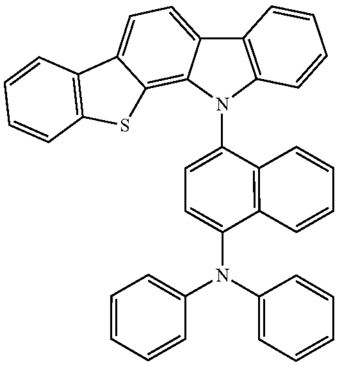
-continued
H-1-74
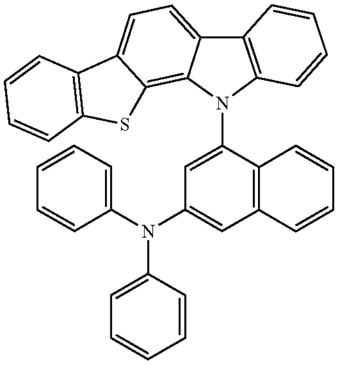
H-1-75
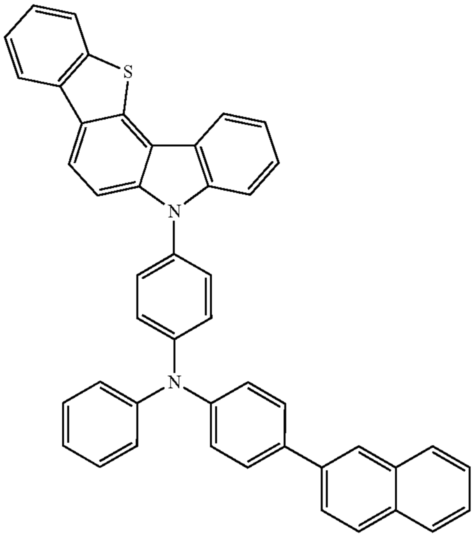
H-1-76
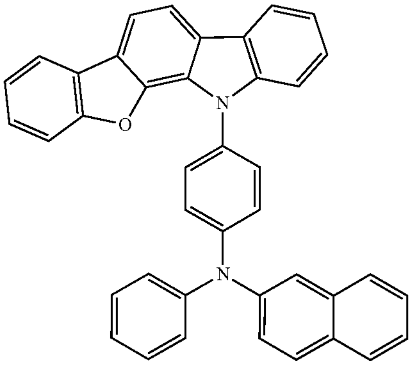

-continued
H-1-77
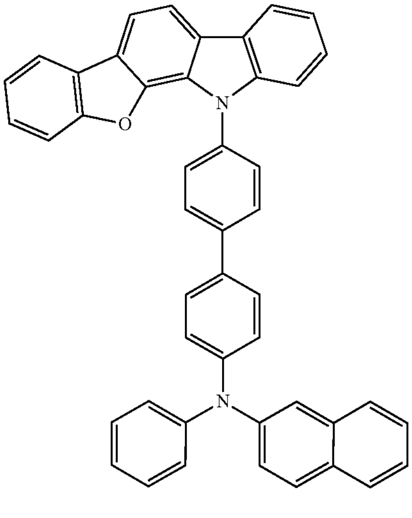
H-1-78
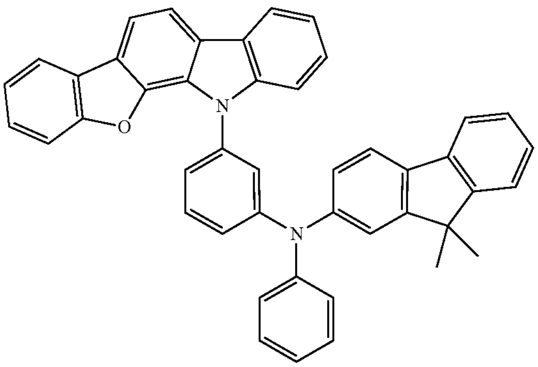
H-1-79
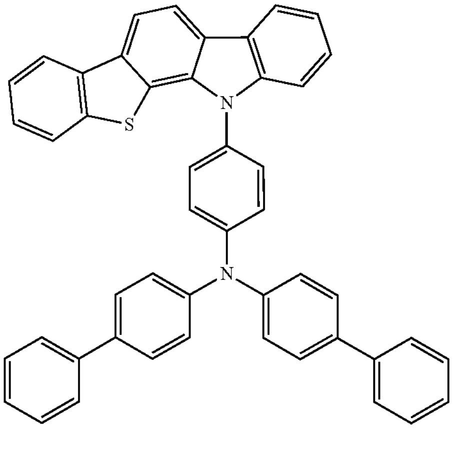
-continued
H-1-80
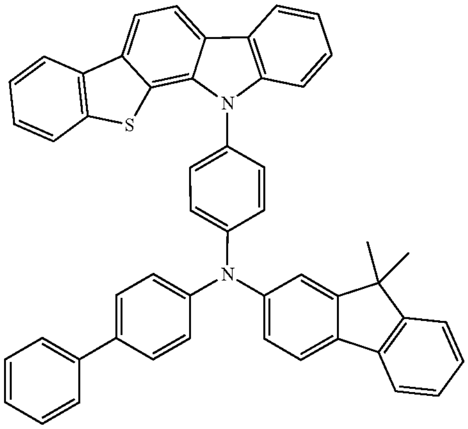
H-1-81
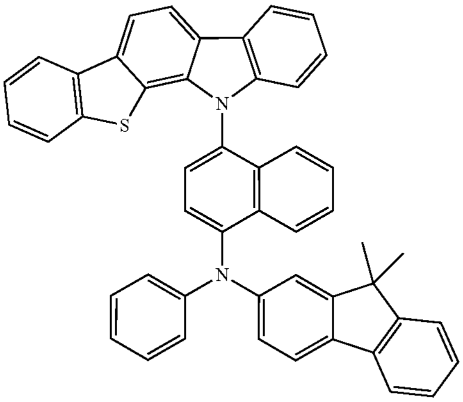
H-1-82
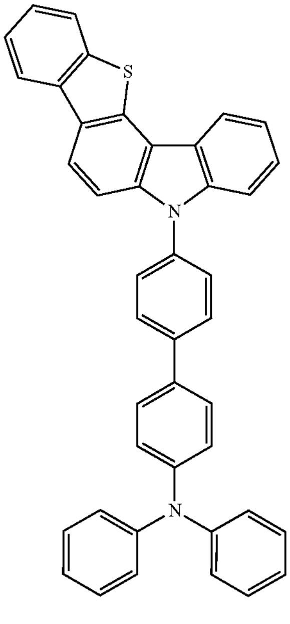

-continued
H-1-83
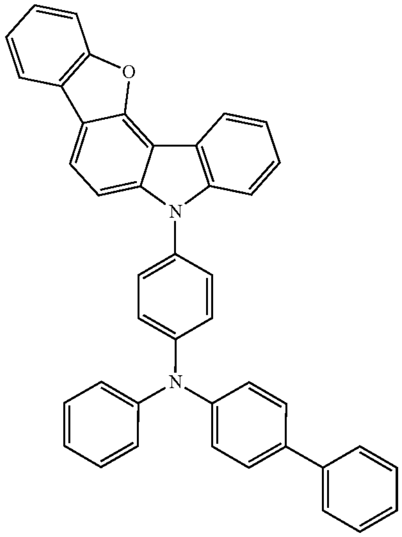
H-1-84
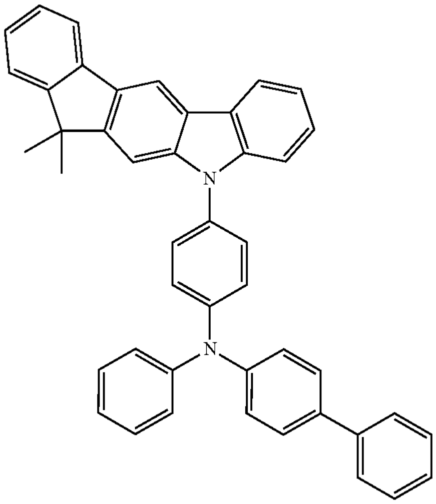
H-1-85
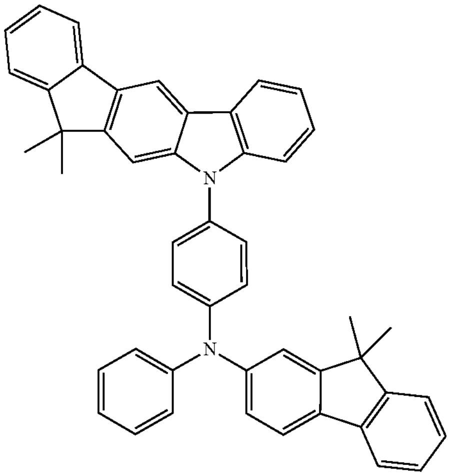
-continued
H-1-86
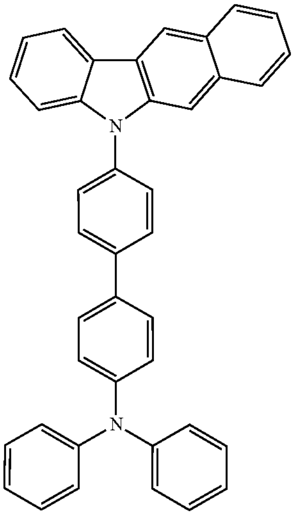
H-1-87
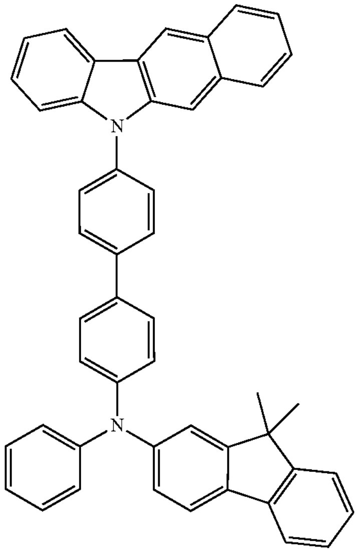
H-1-88
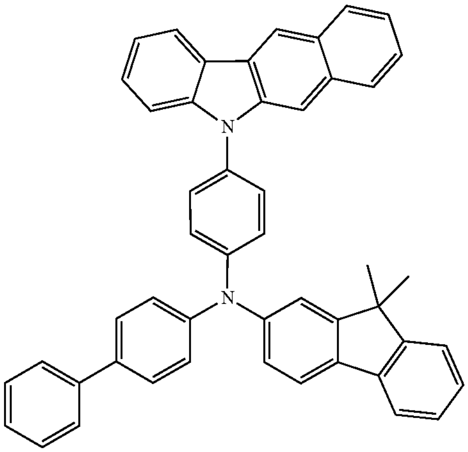

-continued
H-1-89
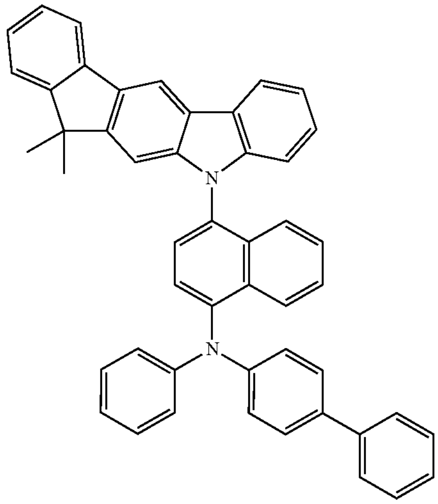
H-1-90
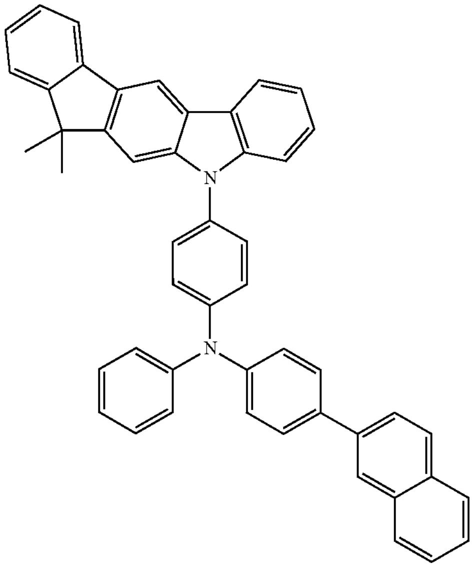
H-1-91
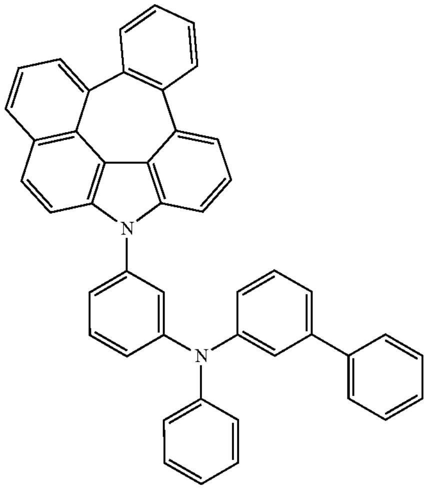
-continued
H-1-92
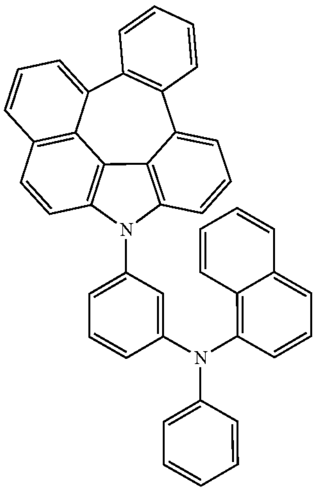
H-1-93
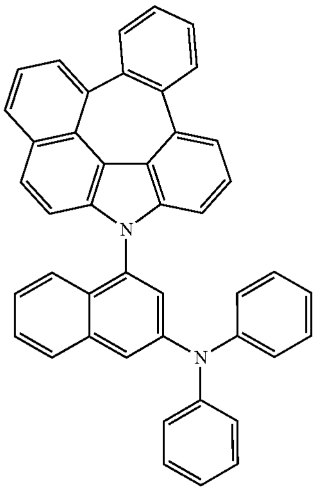
H-1-94
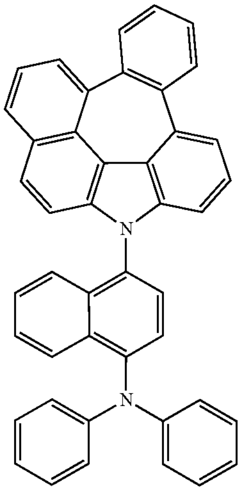
The compound represented by formula 2 may be specifically exemplified by the following compounds, but is not limited thereto.

-continued
C-1
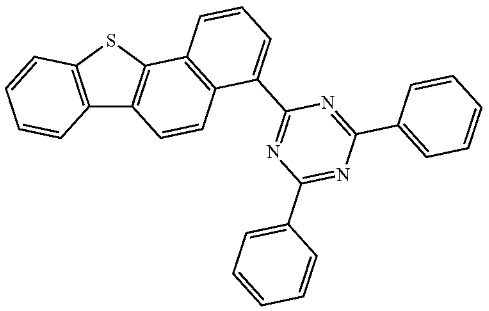
C-2
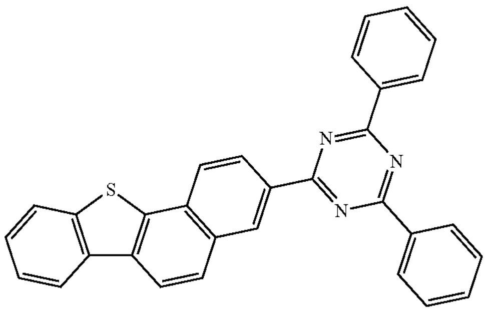
C-3
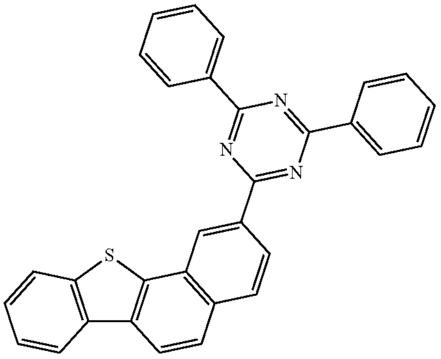
C-4
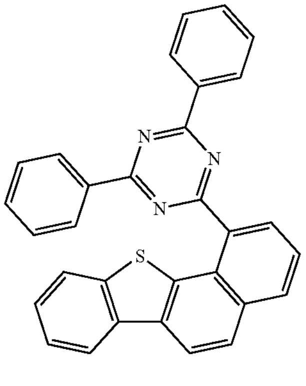
C-5
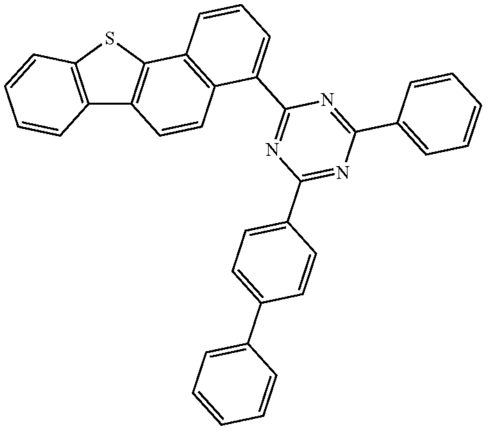
C-6
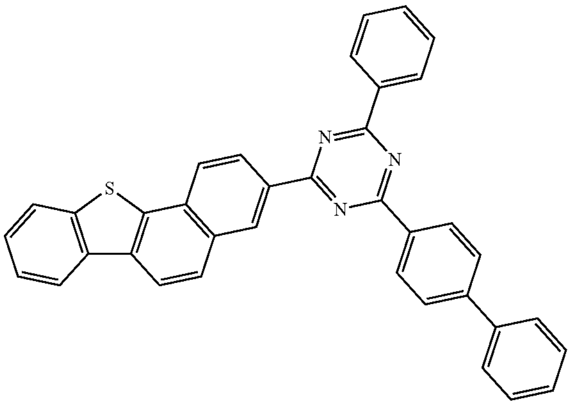
C-7
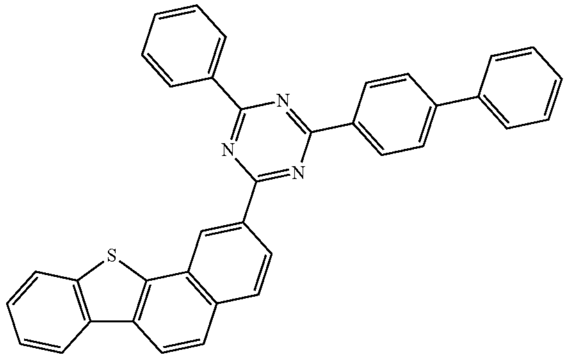
C-8
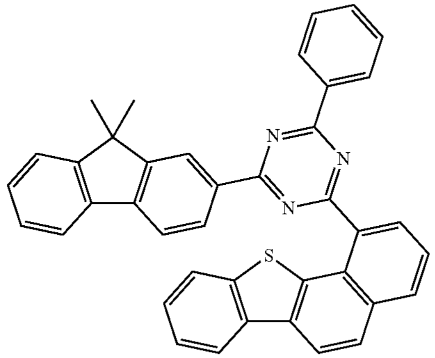

-continued
C-9
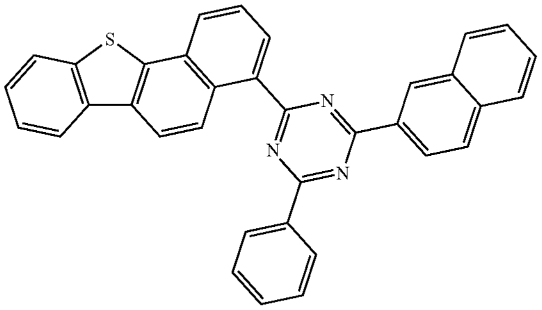
C-10
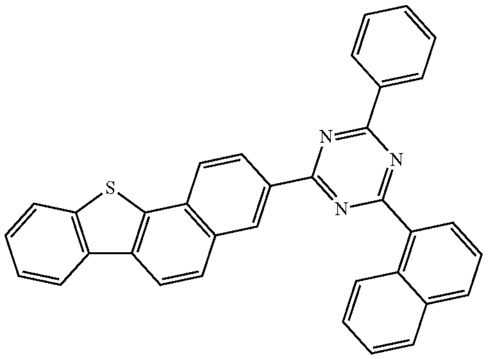
C-11
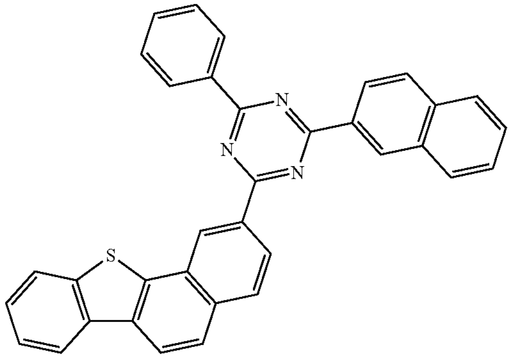
C-12
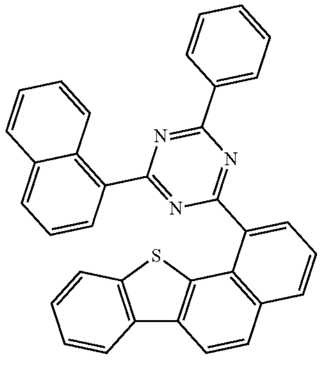
-continued
C-13
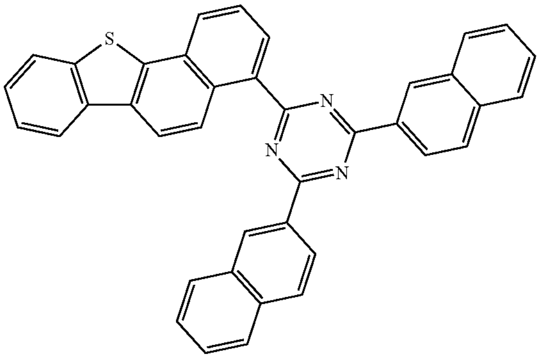
C-14
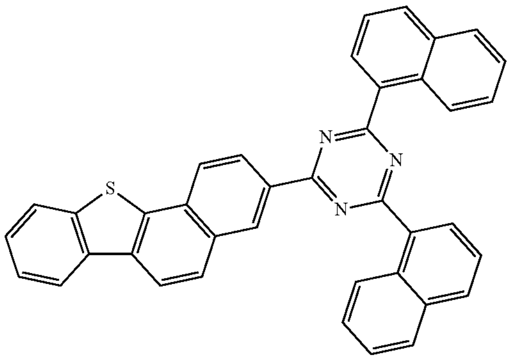
C-15
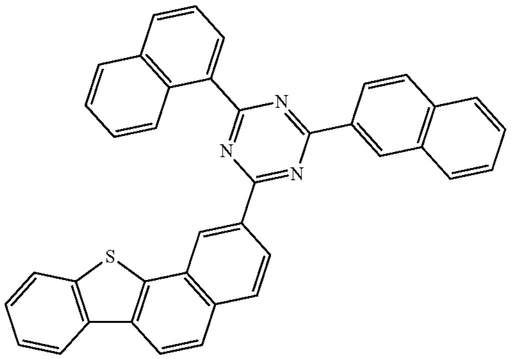
C-16
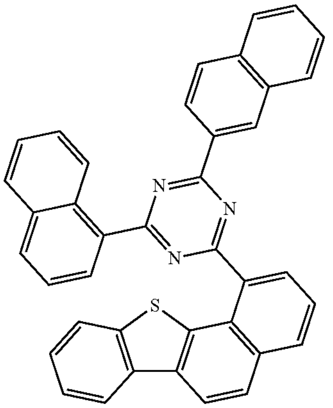

-continued
C-17
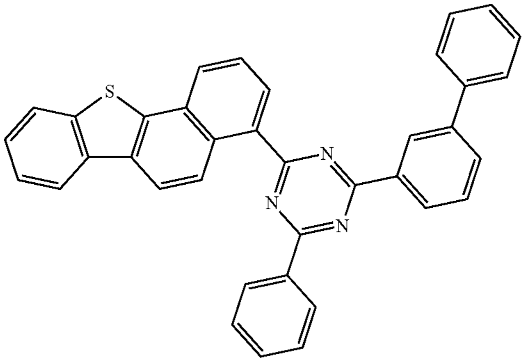
C-18
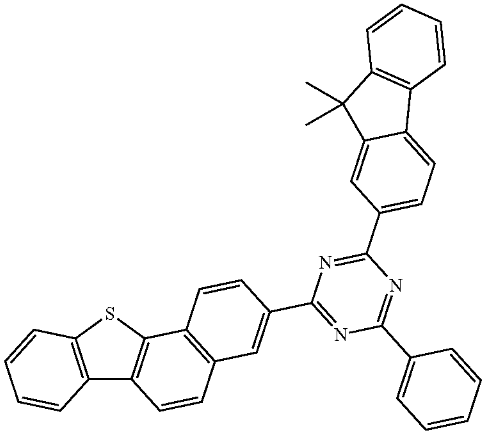
C-19
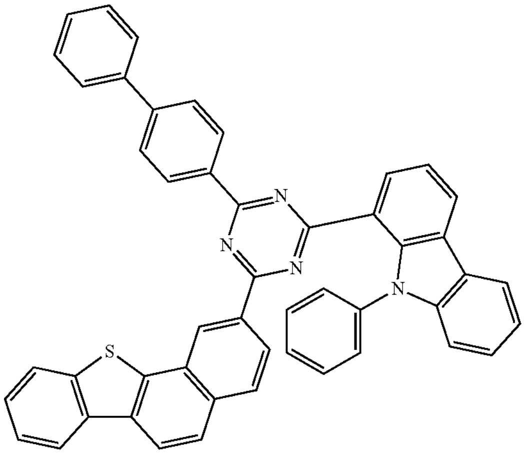
-continued
C-20
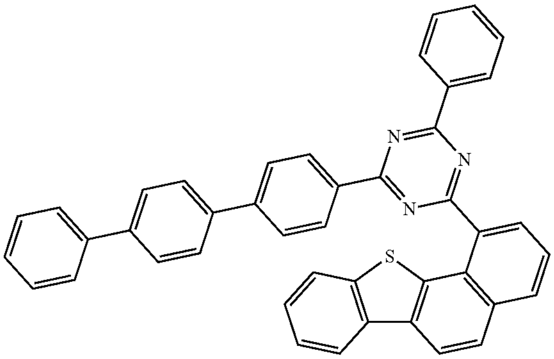
C-21
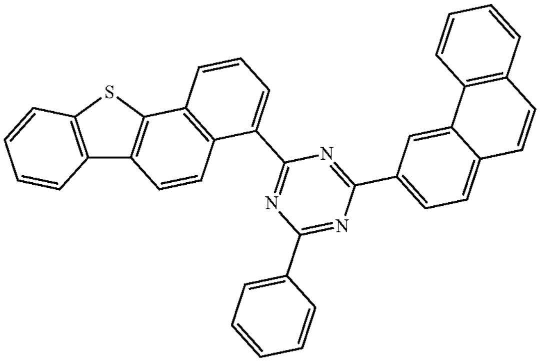
C-22
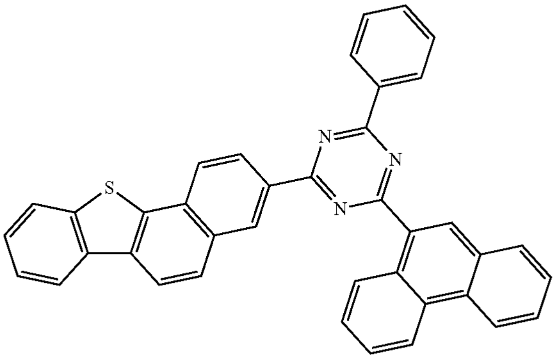
C-23
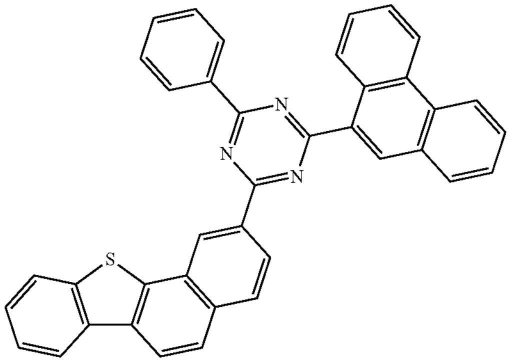

-continued
C-24
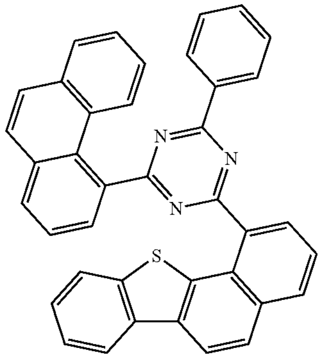
C-25
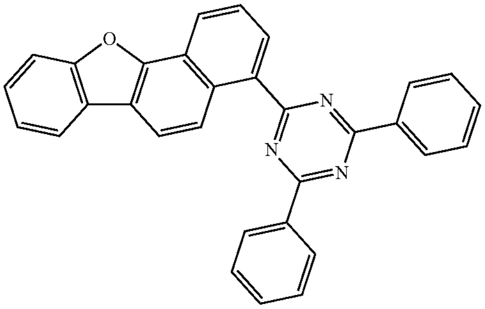
C-26
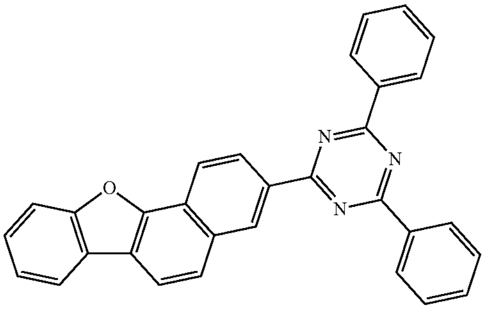
C-27
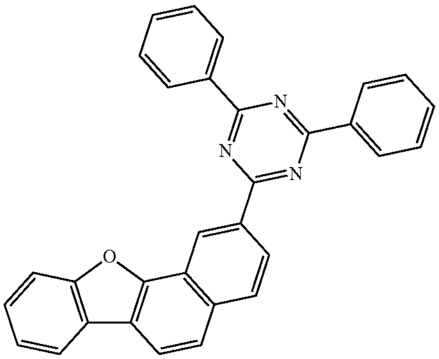
-continued
C-28
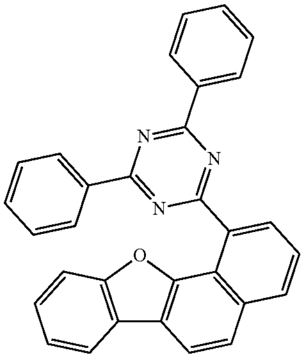
C-29
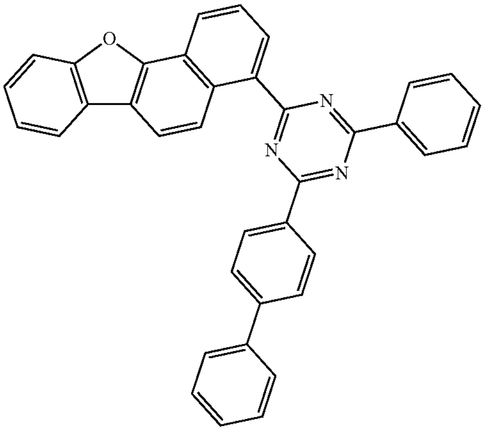
C-30
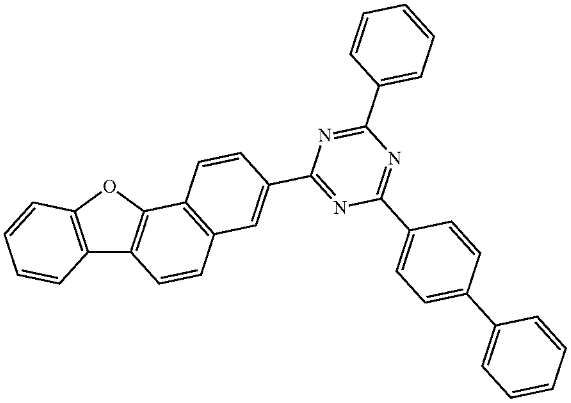
C-31
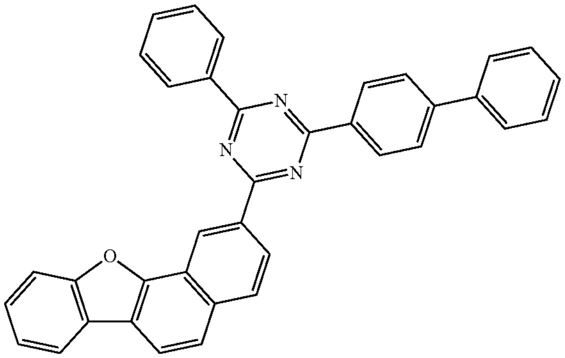

-continued
C-32
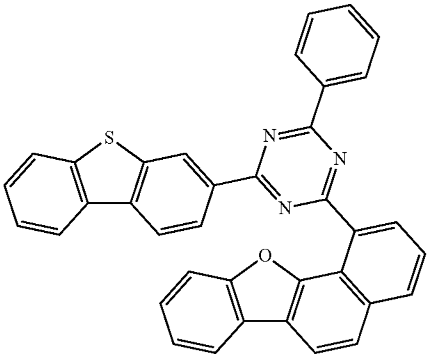
C-33
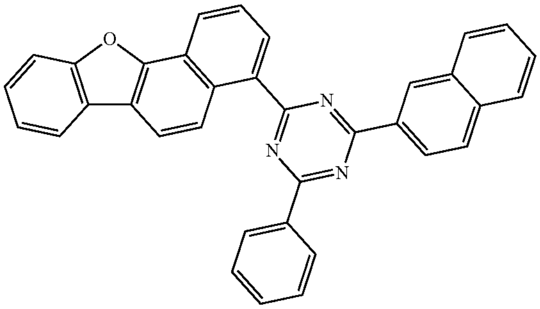
C-34
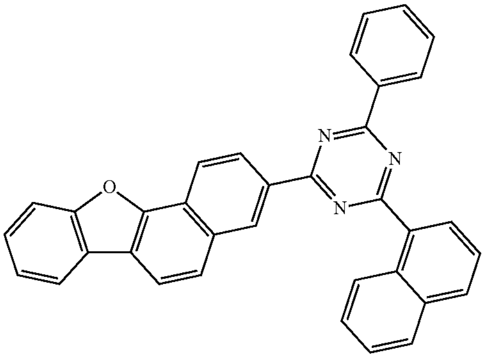
C-35
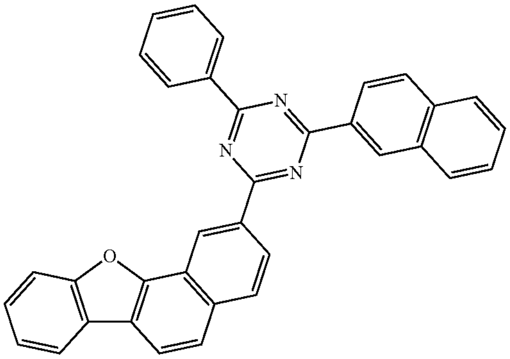
-continued
C-36
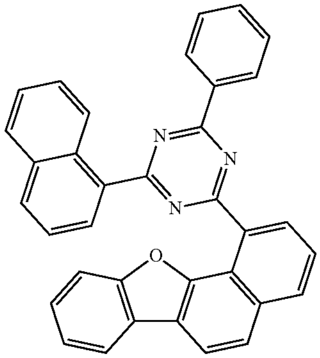
C-37
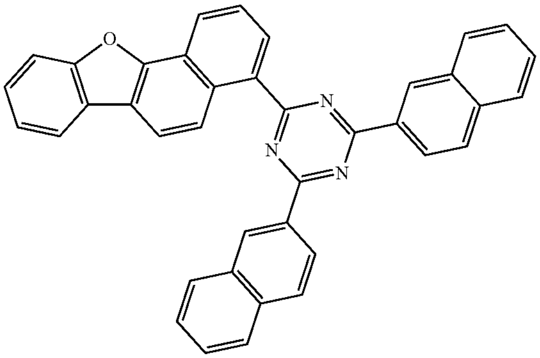
C-38
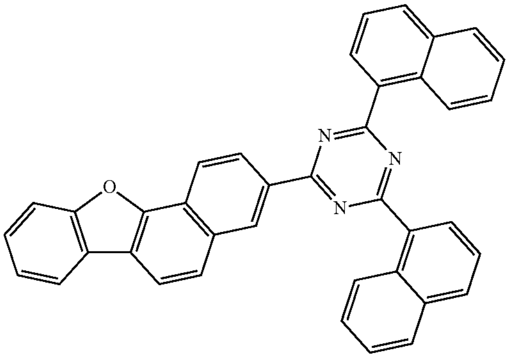
C-39
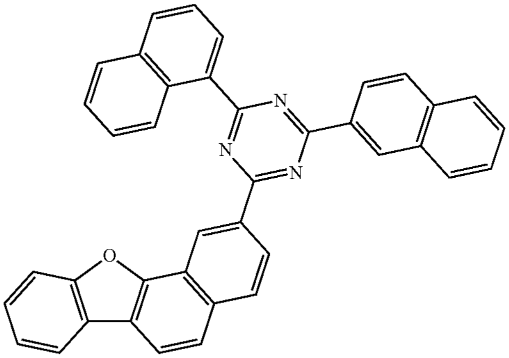

-continued
C-40
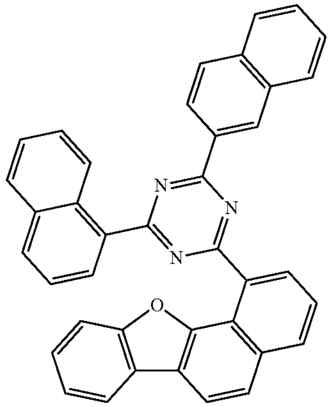
C-41
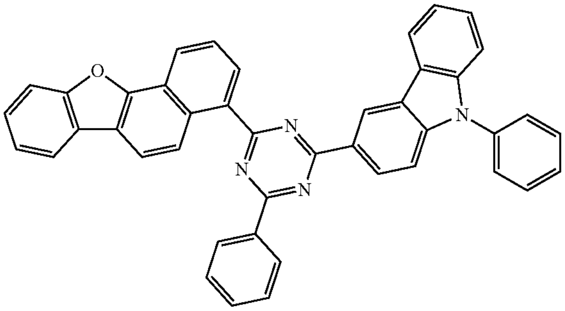
C-42
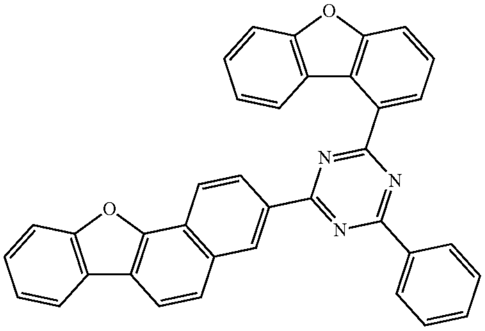
C-43
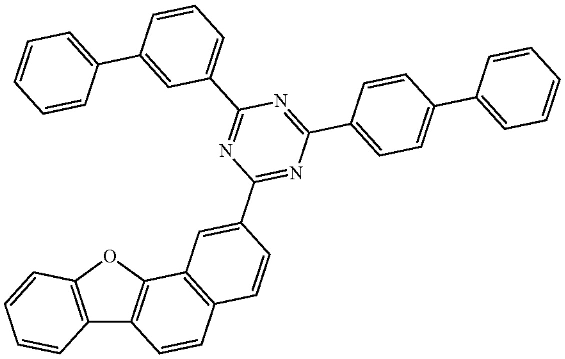
-continued
C-44
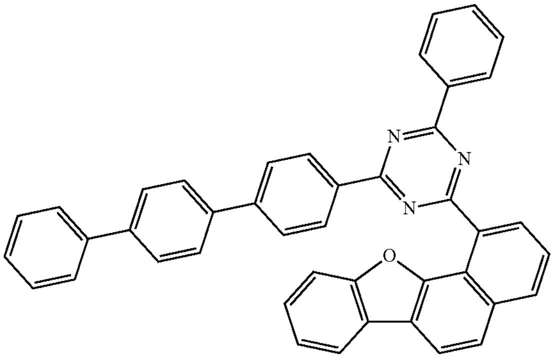
C-45
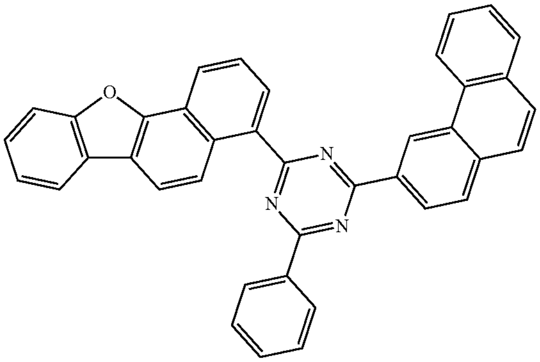
C-46
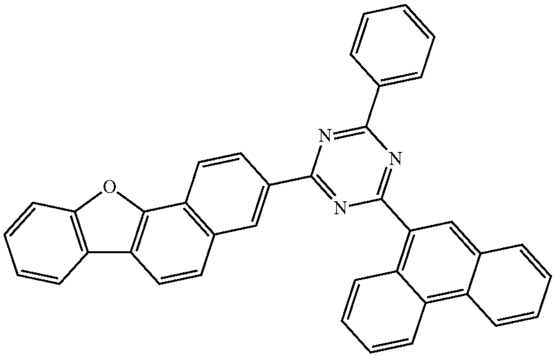
C-47
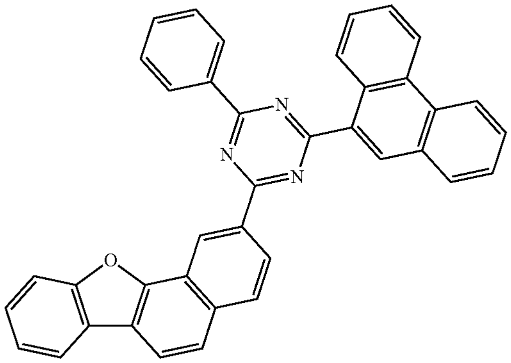

-continued
C-48
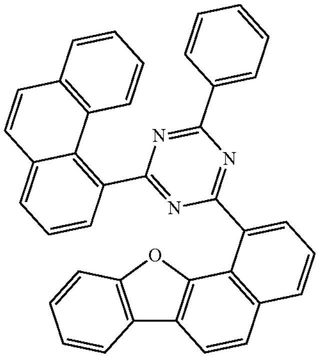
C-49
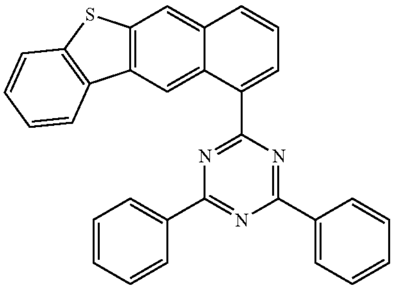
C-50
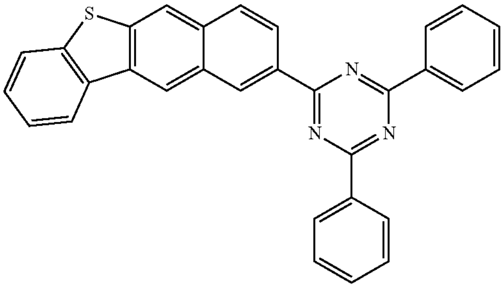
C-51
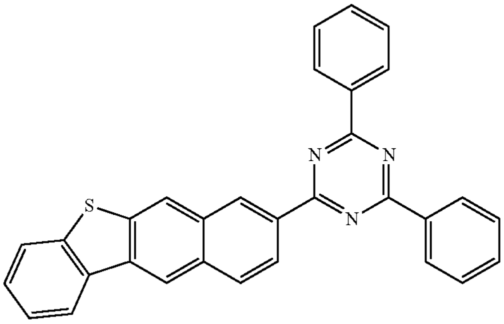
C-52
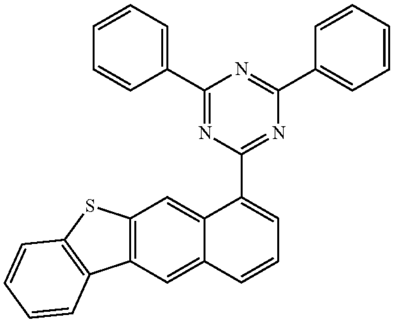
-continued
C-53
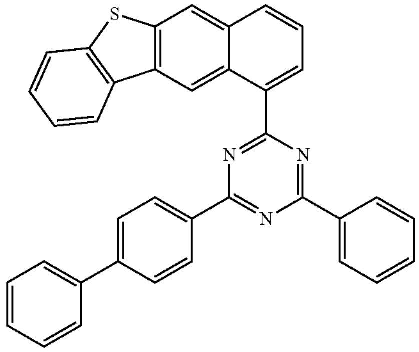
C-54
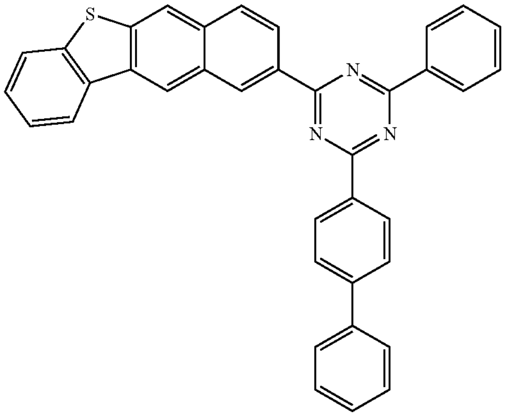
C-55
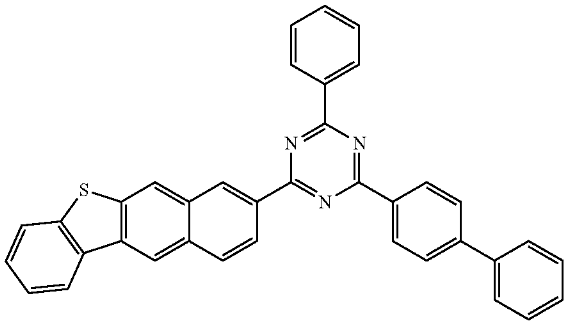
C-56
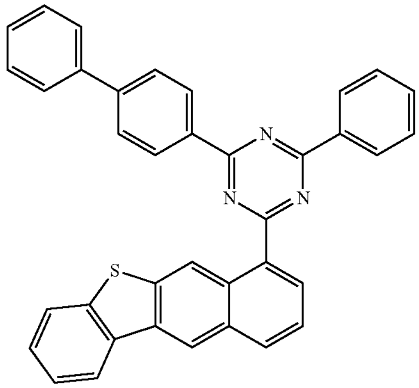

-continued
C-57
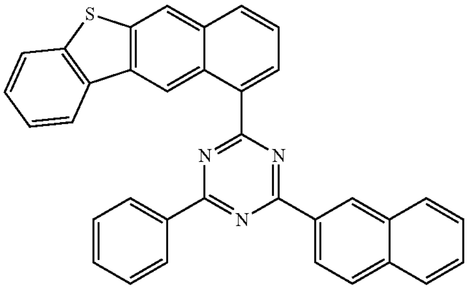
C-58
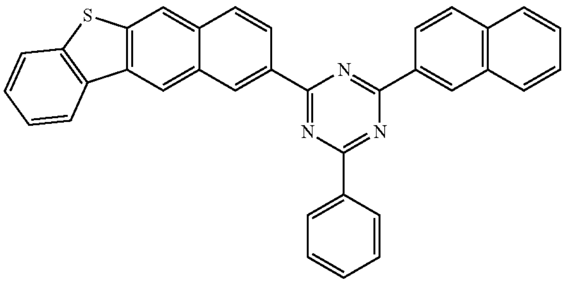
C-59
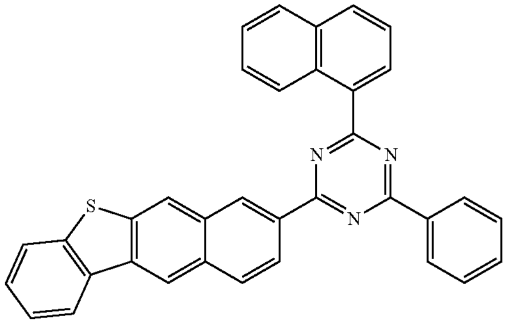
C-60
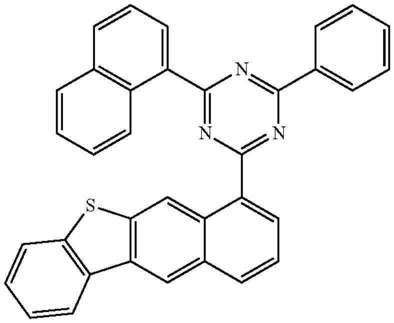
C-61
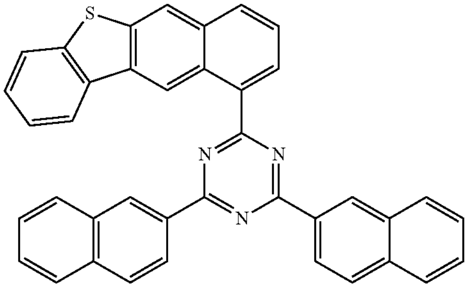
-continued
C-62
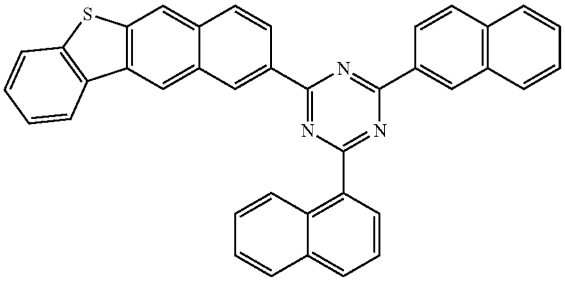
C-63
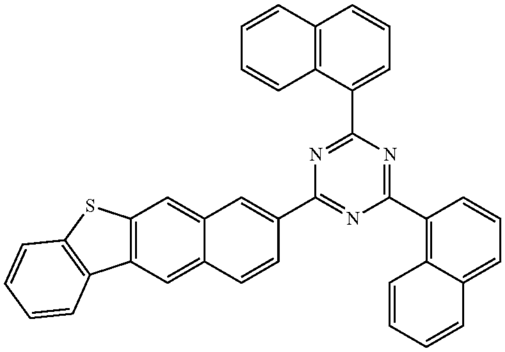
C-64
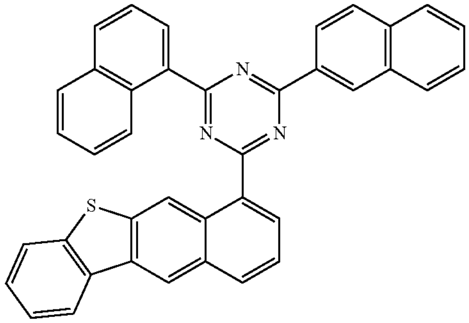
C-65
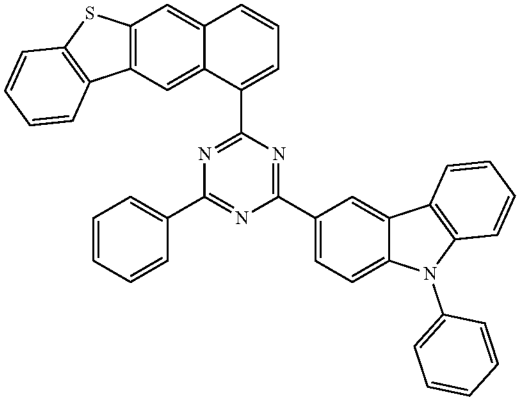

-continued
C-66
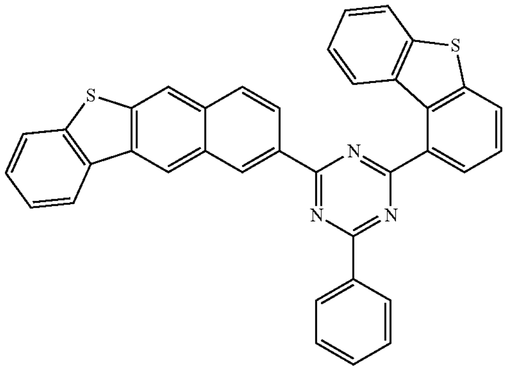
C-67
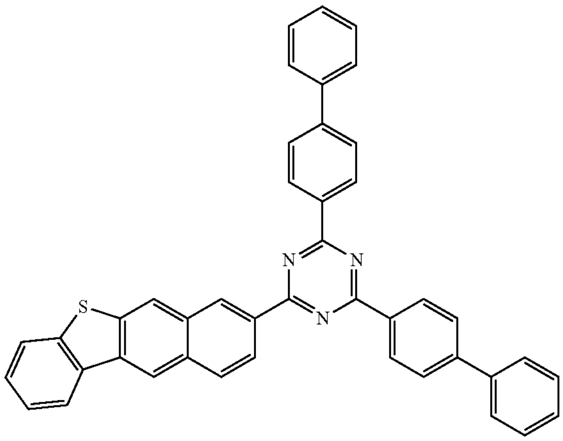
C-68
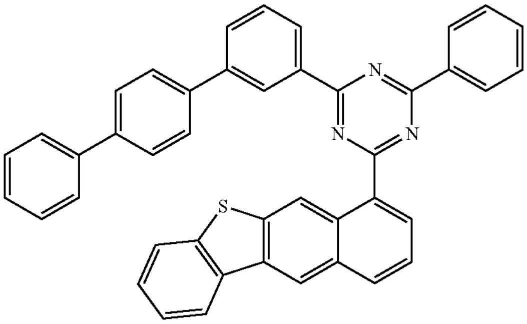
C-69
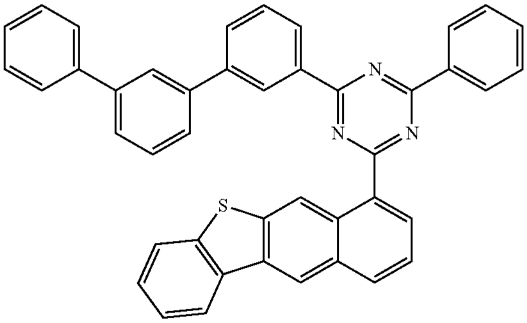
-continued
C-70
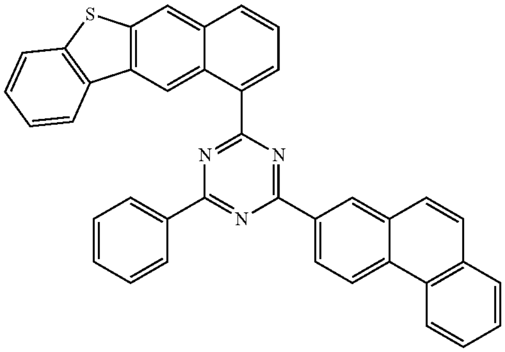
C-71
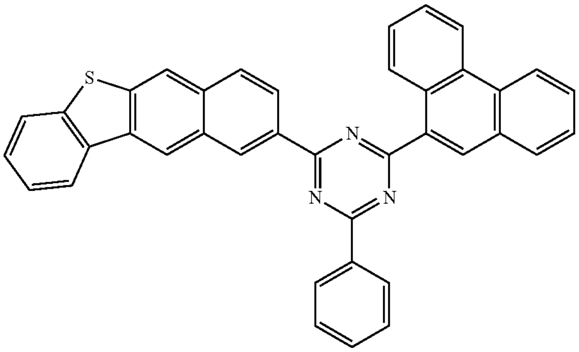
C-72
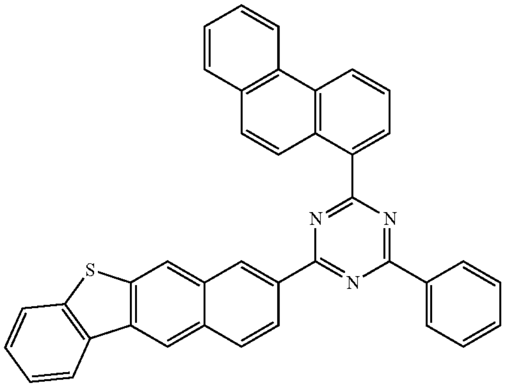
C-73
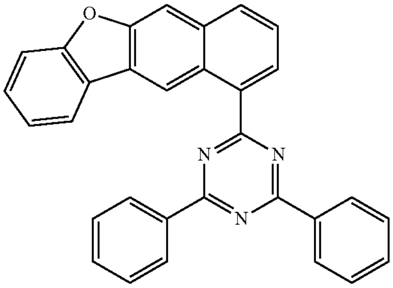

-continued
C-74
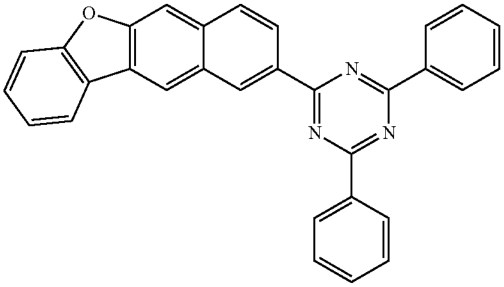
C-75
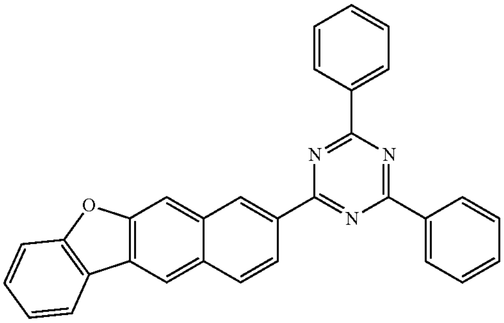
C-76
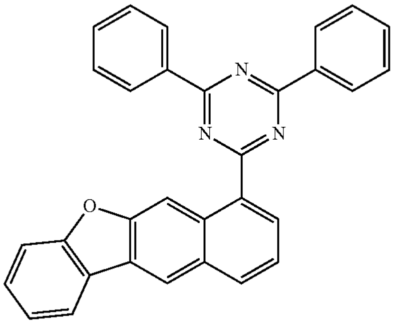
C-77
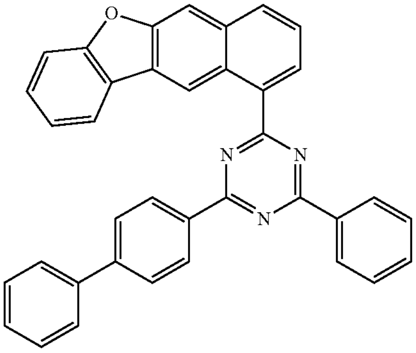
-continued
C-78
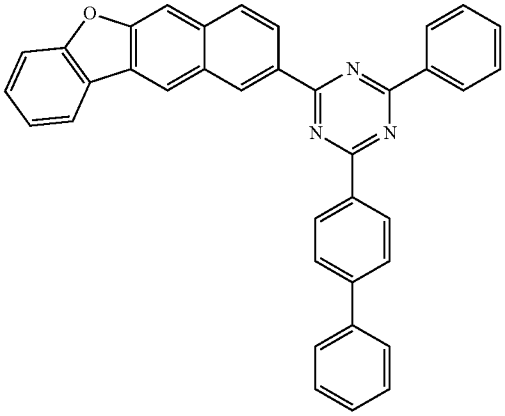
C-79
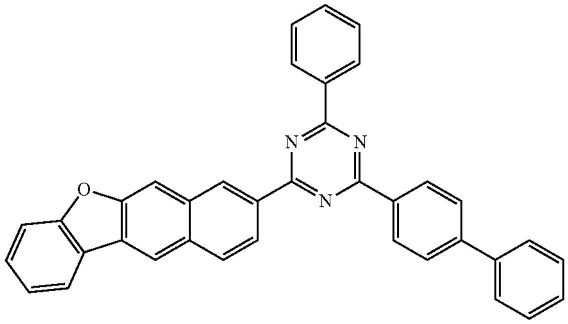
C-80
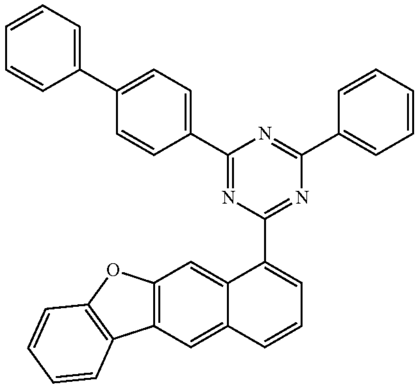
C-81
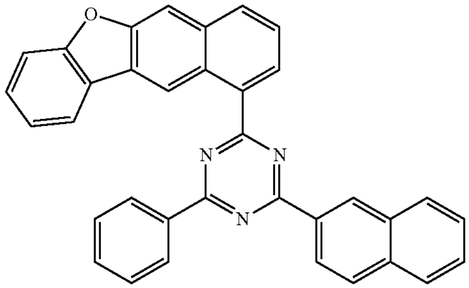

-continued
C-82
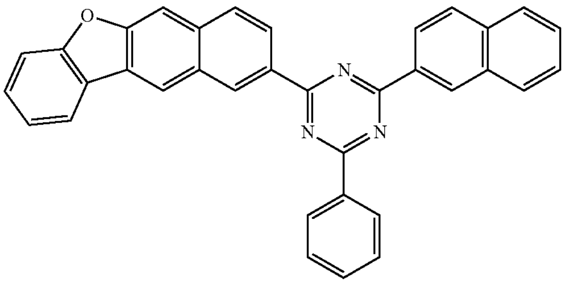
C-83
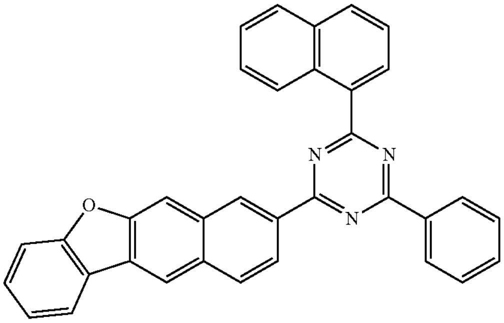
C-84
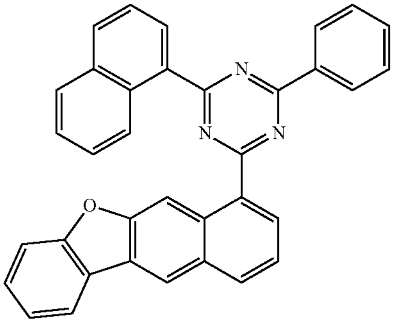
C-85
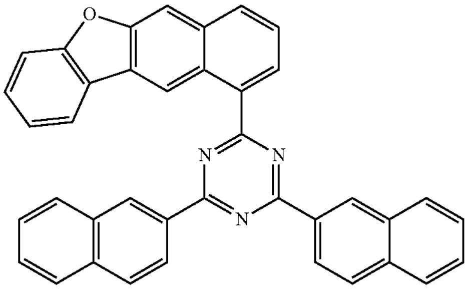
C-86
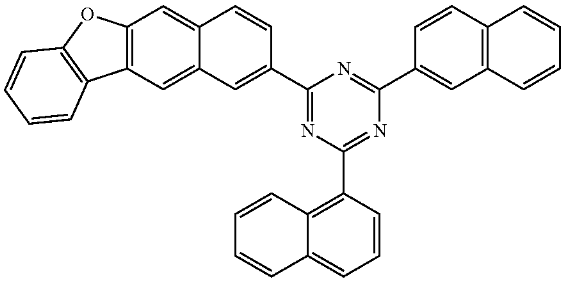
-continued
C-87
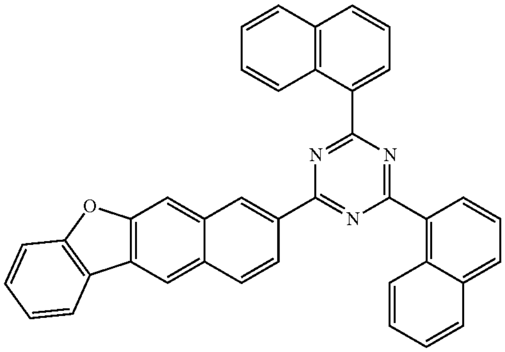
C-88
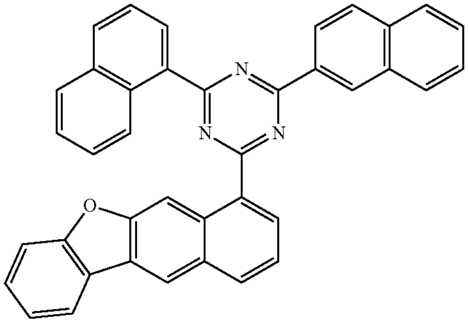
C-89
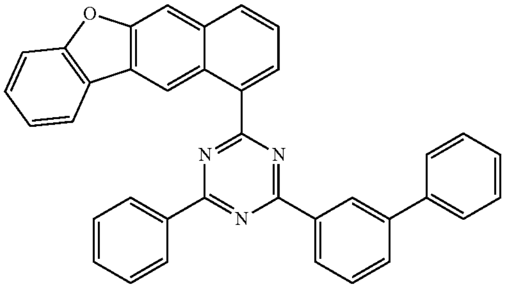
C-90
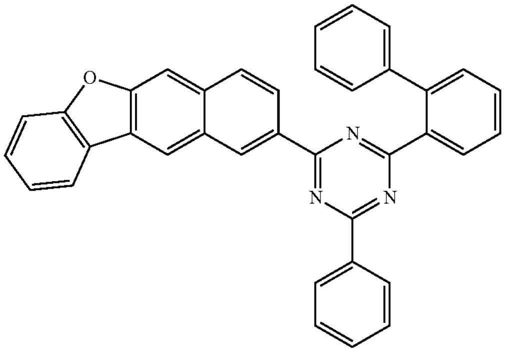

-continued
C-91
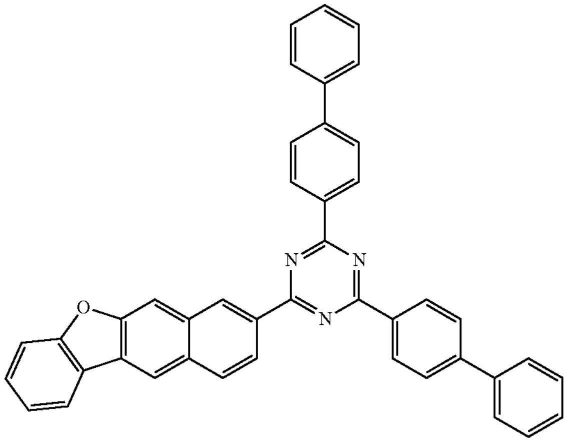
C-92
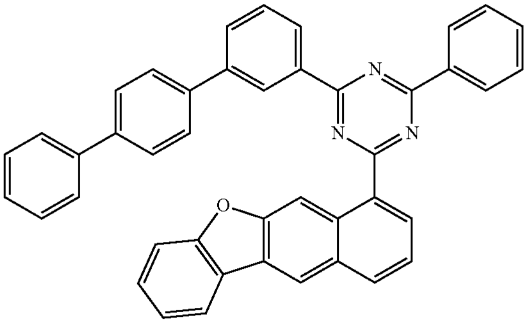
C-93
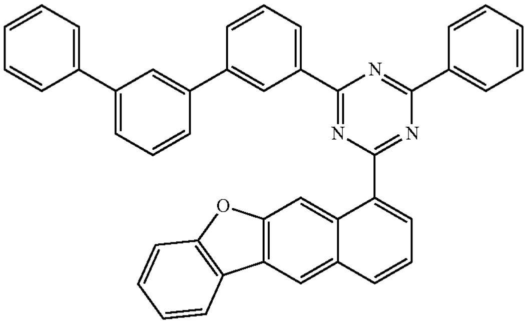
C-94
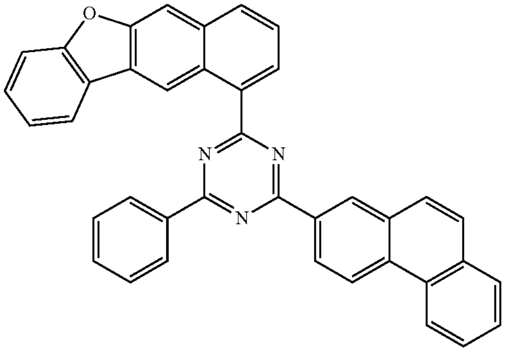
-continued
C-95
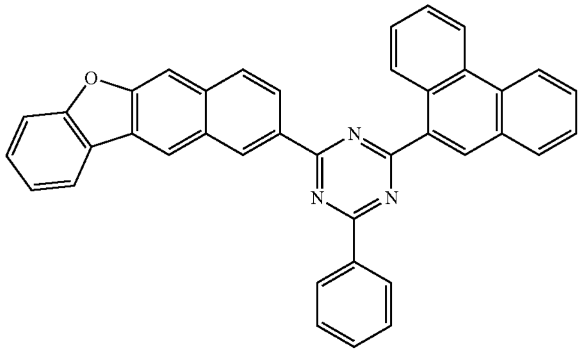
C-96
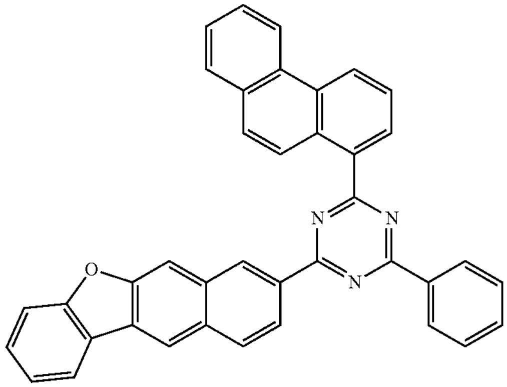
C-97
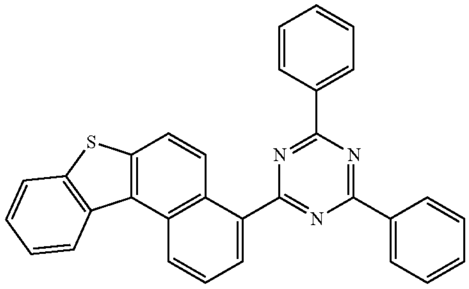
C-98
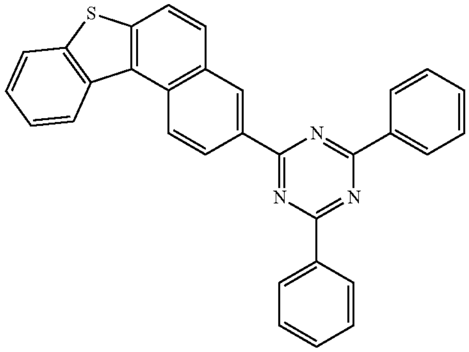

-continued
C-99
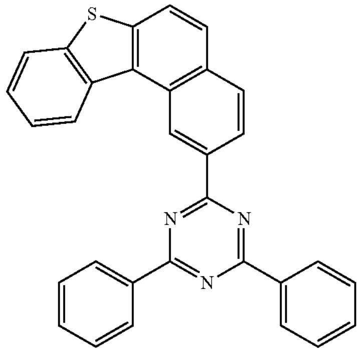
C-100
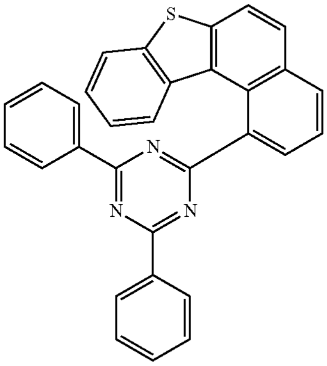
C-101
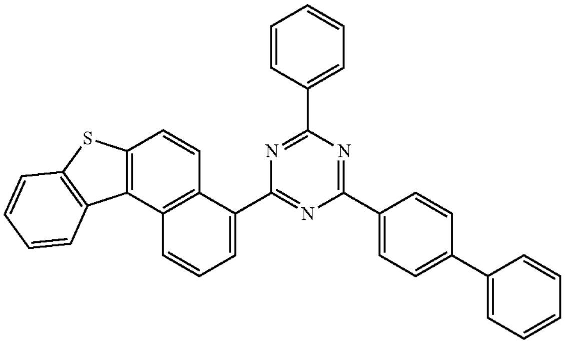
C-102
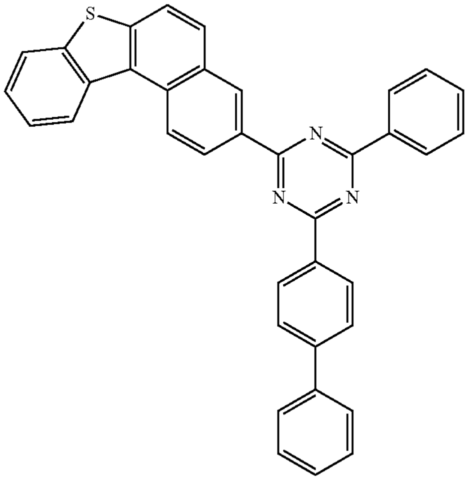
-continued
C-103
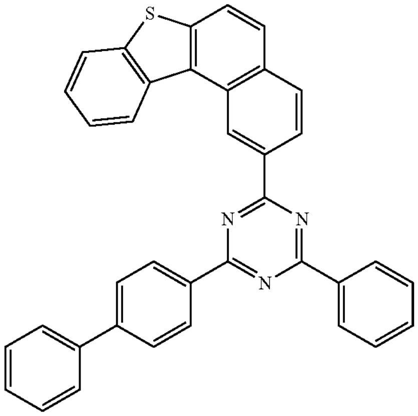
C-104
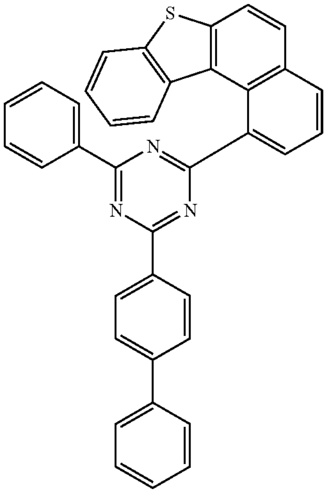
C-105
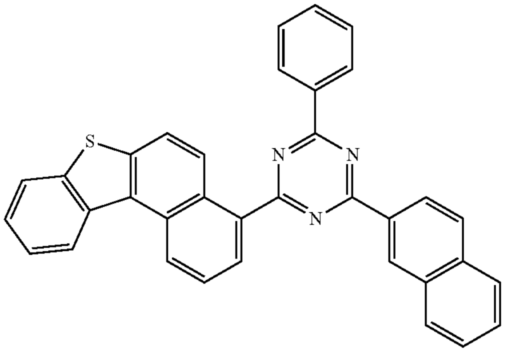

-continued
C-106
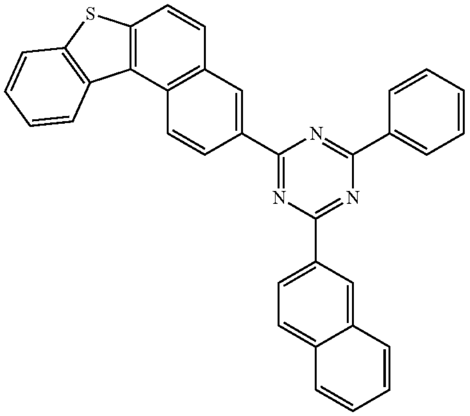
C-107
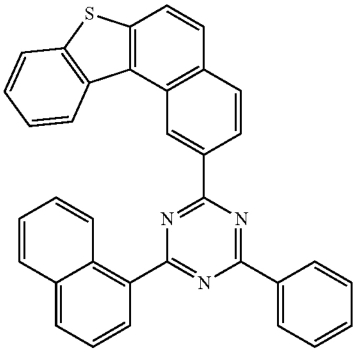
C-108
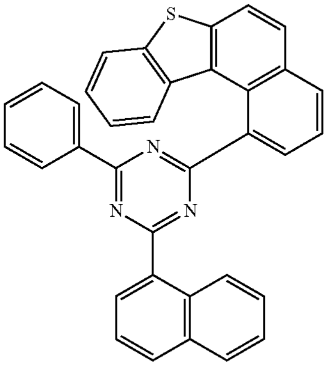
C-109
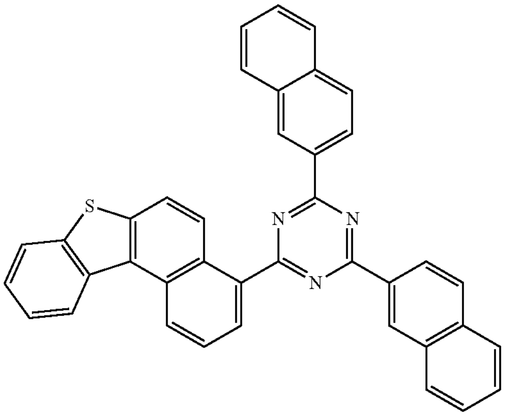
-continued
C-110
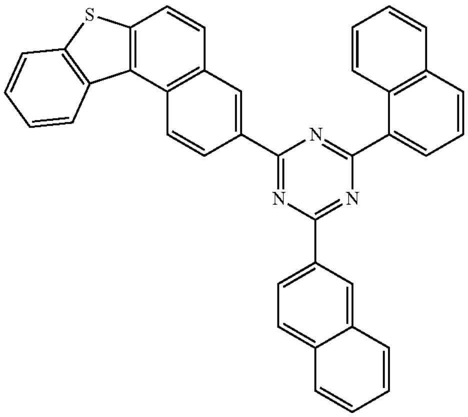
C-111
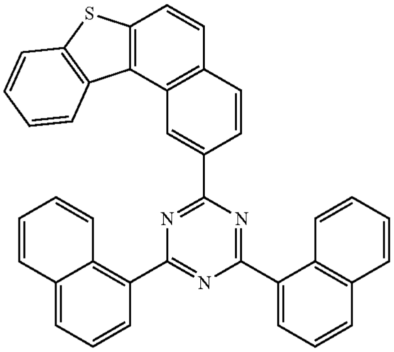
C-112
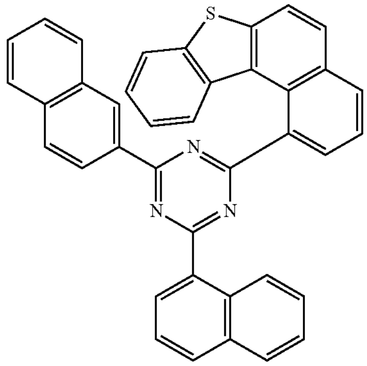
C-113
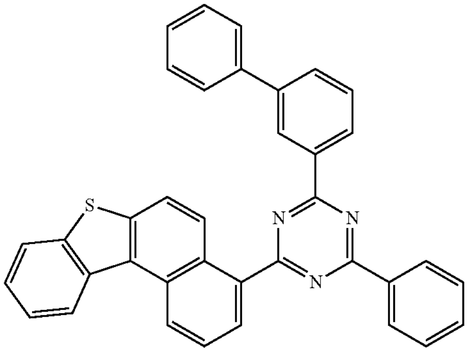

-continued
C-114
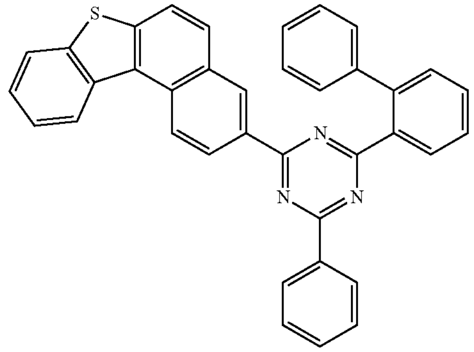
C-115
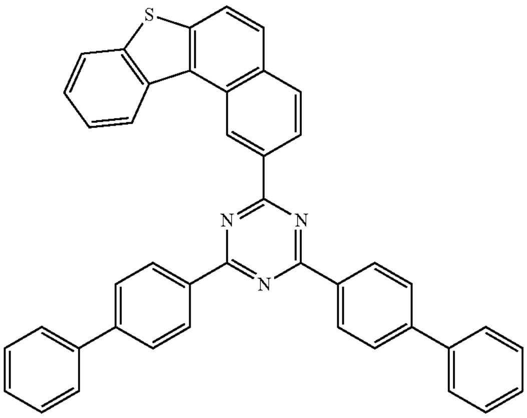
C-116
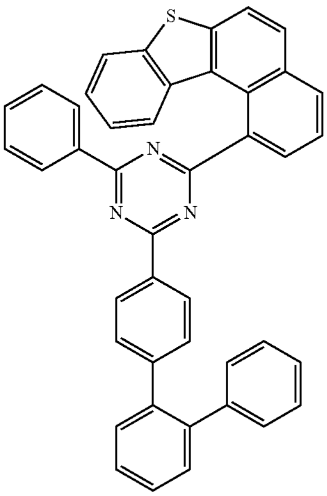
-continued
C-117
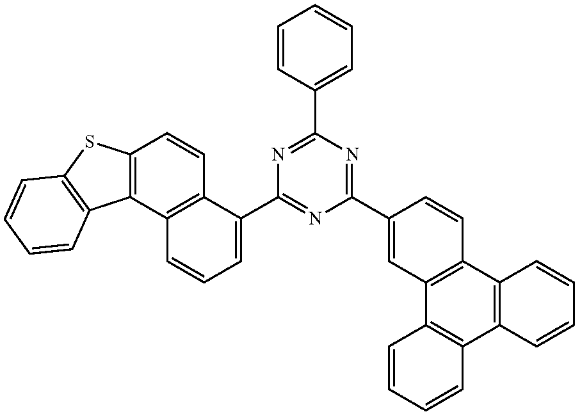
C-118
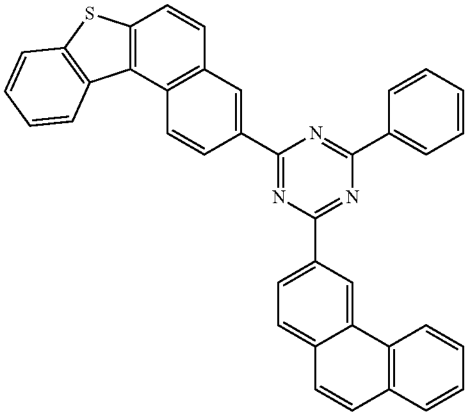
C-119
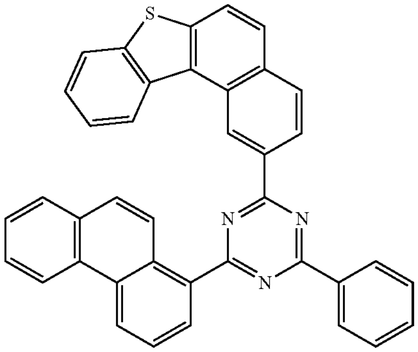
C-120
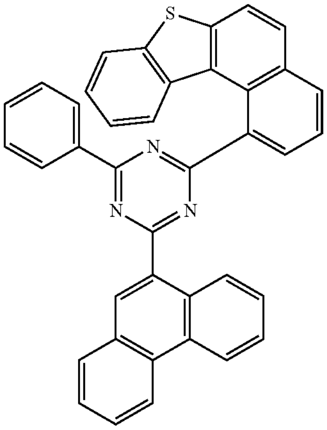

-continued
C-121
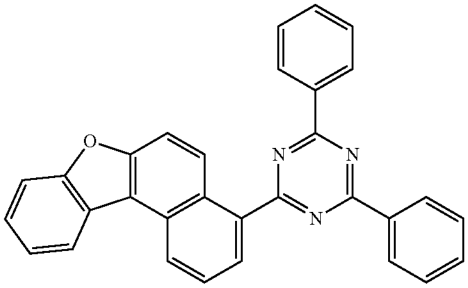
C-122
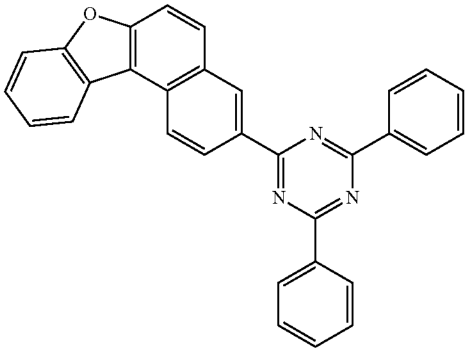
C-123
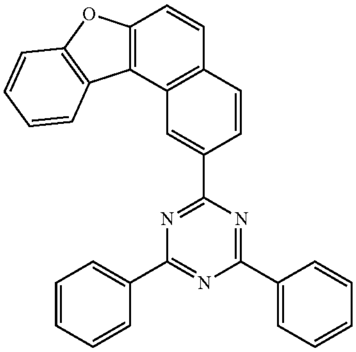
C-124
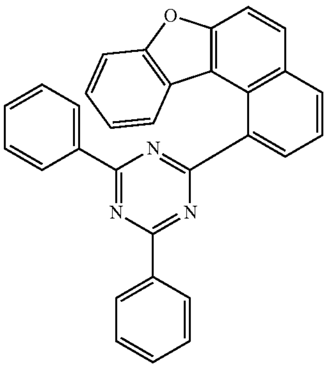
-continued
C-125
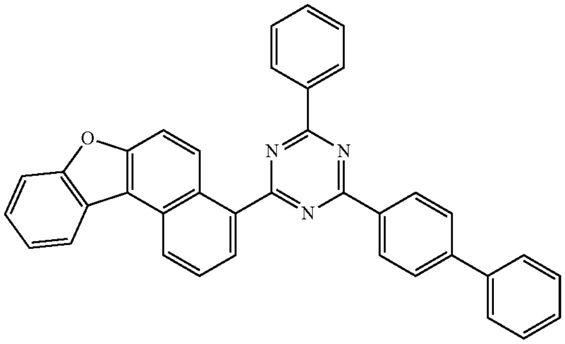
C-126
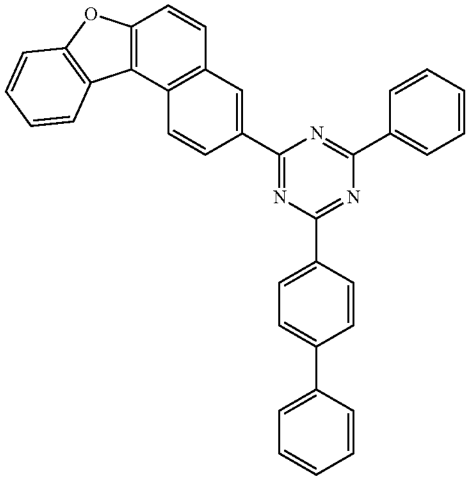
C-127
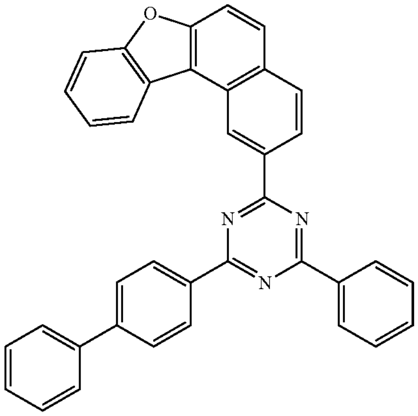

-continued
C-128
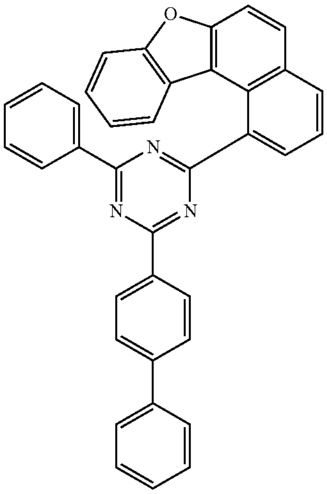
C-129
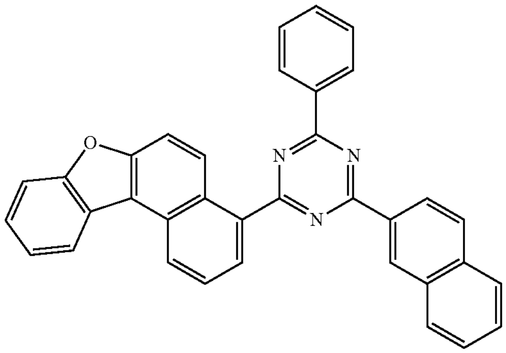
C-130
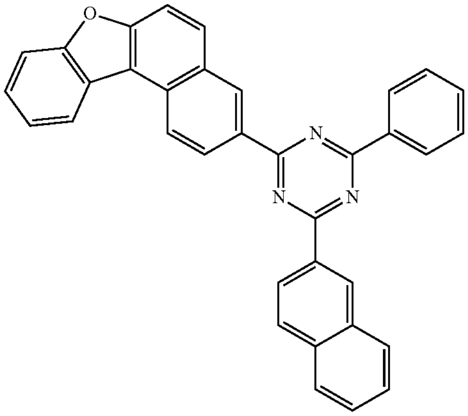
C-131
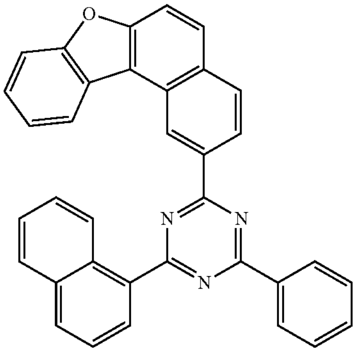
-continued
C-132
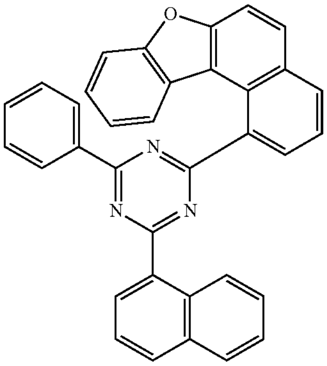
C-133
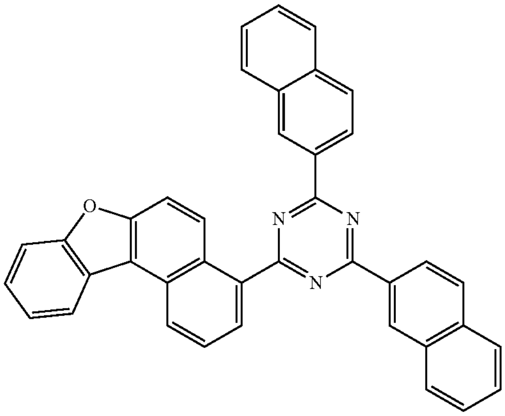
C-134
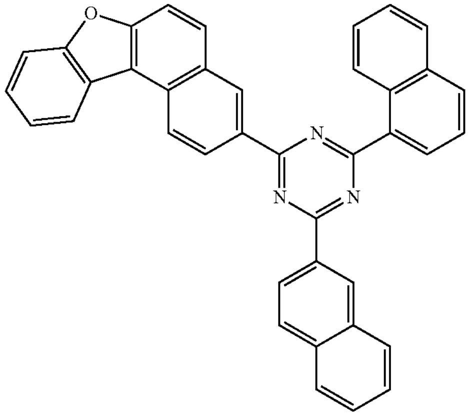
C-135
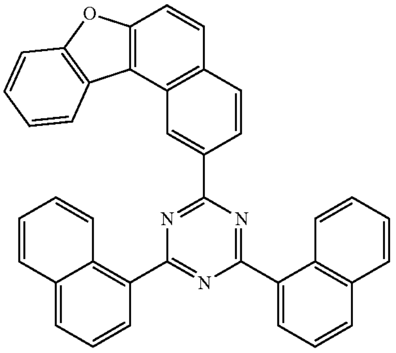

-continued
C-136
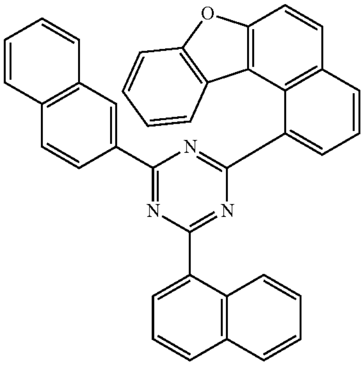
C-137
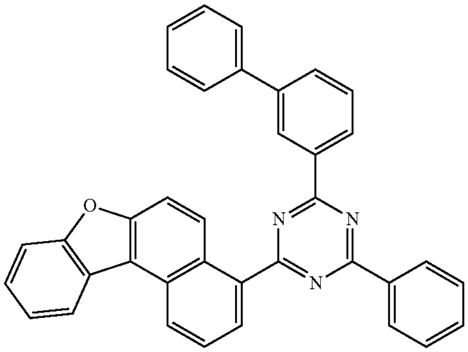
C-138
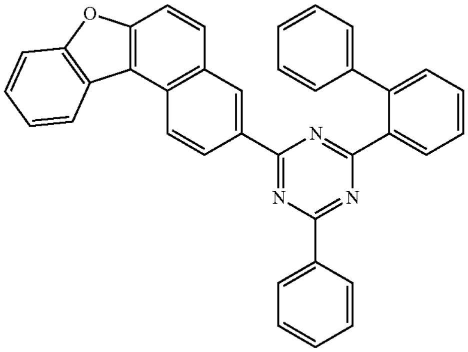
C-139
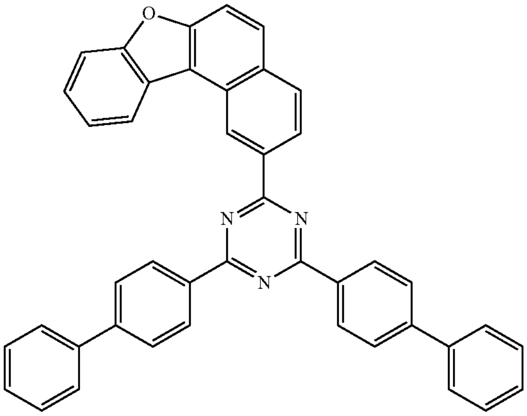
-continued
C-140
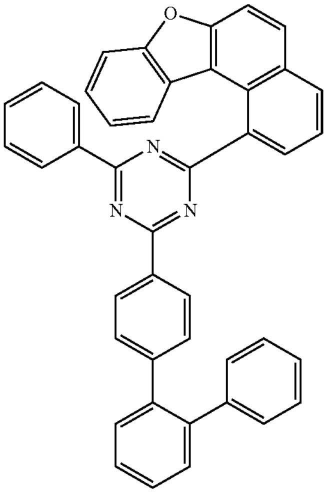
C-141
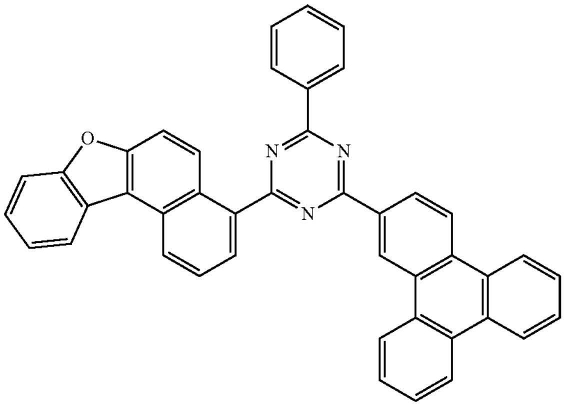
C-142
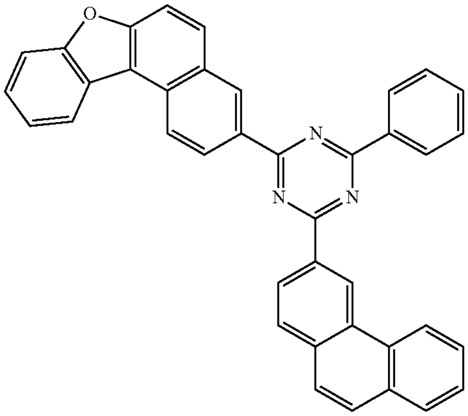

-continued
C-143
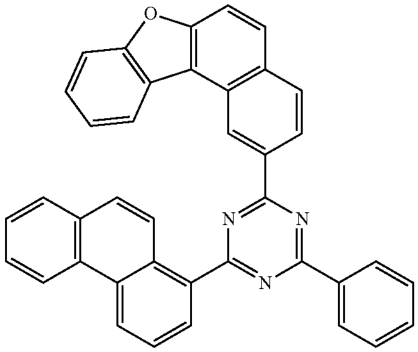
C-144
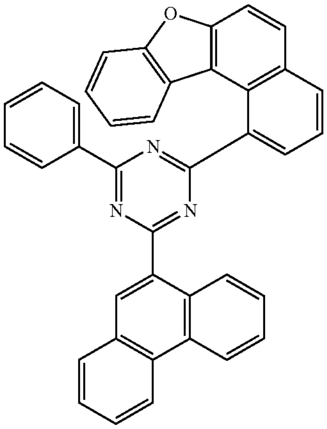
C-145
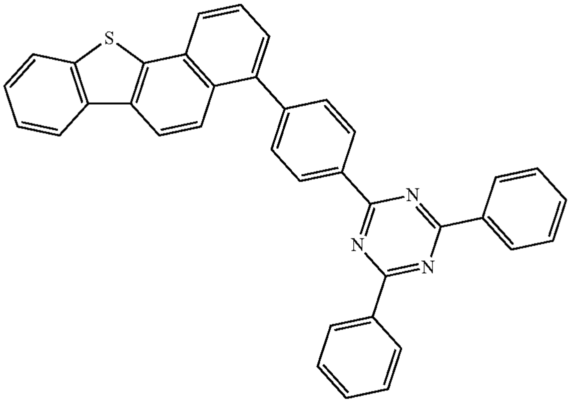
C-146
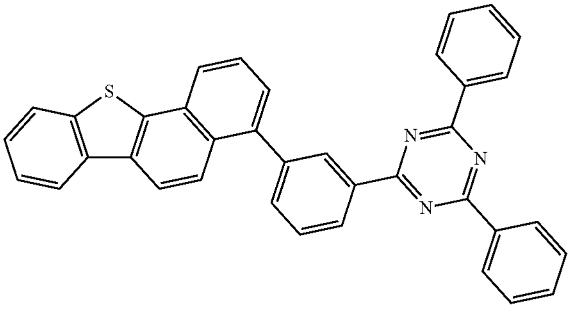
-continued
C-147
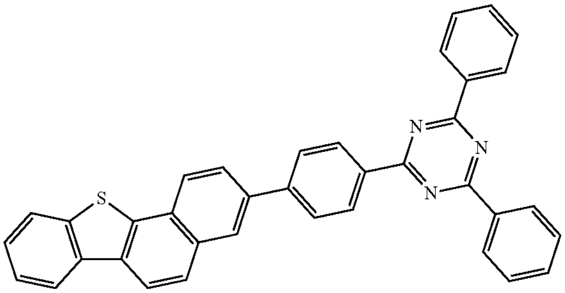
C-148
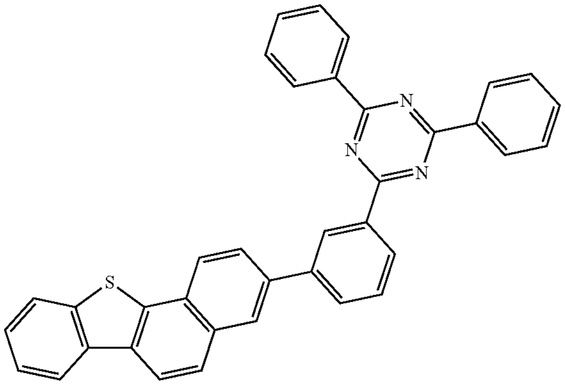
C-149
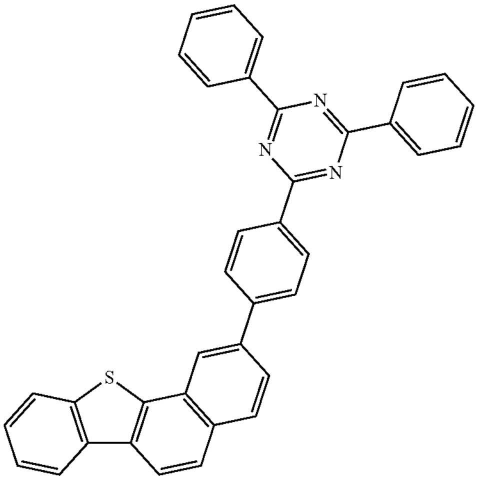

-continued
C-150
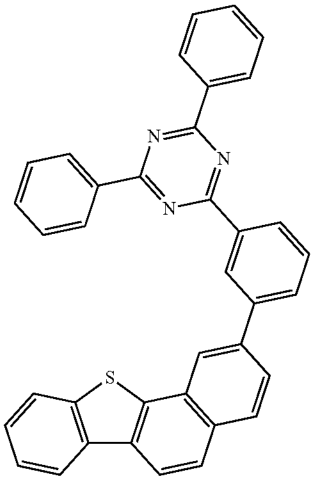
C-151
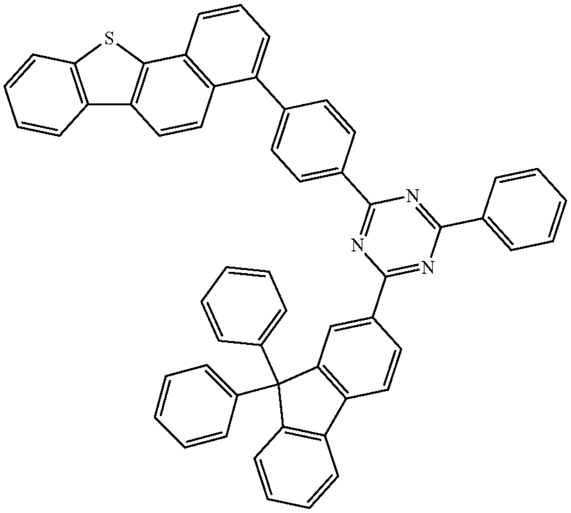
C-152
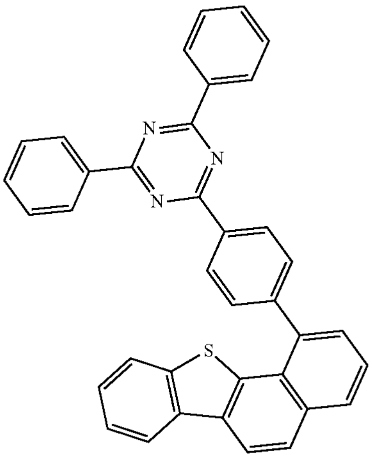
-continued
C-153
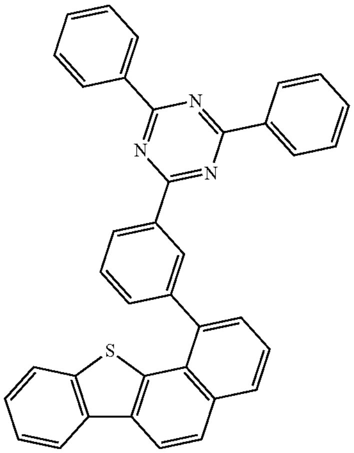
C-154
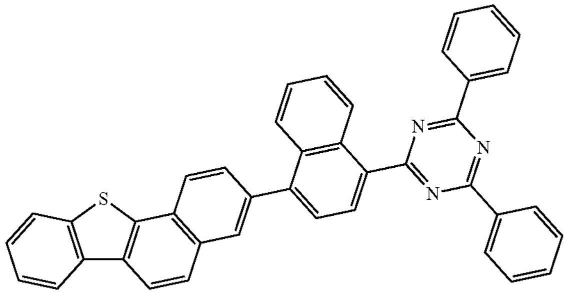
C-155
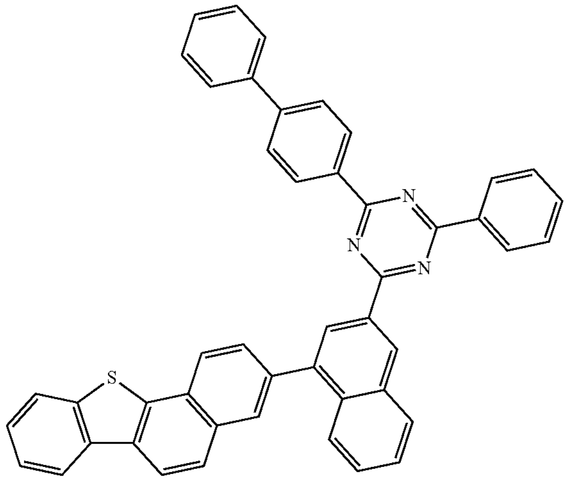

-continued
C-156
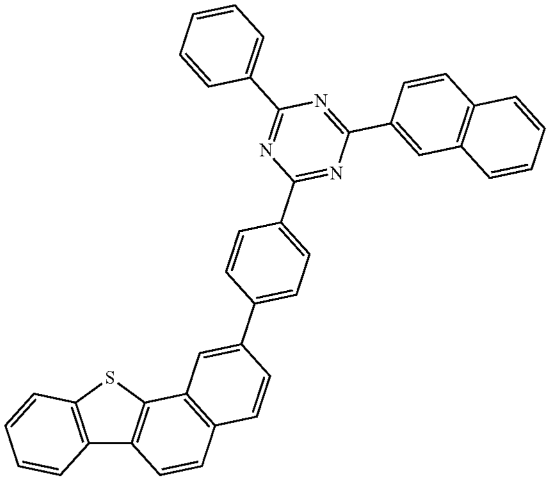
C-157
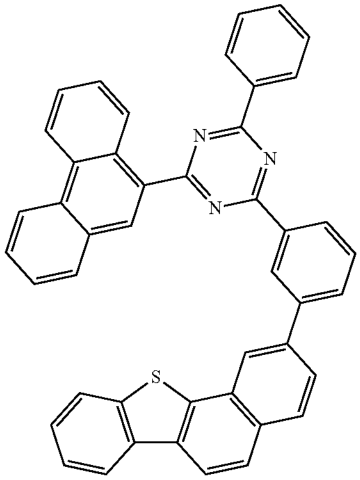
C-158
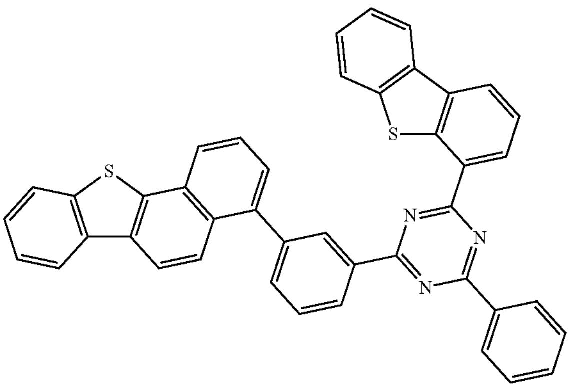
-continued
C-159
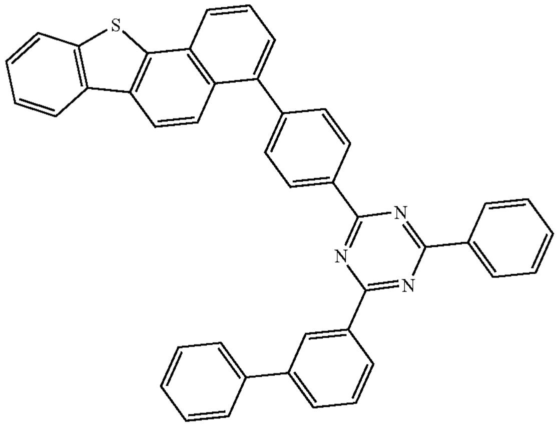
C-160
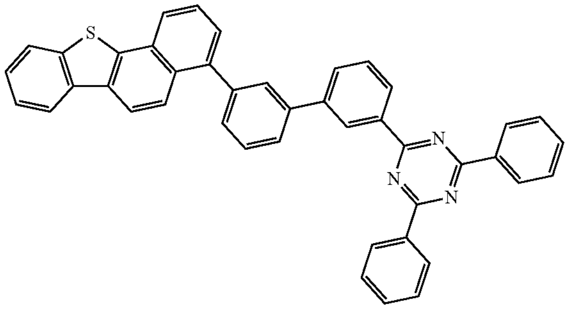
C-161
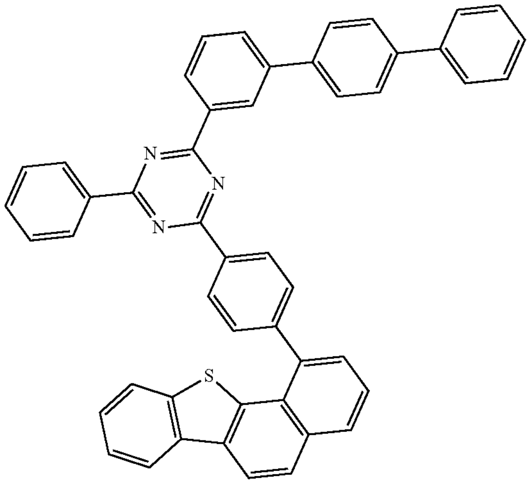

-continued
C-162
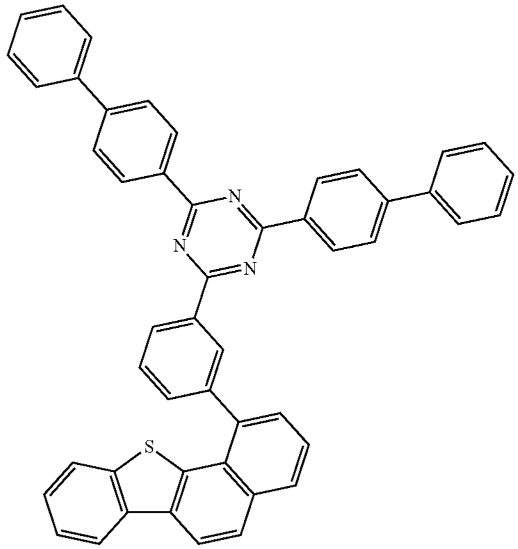
C-163
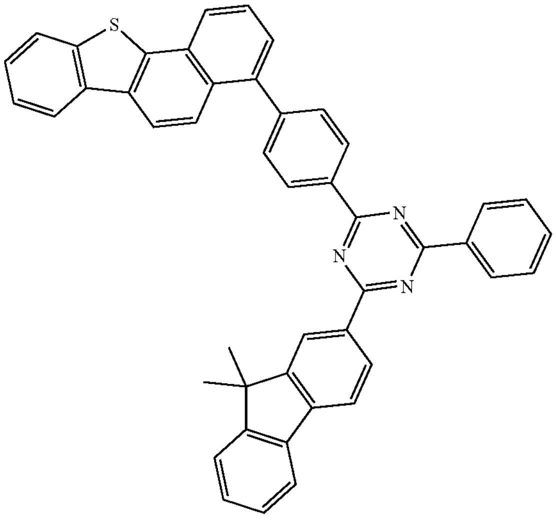
C-164
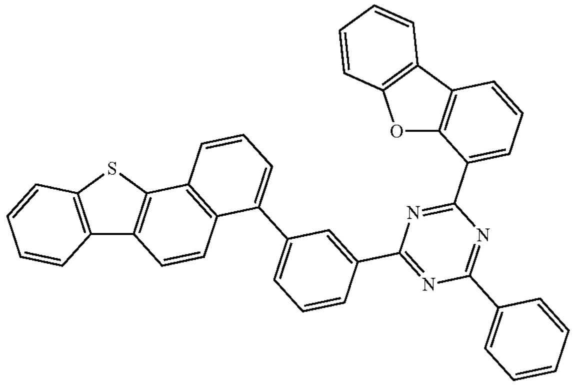
-continued
C-165
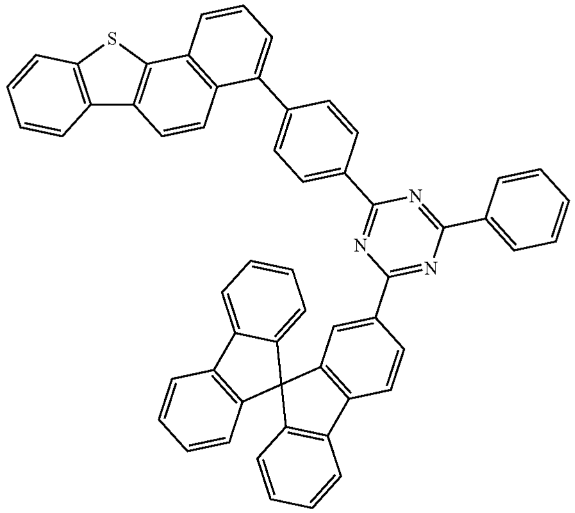
C-166
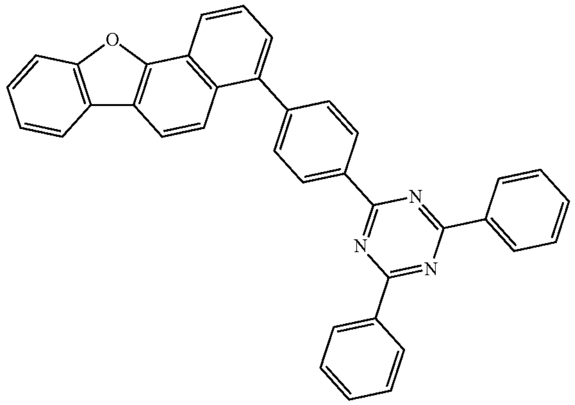
C-167
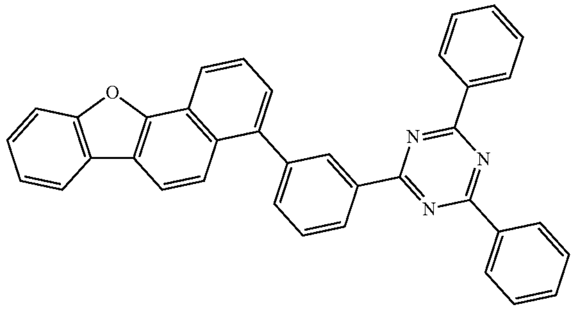
C-168
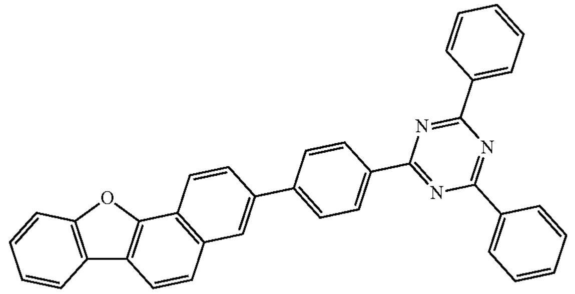

-continued
C-169
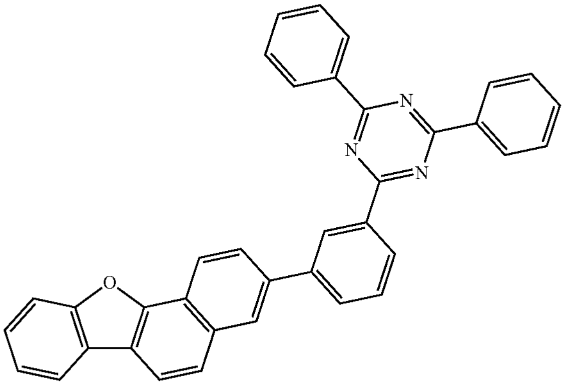
C-170
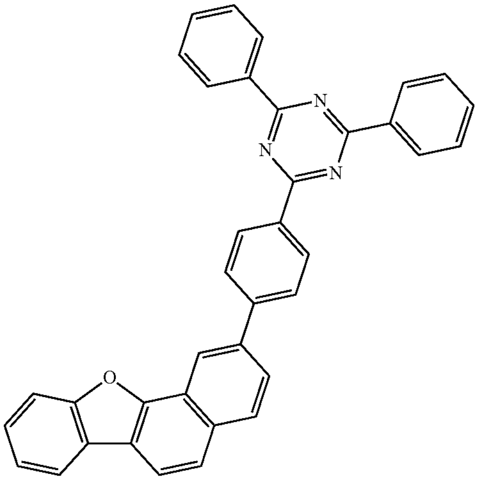
C-171
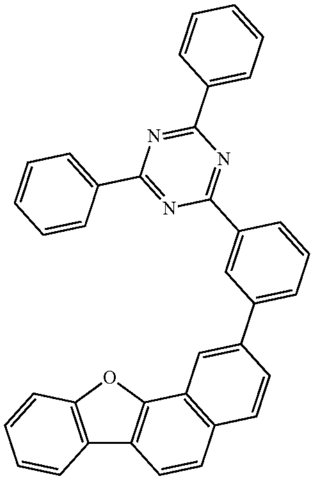
-continued
C-172
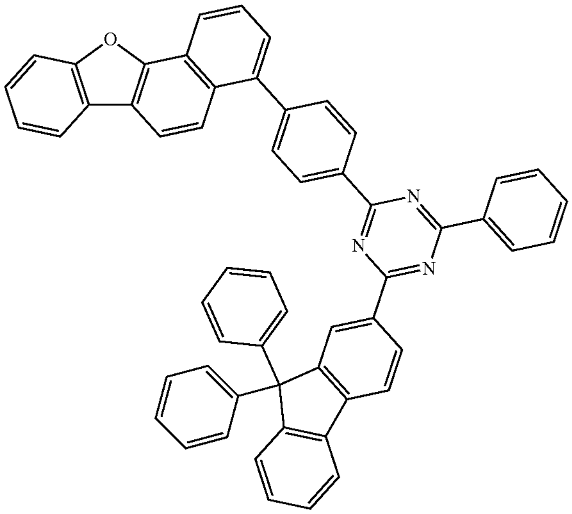
C-173
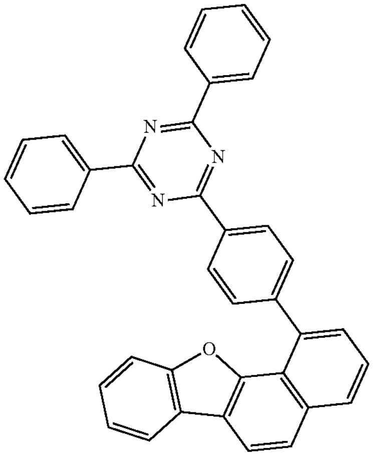
C-174
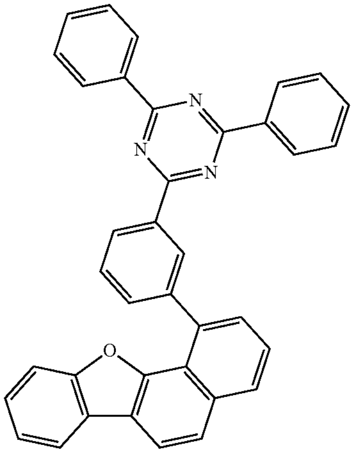

-continued
C-175
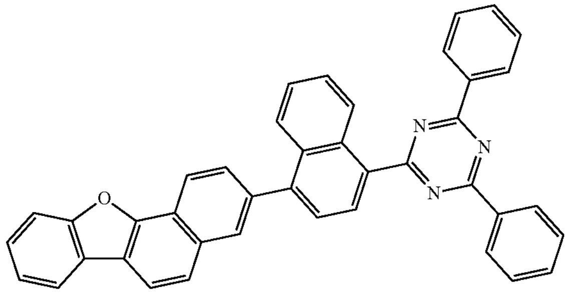
C-176
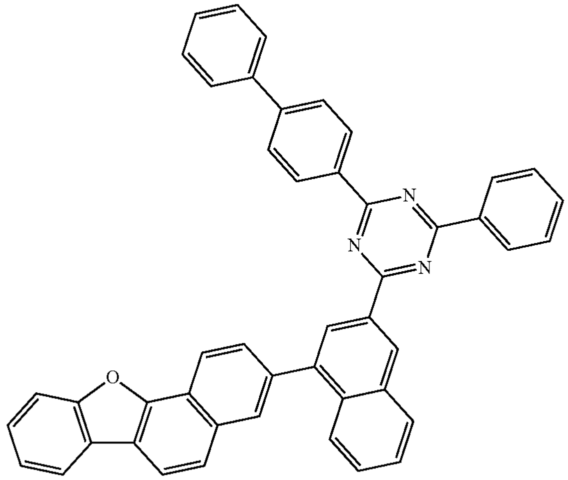
C-177
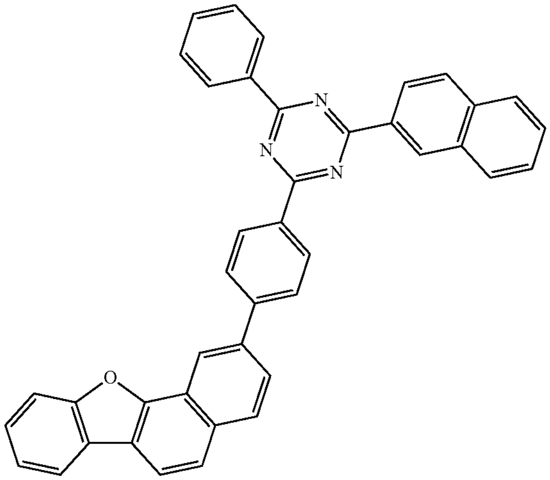
-continued
C-178
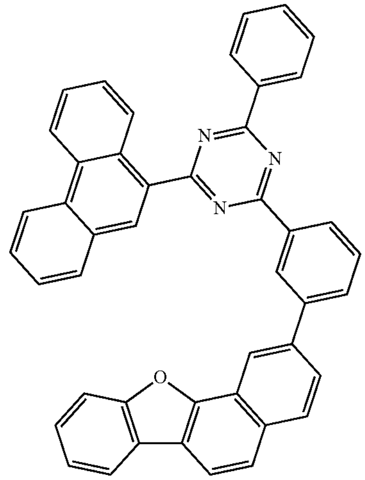
C-179
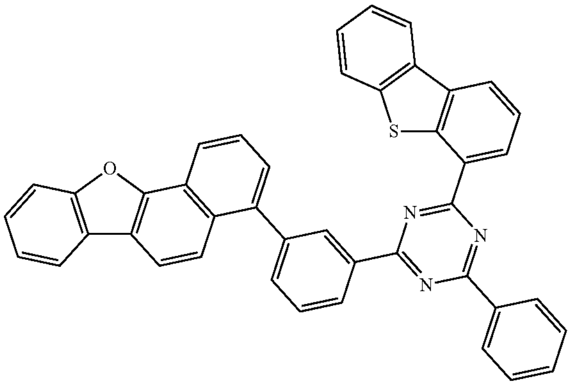
C-180
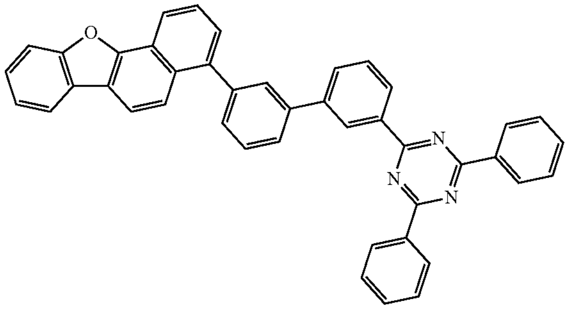
C-181
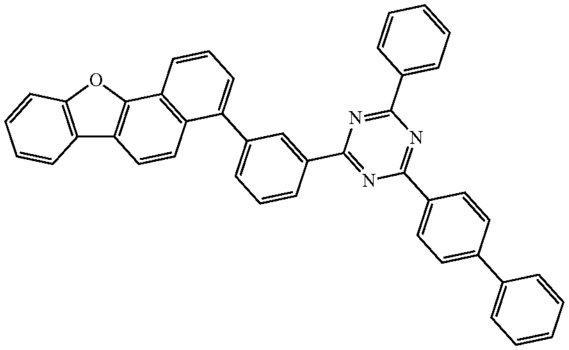

-continued
C-182
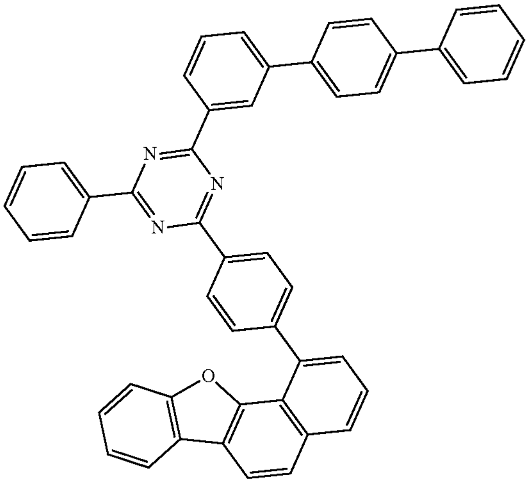
C-183
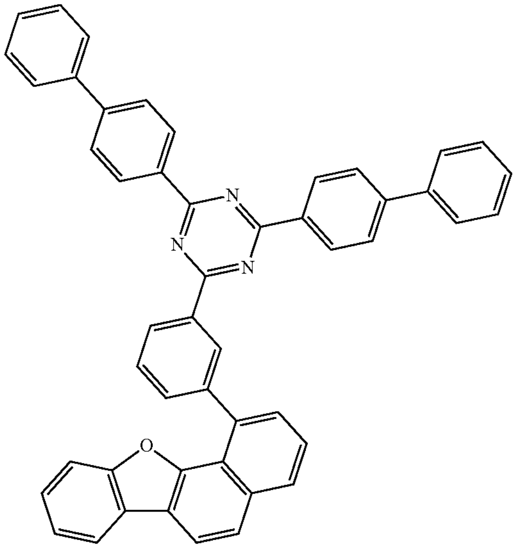
C-184
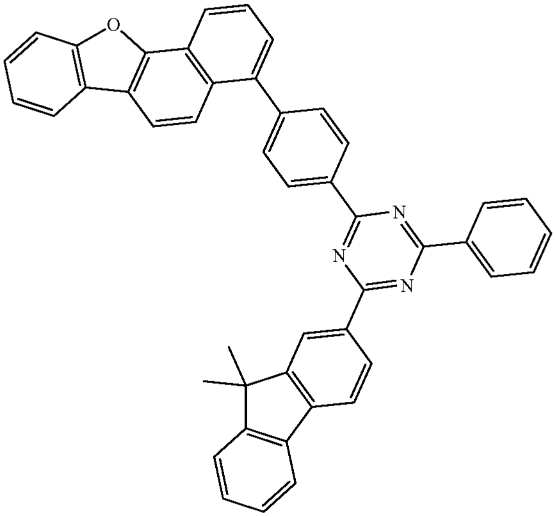
-continued
C-185
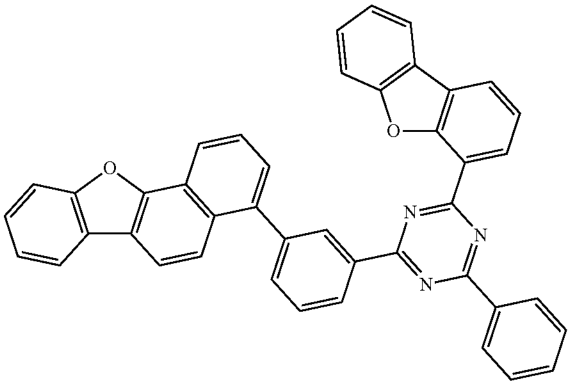
C-186
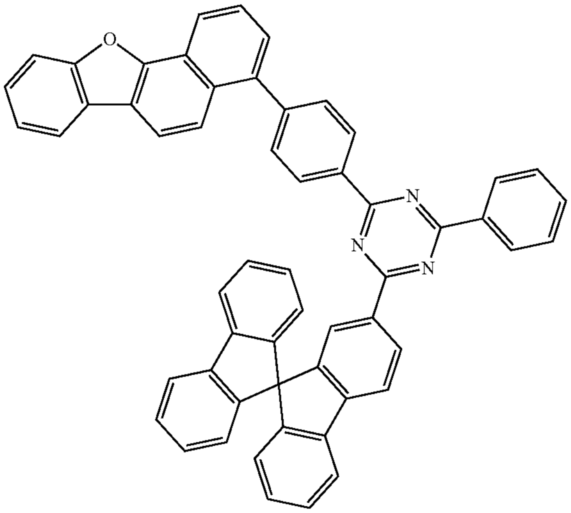
C-187
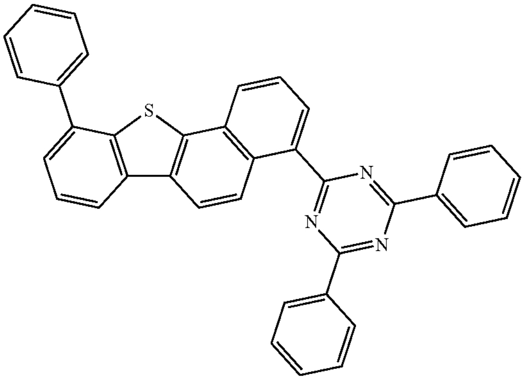

-continued
C-188
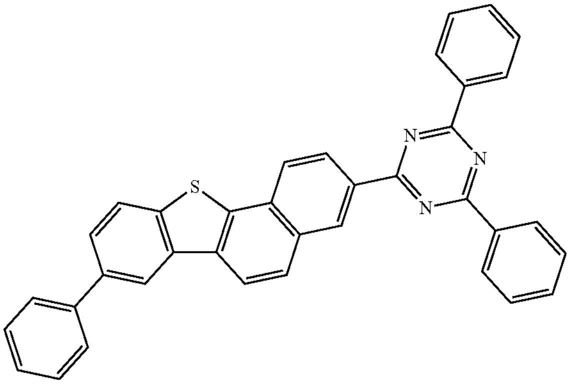
C-189
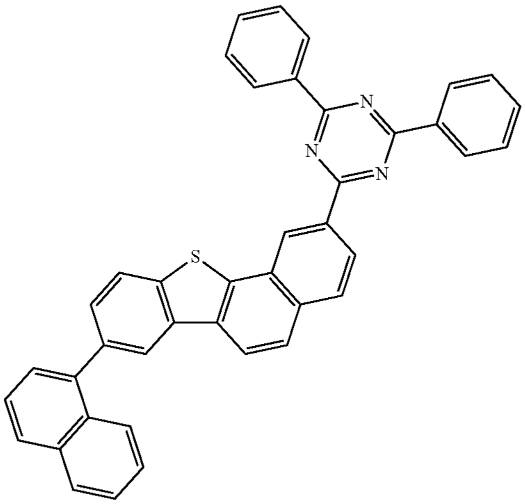
C-190
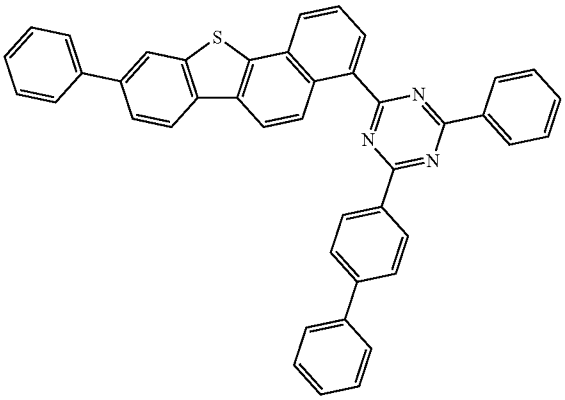
-continued
C-191
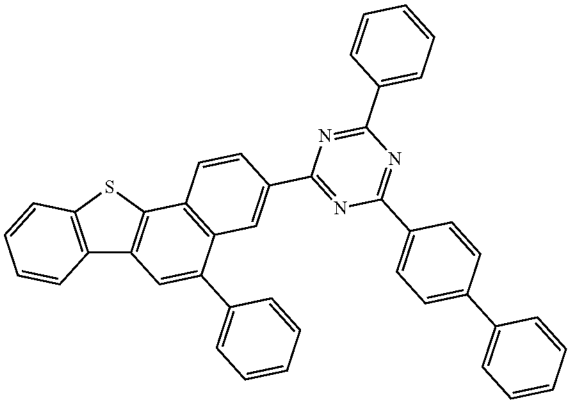
C-192
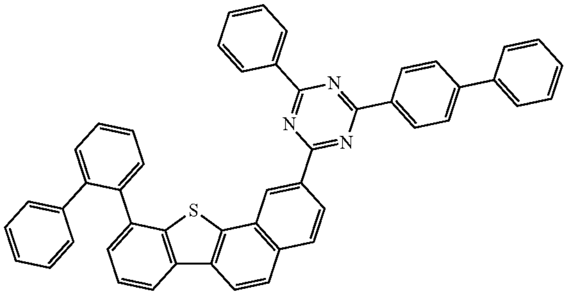
C-193
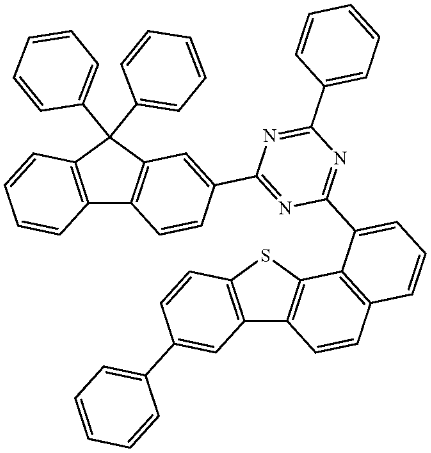
C-194
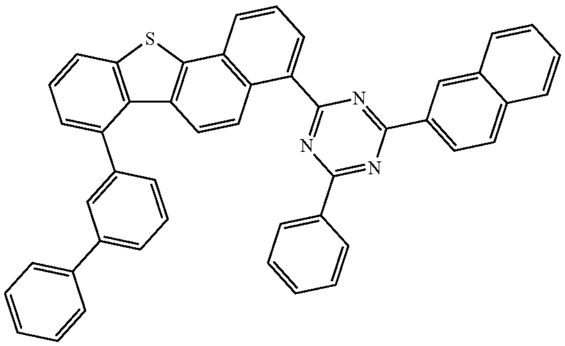

-continued
C-195
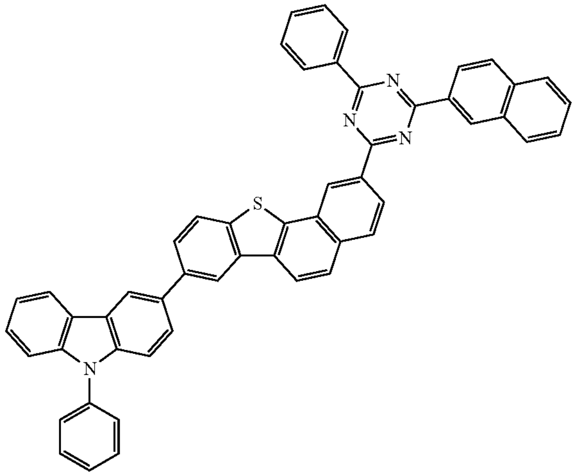
C-196
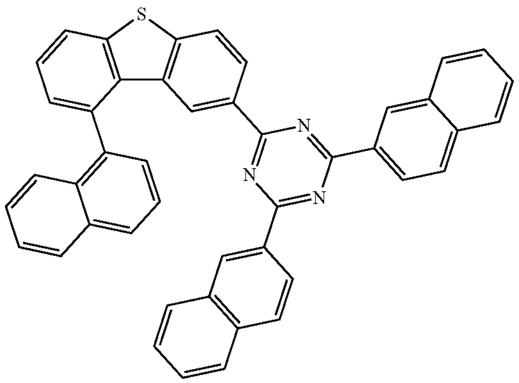
C-197
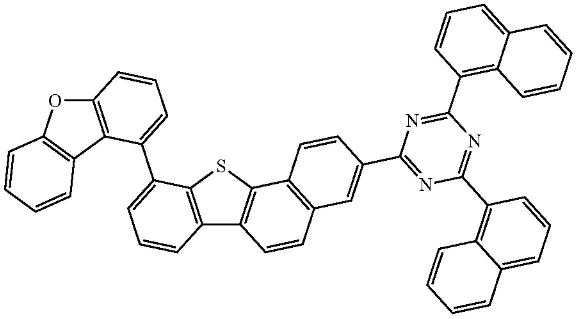
C-198
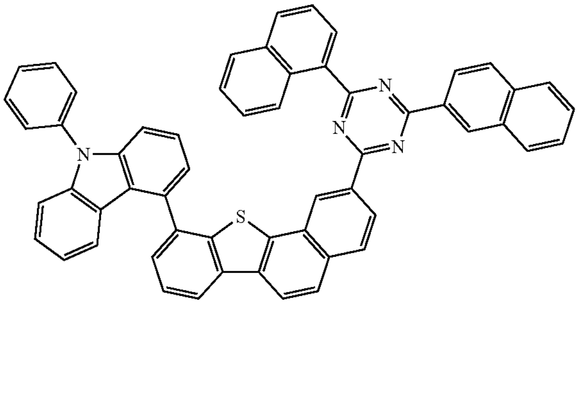
C-199
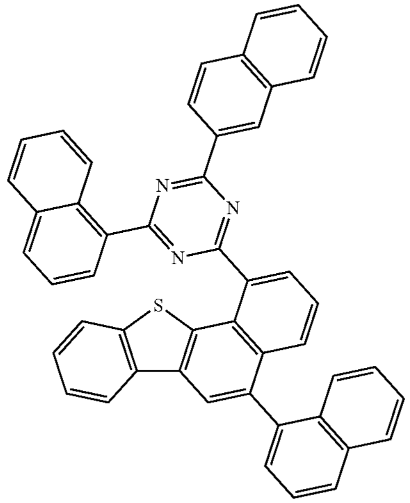
C-200
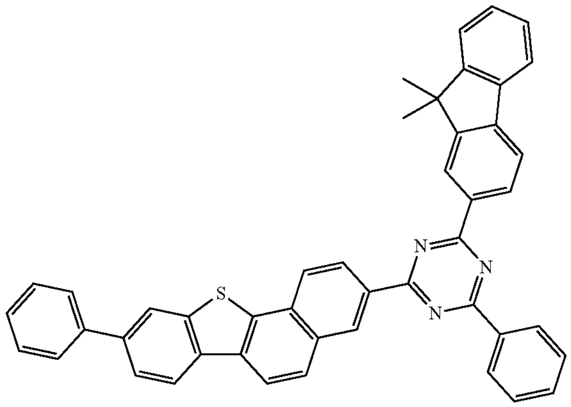
C-201
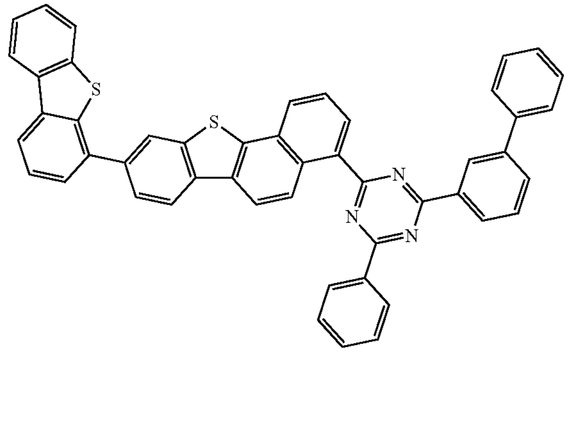

-continued
C-202
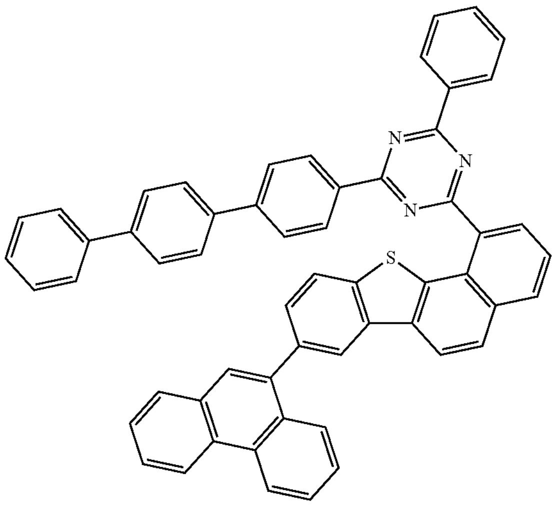
C-203
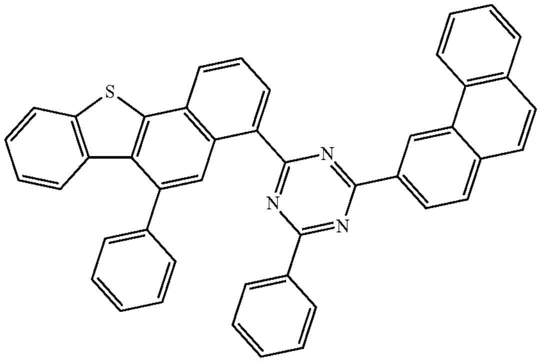
C-204
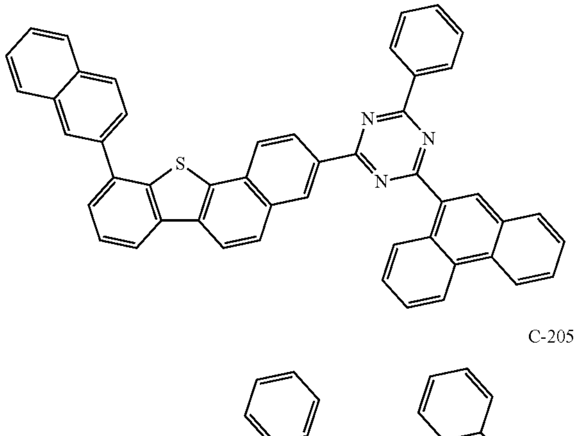
C-205
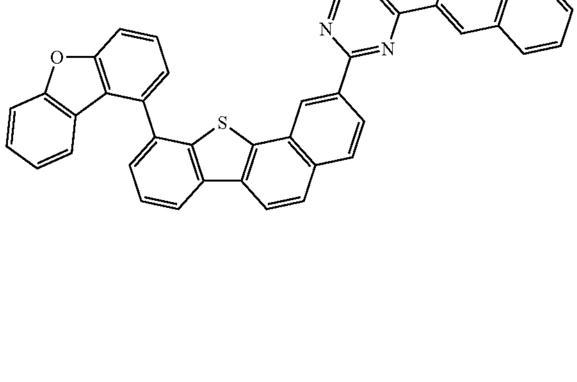
-continued
C-206
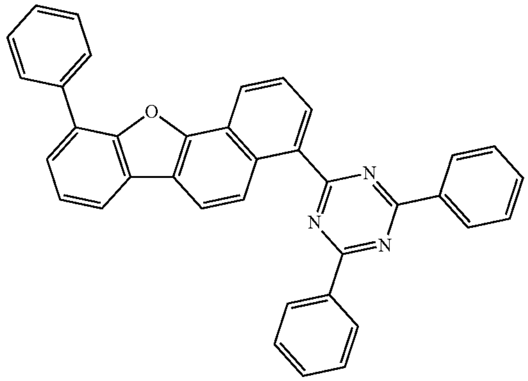
C-207
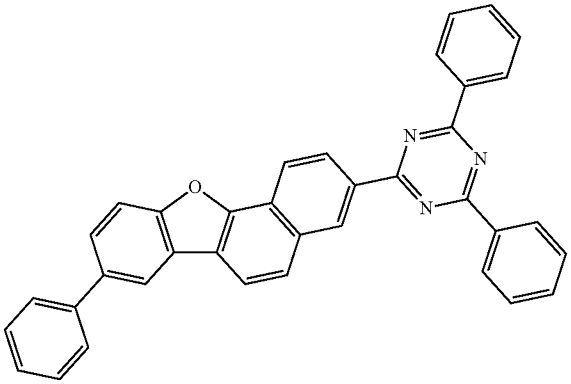
C-208
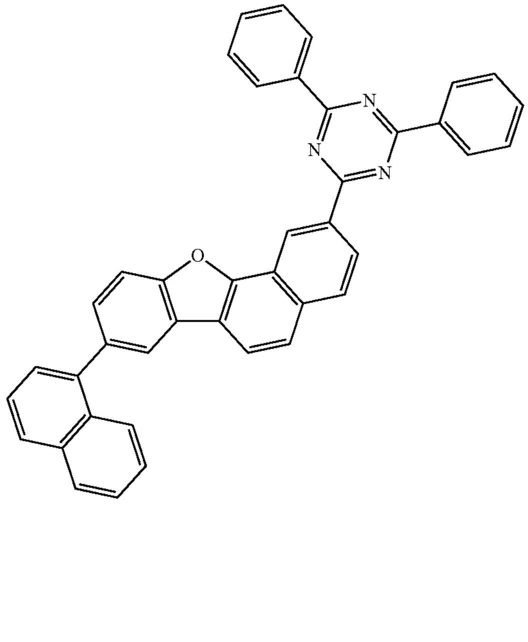

-continued
C-209
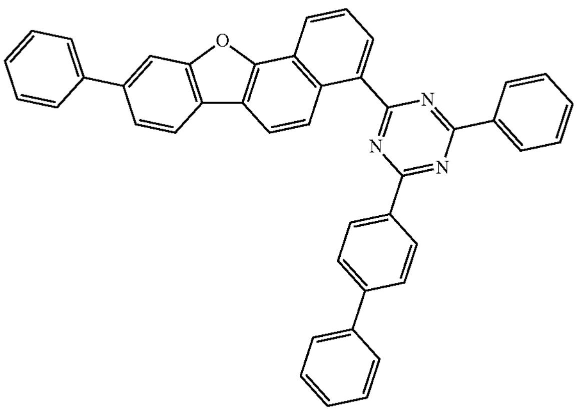
C-210
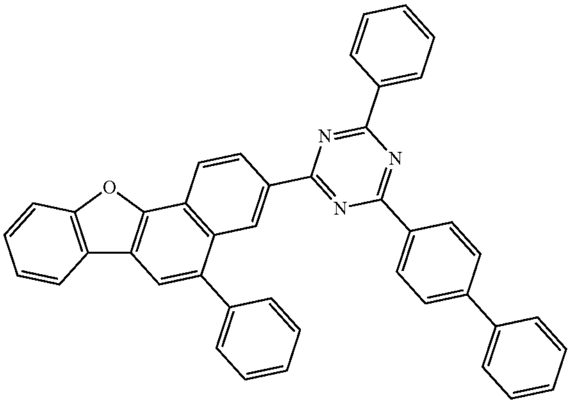
C-211
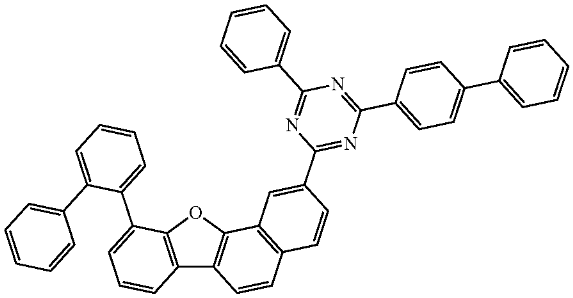
C-212
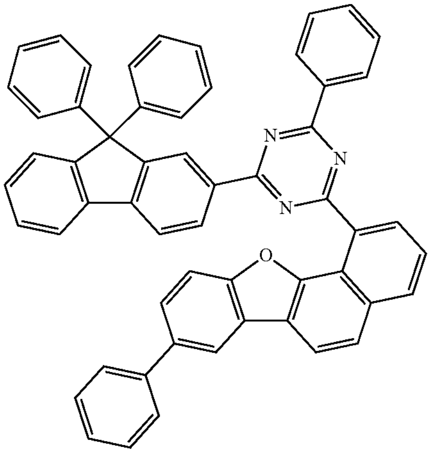
-continued
C-213
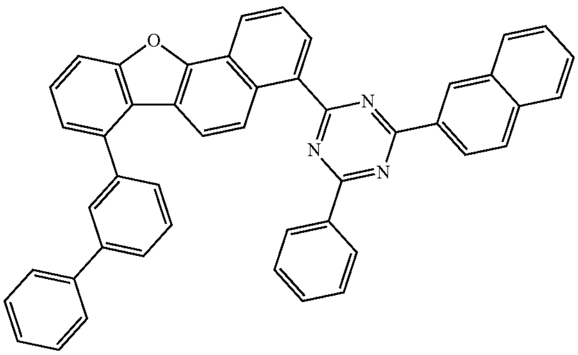
C-214
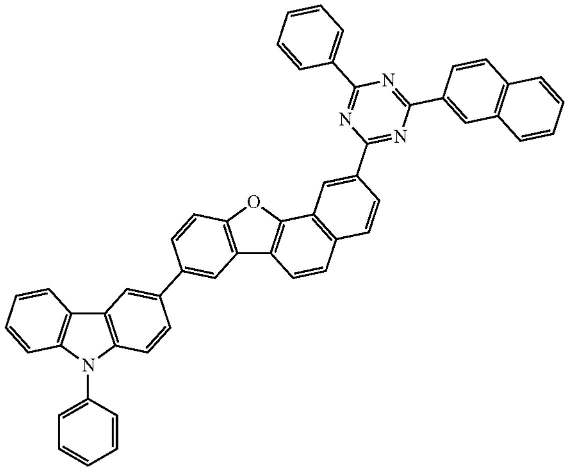
C-215
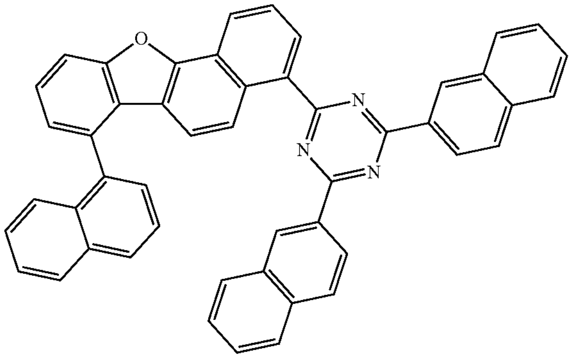
C-216
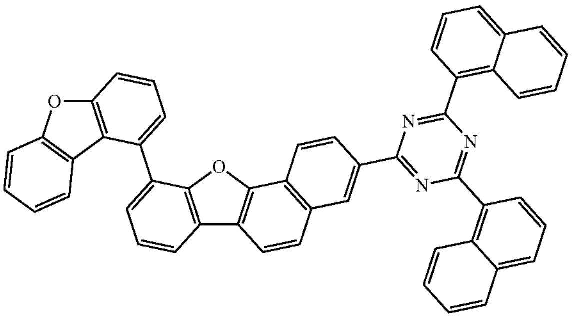

-continued
C-217
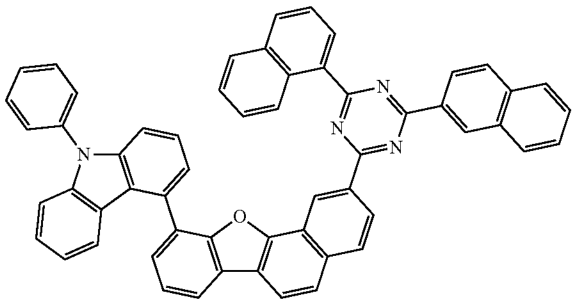
C-218
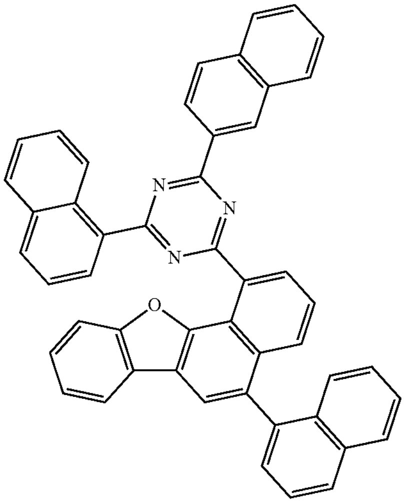
C-219
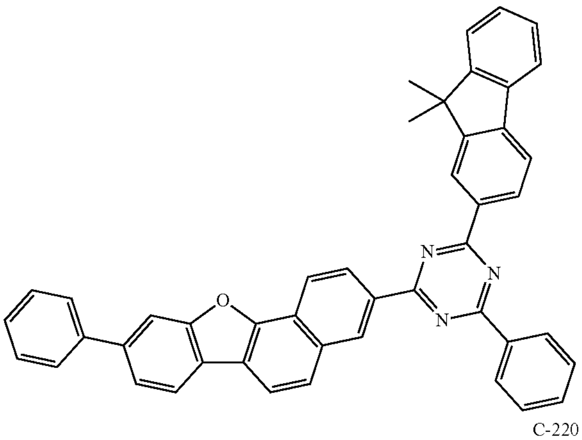
C-220
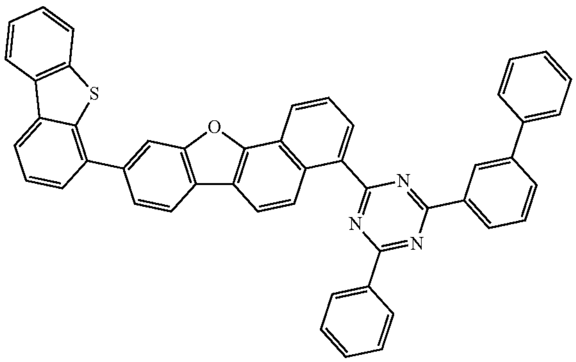
-continued
C-221
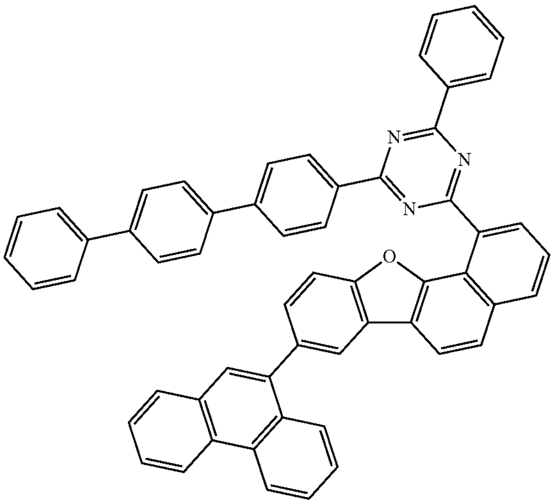
C-222
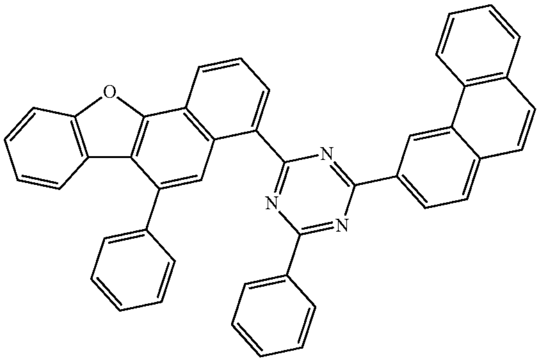
C-223
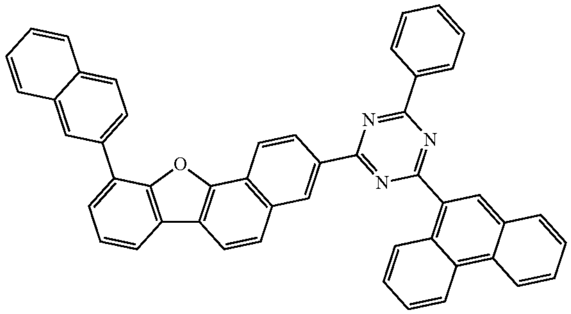
C-224
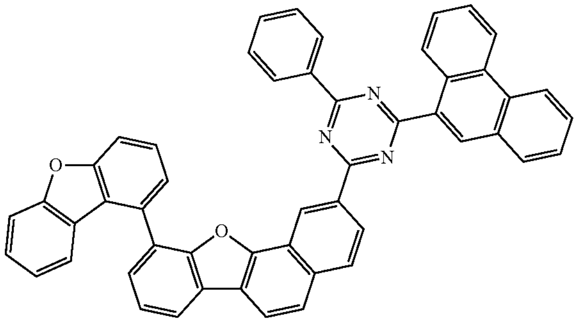

-continued
C-225
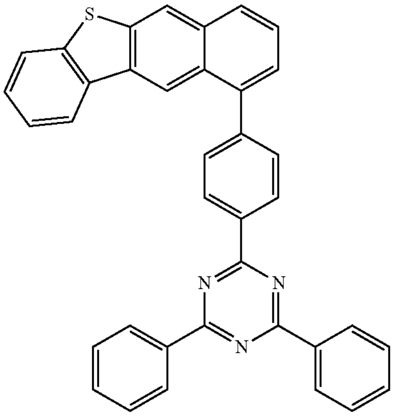
C-226
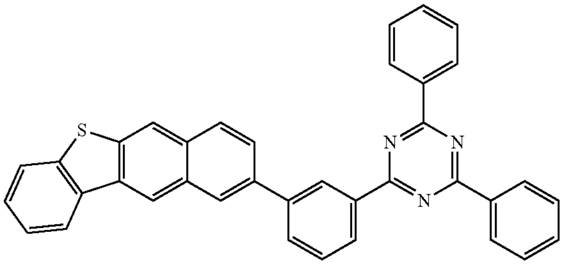
C-227
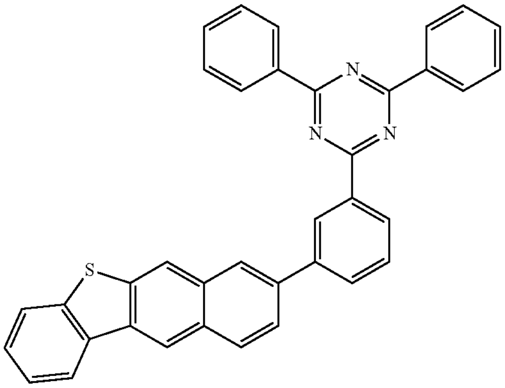
C-228
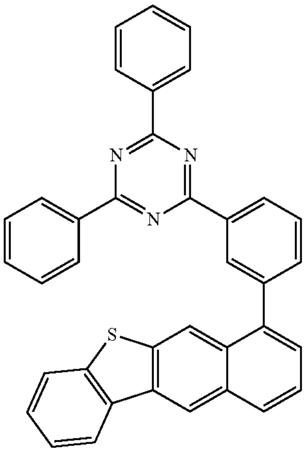
-continued
C-229
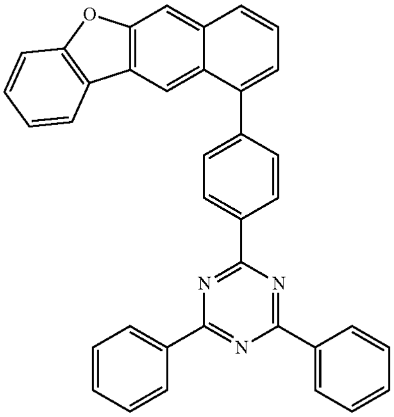
C-230
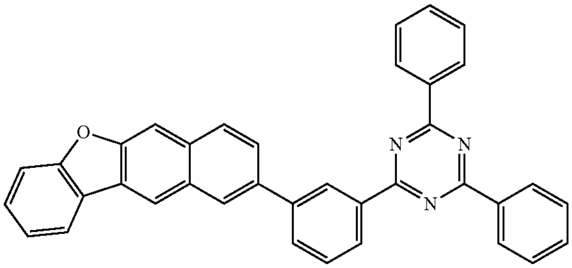
C-231
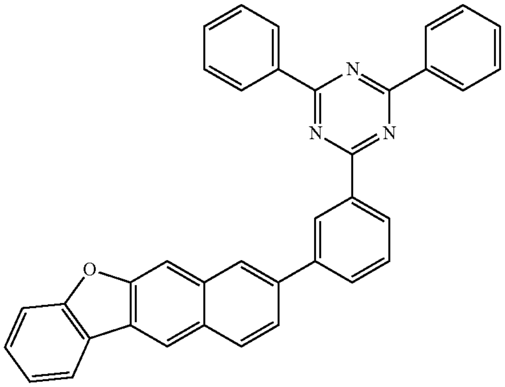
C-232
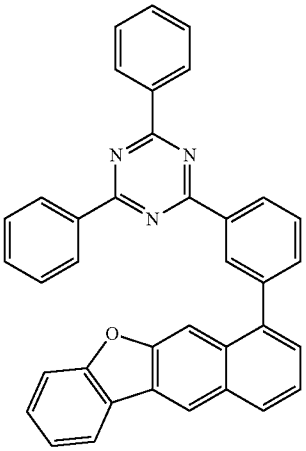

-continued
C-233
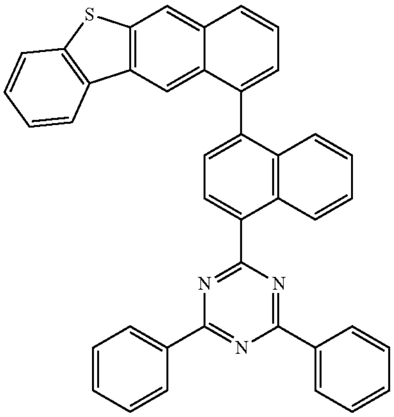
C-234
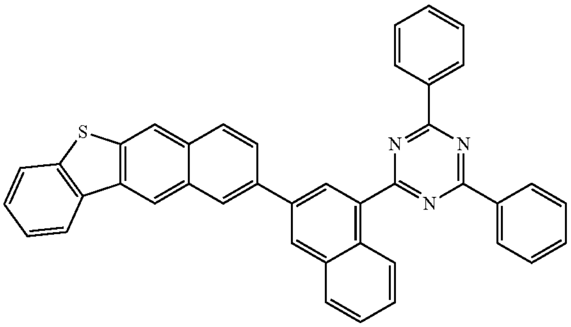
C-235
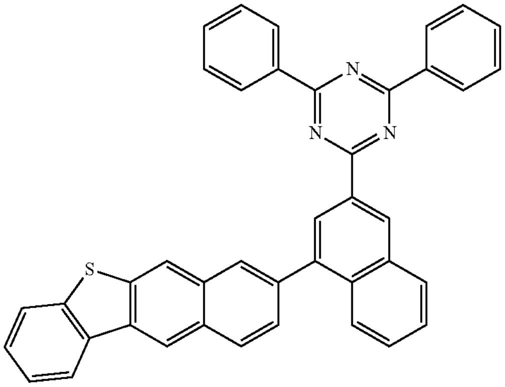
C-236
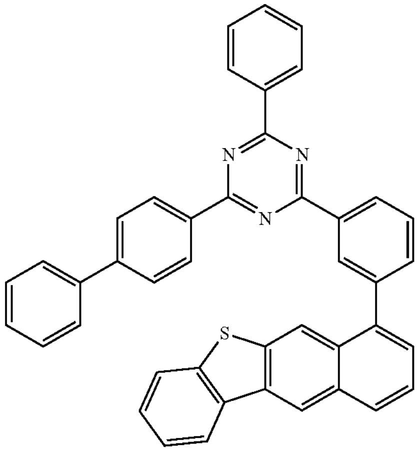
-continued
C-237
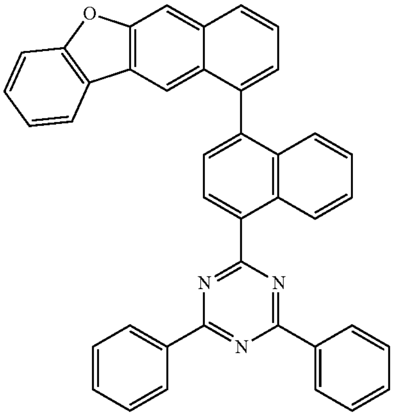
C-238
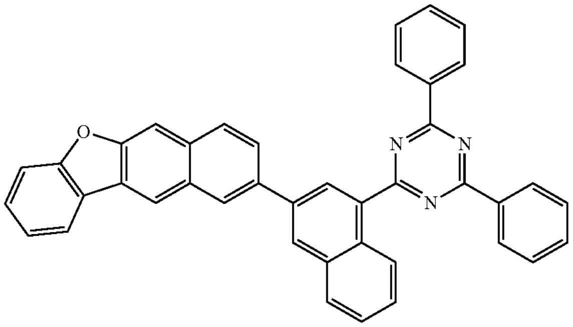
C-239
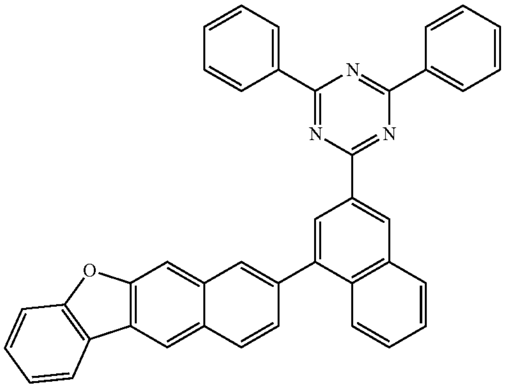
C-240
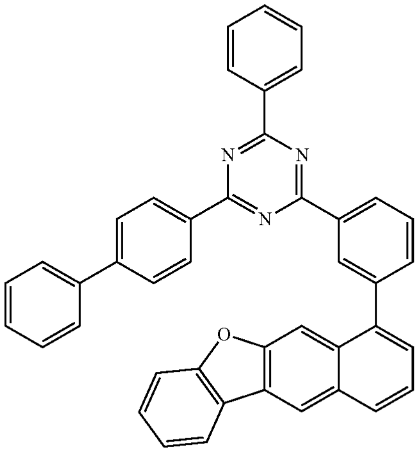

-continued
C-241
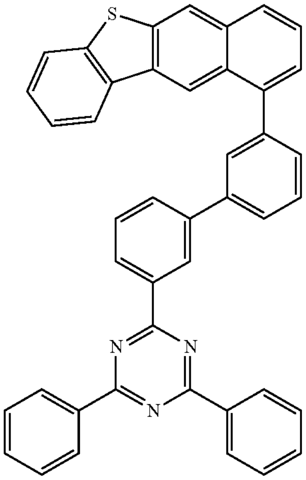
C-242
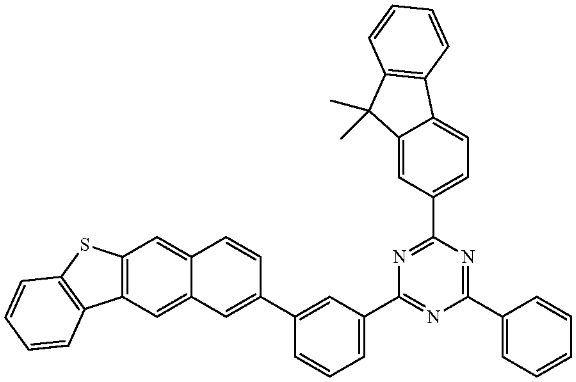
C-243
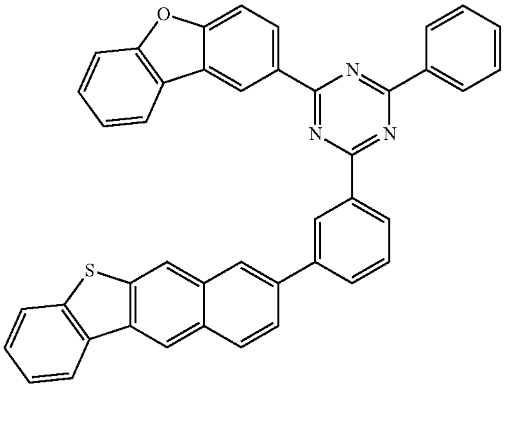
-continued
C-244
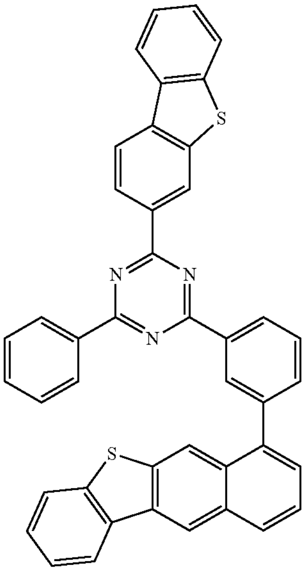
C-245
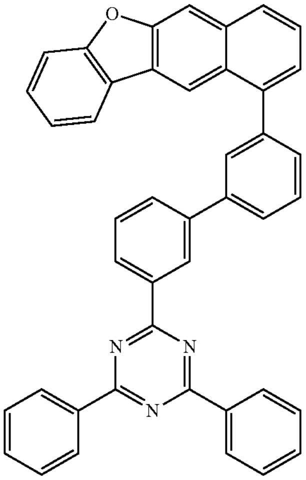
C-246
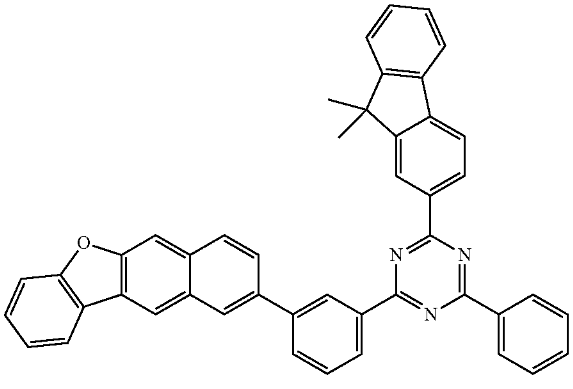

-continued
C-247
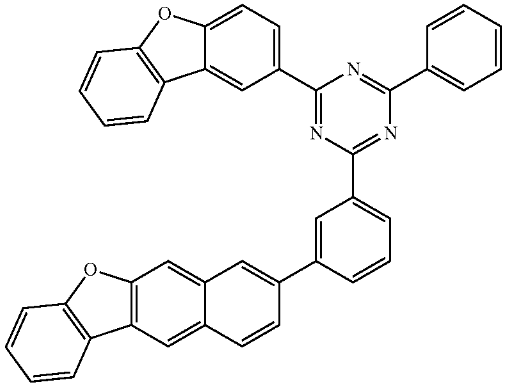
C-248
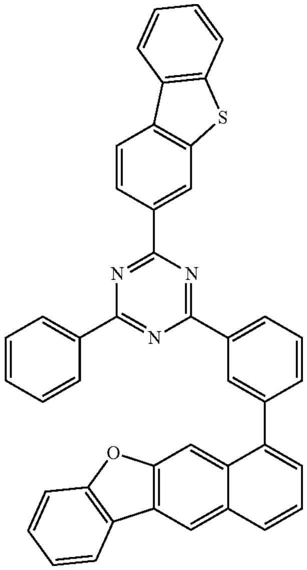
C-249
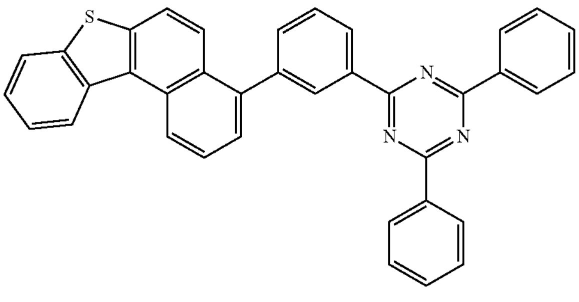
-continued
C-250
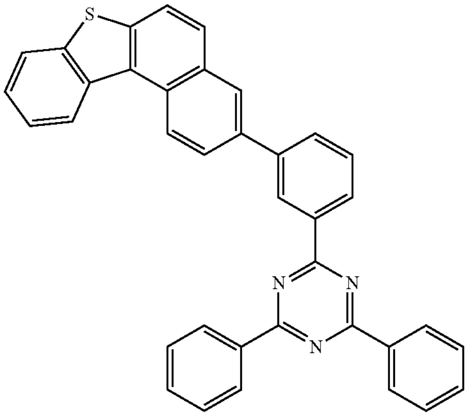
C-251
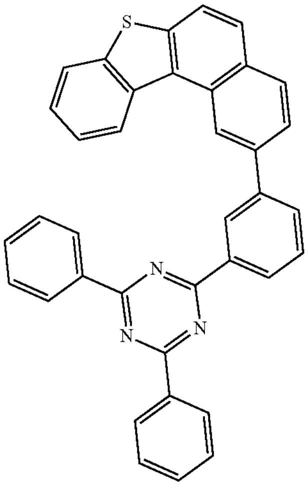
C-252
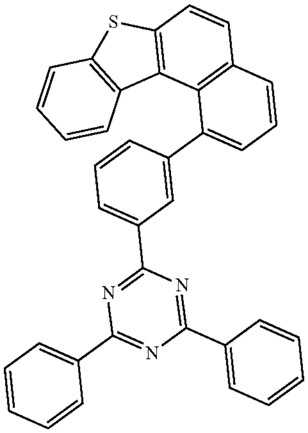
C-253
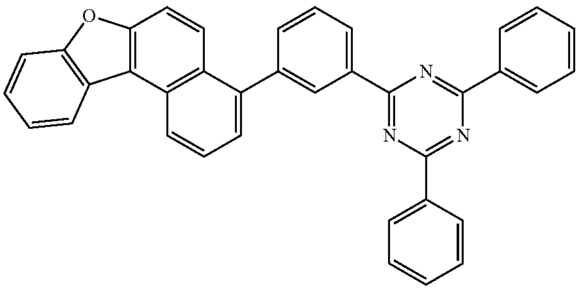

C-254
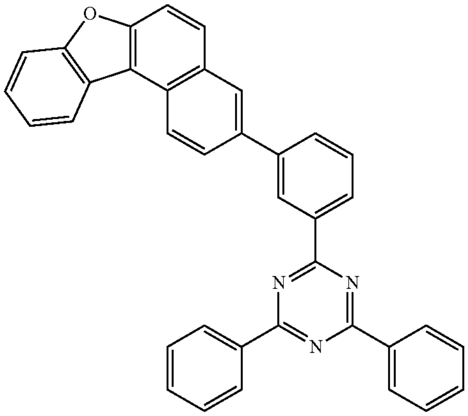
C-255
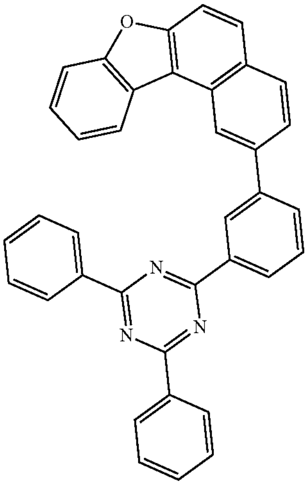
C-256
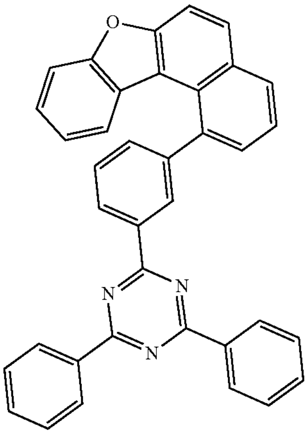
C-257
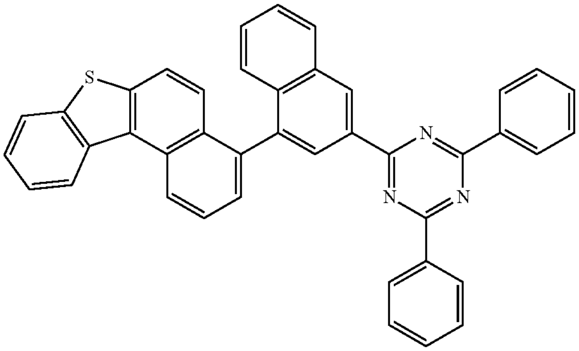
C-258
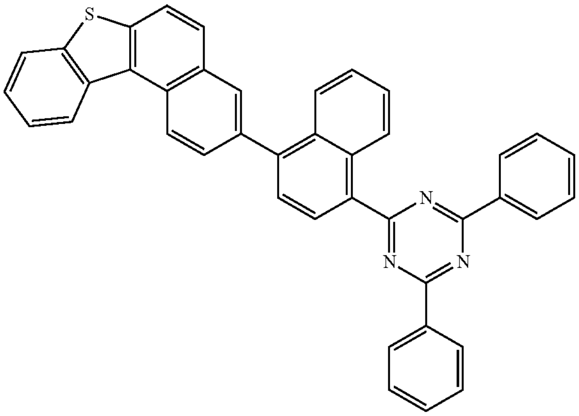
C-259
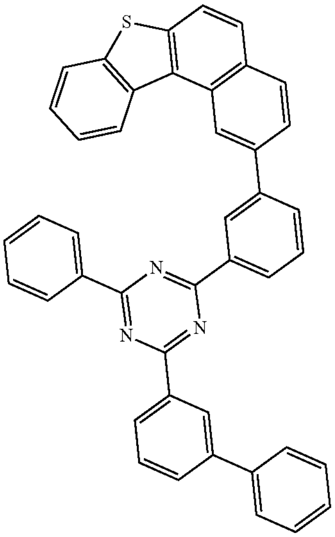

-continued
C-260
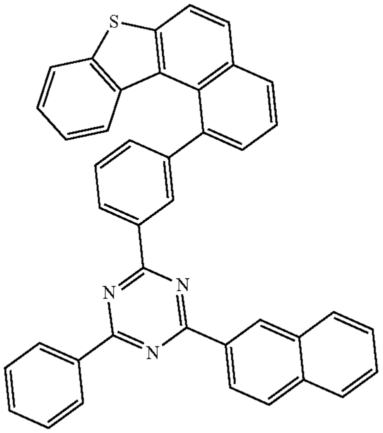
C-261
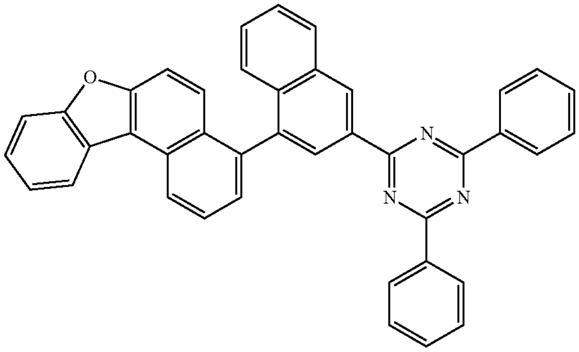
C-262
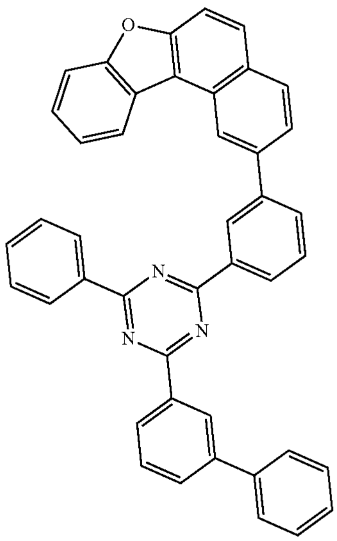
-continued
C-263
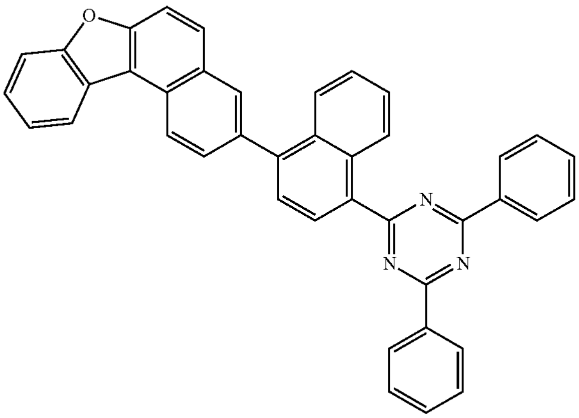
C-264
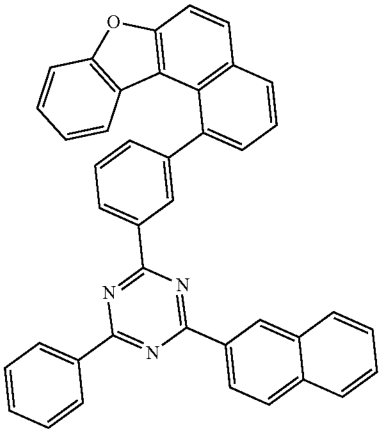
C-265
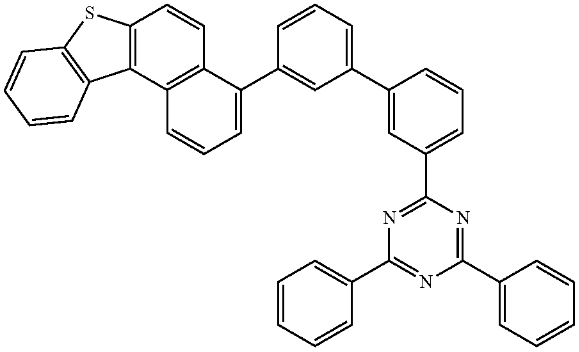

C-266
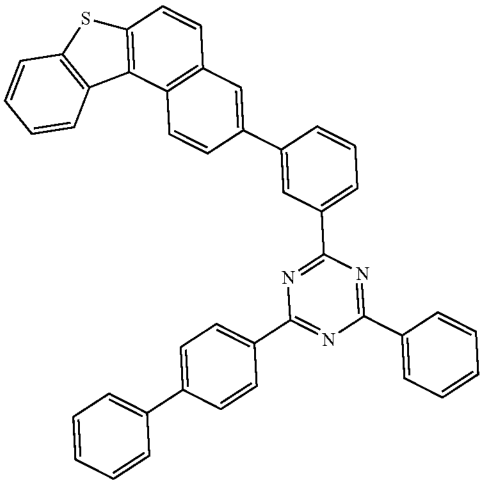
C-267
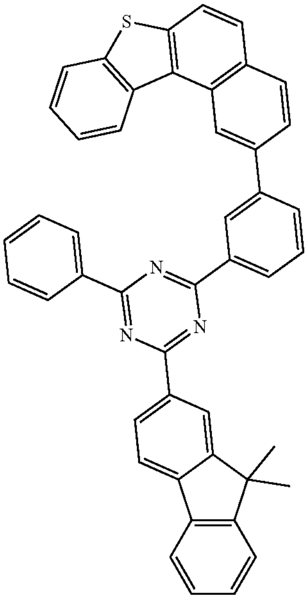
C-268
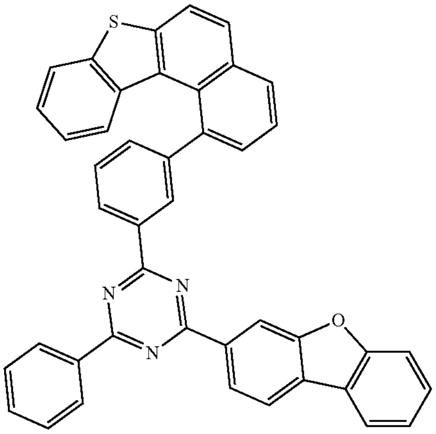
C-269
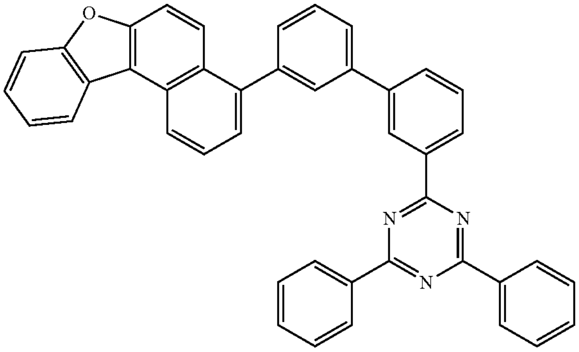
C-270
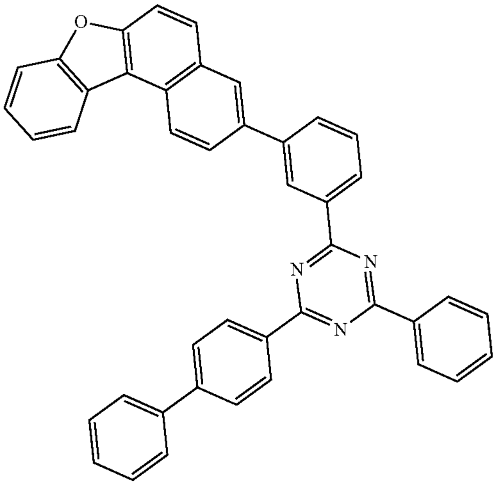
C-271
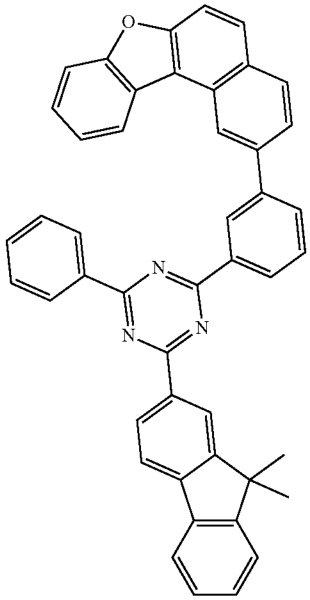

-continued
C-272
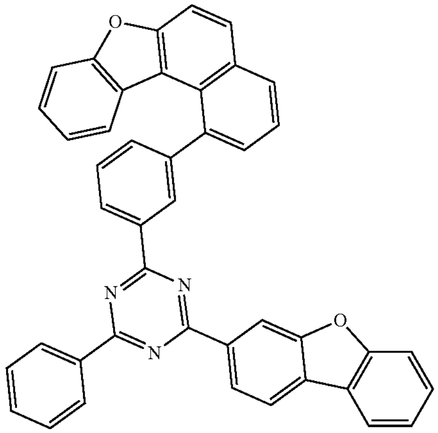
C-273
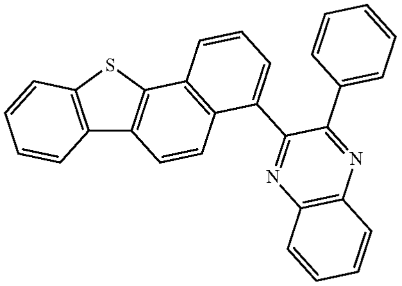
C-274
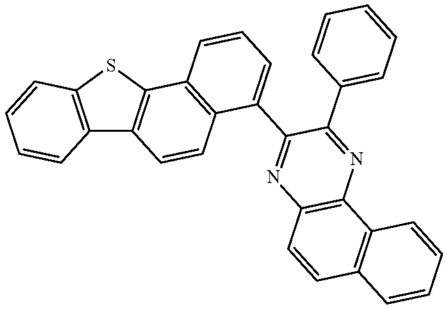
C-275
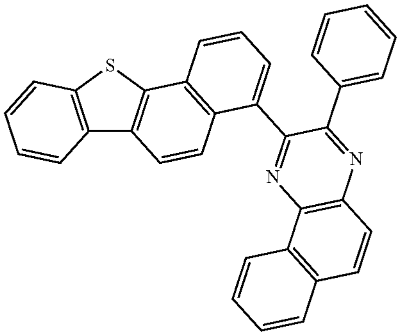
-continued
C-276
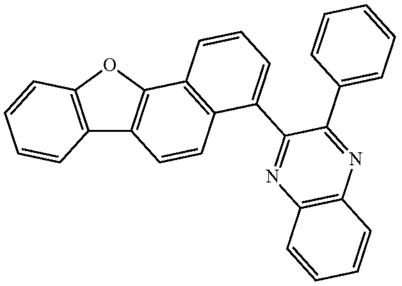
C-277
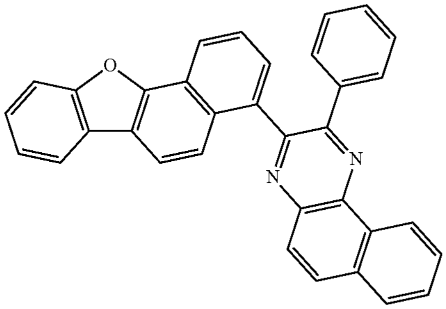
C-278
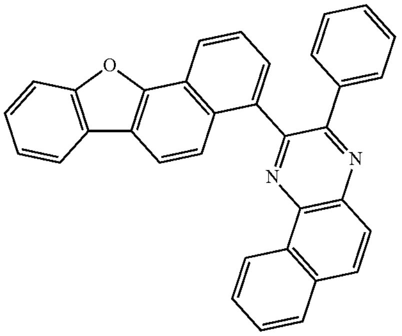
C-279
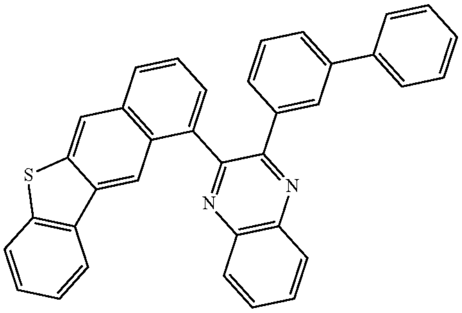
C-280
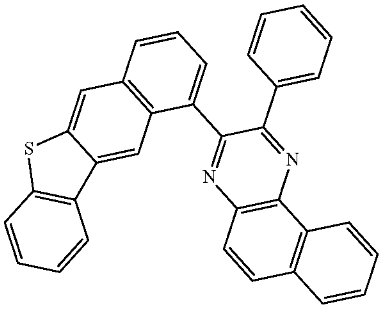

-continued
C-281
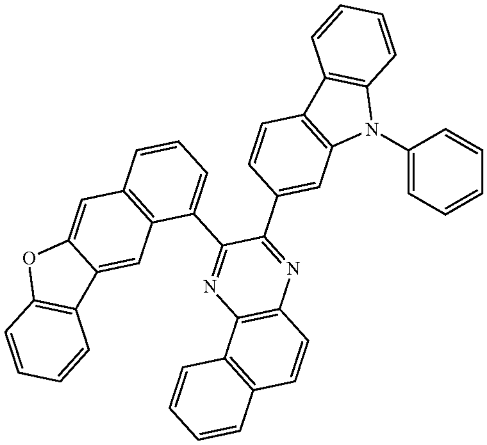
C-282
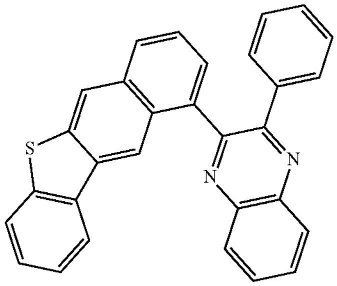
C-283
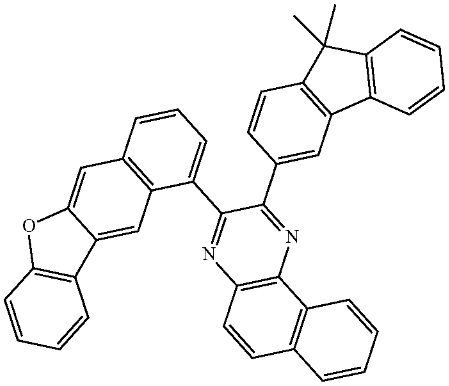
C-284
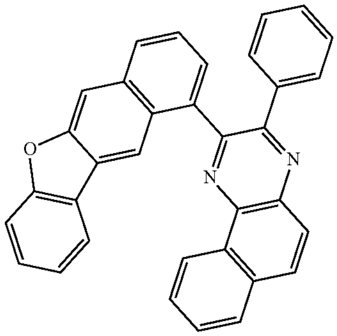
-continued
C-285
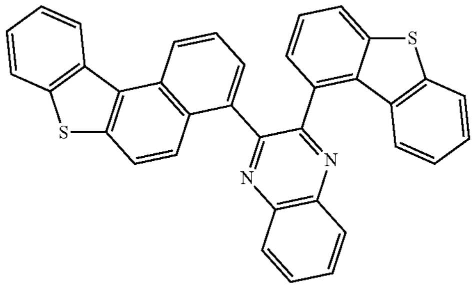
C-286
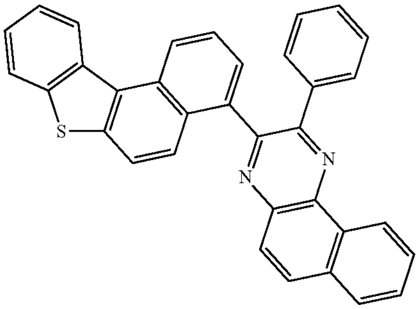
C-287
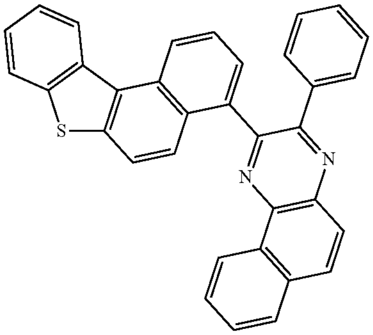
C-288
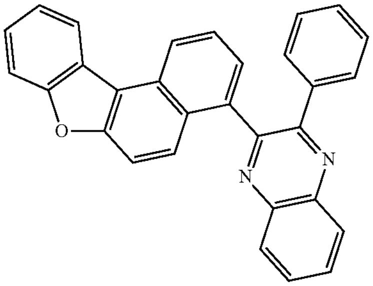
C-289
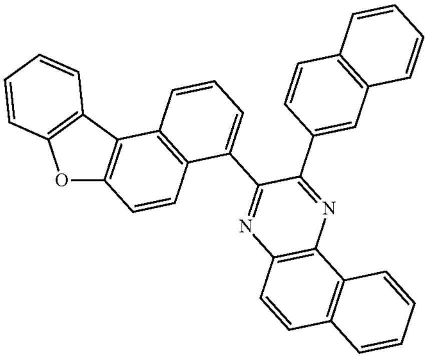

-continued
C-290
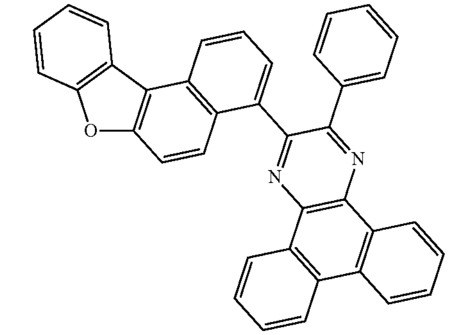
C-291
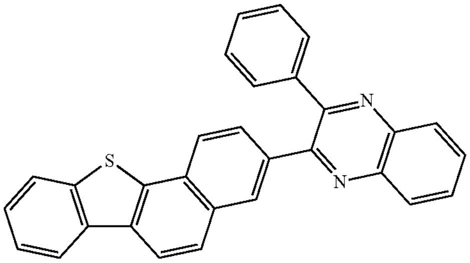
C-292
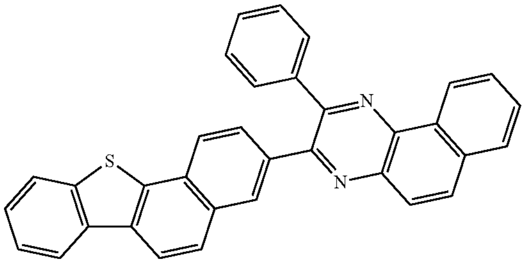
C-293
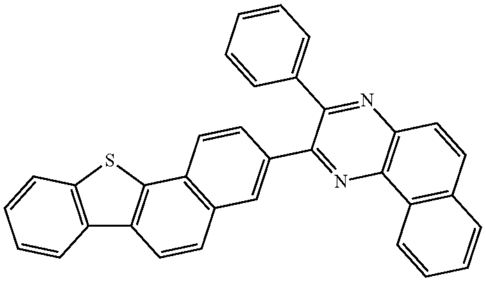
C-294
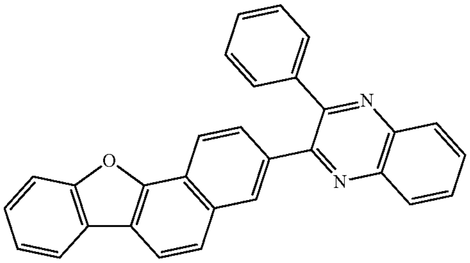
-continued
C-295
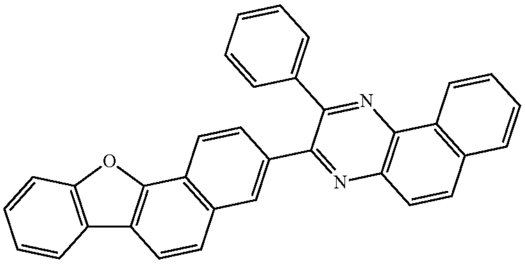
C-296
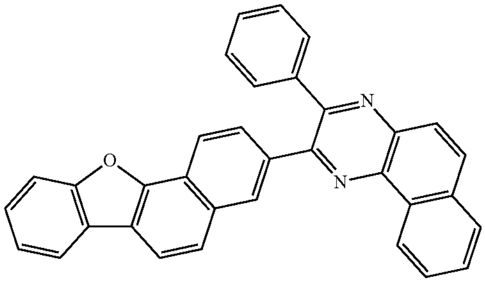
C-297
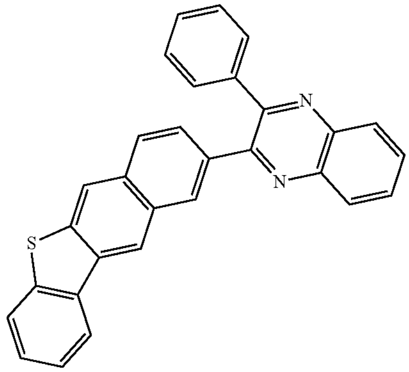
C-298
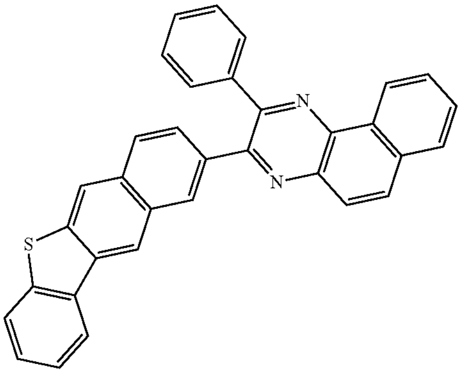

-continued
C-299
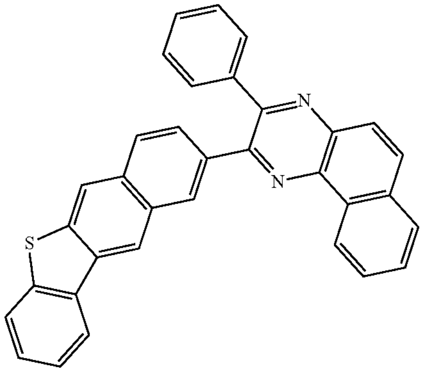
C-300
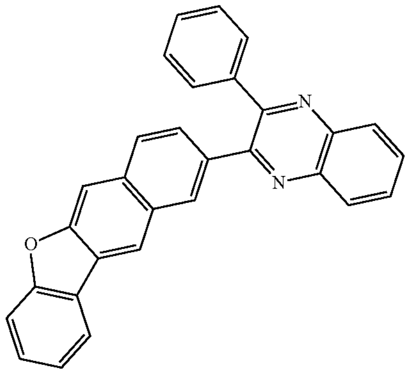
C-301
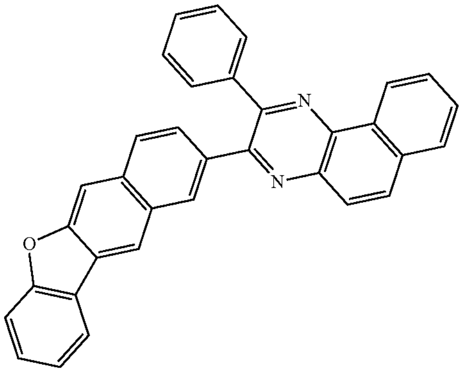
C-302
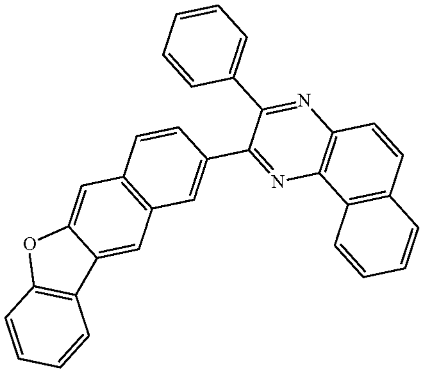
-continued
C-303
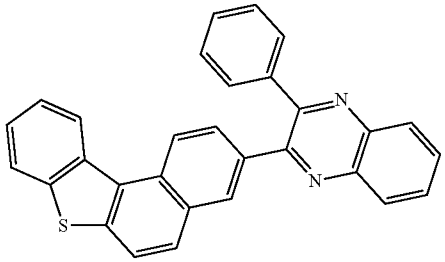
C-304
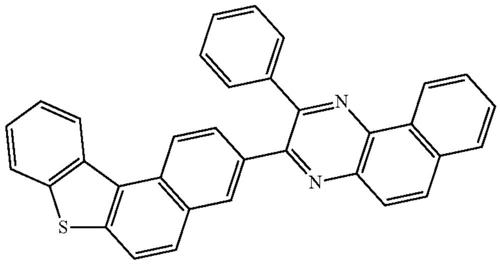
C-305
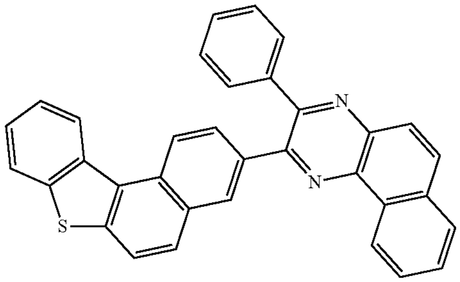
C-306
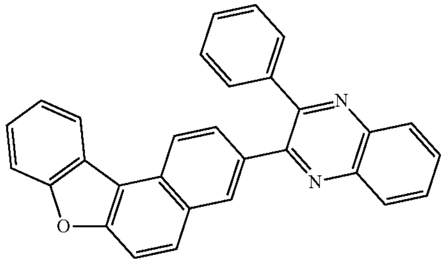
C-307
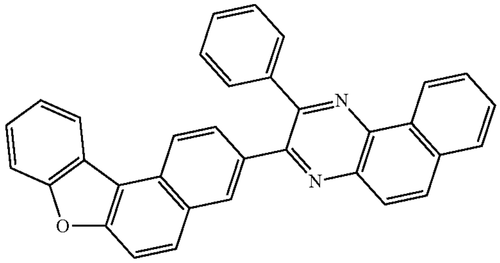

-continued
C-308
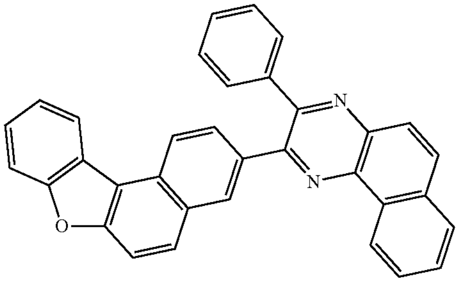
C-309
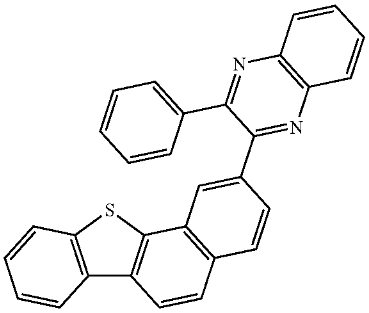
C-310
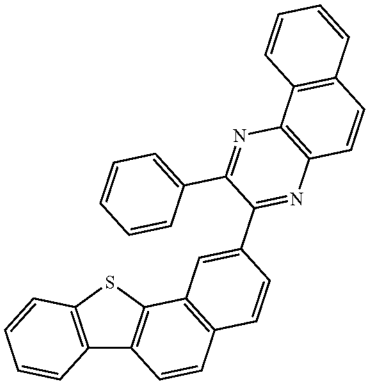
C-311
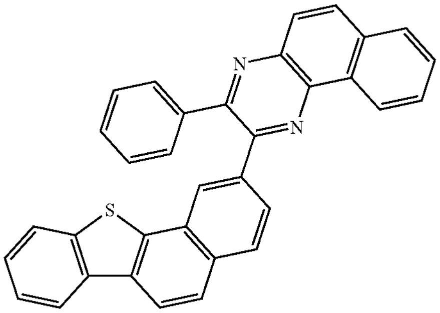
C-312
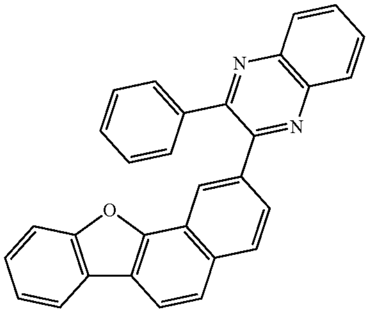
-continued
C-313
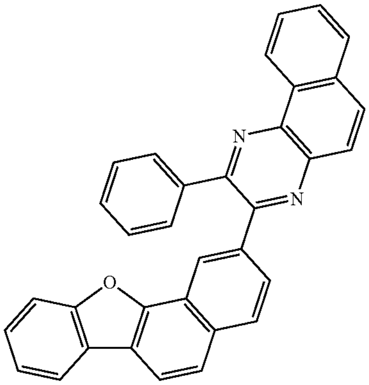
C-314
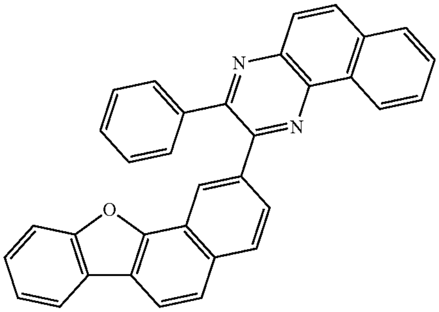
C-315
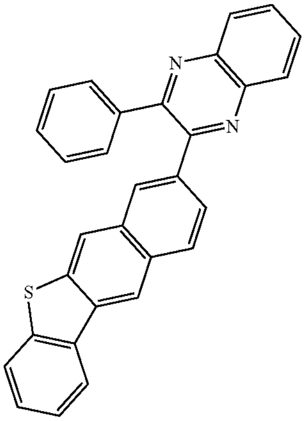
C-316
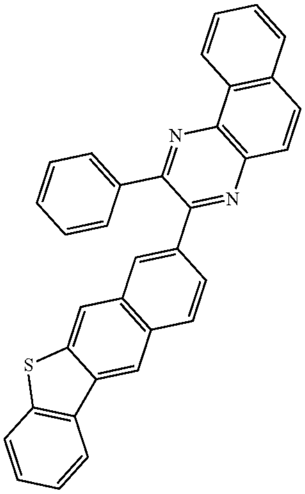

-continued
C-317
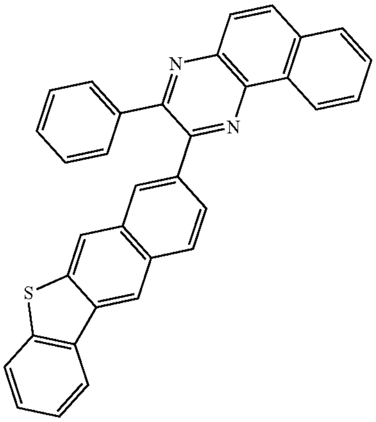
C-318
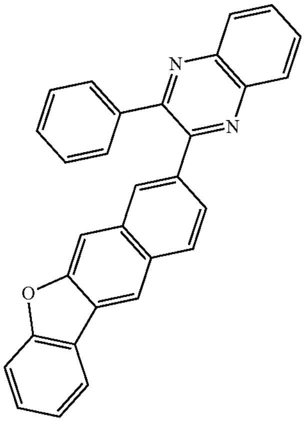
C-319
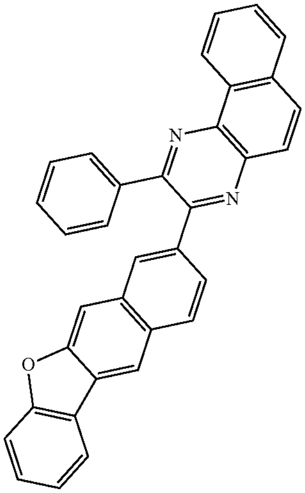
-continued
C-320
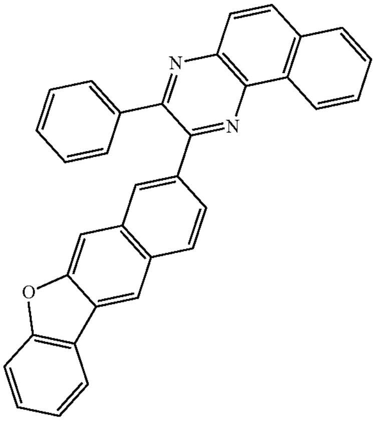
C-321
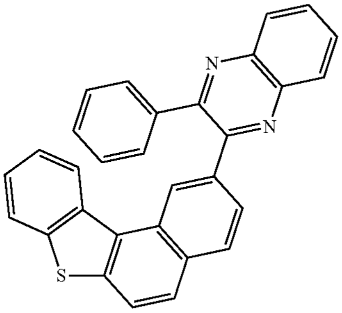
C-322
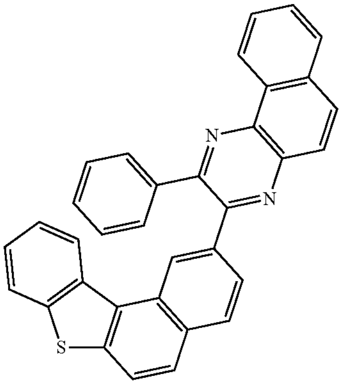
C-323
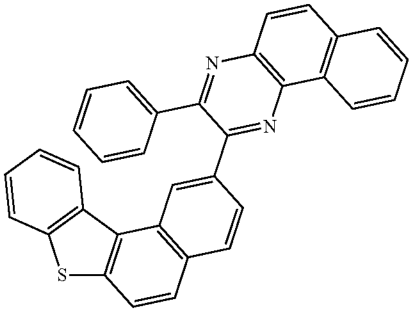

-continued
C-324
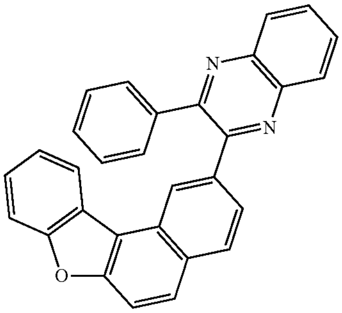
C-325
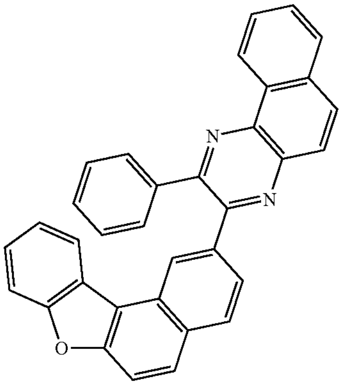
C-326
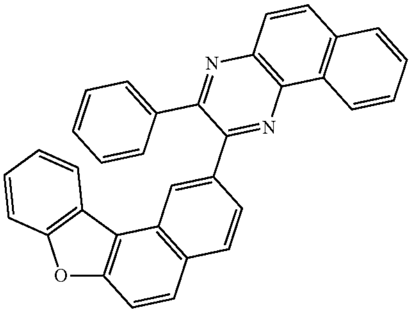
C-327
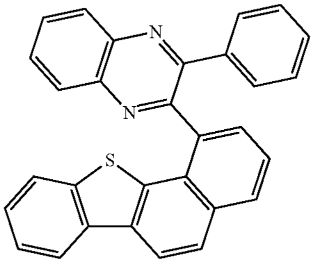
C-328
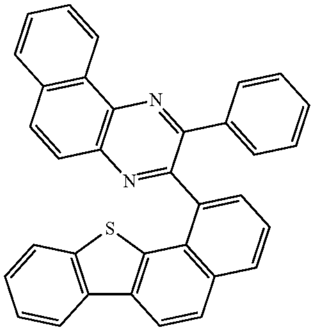
-continued
C-329
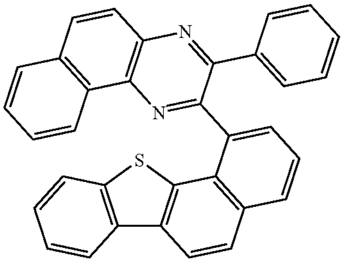
C-330
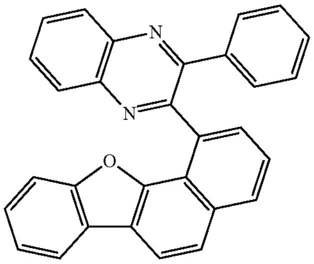
C-331
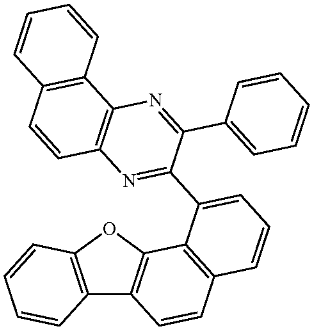
C-332
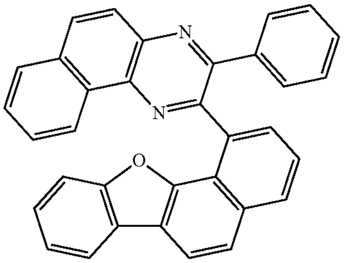
C-333
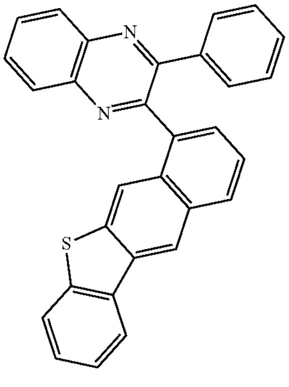

-continued
C-334
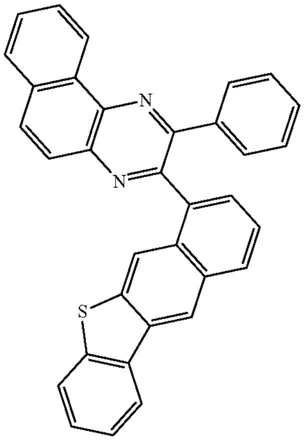
C-335
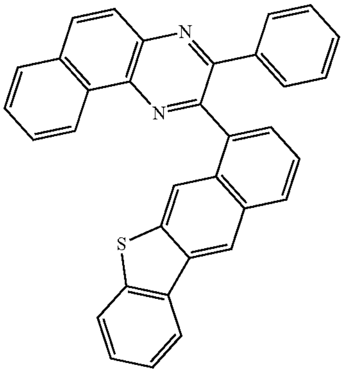
C-336
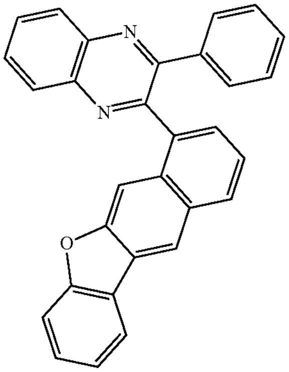
C-337
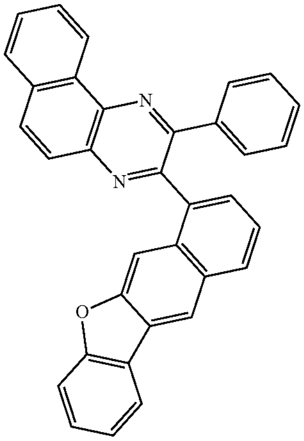
-continued
C-338
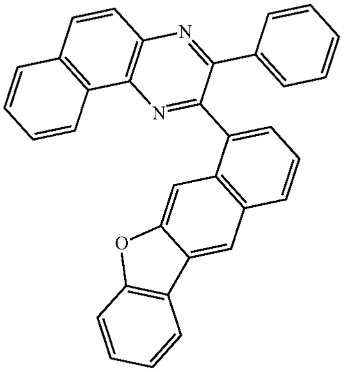
C-339
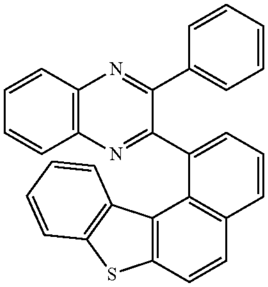
C-340
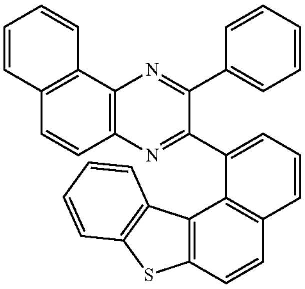
C-341
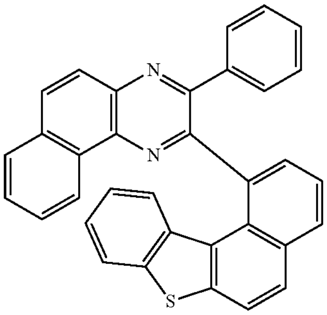
C-342
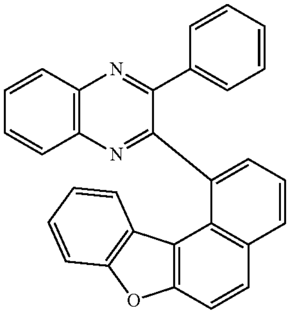

-continued
C-343
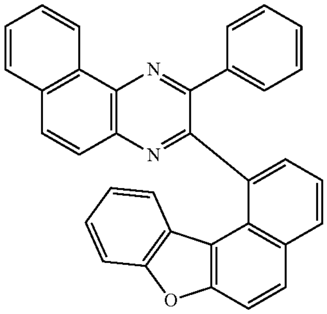
C-344
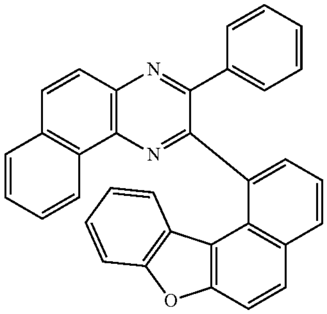
C-345
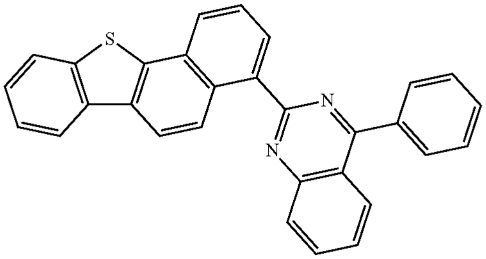
C-346
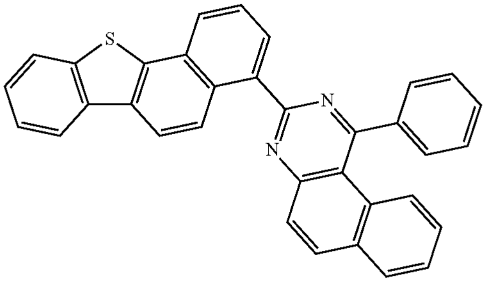
C-347
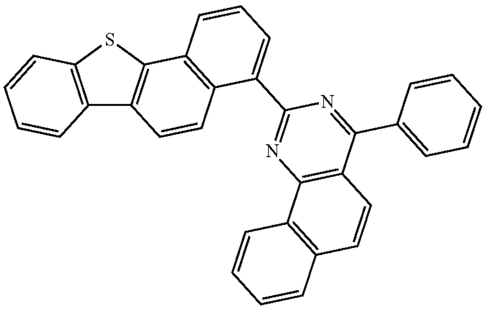
-continued
C-348
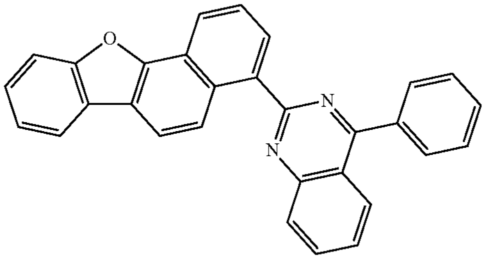
C-349
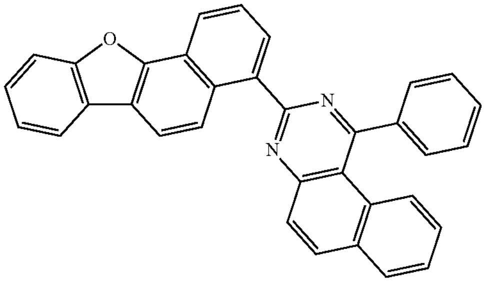
C-350
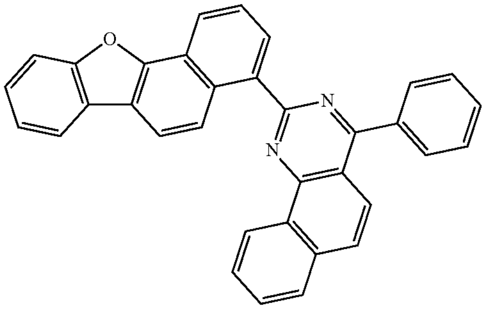
C-351
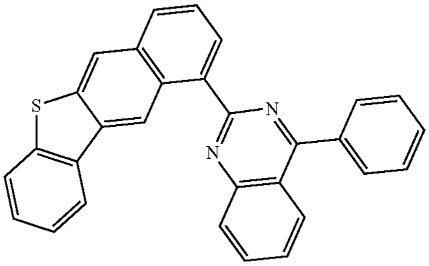
C-352
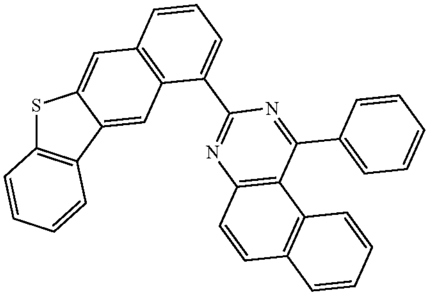

-continued
C-353
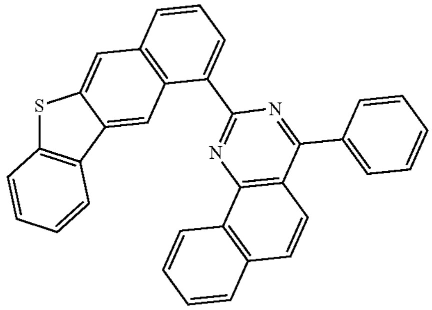
C-354
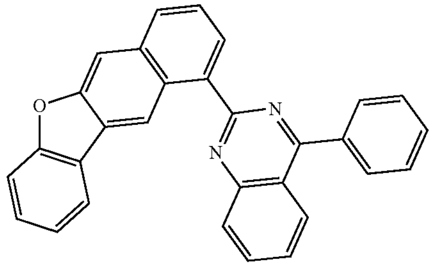
C-355
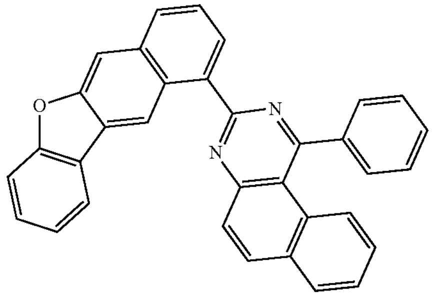
C-356
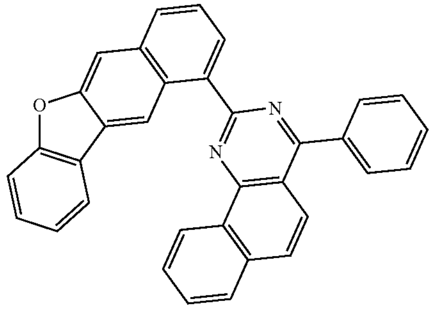
C-357
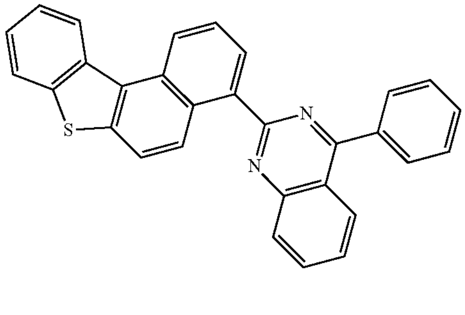
-continued
C-358
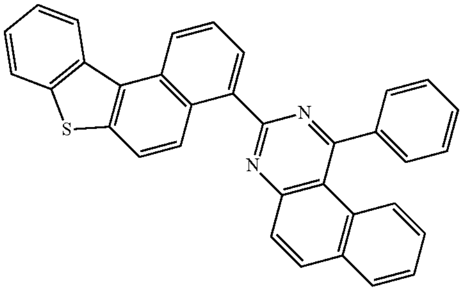
C-359
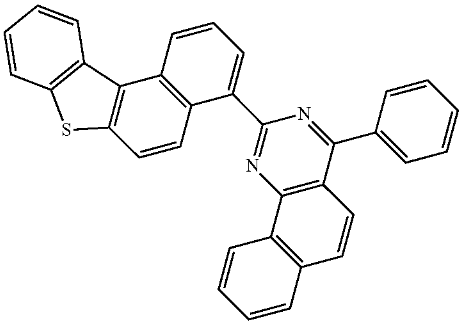
C-360
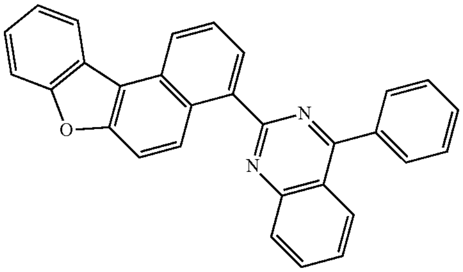
C-361
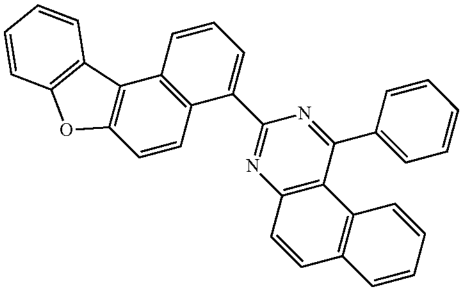
C-362
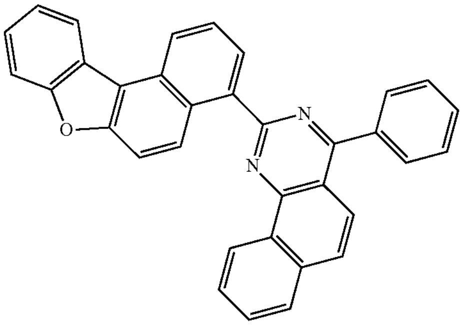

-continued
C-363
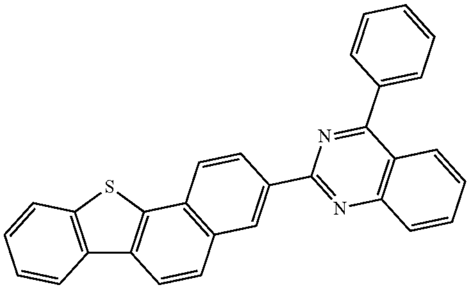
C-364
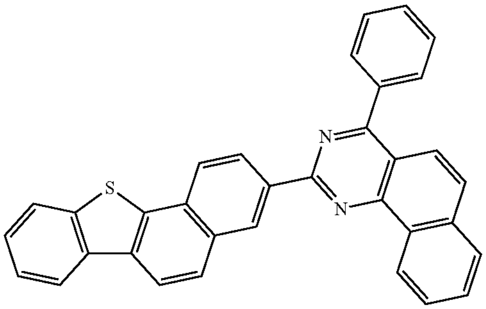
C-365
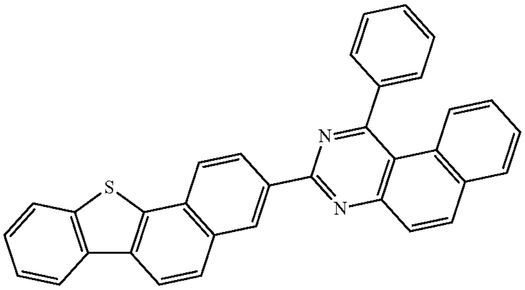
C-366
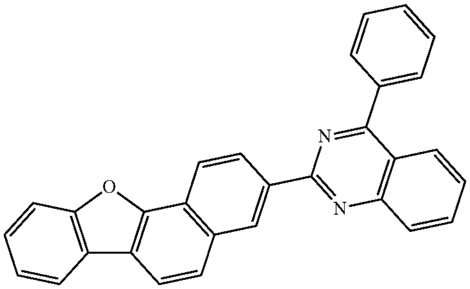
C-367
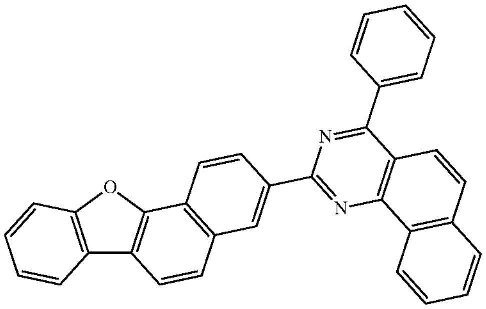
-continued
C-368
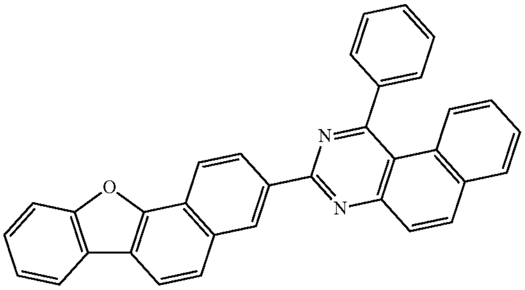
C-369
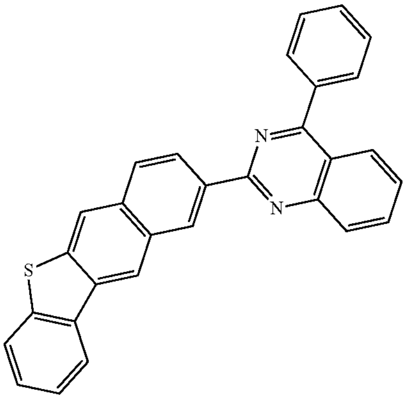
C-370
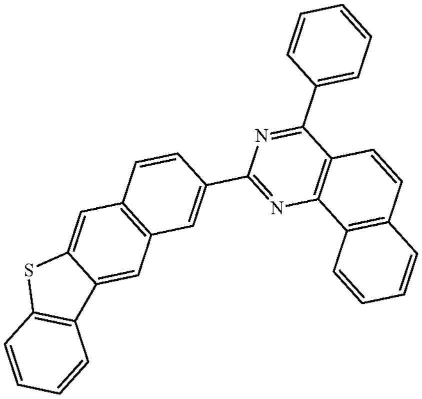
C-371
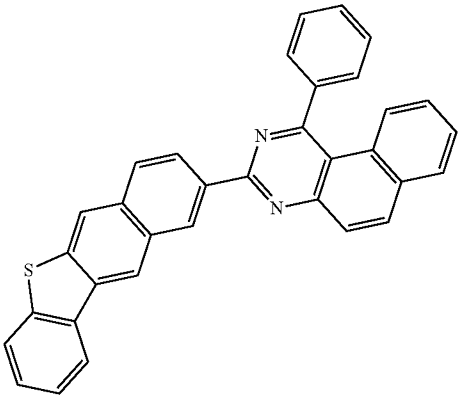

-continued
C-372
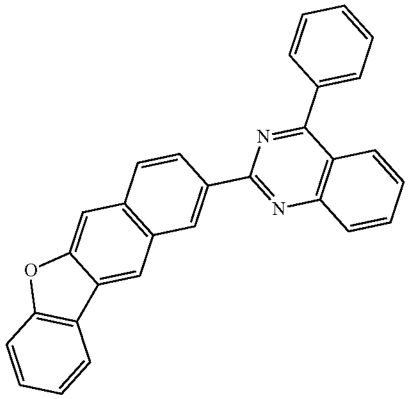
C-373
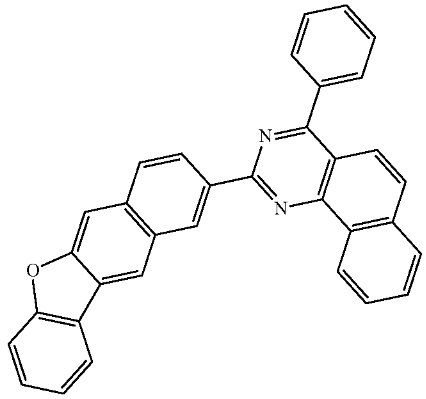
C-374
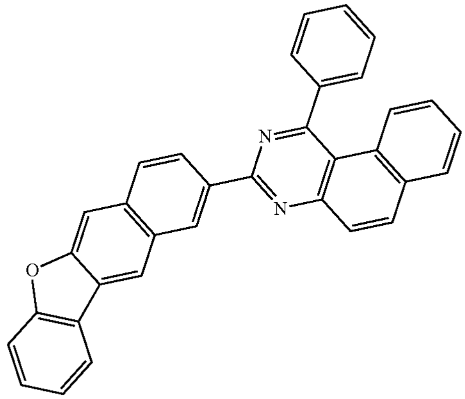
C-375
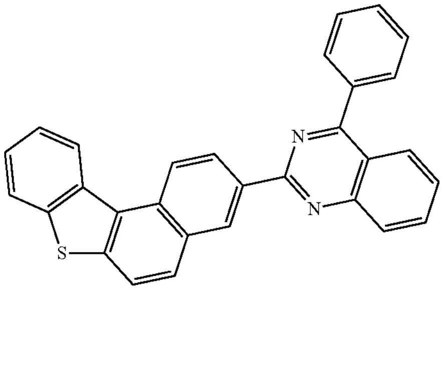
-continued
C-376
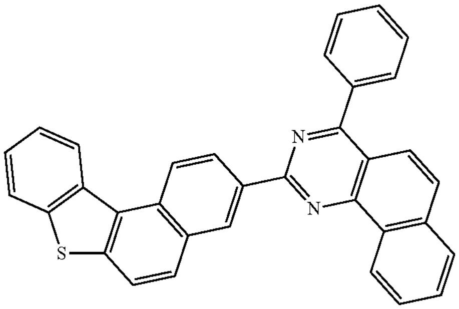
C-377
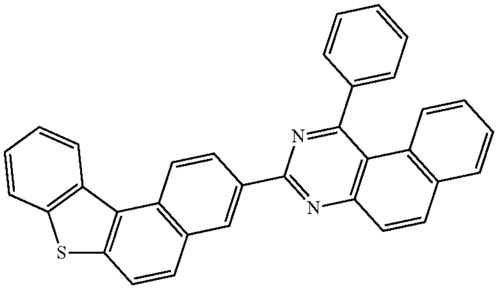
C-378
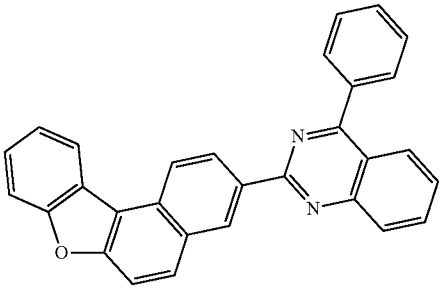
C-379
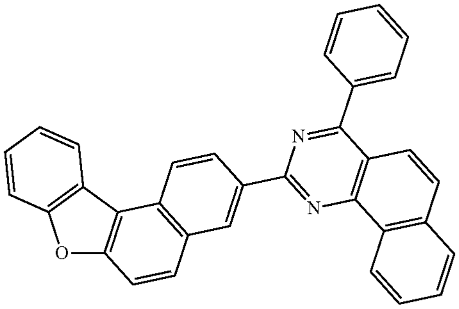
C-380
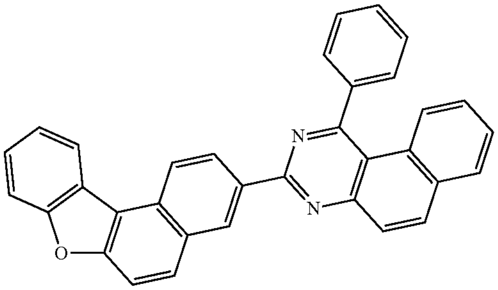

-continued
C-381
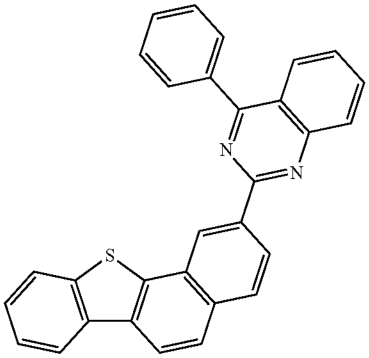
C-382
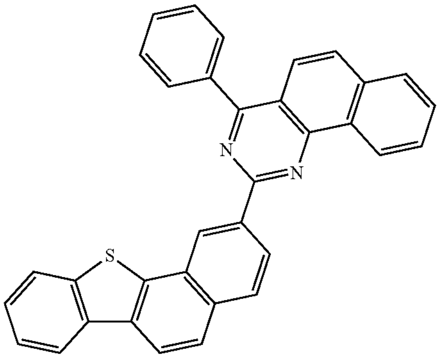
C-383
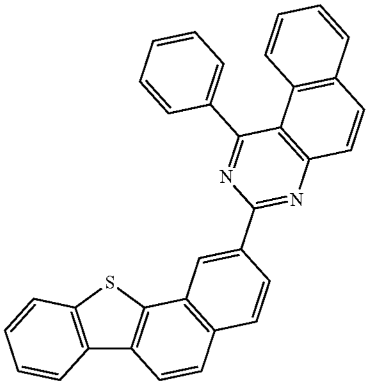
C-384
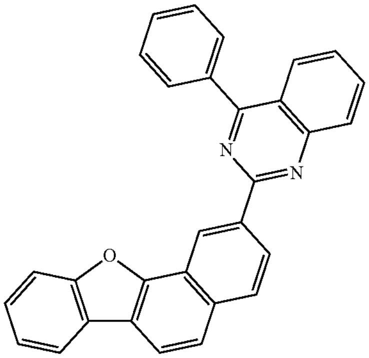
-continued
C-385
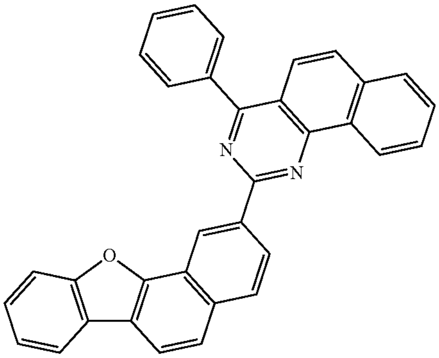
C-386
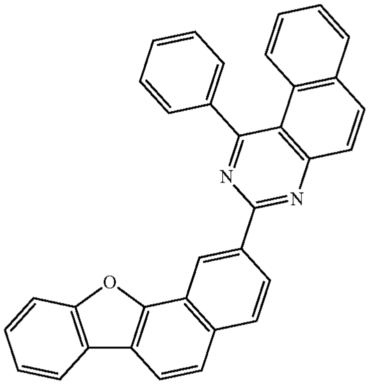
C-387
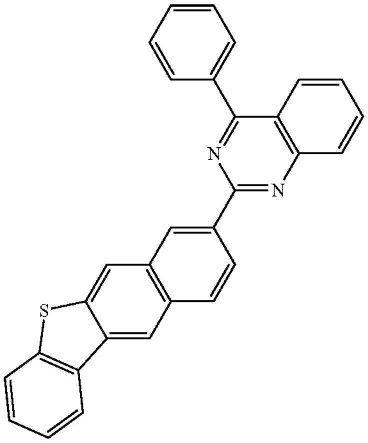
C-388
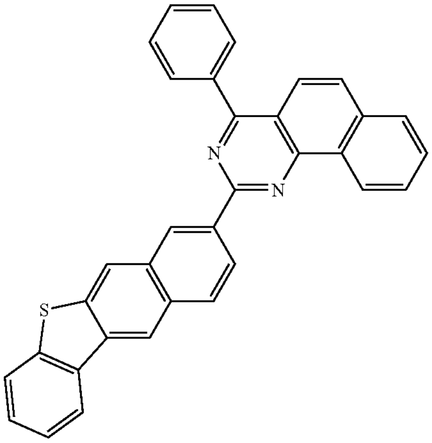

-continued
C-389
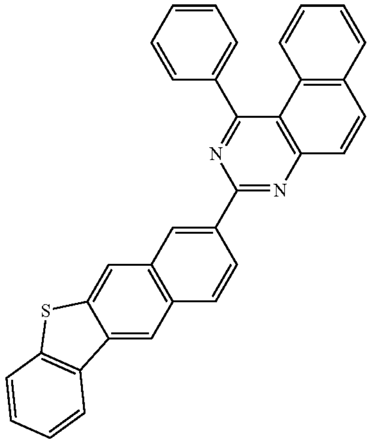
C-390
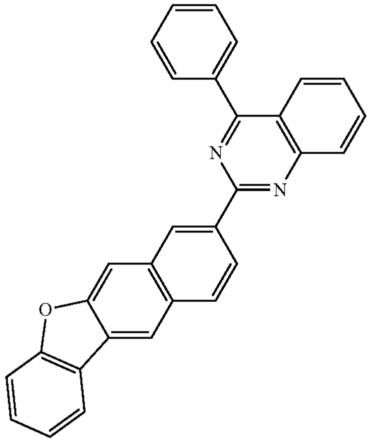
C-391
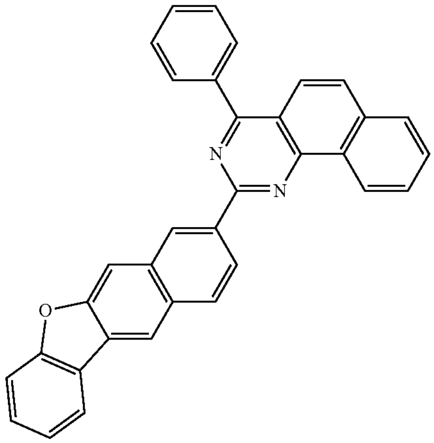
-continued
C-392
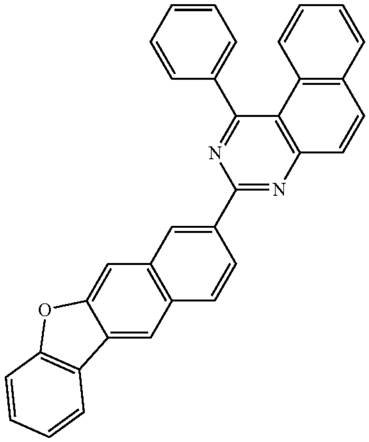
C-393
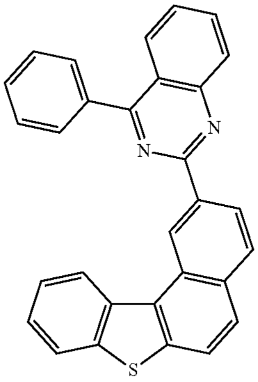
C-394
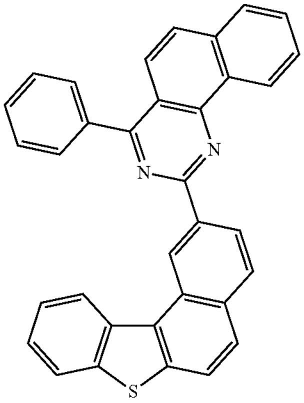

-continued
C-395
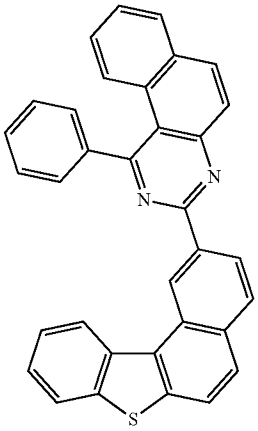
C-396
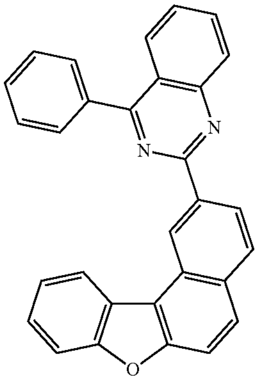
C-397
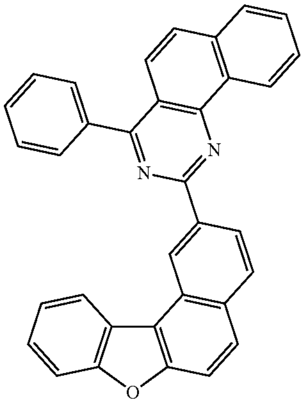
C-398
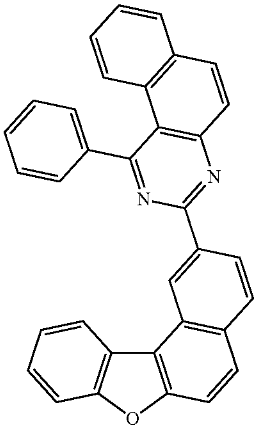
-continued
C-399
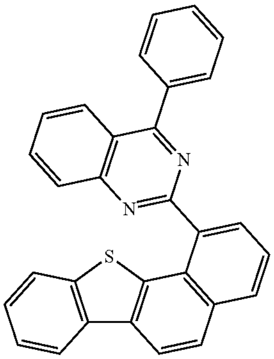
C-400
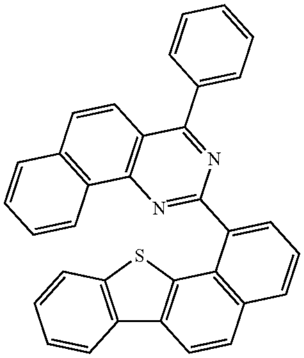
C-401
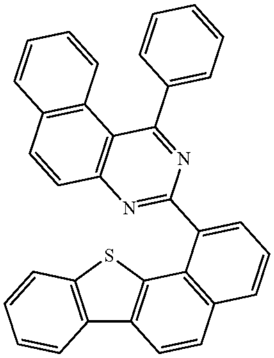
C-402
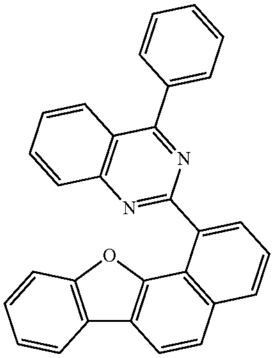

-continued
C-403
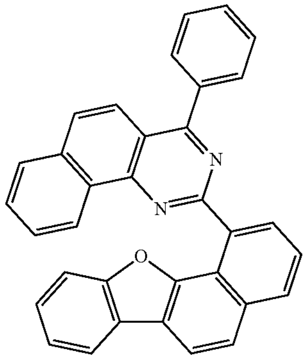
C-404
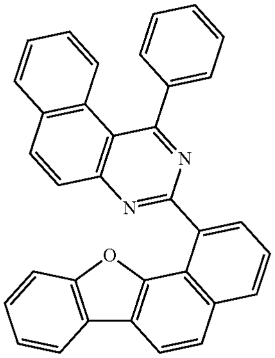
C-405
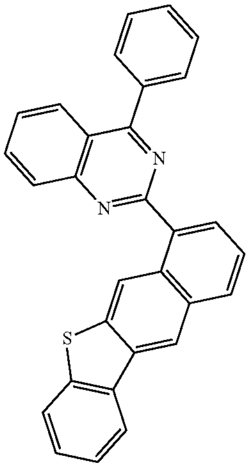
-continued
C-406
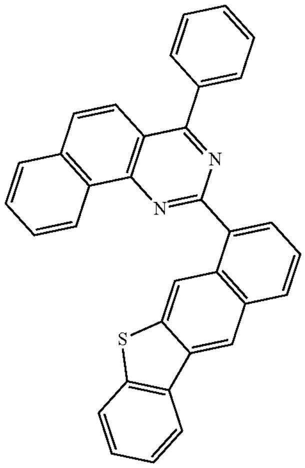
C-407
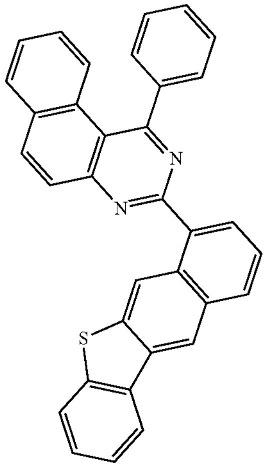
C-408
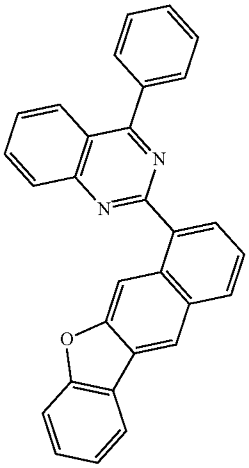

-continued
C-409
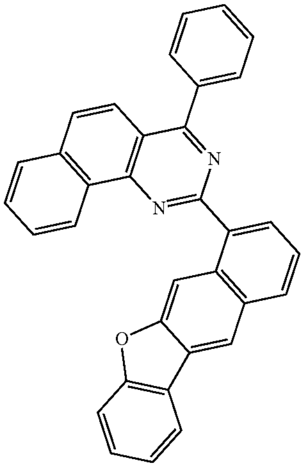
C-410
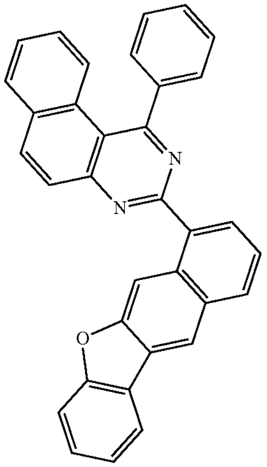
C-411
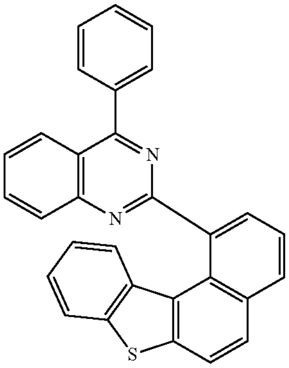
-continued
C-412
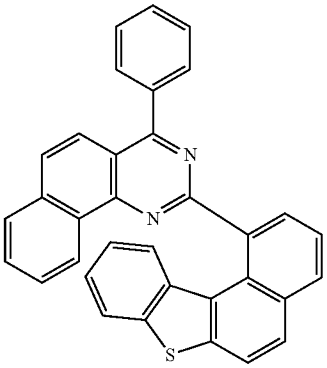
C-413
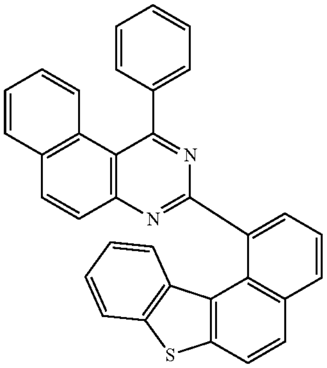
C-414
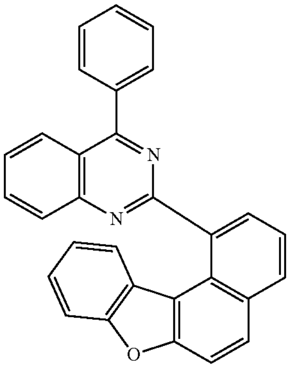
C-415
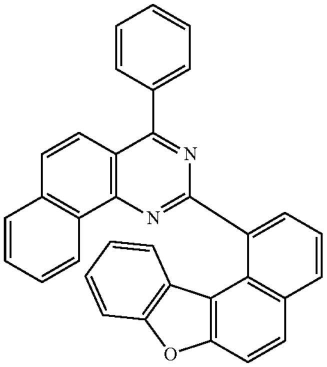

-continued
C-416
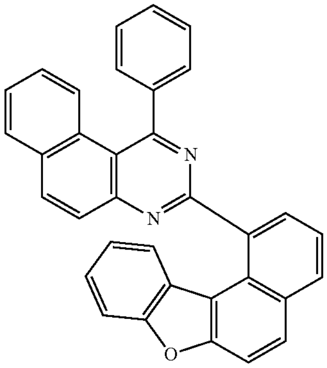
C-417
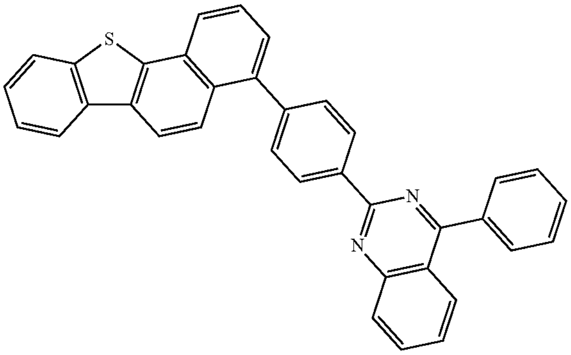
C-418
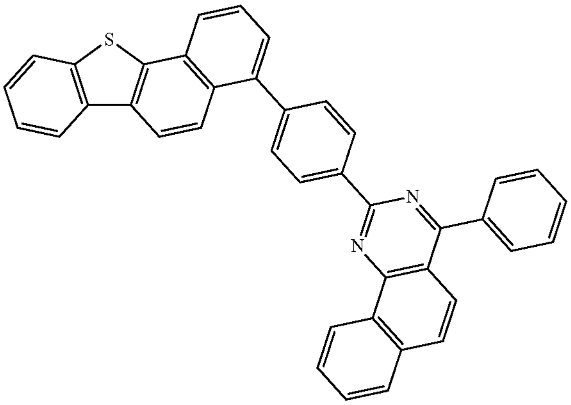
C-419
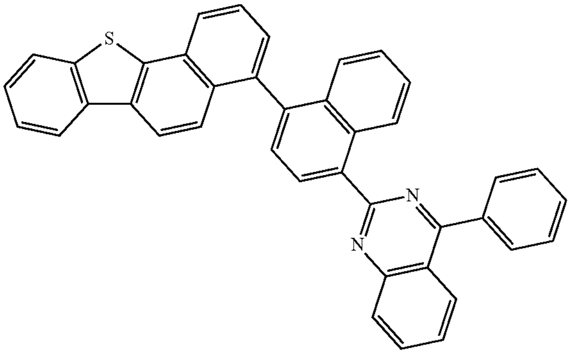
-continued
C-420
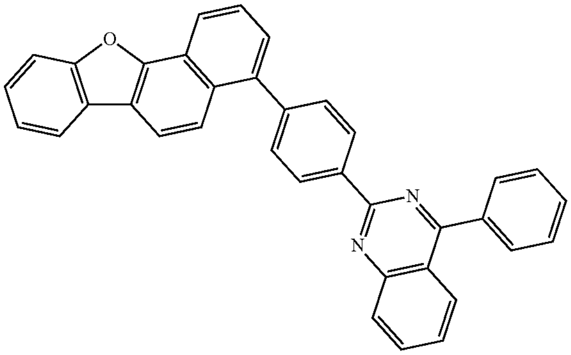
C-421
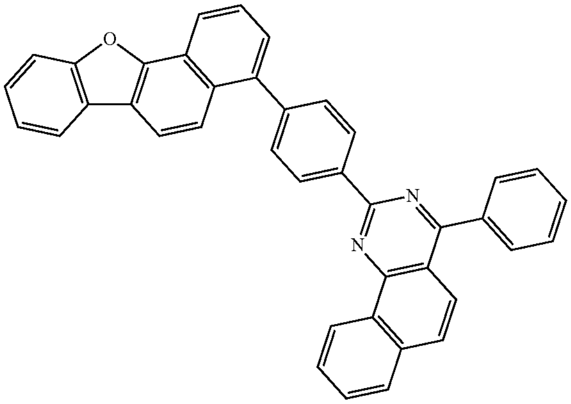
C-422
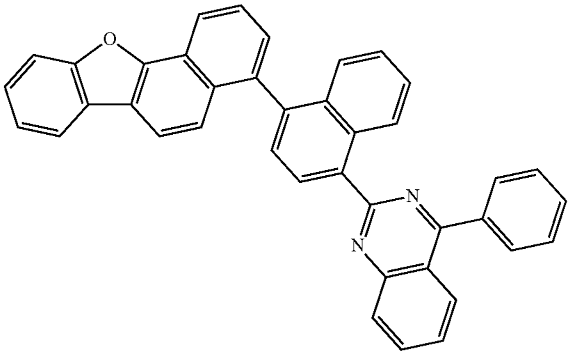
C-423
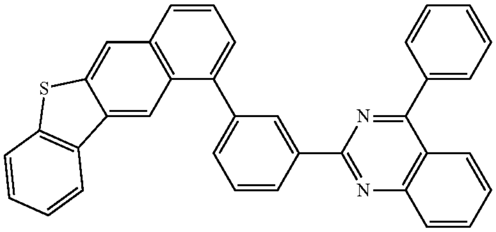

-continued
C-424
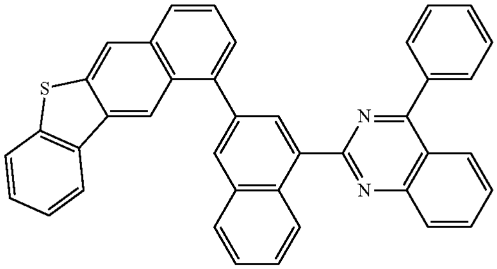
C-425
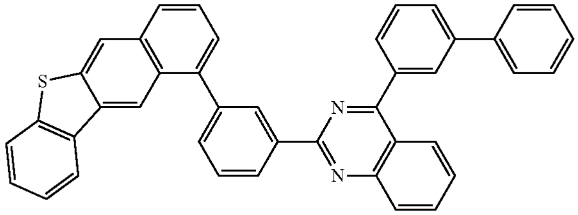
C-426
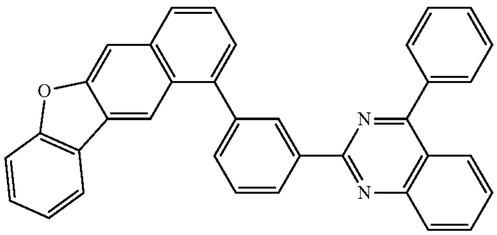
C-427
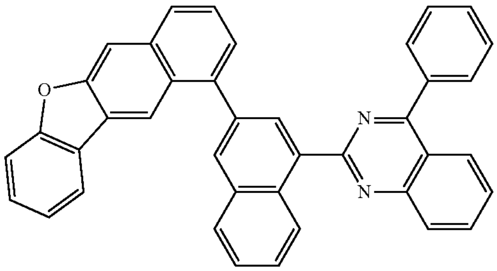
C-428
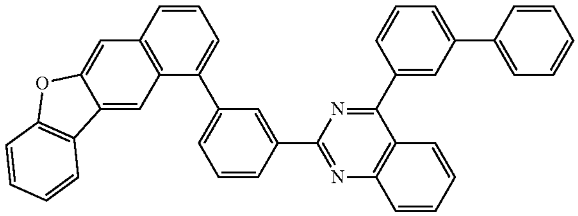
-continued
C-429
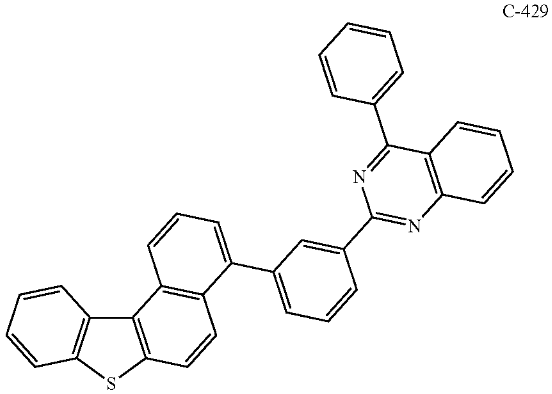
C-430
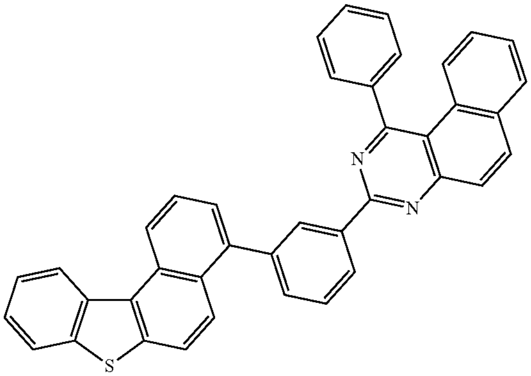
C-431
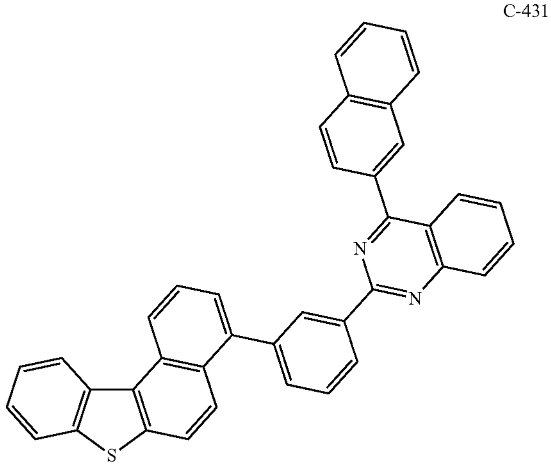
C-432
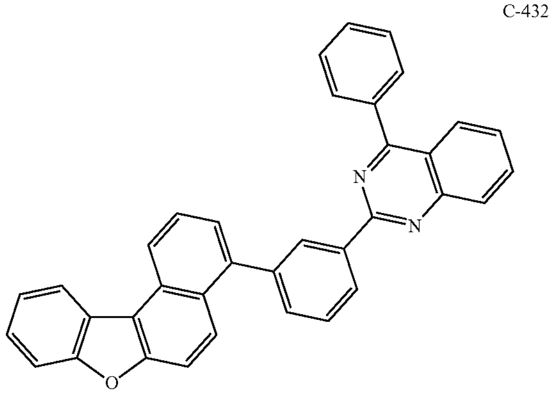

-continued
C-433
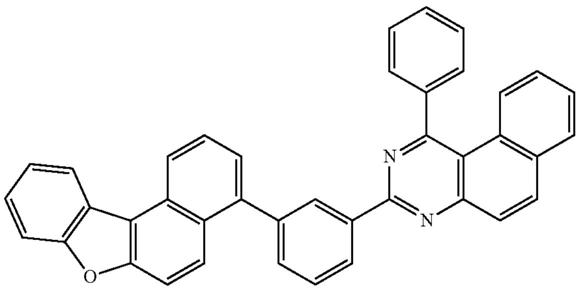
C-434
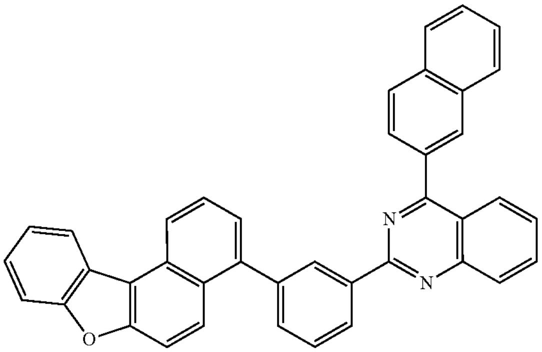
C-435
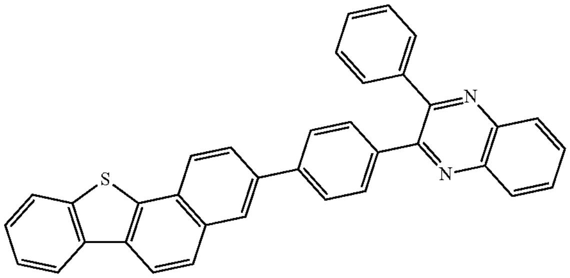
C-436
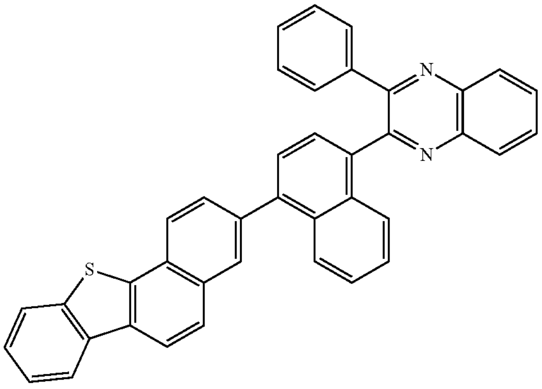
-continued
C-437
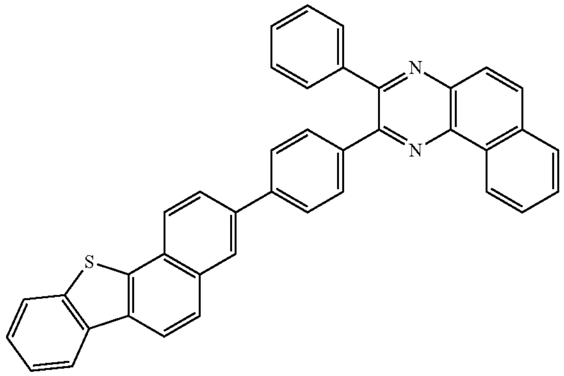
C-438
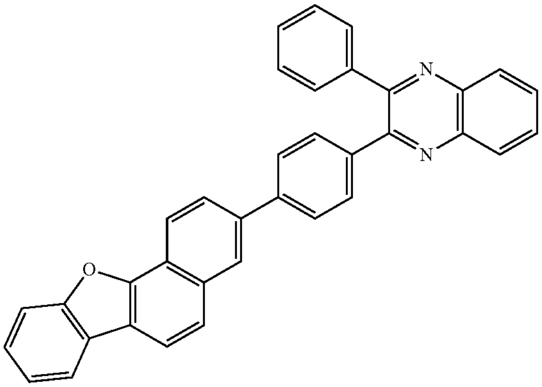
C-439
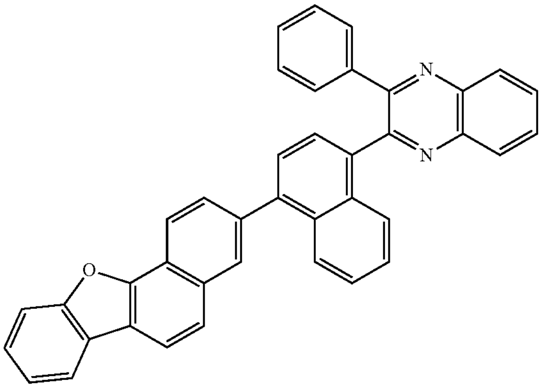
C-440
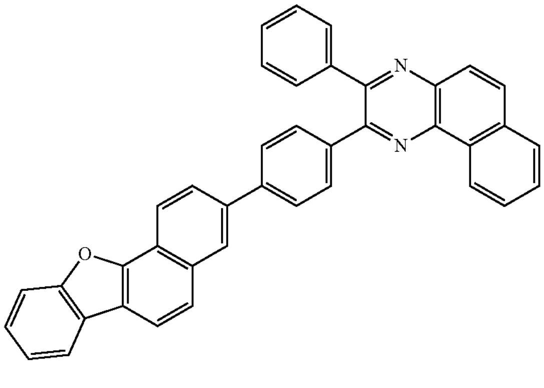

-continued
C-441
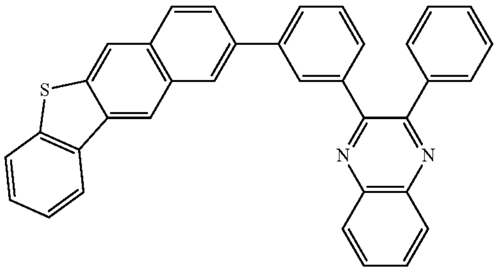
C-442
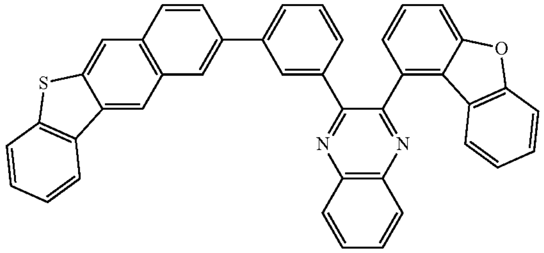
C-443
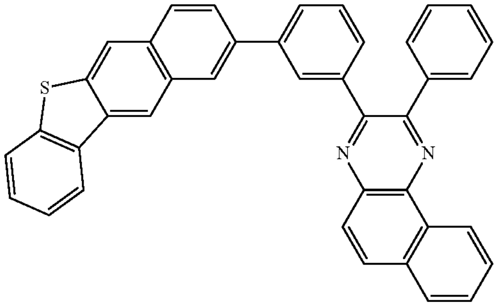
C-444
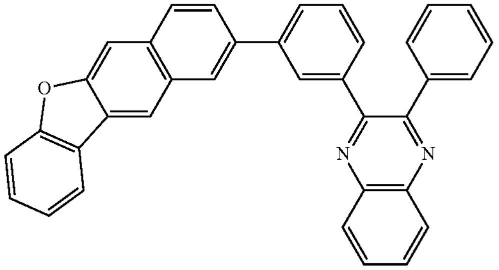
C-445
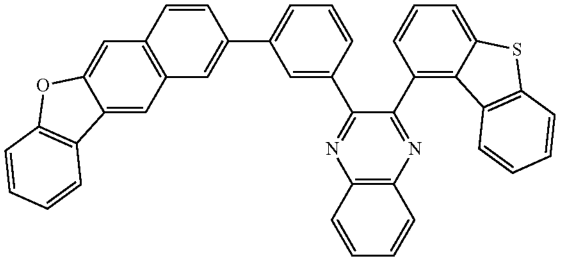
-continued
C-446
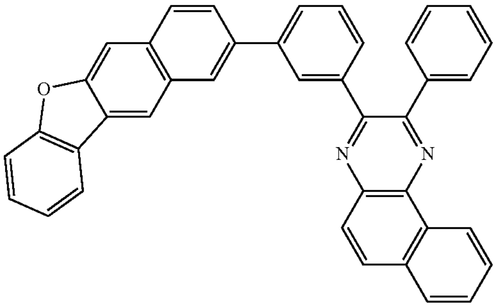
C-447
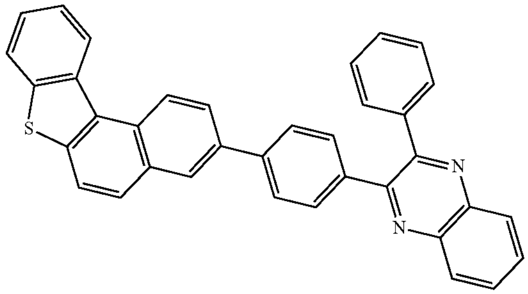
C-448
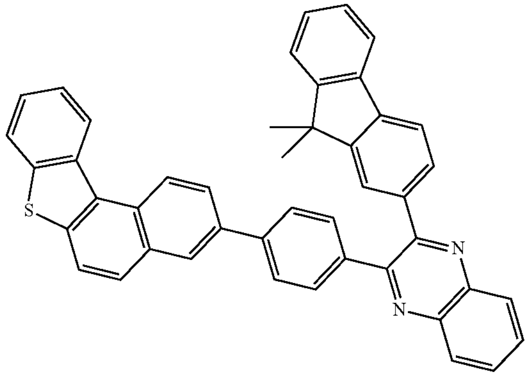
C-449
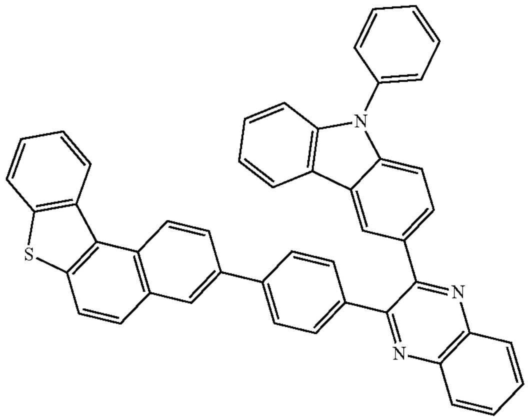

-continued
C-450
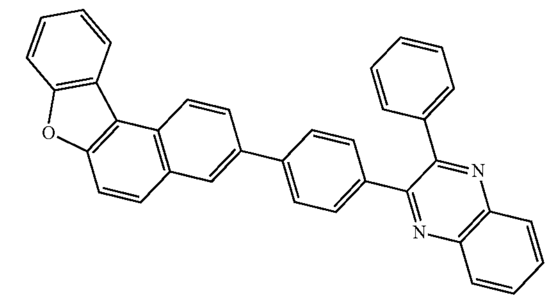
C-451
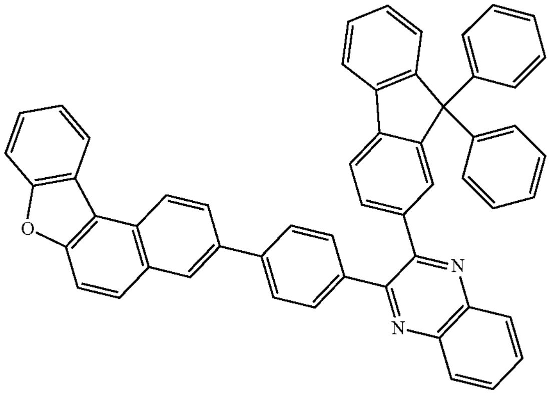
C-452
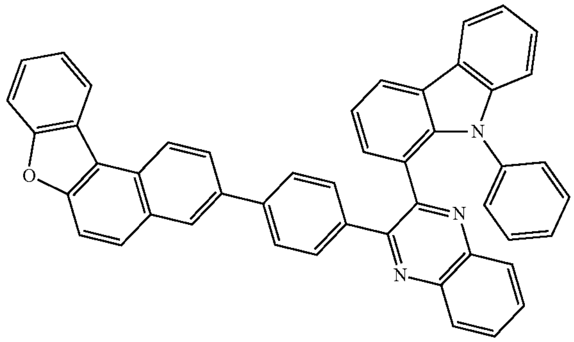
C-453
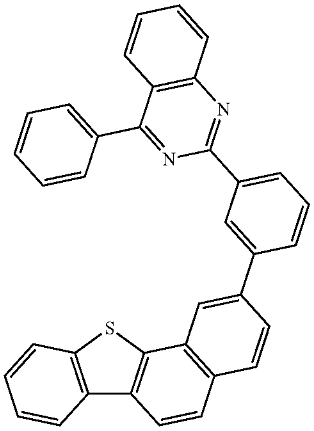
-continued
C-454
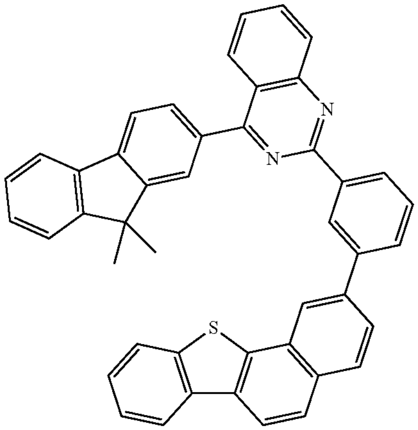
C-455
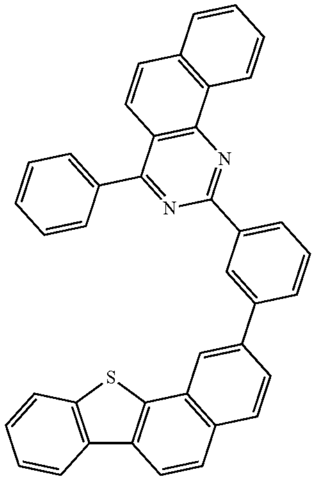
C-456
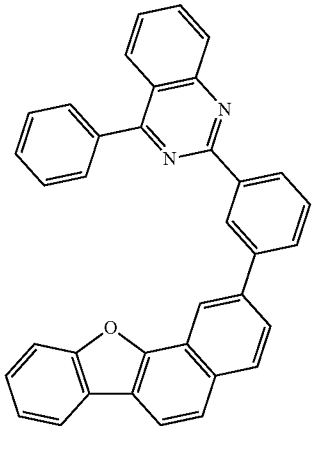

-continued
C-457
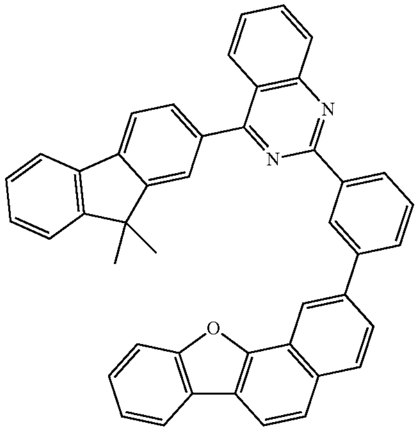
C-458
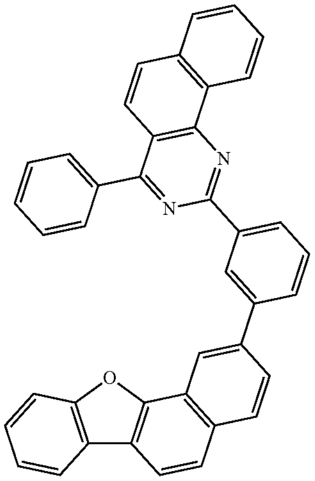
C-459
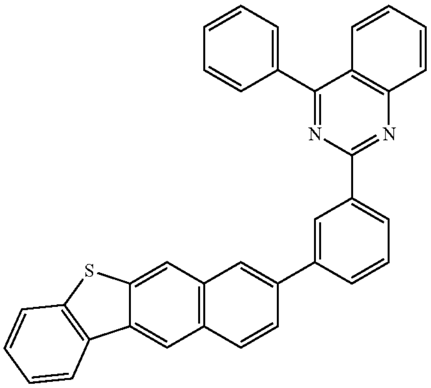
-continued
C-460
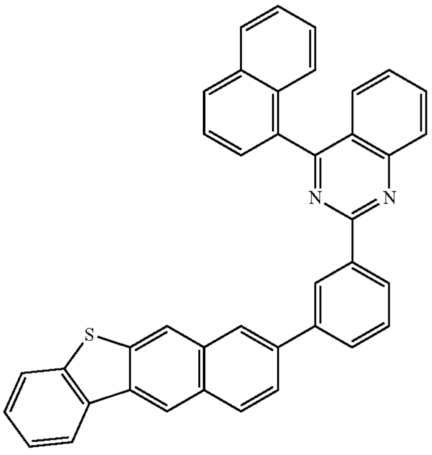
C-461
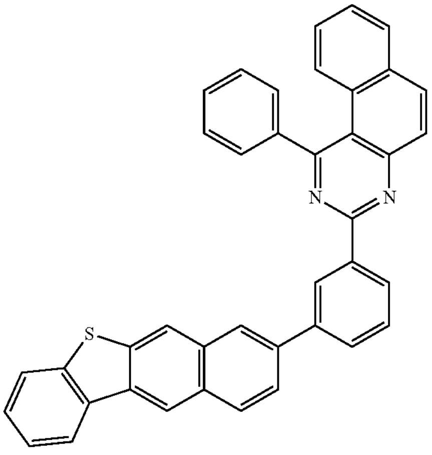
C-462
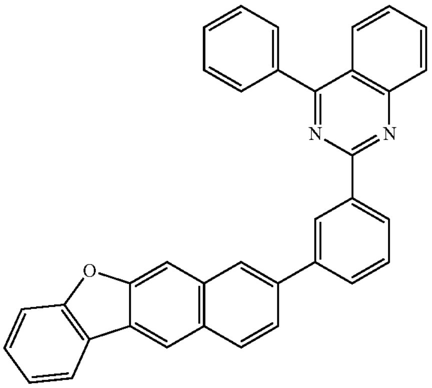

-continued
C-463
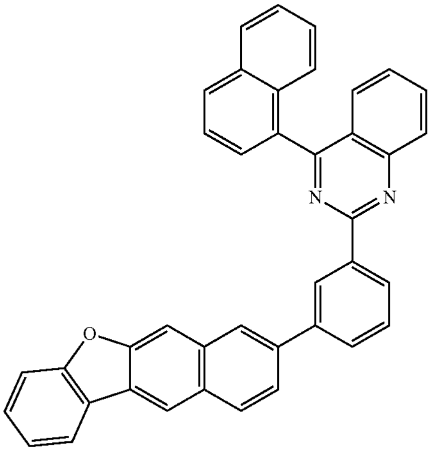
C-464
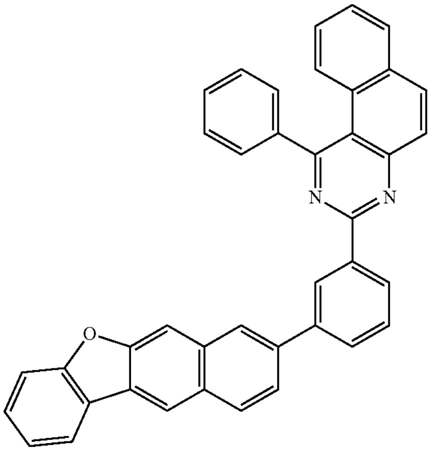
C-465
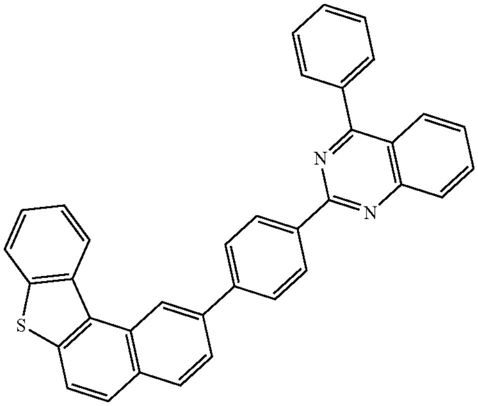
-continued
C-466
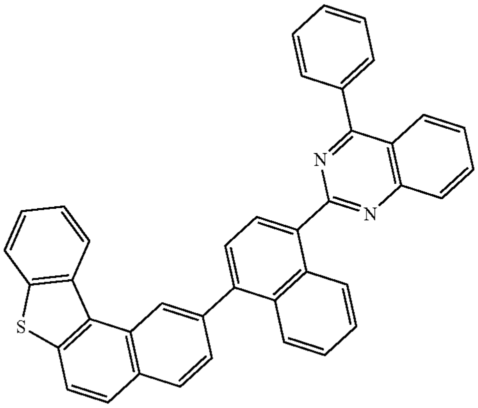
C-467
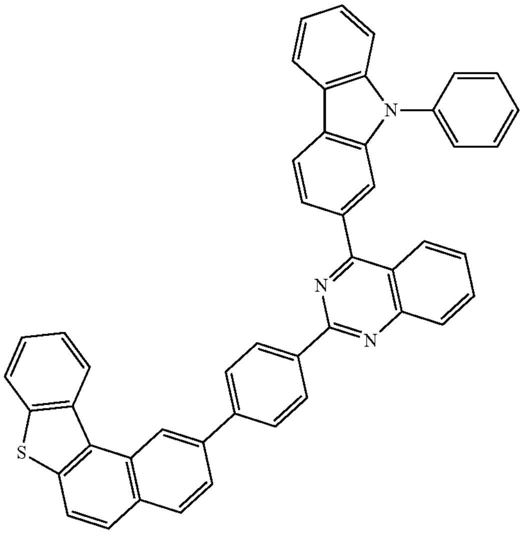
C-468
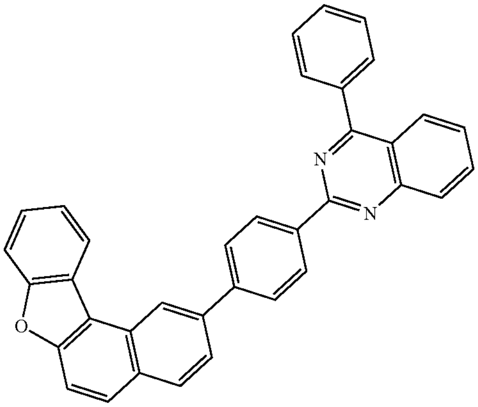

C-469
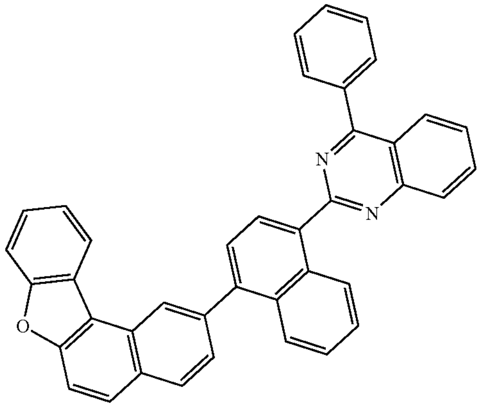
C-470
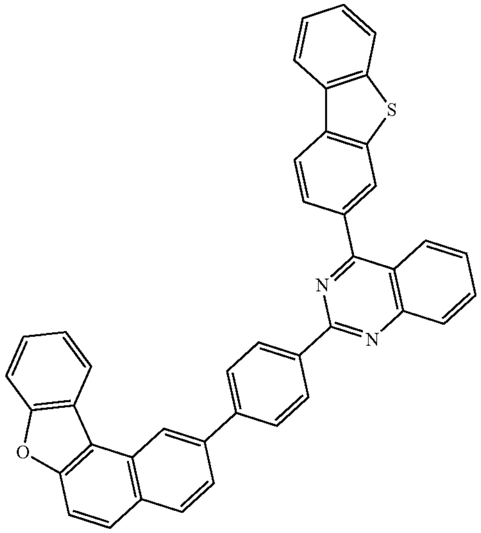
C-471
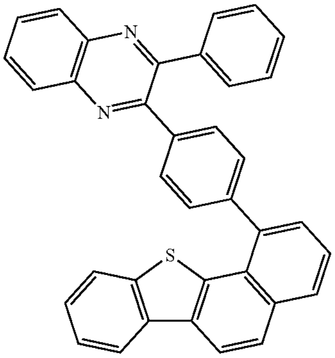
C-472
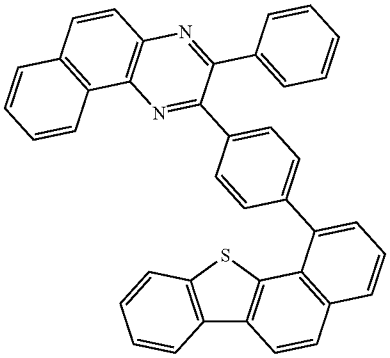
C-473
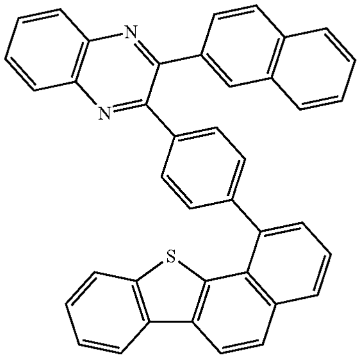
C-474
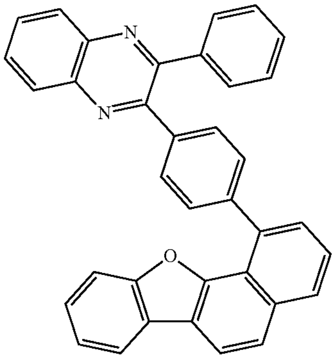
C-475
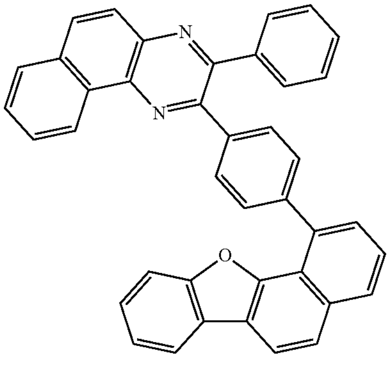

-continued
C-476
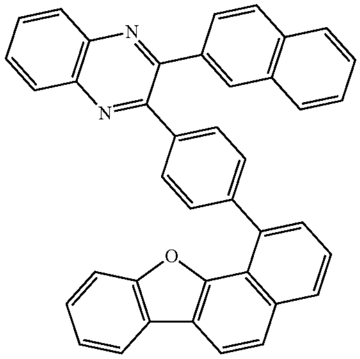
C-477
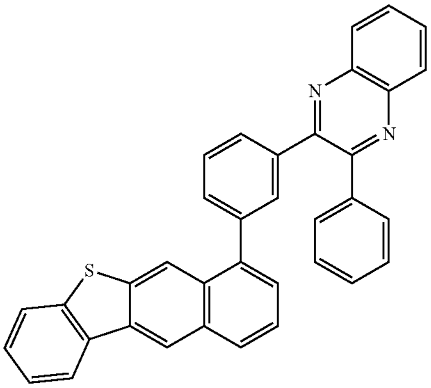
C-478
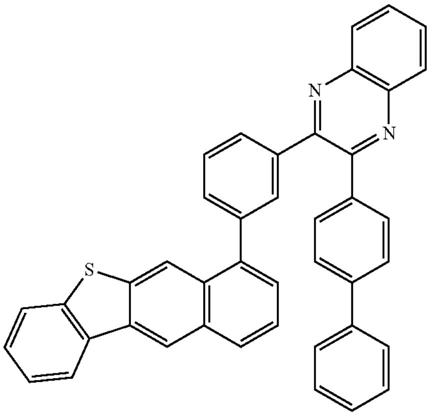
C-479
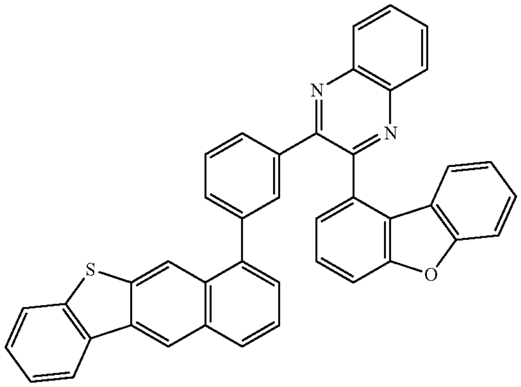
-continued
C-480
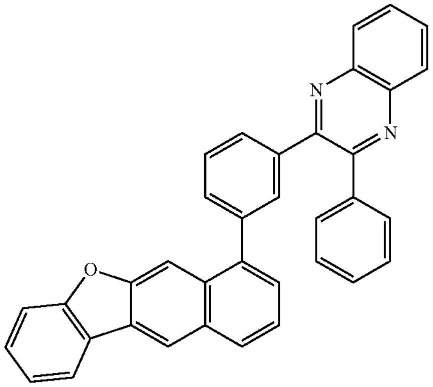
C-481
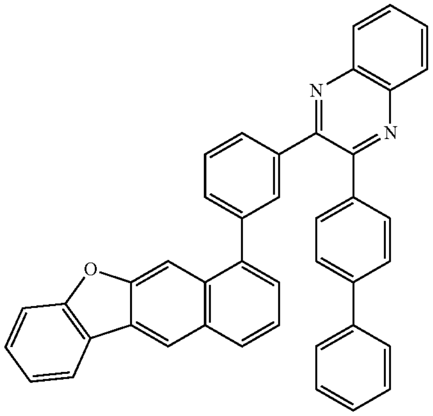
C-482
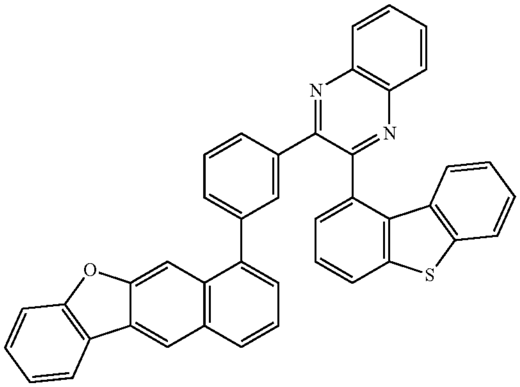
C-483
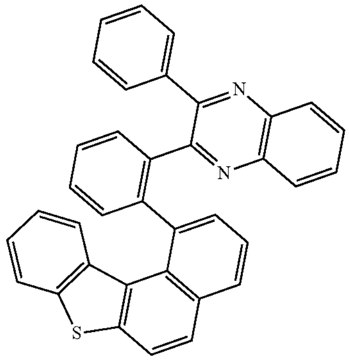

-continued
C-484
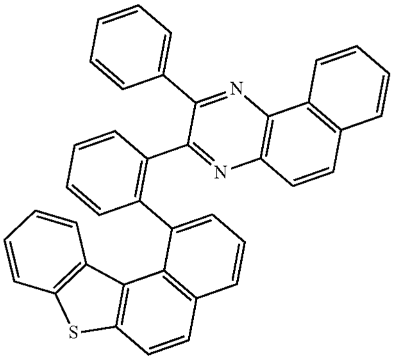
C-485
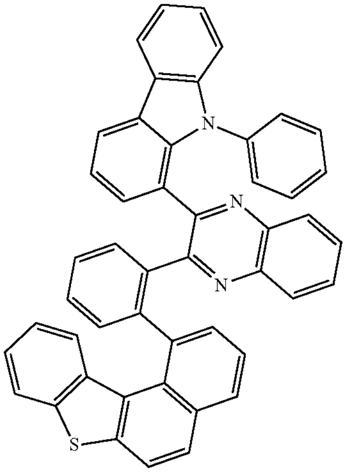
C-486
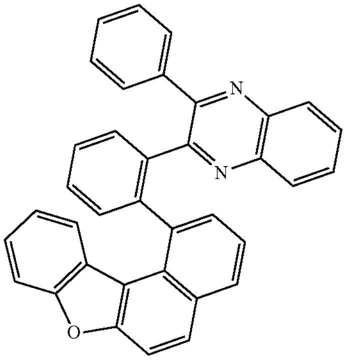
C-487
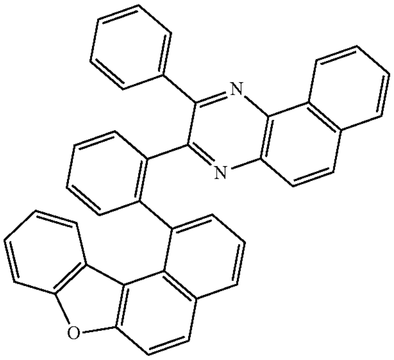
-continued
C-488
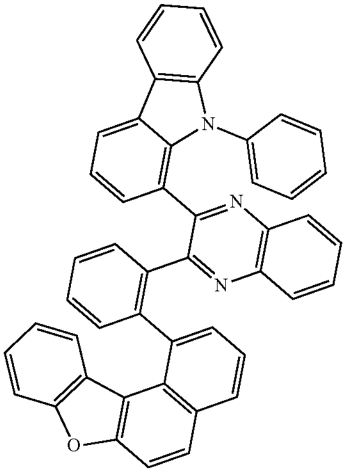
C-489
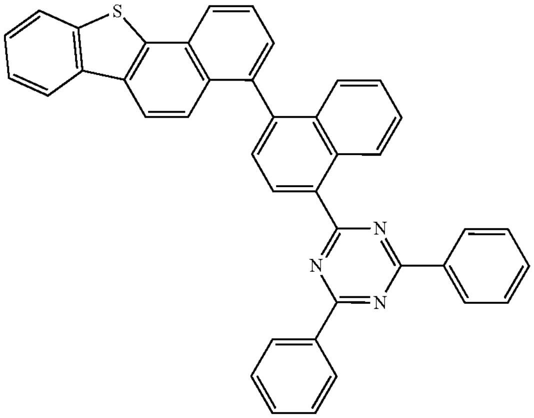
C-490
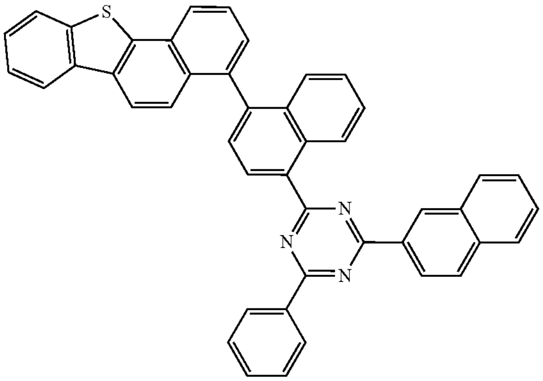

-continued
C-491
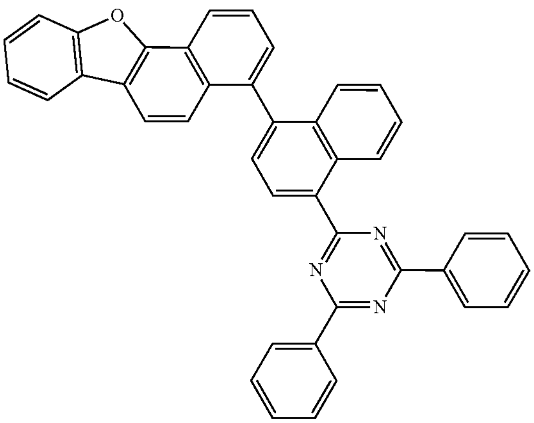
C-492
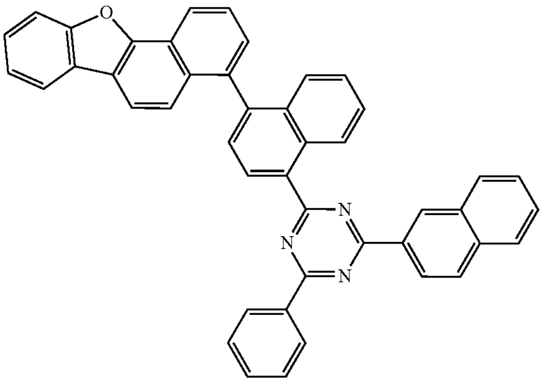
C-493
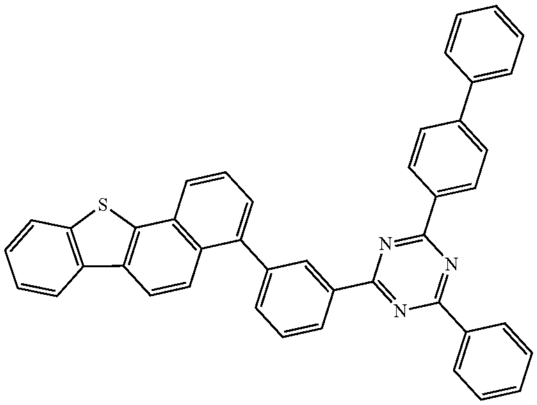
C-494
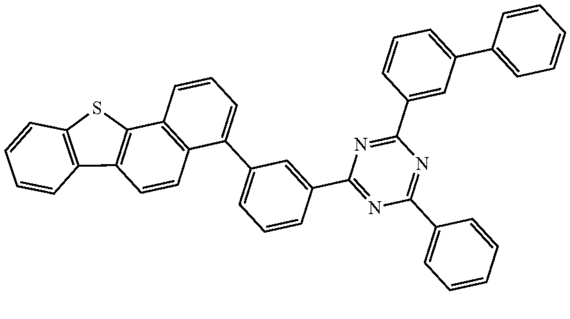
-continued
C-495
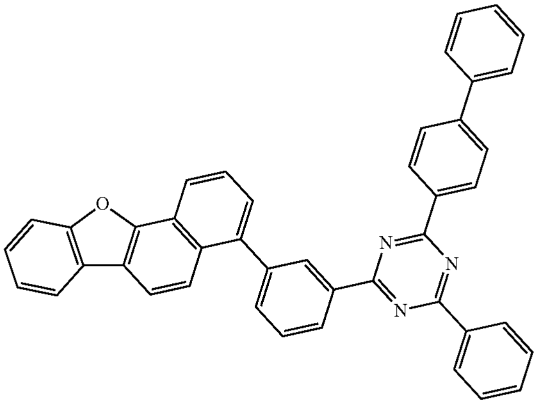
C-496
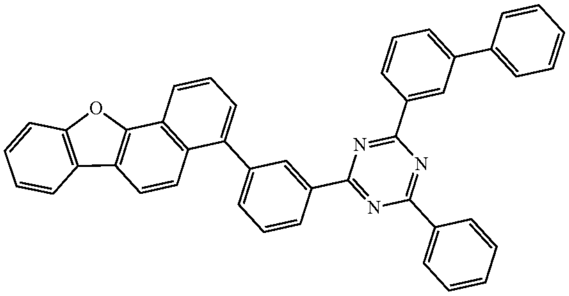
C-497
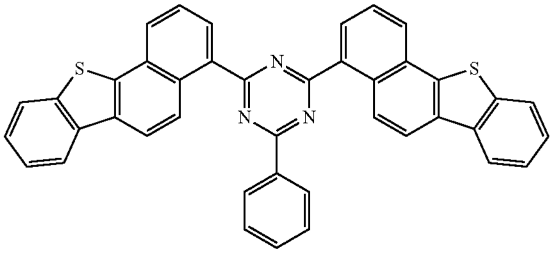
C-498
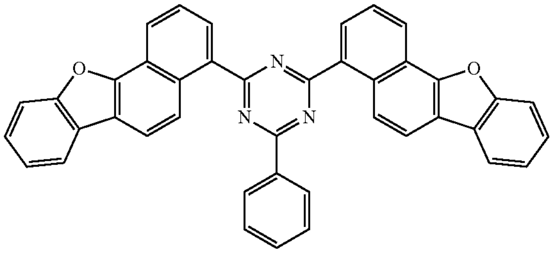
C-499
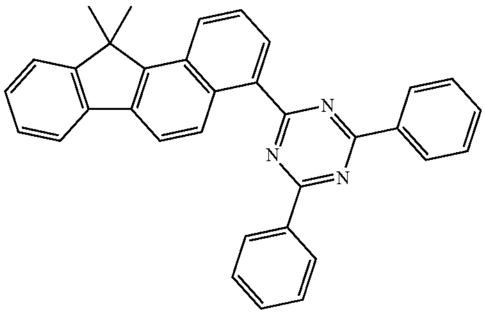

-continued
C-500
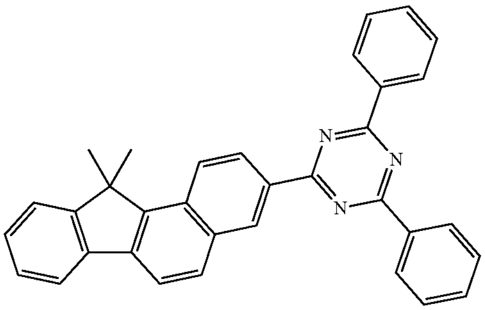
C-501
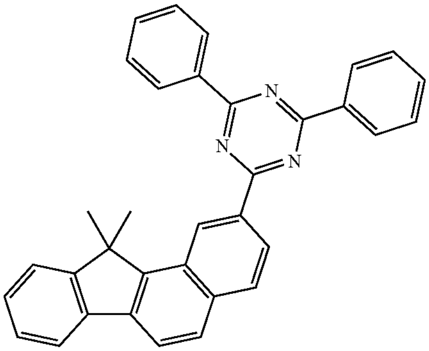
C-502
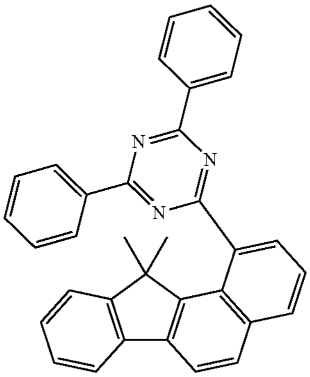
C-503
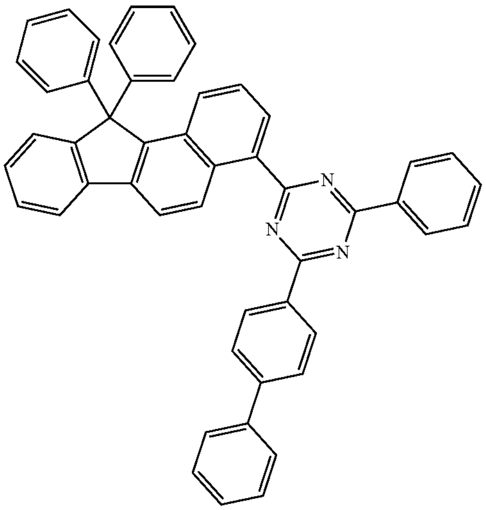
-continued
C-504
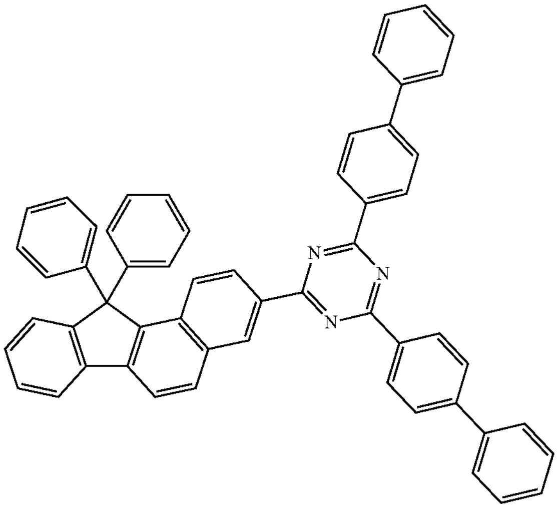
C-505
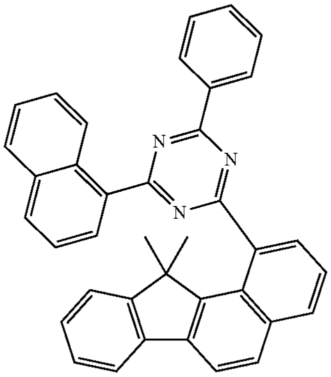
C-506
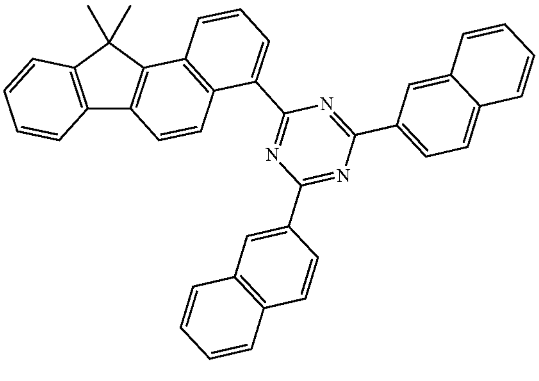

-continued
C-507
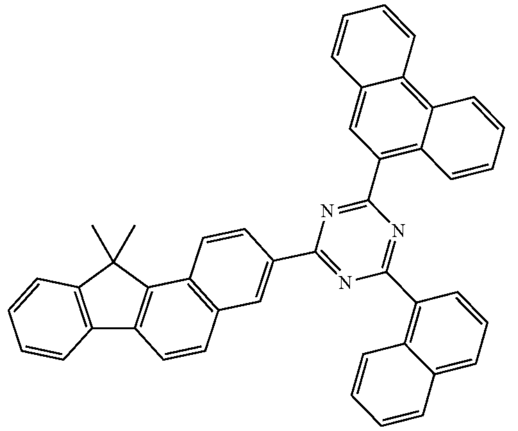
C-508
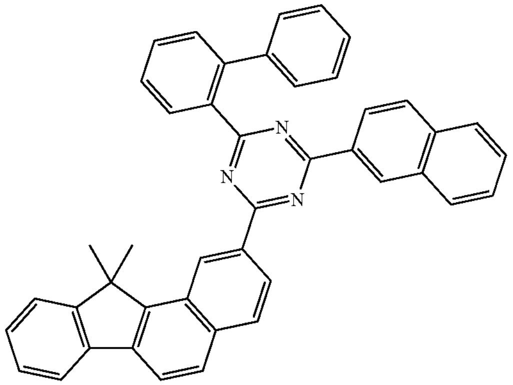
C-509
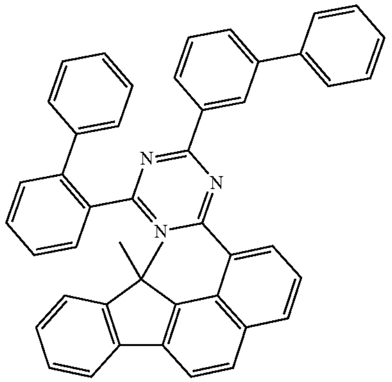
C-510
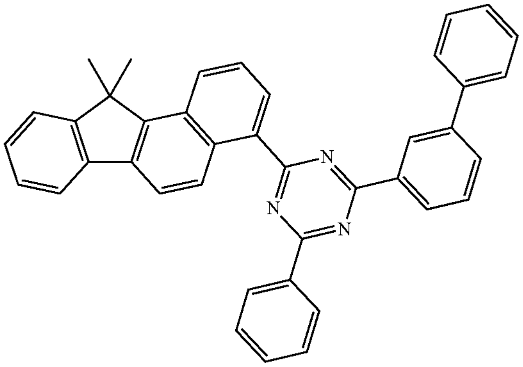
-continued
C-511
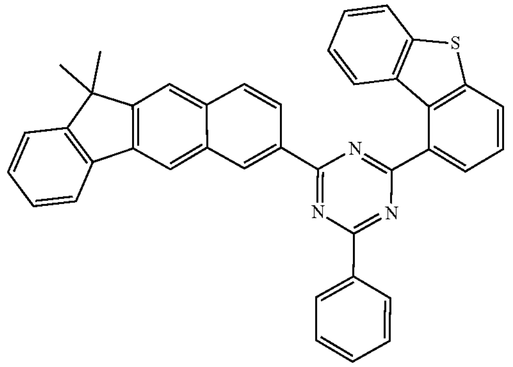
C-512
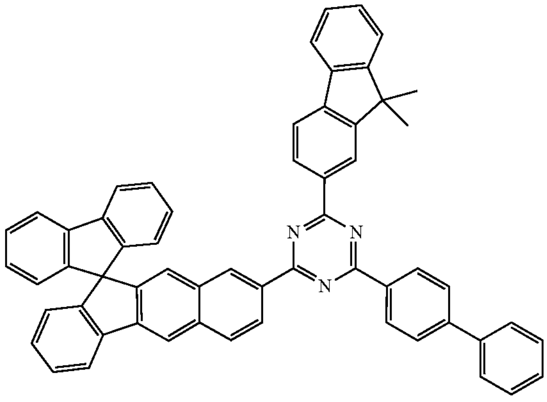
C-513
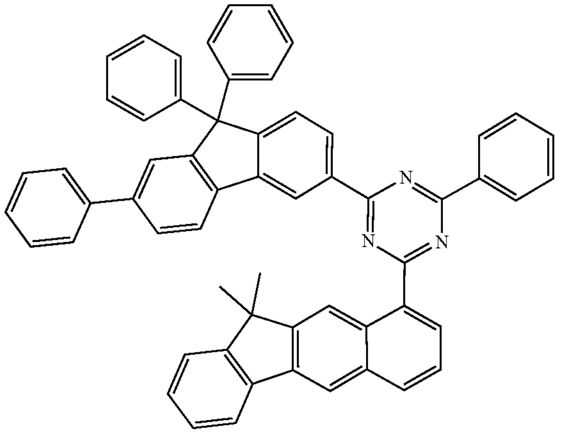
C-514
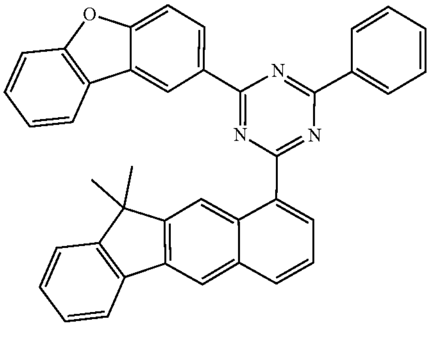

-continued
C-515
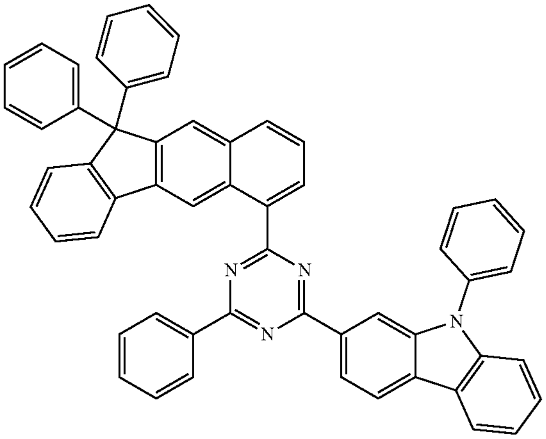
C-516
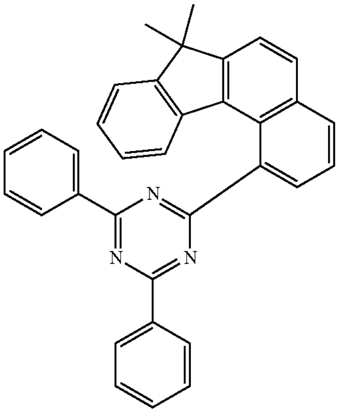
C-517
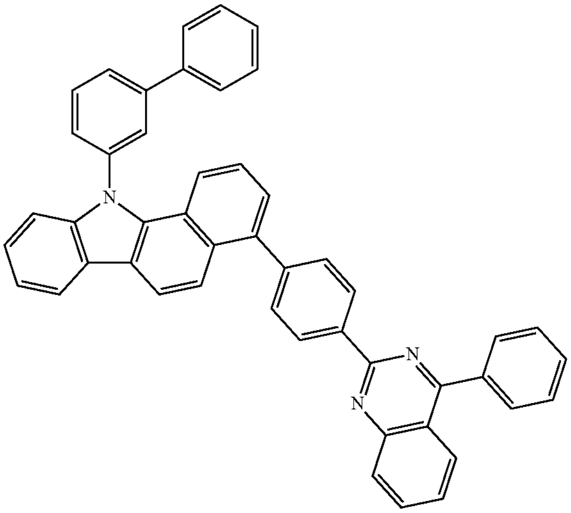
-continued
C-518
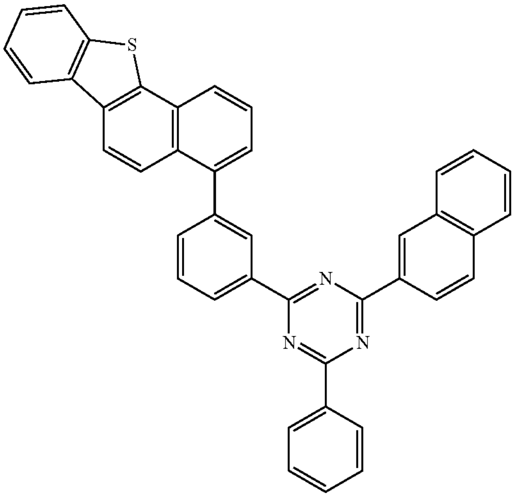
C-519
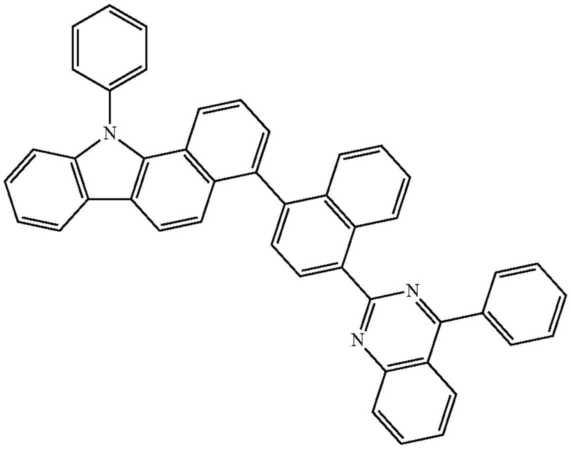
C-520
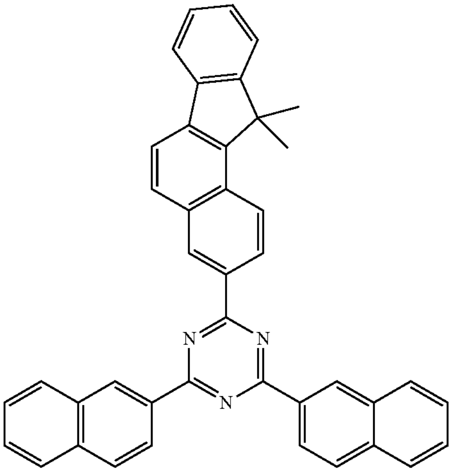

-continued
C-521
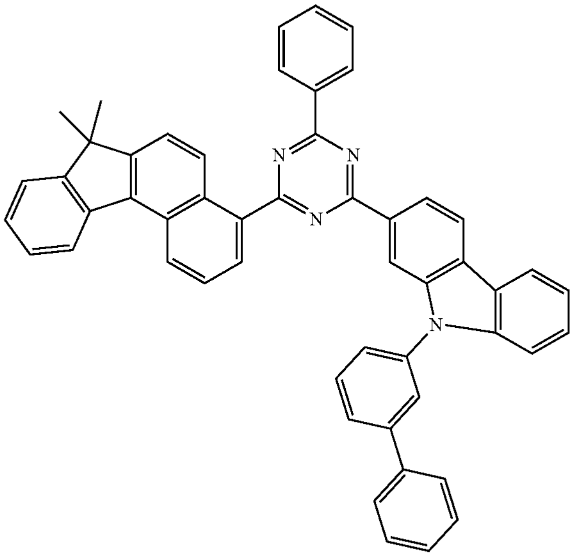
C-522
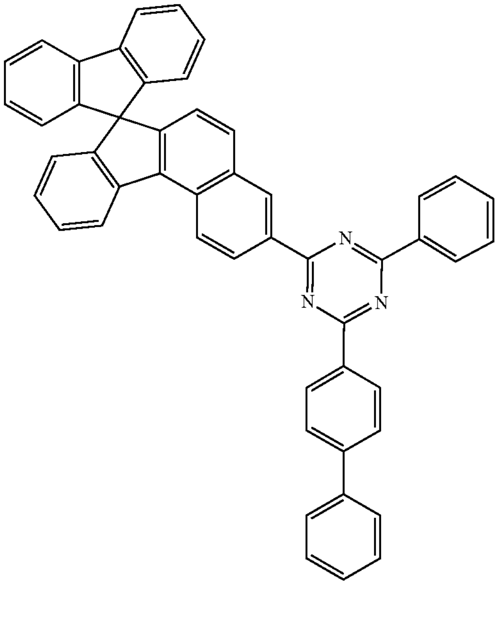
-continued
C-523
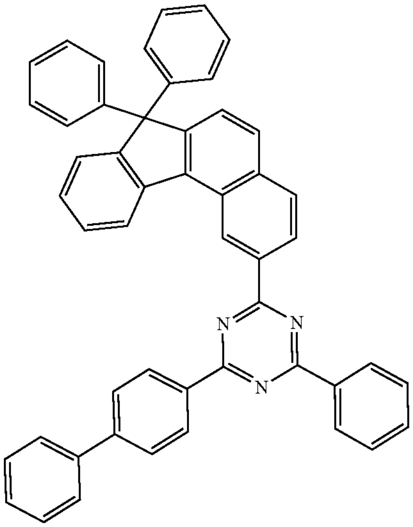
C-524
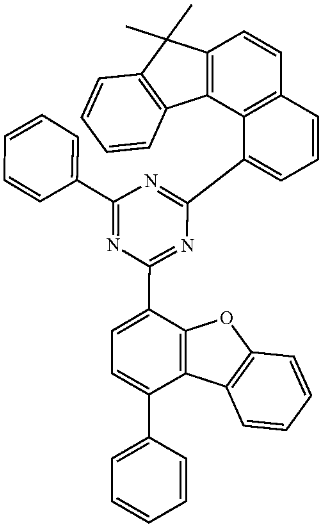
C-525
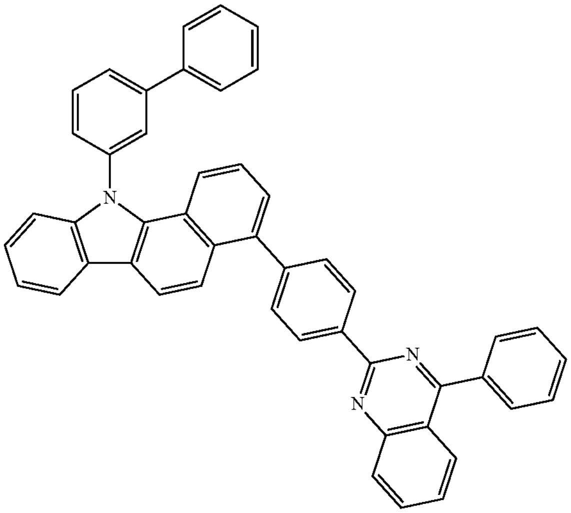

-continued
C-526
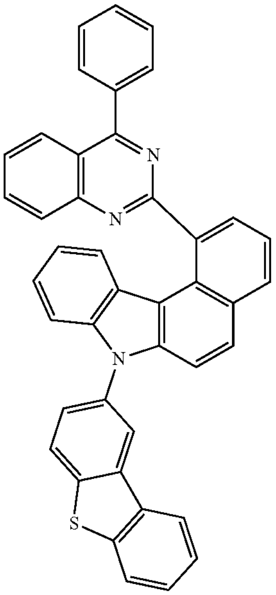
C-527
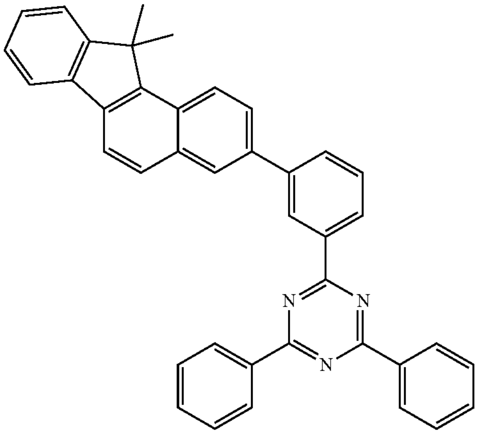
C-528
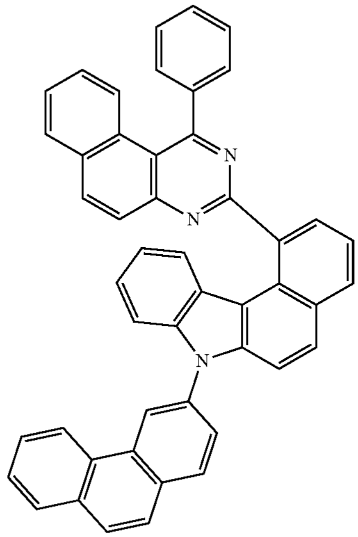
-continued
C-529
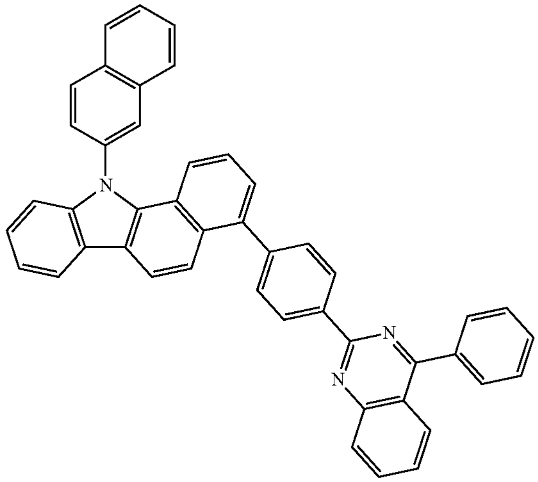
C-530
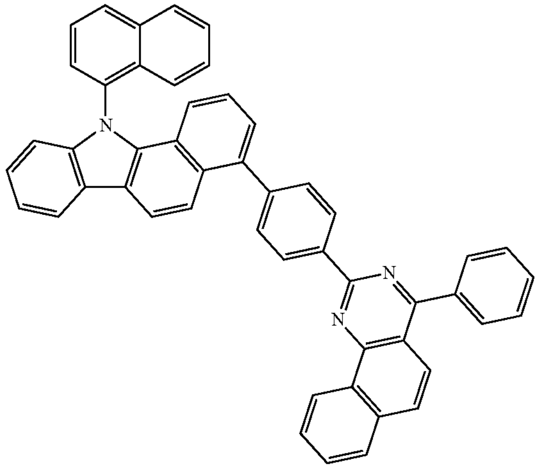
C-531
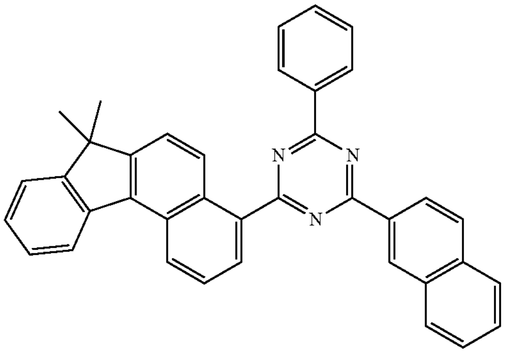

-continued
C-532
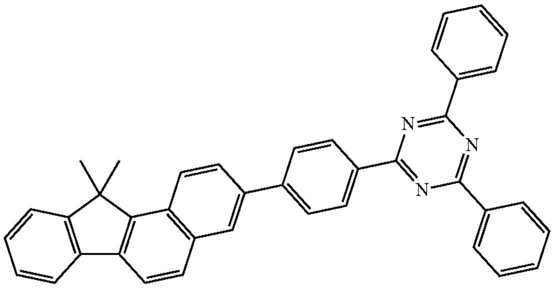
C-533
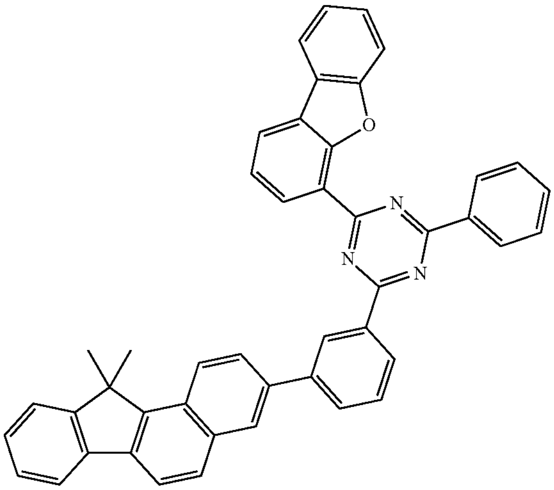
C-534
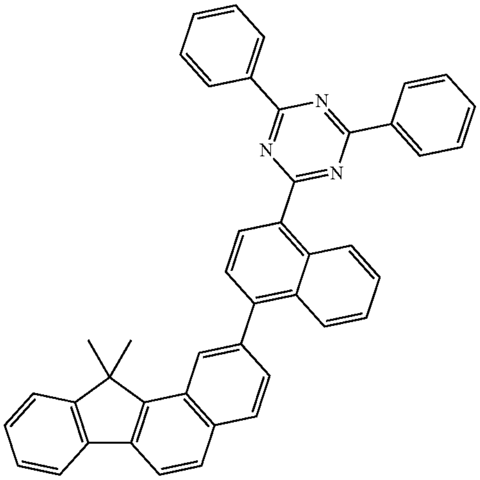
-continued
C-535
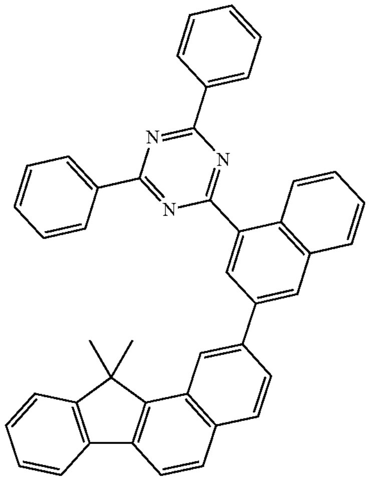
C-536
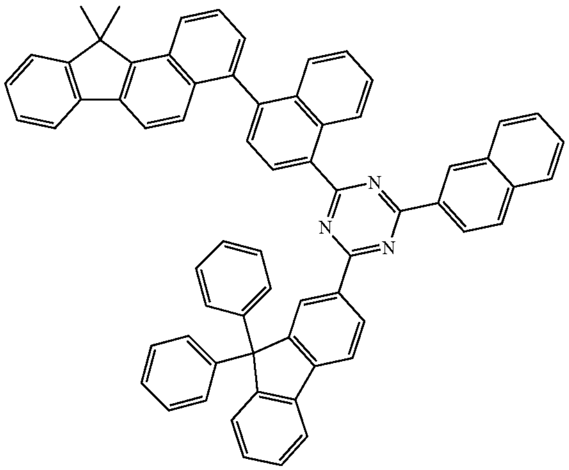
C-537
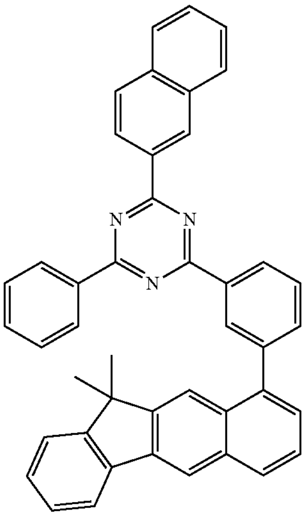

-continued
C-538
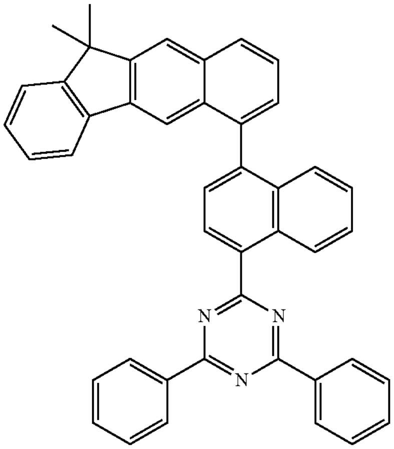
C-539
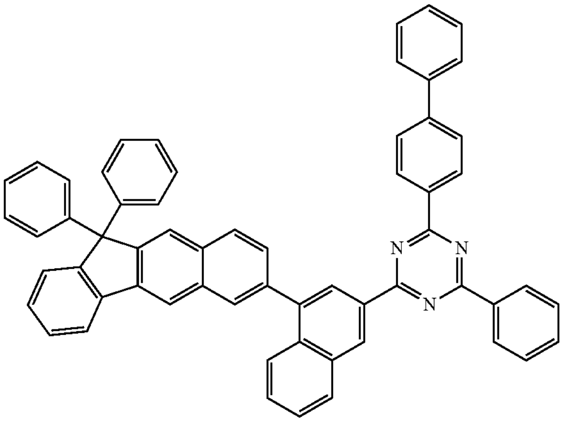
C-540
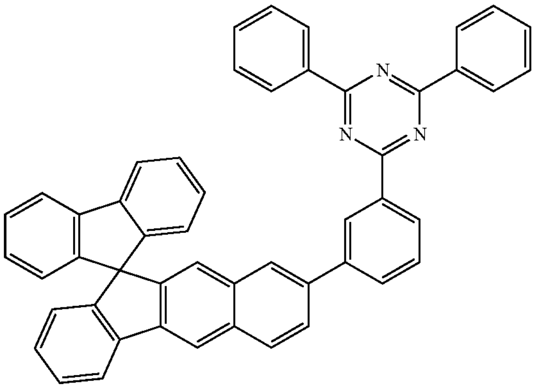
-continued
C-541
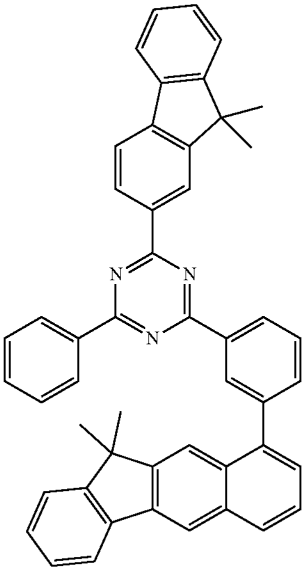
C-542
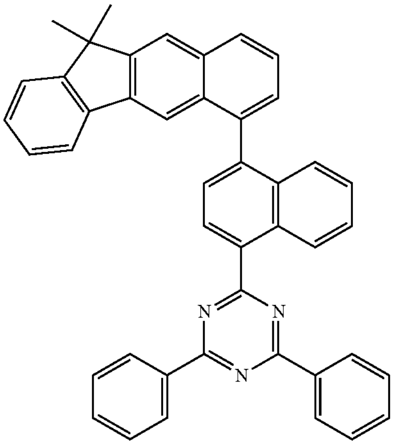
C-543
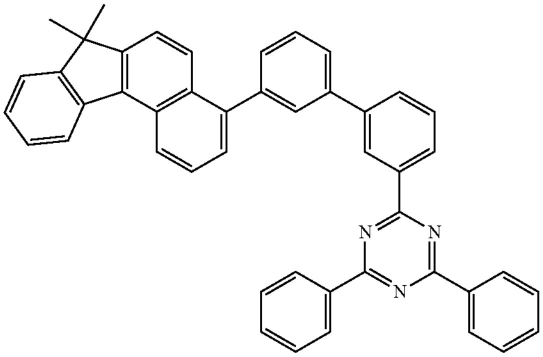

-continued
C-544
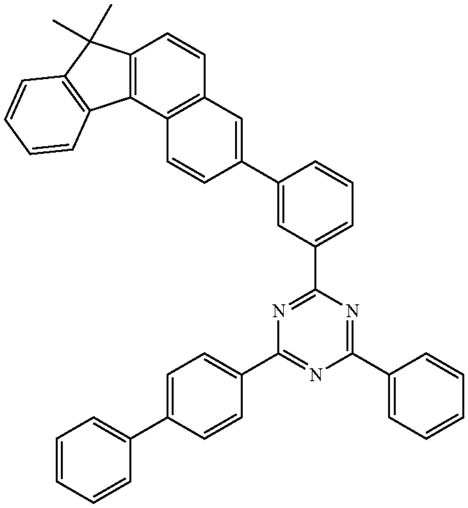
C-545
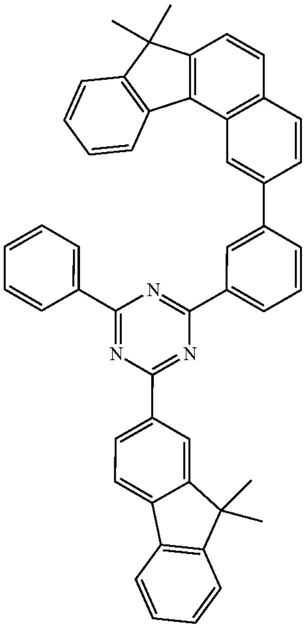
C-546
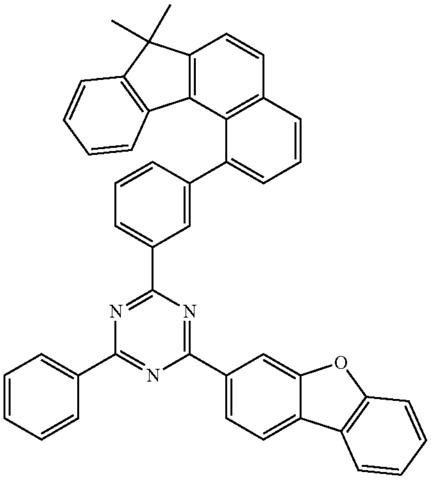
-continued
C-547
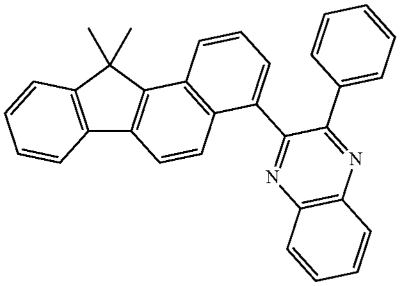
C-548
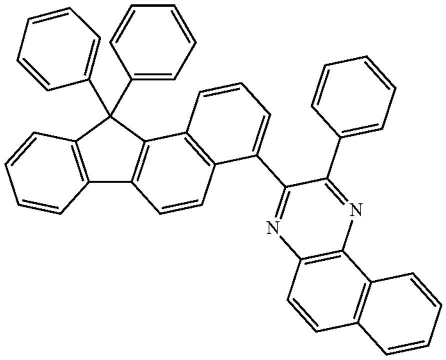
C-549
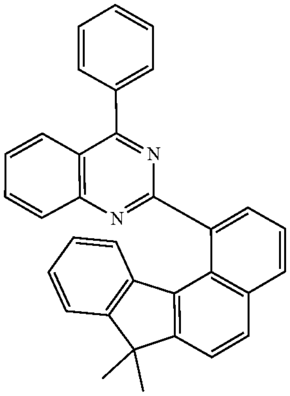
C-550
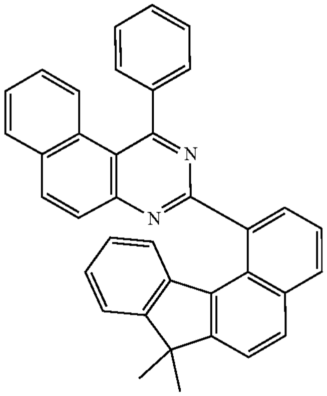

-continued
C-551
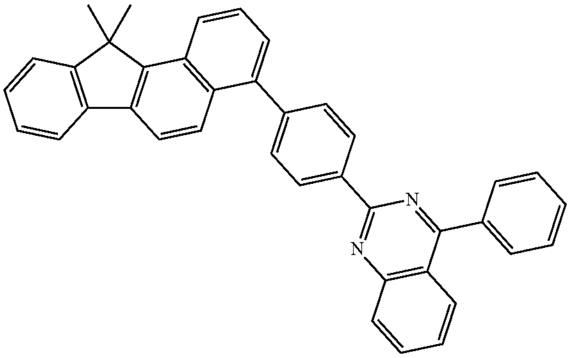
C-552
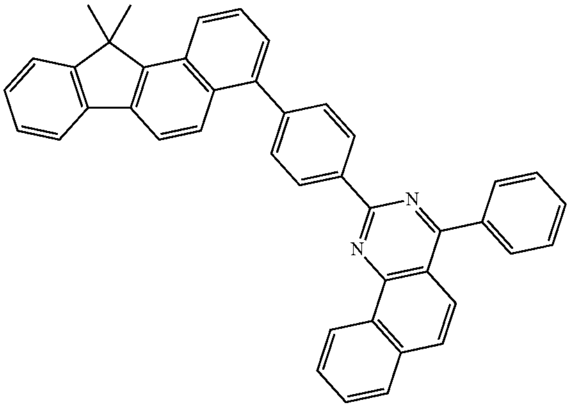
C-553
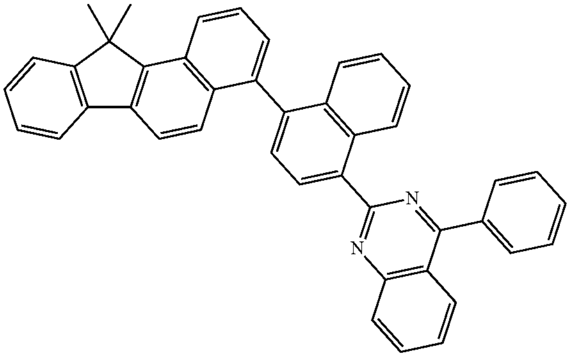
C-554
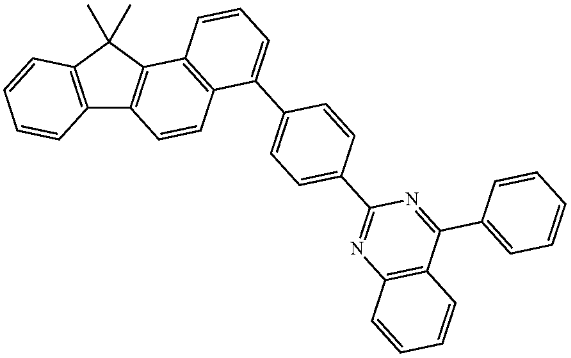
-continued
C-555
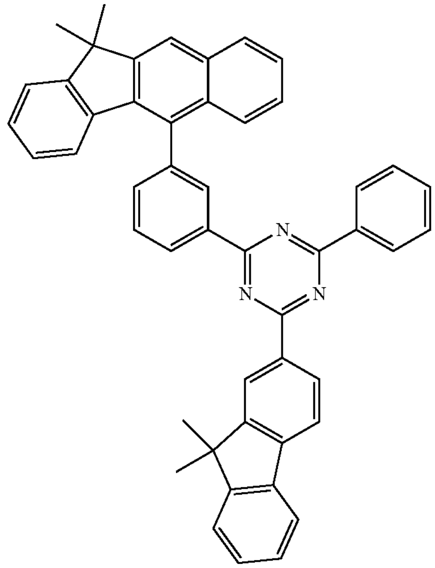
C-556
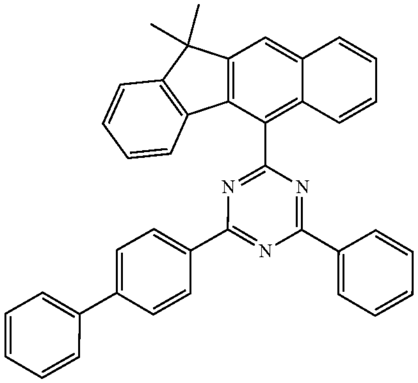
C-557
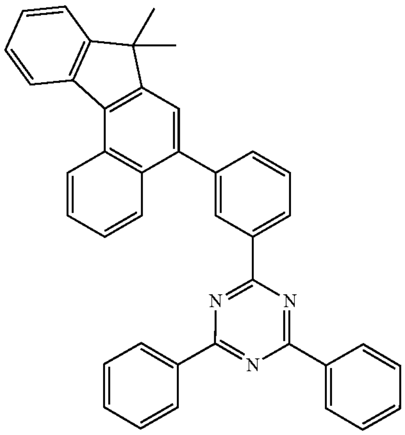

-continued
C-558
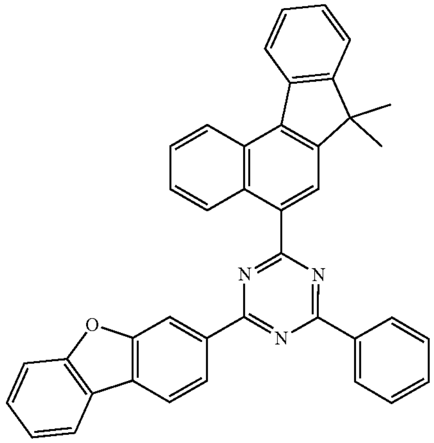
C-559
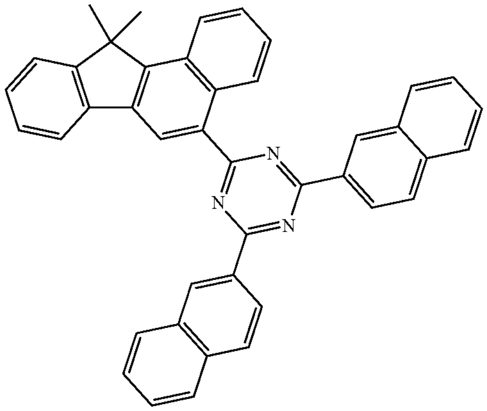
C-560
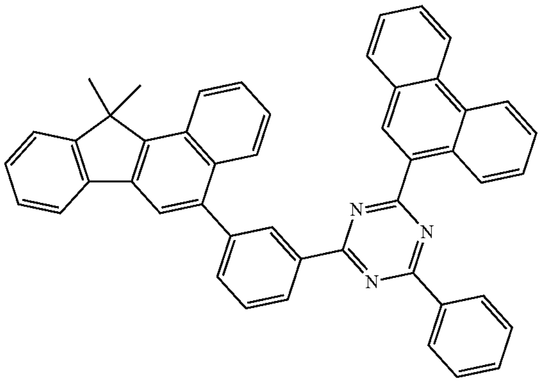
-continued
C-561
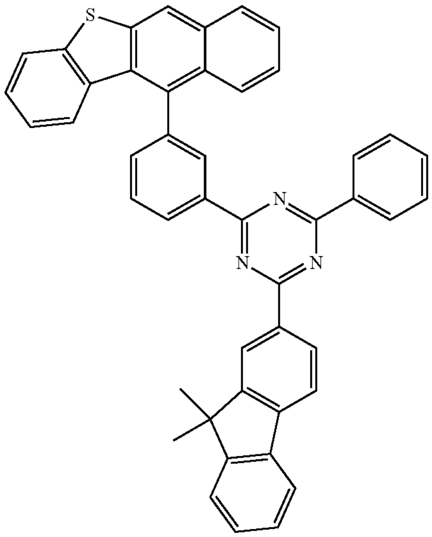
C-562
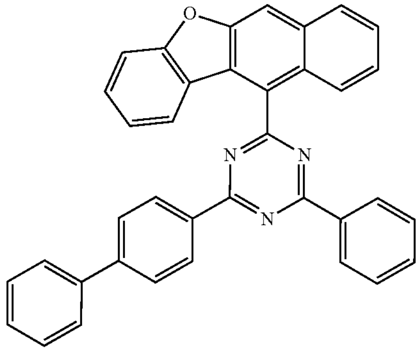
C-563
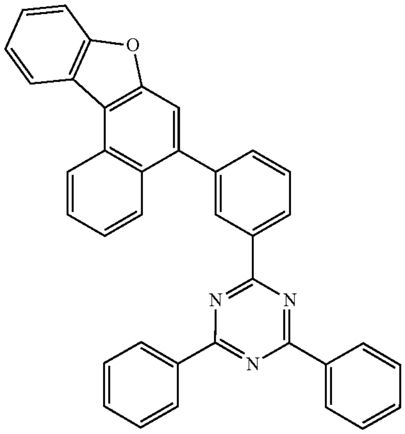

-continued
C-564
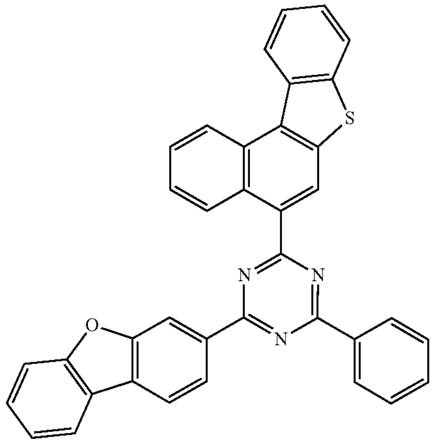
C-565
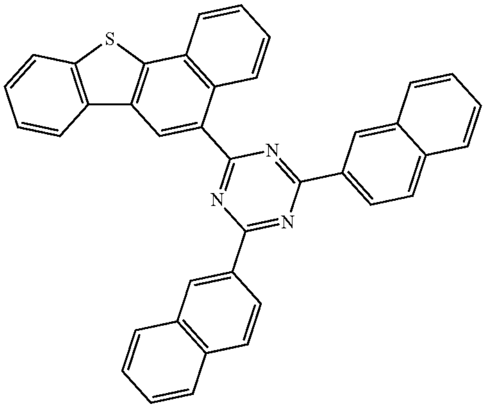
C-566
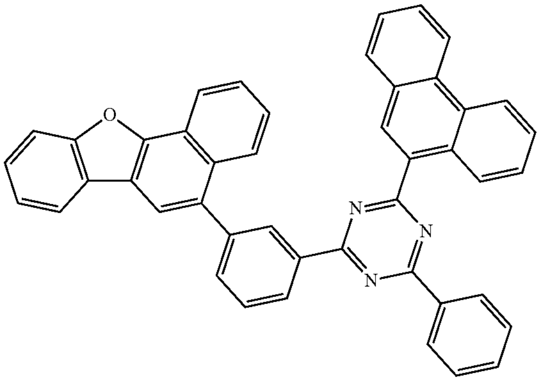
C-567
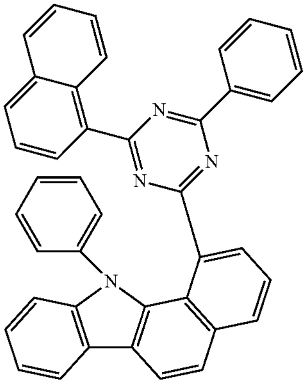
-continued
C-568
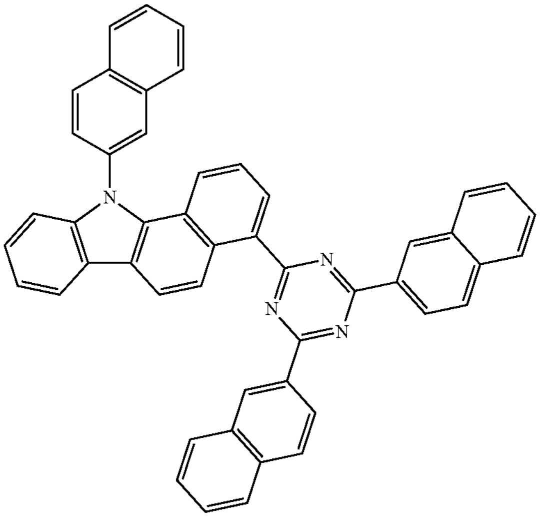
C-569
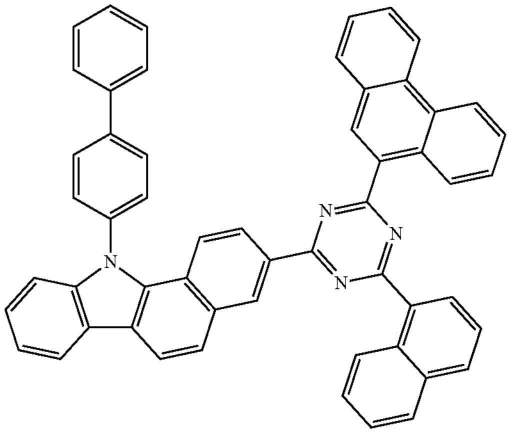
C-570
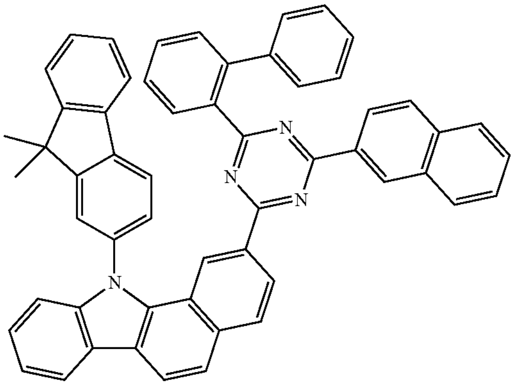

-continued
C-571
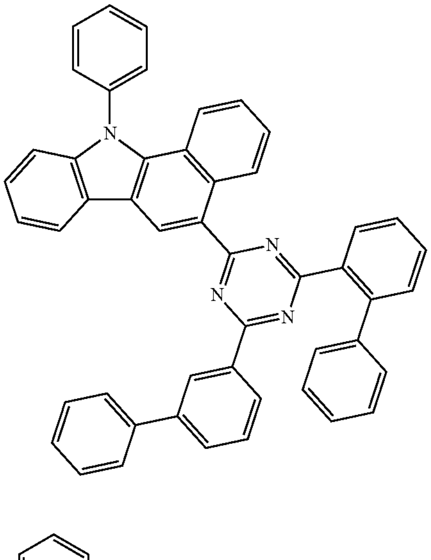
C-572
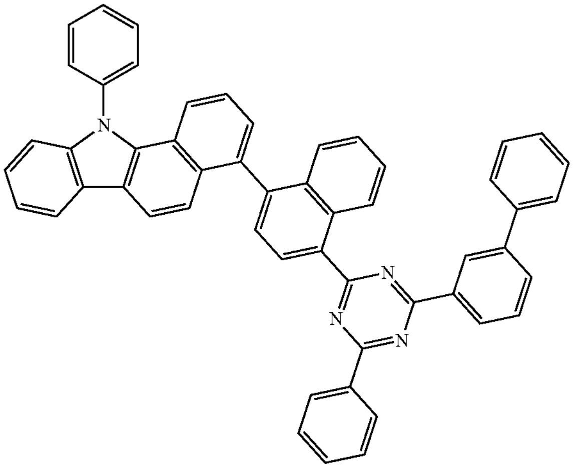
C-573
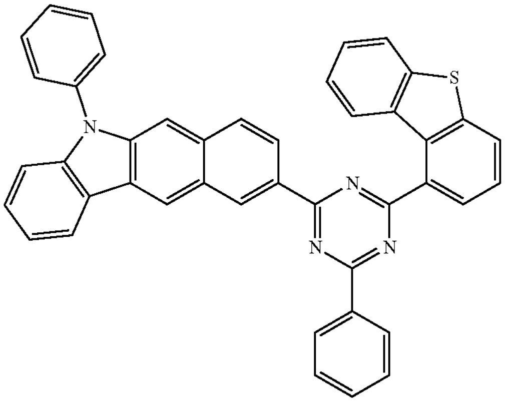
-continued
C-574
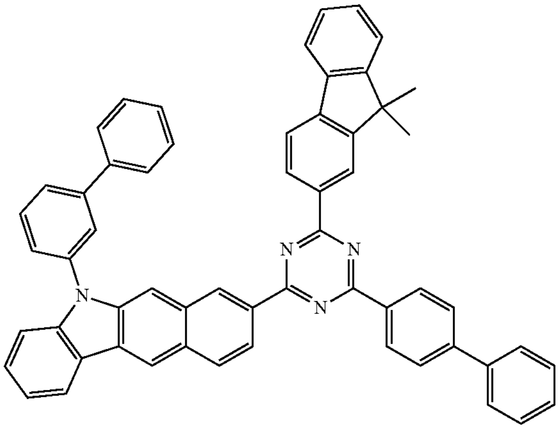
C-575
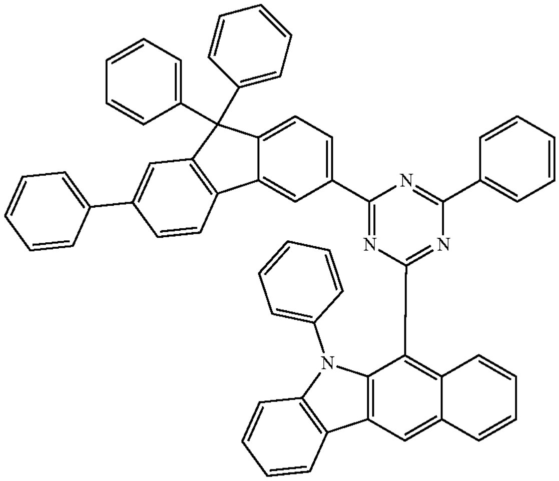
C-576
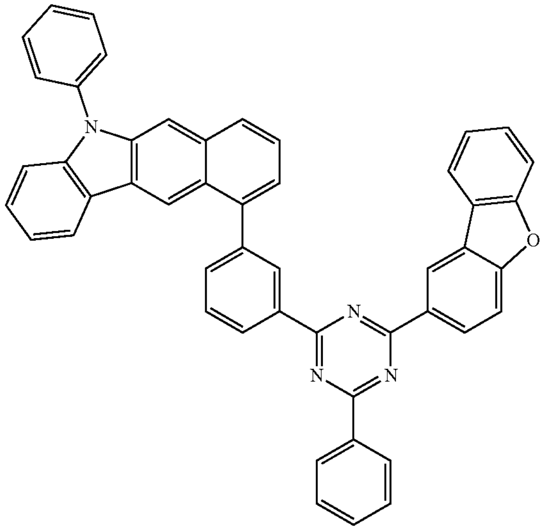

-continued
C-577
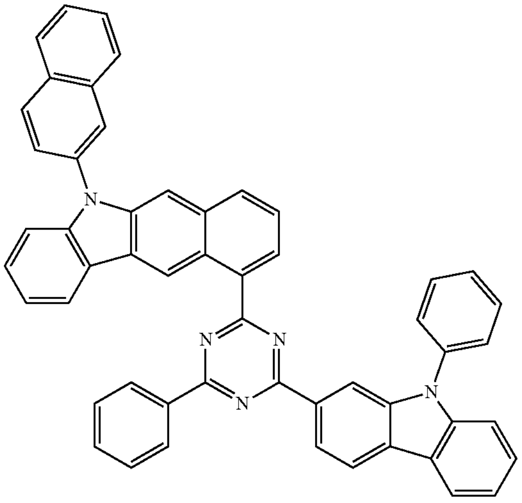
C-578
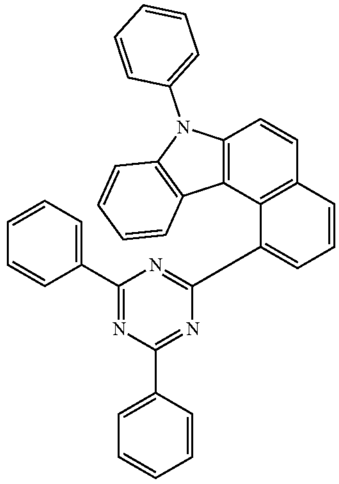
C-579
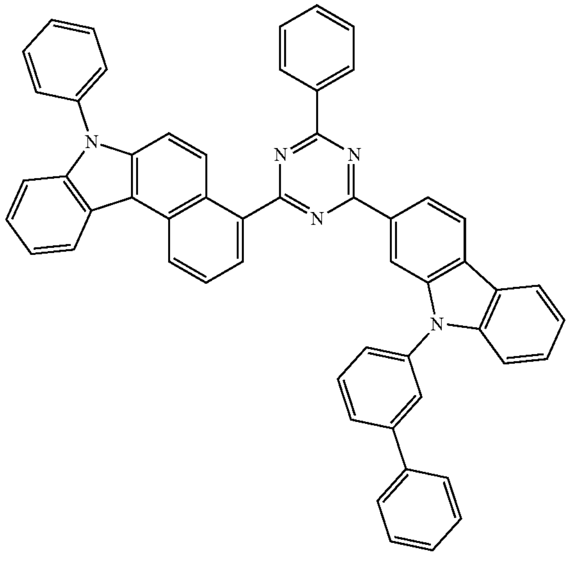
-continued
C-580
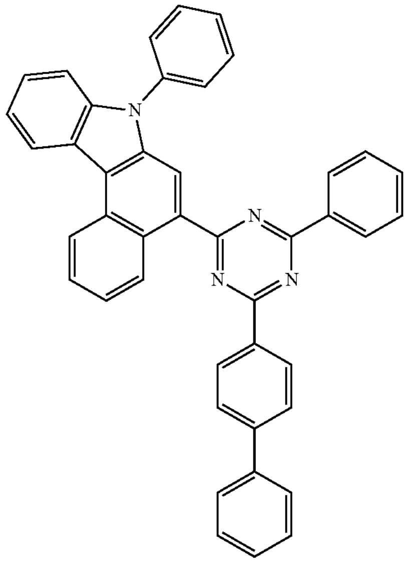
C-581
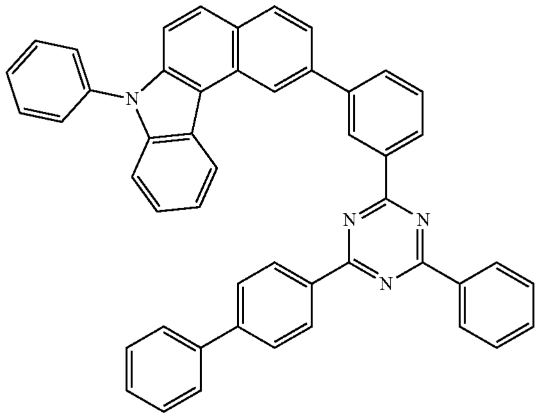
C-582
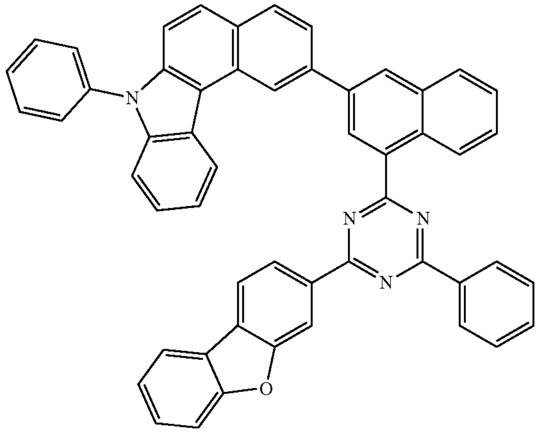

-continued

C-583

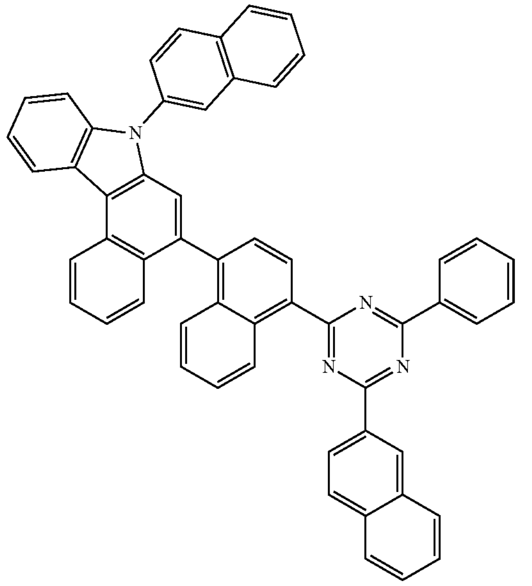

C-584

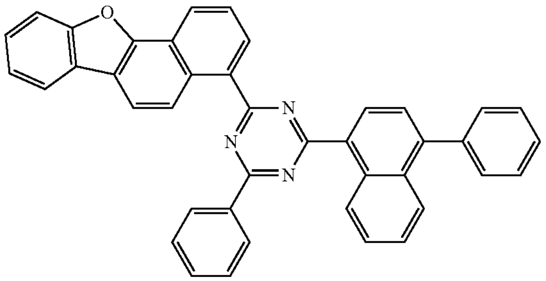

C-585

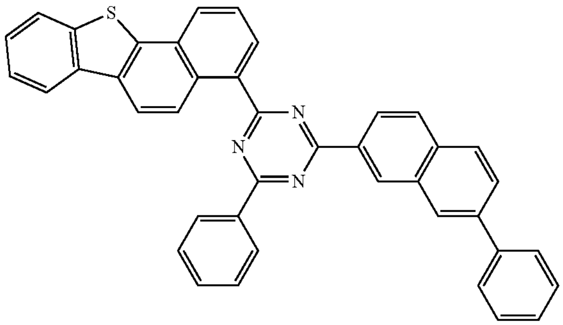

-continued

C-586

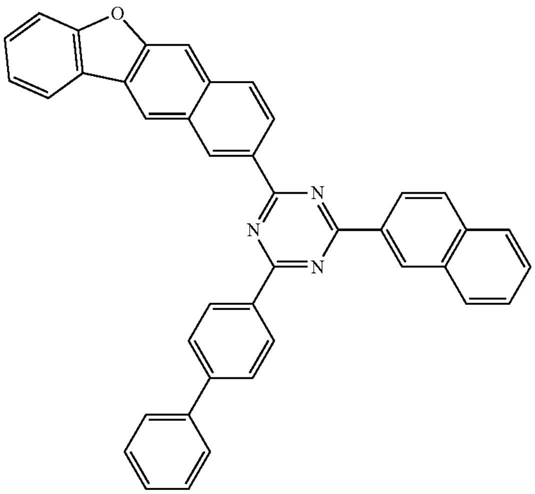

C-587

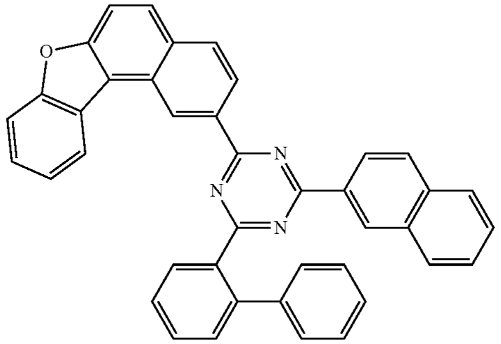

C-588

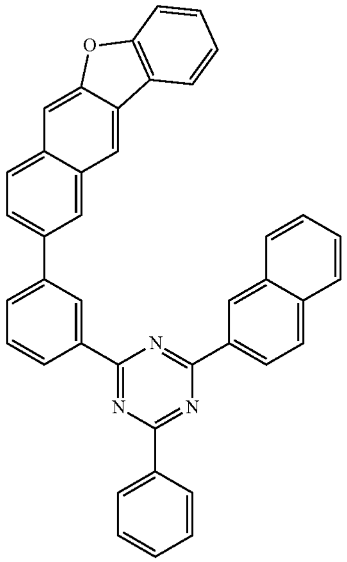

The combination of at least one of compounds H-1-1 to H-1-94, and at least one of compounds C-1 to C-588 may be used in an organic electroluminescent device.

The compounds represented by formulas 1 and 2 according to the present disclosure may be prepared by synthetic methods known to one skilled in the art, and particularly, may be prepared by referring to synthetic methods disclosed in a number of patent documents. For example, the compound represented by formula 1 can be prepared by referring to Korean Patent Appl. Laid-Open Nos. 2013-0106255 A (published on Sep. 27, 2013), 2012-0042633 A (published on May 3, 2012), 2018-0099510 A (published on Sep. 5, 2018), and 2018-0012709 A (published on Feb. 3, 2018), but are not limited thereto. The compound represented by formula 2 can be prepared by referring to the following reaction schemes 1 to 4, but are not limited thereto.
[Reaction Scheme 1]
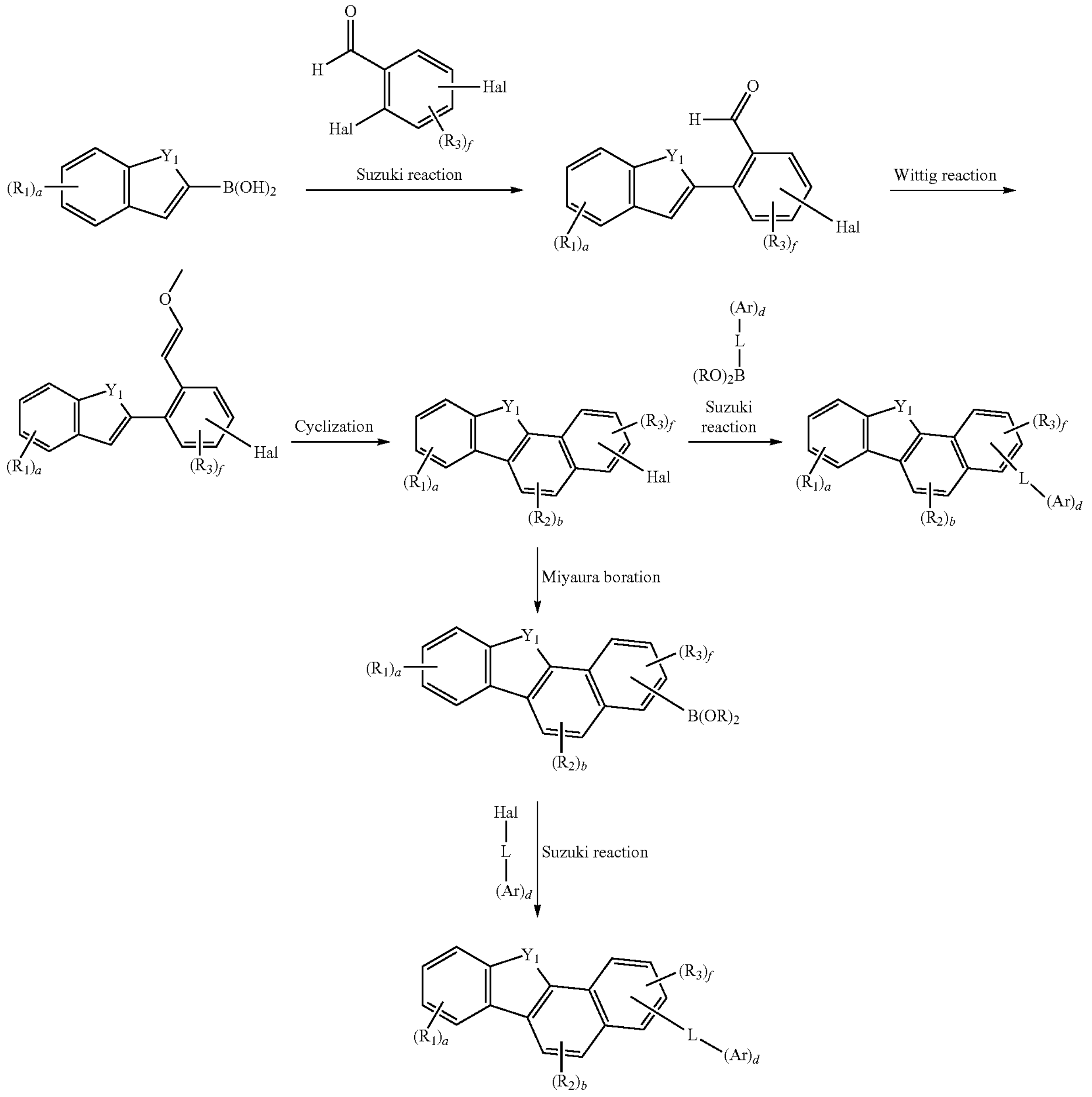
[Reaction Scheme 2]
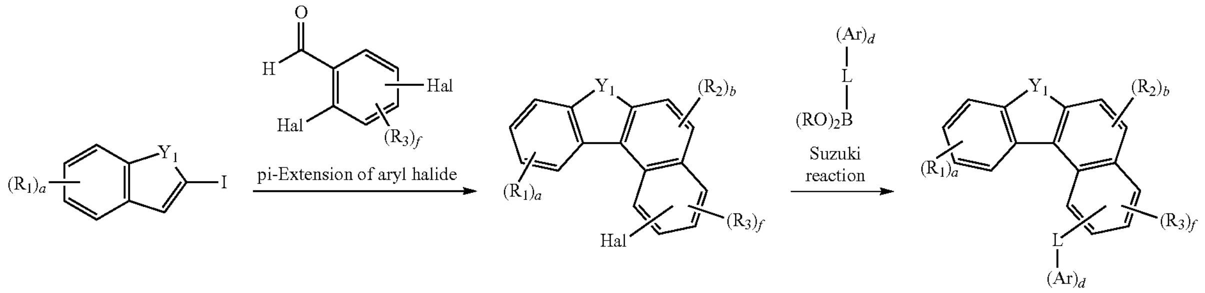

-continued
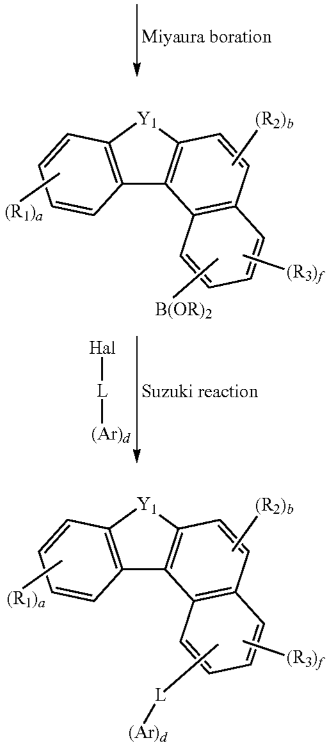
[Reaction Scheme 3]
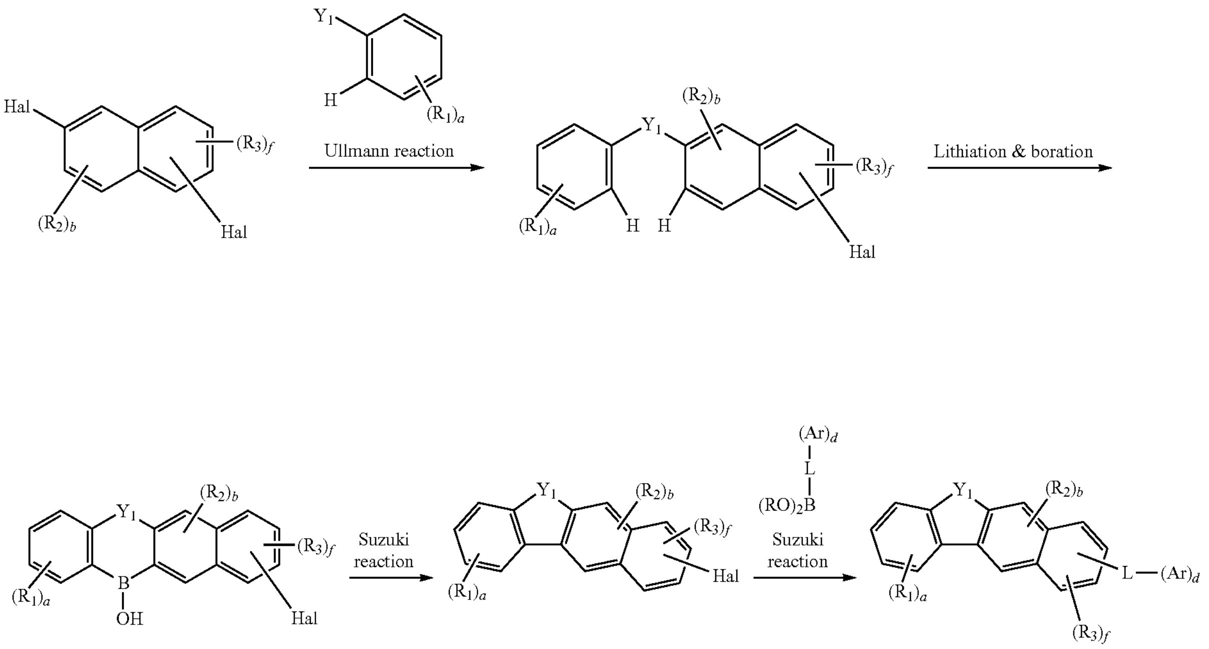

-continued

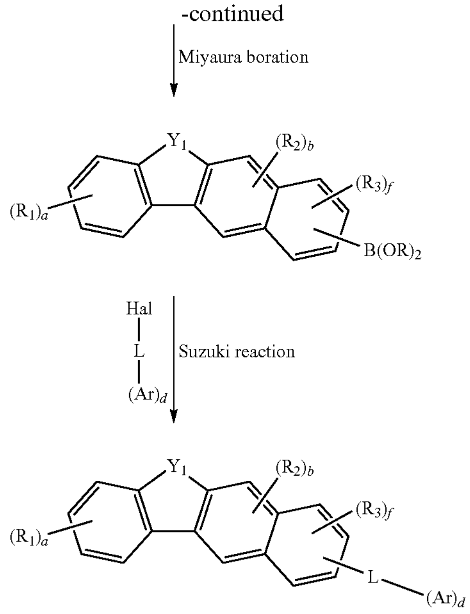

[Reaction Scheme 4]

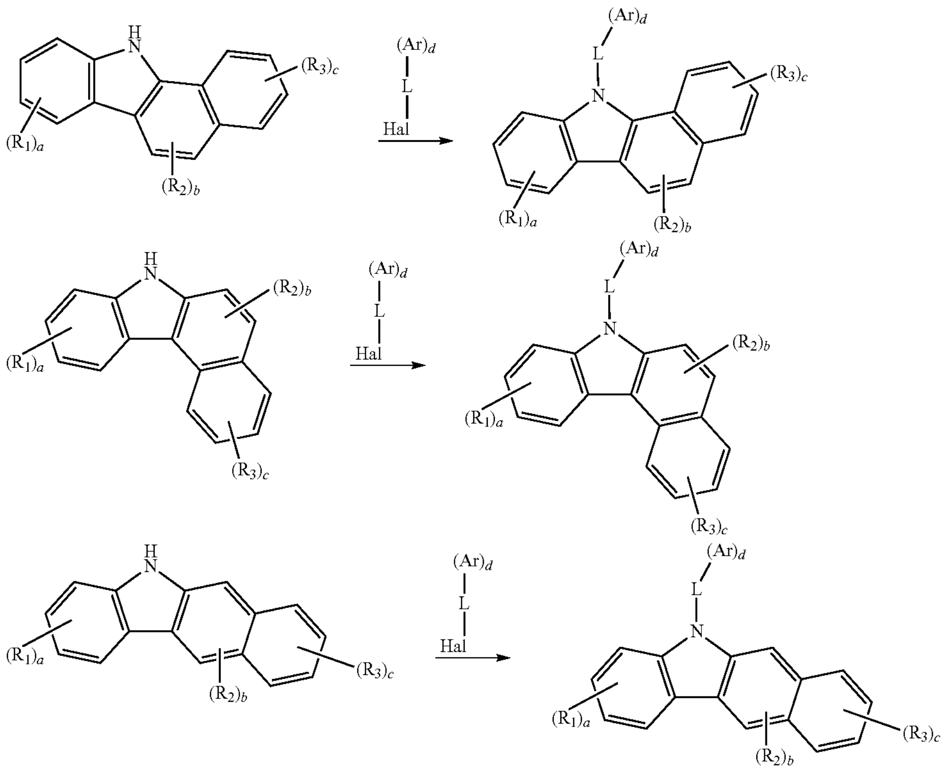

In reaction schemes 1 to 4, $Y_1$, L, Ar, $R_1$ to $R_3$, a to d and f are as defined in formulas 2-1 to 2-6 above, and Hal represents I, Br, Cl, ONf (nonafluorobutanesulfonyl), or OTf (triflate).

Although illustrative synthesis examples of the compound represented by formula 2 are described above, one skilled in the art will be able to readily understand that all of them are based on a Buchwald-Hartwig cross-coupling reaction, an N-arylation reaction, a H-mont-mediated etherification reaction, a Miyaura borylation reaction, a Suzuki cross-coupling reaction, a Pd(II)-catalyzed oxidative cyclization reaction, a Heck reaction, a Cyclic Dehydration reaction, an $SN_1$ substitution reaction, an $SN_2$ substitution reaction, a Phosphine-mediated reductive cyclization reaction, Ullmann reaction, Wittig reaction, etc., and the reactions above proceed even when substituents, which are defined in formula 2 above but are not specified in the specific synthesis examples, are bonded.

The organic electroluminescent device according to the present disclosure comprises an anode, a cathode, and at least one organic layer between the anode and the cathode. The organic layer may comprise a plurality of organic electroluminescent materials in which the compound represented by formula 1 is included as a first organic electroluminescent material, and the compound represented by formula 2 is included as a second organic electroluminescent material. According to one embodiment of the present disclosure, the organic electroluminescent device comprises an anode, a cathode, and at least one light-emitting layer between the anode and the cathode, and the light-emitting layer comprises a plurality of host materials comprising the compound represented by formula 1 as a first host material, and the compound represented by formula 2 as a second host material.

The light-emitting layer comprises a host and a dopant. The host comprises a plurality of host materials. The plurality of host materials comprises a first host material and a second host material. The first host material may consist of the compound represented by formula 1 alone, or at least one compound represented by formula 1, and may further include conventional materials included in organic electroluminescent materials. The second host material may consist of the compound represented by formula 2 alone, or at least one compound represented by formula 2, and may further include conventional materials included in organic electroluminescent materials. The weight ratio of the first host compound to the second host compound is in the range of about 1:99 to about 99:1, preferably about 10:90 to about 90:10, more preferably about 30:70 to about 70:30, even more preferably about 40:60 to about 60:40, and still more preferably about 50:50.

The light-emitting layer is a layer from which light is emitted, and can be a single layer or a multi-layer in which two or more layers are stacked. In the plurality of host materials according to the present disclosure, the first and second host materials may both be comprised in one layer, or may be respectively comprised in different light-emitting layers. According to one embodiment of the present disclosure, the doping concentration of the dopant compound with respect to the host compound in the light-emitting layer is less than about 20 wt %.

The organic electroluminescent device of the present disclosure may further comprise at least one layer selected from a hole injection layer, a hole transport layer, a hole auxiliary layer, a light-emitting auxiliary layer, an electron transport layer, an electron injection layer, an interlayer, an electron buffer layer, a hole blocking layer, and an electron blocking layer. According to one embodiment of the present disclosure, the organic electroluminescent device may further comprise amine-based compounds in addition to the plurality of host materials of the present disclosure as at least one of a hole injection material, a hole transport material, a hole auxiliary material, a light-emitting material, a light-emitting auxiliary material, and an electron blocking material. Also, according to one embodiment of the present disclosure, the organic electroluminescent device of the present disclosure may further comprise azine-based compounds in addition to the plurality of host materials of the present disclosure as at least one of an electron transport material, an electron injection material, an electron buffer material, and a hole blocking material.

The dopant comprised in the organic electroluminescent device of the present disclosure may be at least one phosphorescent or fluorescent dopant, preferably a phosphorescent dopant. The phosphorescent dopant material applied in the organic electroluminescent device of the present disclosure is not particularly limited, but may be selected from the metallated complex compounds of iridium (Ir), osmium (Os), copper (Cu), and platinum (Pt), preferably selected from ortho-metallated complex compounds of iridium (Ir), osmium (Os), copper (Cu), and platinum (Pt), and more preferably ortho-metallated iridium complex compounds.

The dopant may comprise a compound represented by the following formula 101, but is not limited thereto.

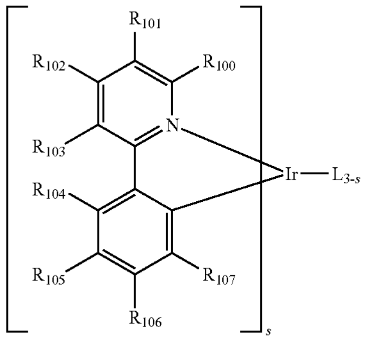

(101)

In formulas 101,

L is any one selected from the following structures 1 to 3:

[Structure 1]

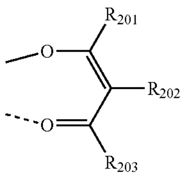

[Structure 2]

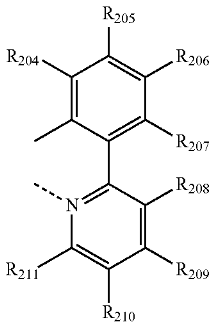

[Structure 3]

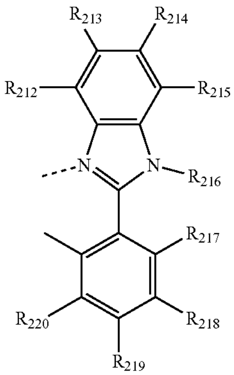

$R_{100}$ to $R_{103}$, each independently, represent hydrogen, deuterium, a halogen, a (C1-C30)alkyl unsubstituted or substituted with deuterium and/or a halogen(s), a substituted or unsubstituted (C3-C30)cycloalkyl, a substituted or unsubstituted (C6-C30)aryl, a cyano, a substituted or unsubstituted (3- to 30-membered)heteroaryl, or a substituted or unsubstituted (C1-C30)alkoxy; or may be linked to adjacent one(s) of $R_{100}$ to $R_{103}$, to form a ring(s), e.g., a substituted or unsubstituted quinoline, a substituted or unsubstituted isoquinoline, a substituted or unsubstituted benzofuropyridine, a substituted or unsubstituted benzothienopyridine, a substituted or unsubstituted indenopyridine, a substituted or unsubstituted benzofuroquinoline, a substituted or unsubstituted benzothienoquinoline, or a substituted or unsubstituted indenoquinoline ring, with a pyridine;

$R_{104}$ to $R_{107}$, each independently, represent hydrogen, deuterium, a halogen, a (C1-C30)alkyl unsubstituted or substituted with deuterium and/or a halogen(s), a substituted or unsubstituted (C3-C30)cycloalkyl, a substituted or unsubstituted (C6-C30)aryl, a substituted or unsubstituted (3- to 30-membered)heteroaryl, a cyano, or a substituted or unsubstituted (C1-C30)alkoxy; or may be linked to adjacent one(s) of $R_{104}$ to $R_{107}$ to form a ring(s), e.g., a substituted or unsubstituted naphthalene, a substituted or unsubstituted fluorene, a substituted or unsubstituted dibenzothiophene, a substituted or unsubstituted dibenzofuran, a substituted or unsubstituted indenopyridine, a substituted or unsubstituted benzofuropyridine, or a substituted or unsubstituted benzothienopyridine ring, with a benzene;

$R_{201}$ to $R_{220}$, each independently, represent hydrogen, deuterium, a halogen, a (C1-C30)alkyl unsubstituted or substituted with deuterium or a halogen(s), a substituted or unsubstituted (C3-C30)cycloalkyl, or a substituted or unsubstituted (C6-C30)aryl; or may be linked to adjacent one(s) of $R_{201}$ to $R_{220}$ to form a ring(s); and s represents an integer of 1 to 3.

The specific examples of the dopant compound are as follows, but are not limited thereto.

D-1

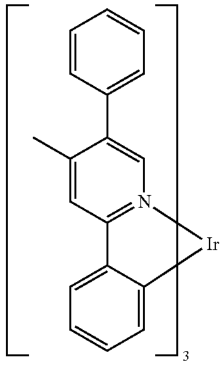

D-2

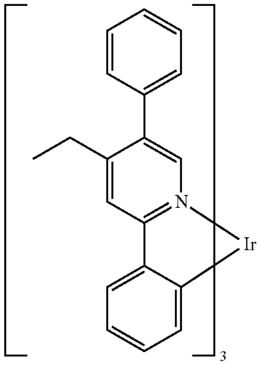

-continued

D-3

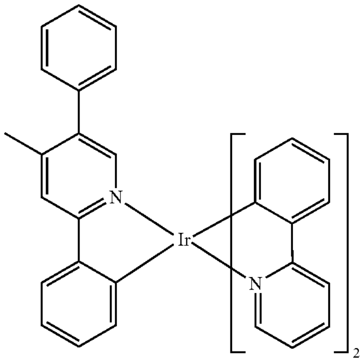

D-4

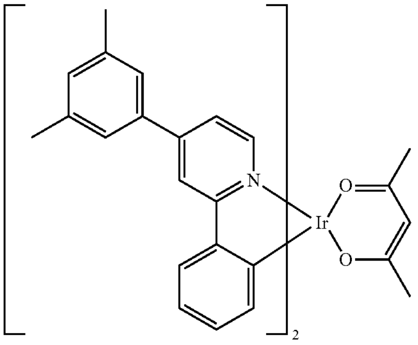

D-5

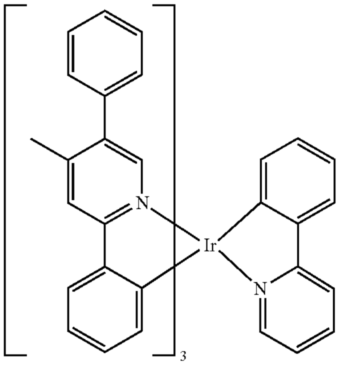

D-6

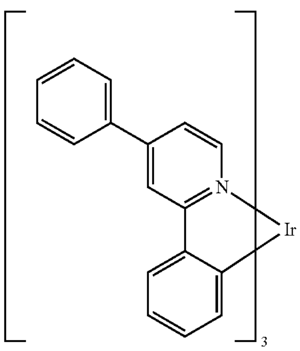

-continued
D-7
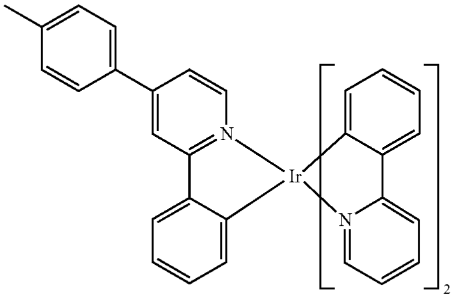
D-8
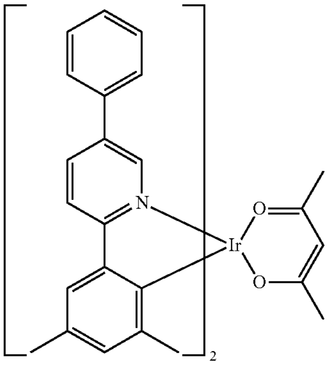
D-9
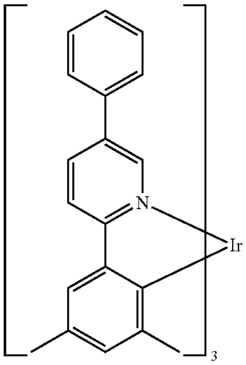
D-10
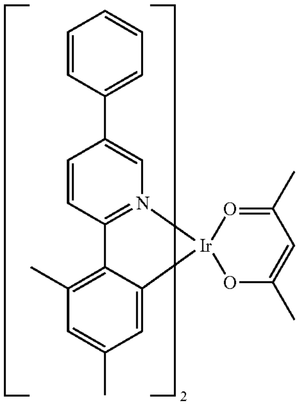
-continued
D-11
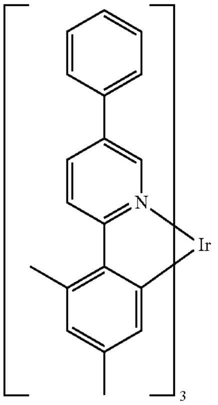
D-12
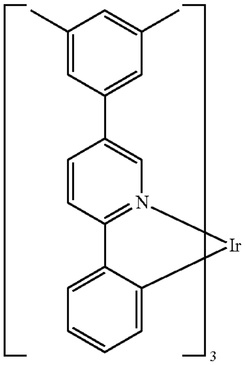
D-13
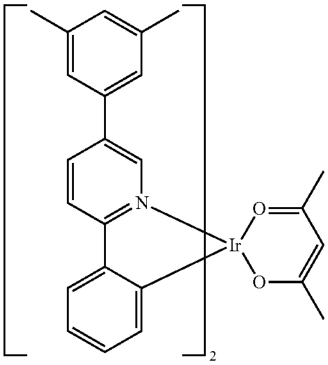
D-14
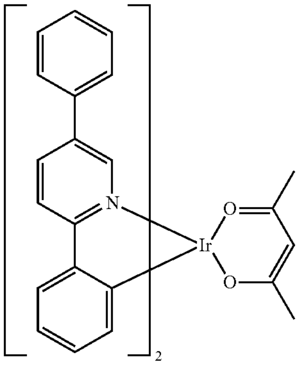

-continued
D-15
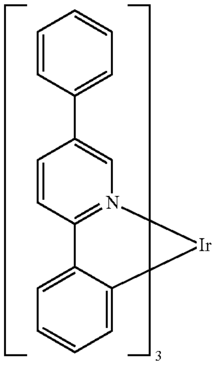
D-16
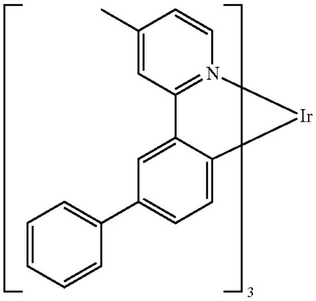
D-17
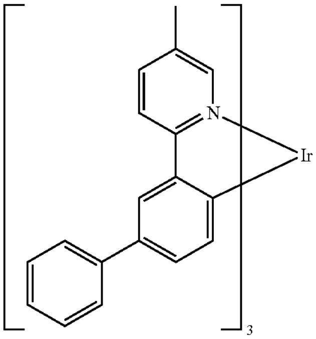
D-18
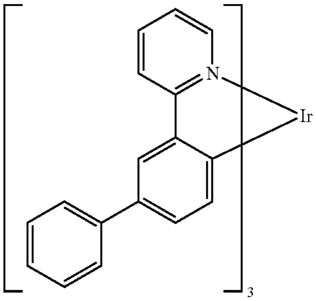
-continued
D-19
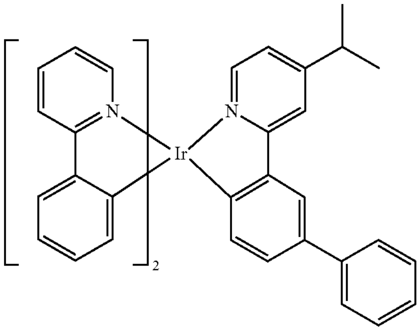
D-20
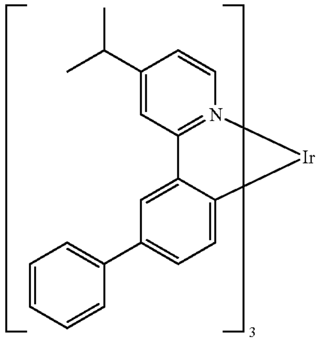
D-21
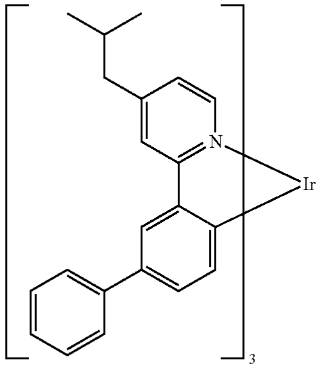
D-22
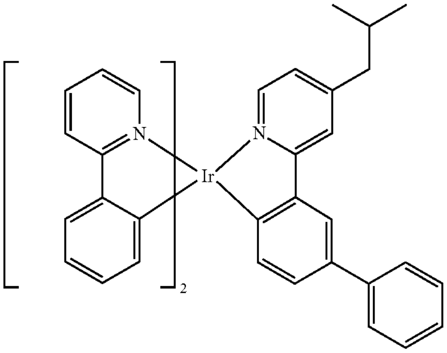

-continued
D-23
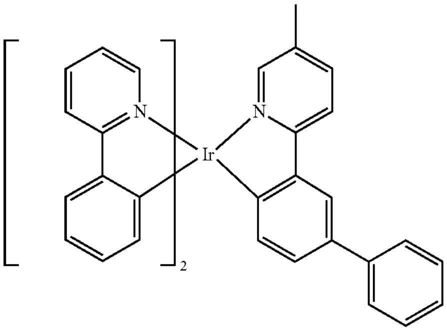
D-24
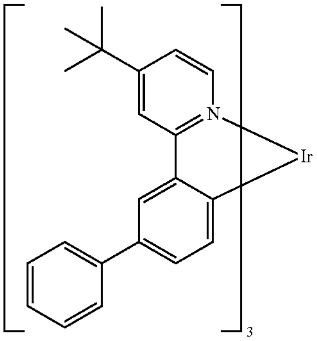
D-25
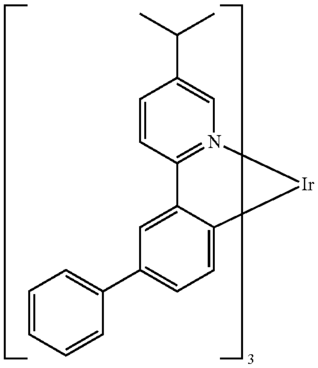
D-26
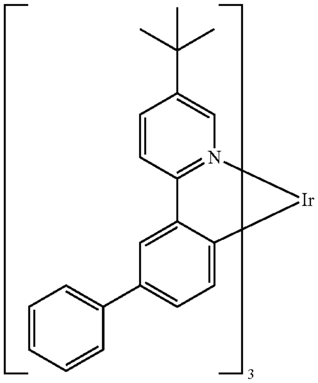
-continued
D-27
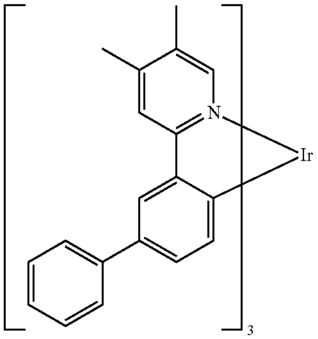
D-28
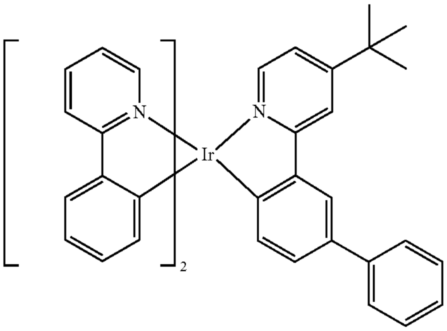
D-29
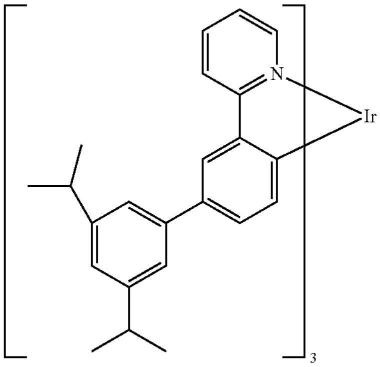
D-30
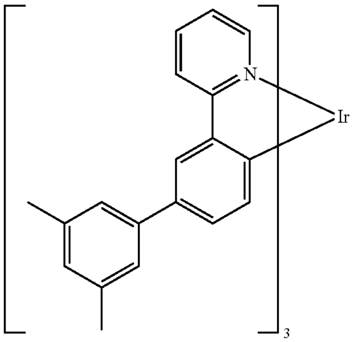

-continued
D-31
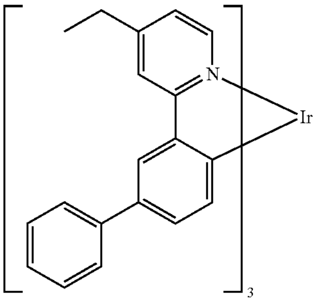
D-32
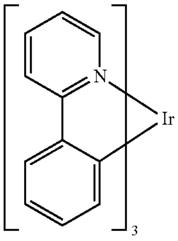
D-33
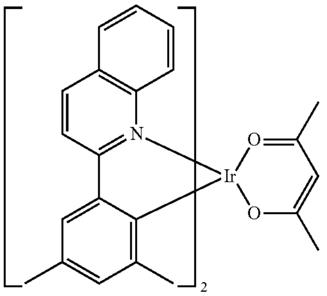
D-34
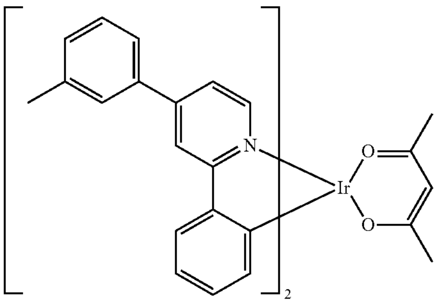
D-35
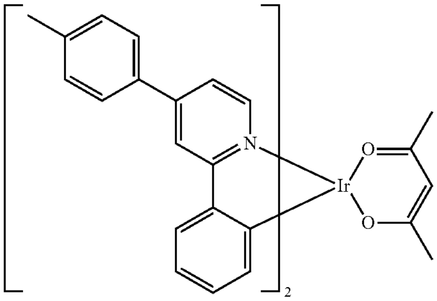
-continued
D-36
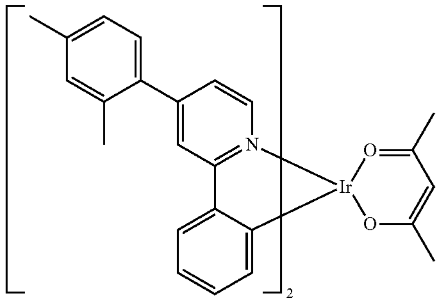
D-37
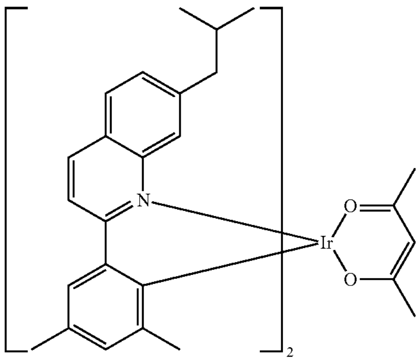
D-38
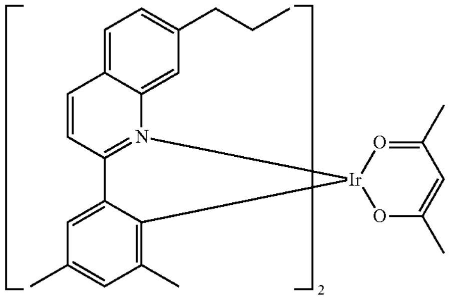
D-39
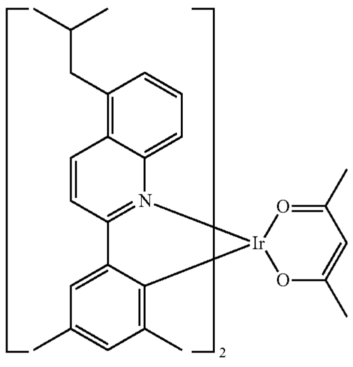

-continued
D-40
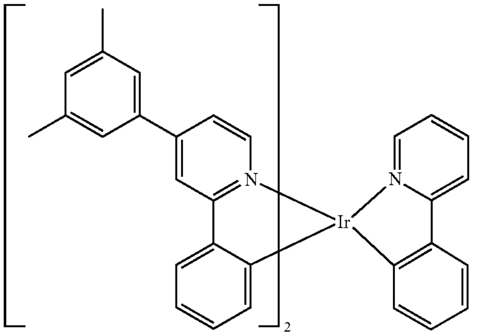
D-41
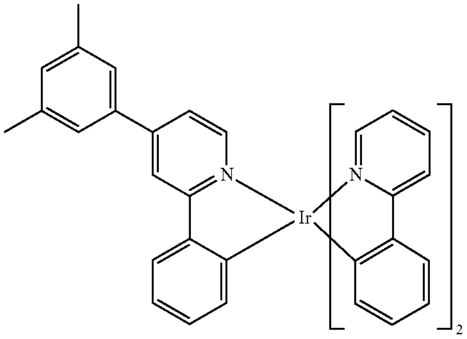
D-42
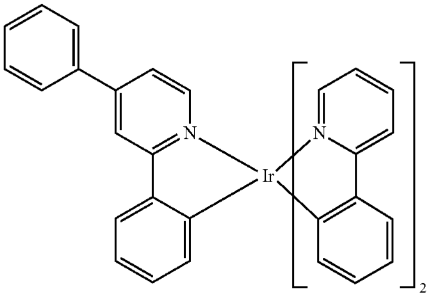
D-43
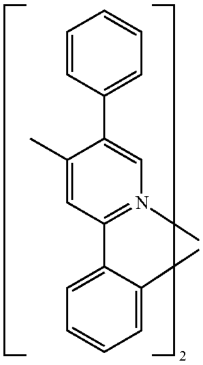
-continued
D-44
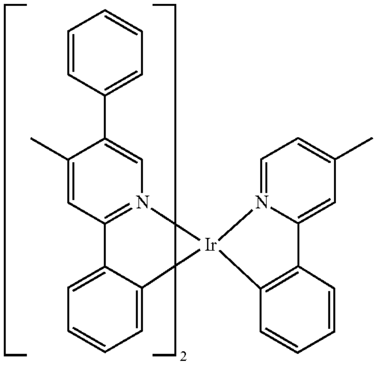
D-45
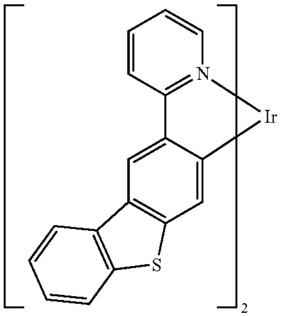
D-46
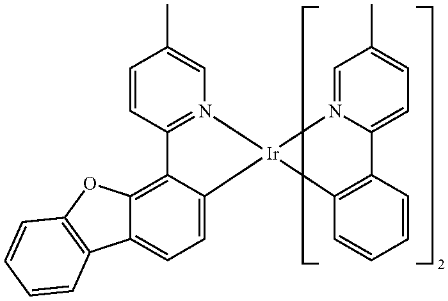
D-47
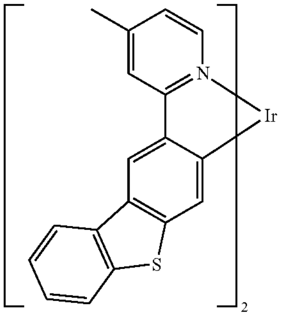
D-48
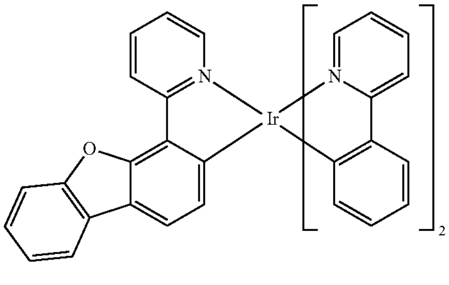

-continued
D-49
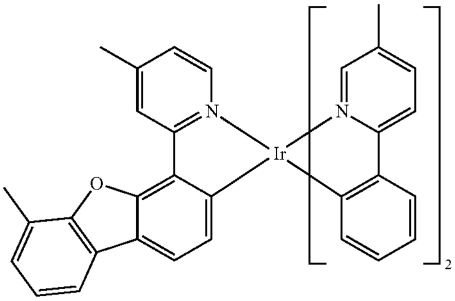
D-50
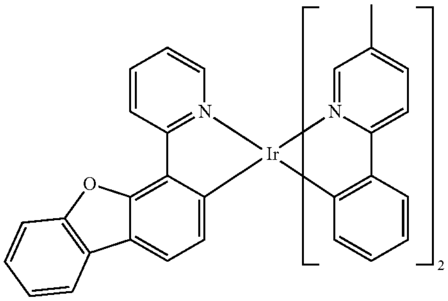
D-51
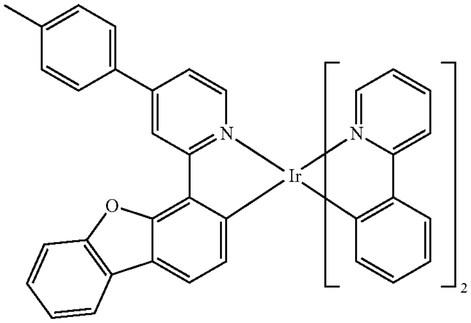
D-52
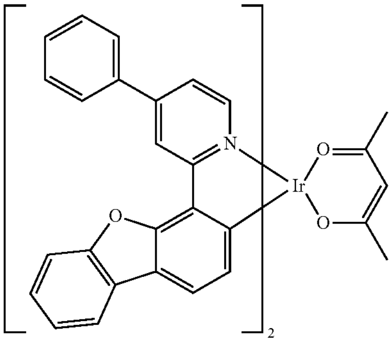
D-53
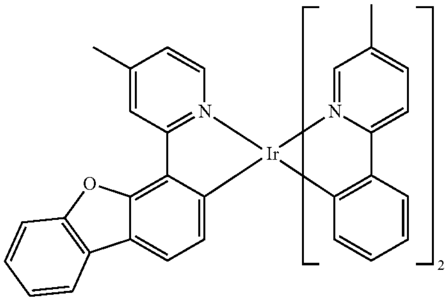
-continued
D-54
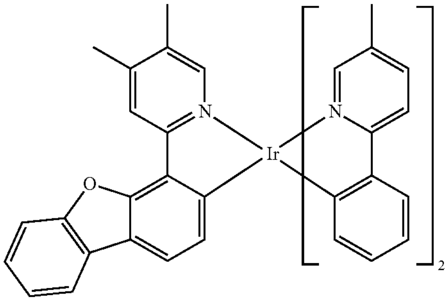
D-55
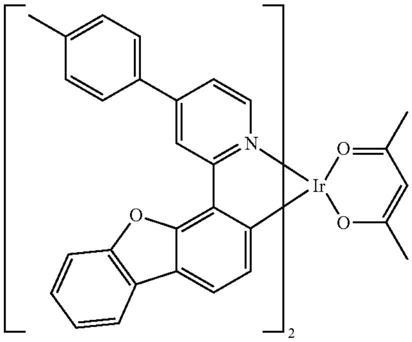
D-56
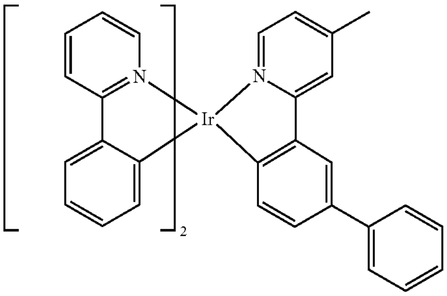
D-57
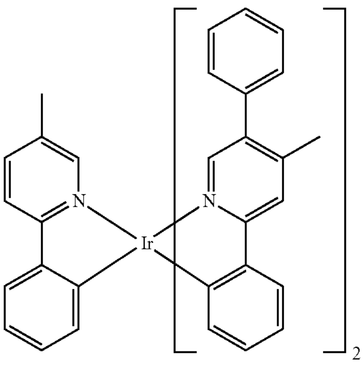

-continued
D-58
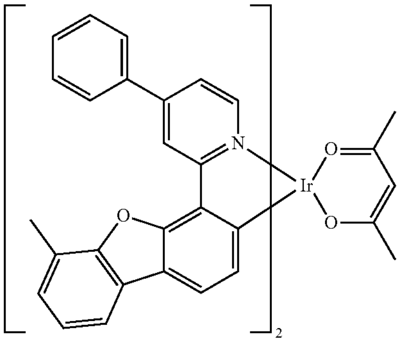
D-59
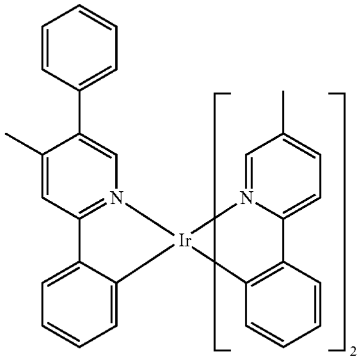
D-60
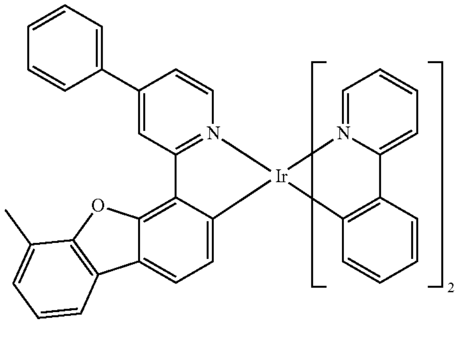
D-61
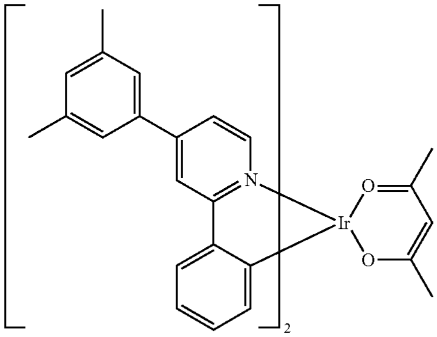
-continued
D-62
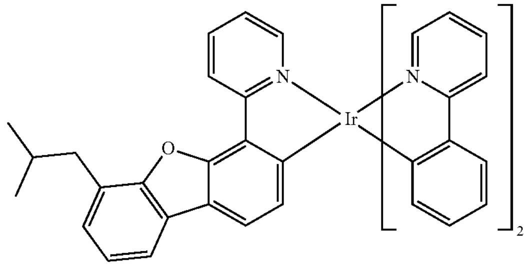
D-63
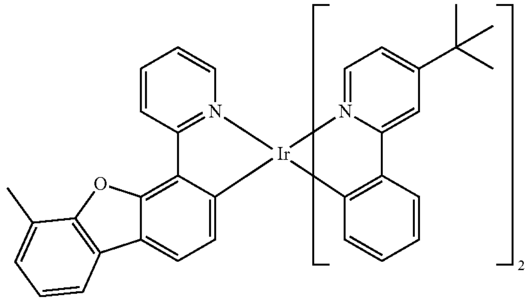
D-64
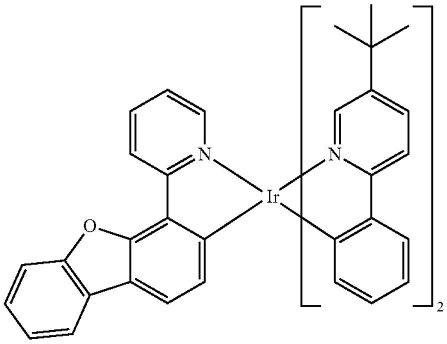
D-65
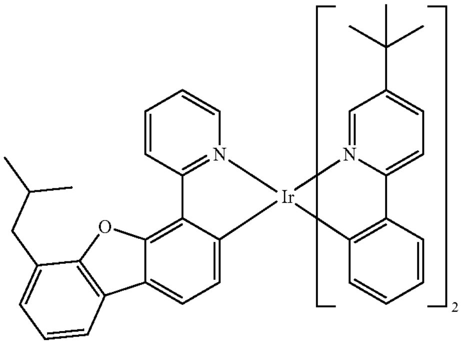

-continued
D-66
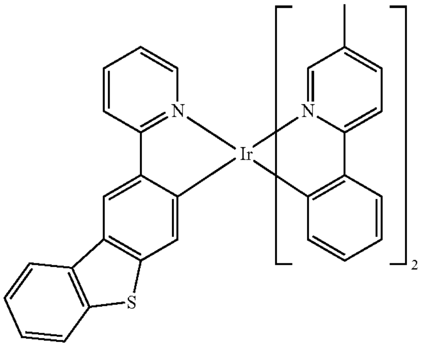
D-67
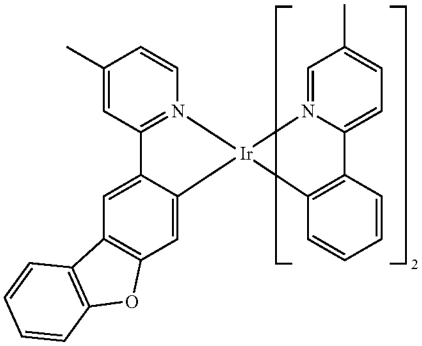
D-68
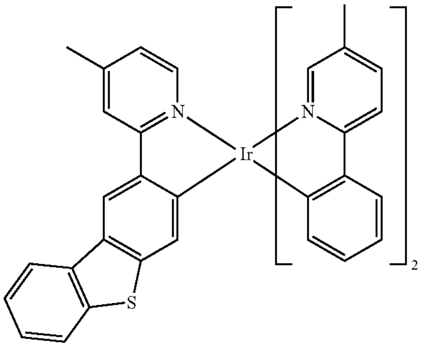
D-69
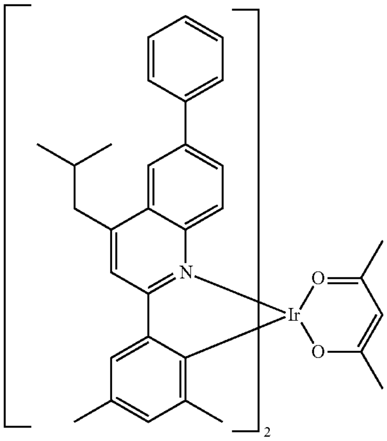
-continued
D-70
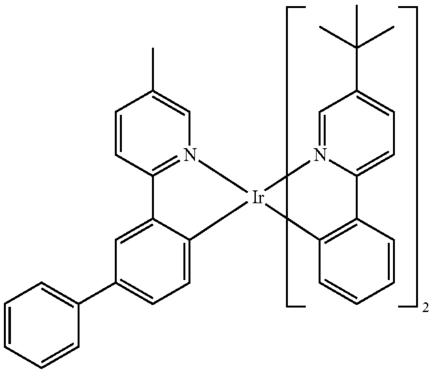
D-71
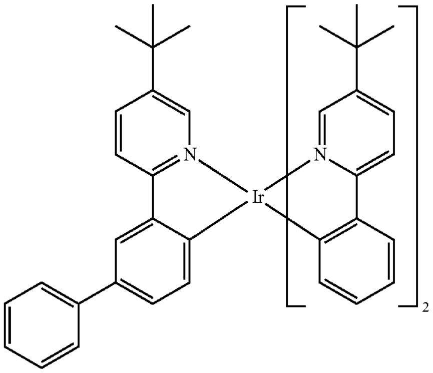
D-72
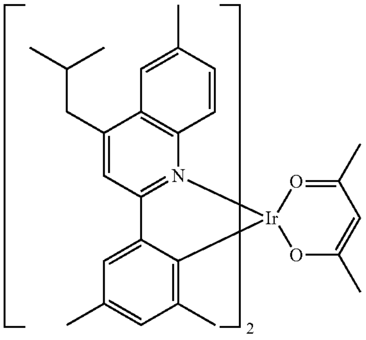
D-73
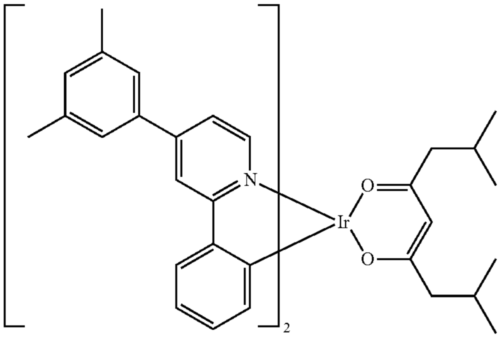

-continued
D-74
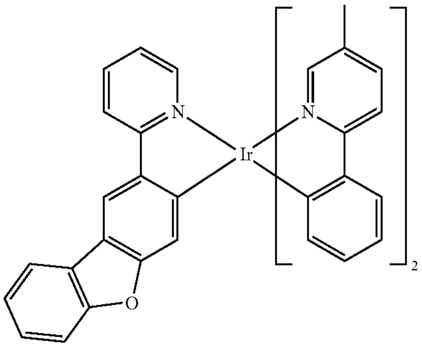
D-75
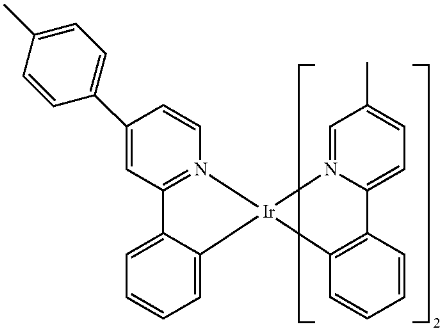
D-76
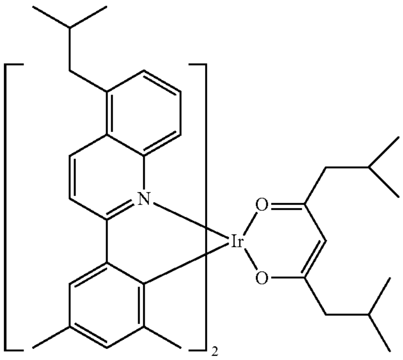
D-77
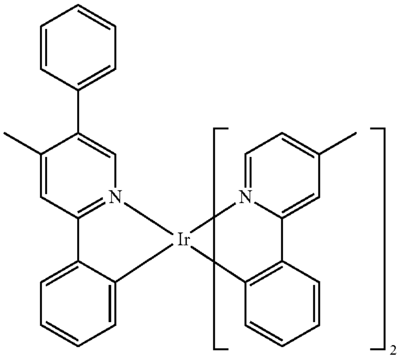
-continued
D-78
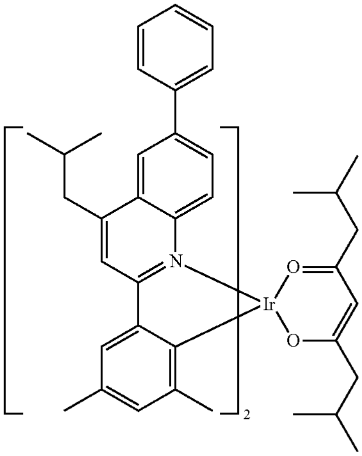
D-79
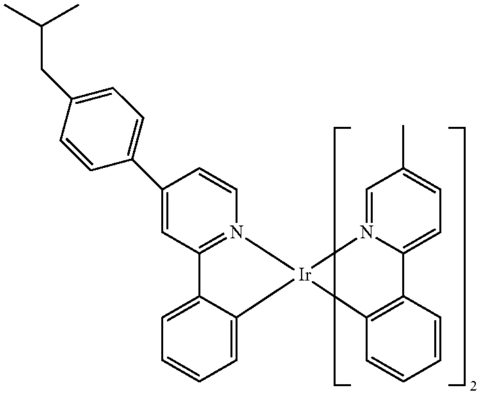
D-80
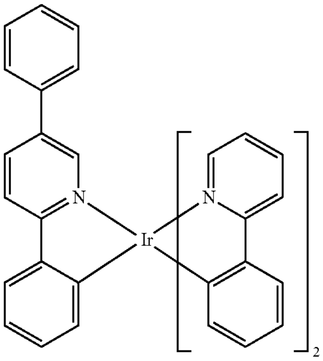

-continued
D-81
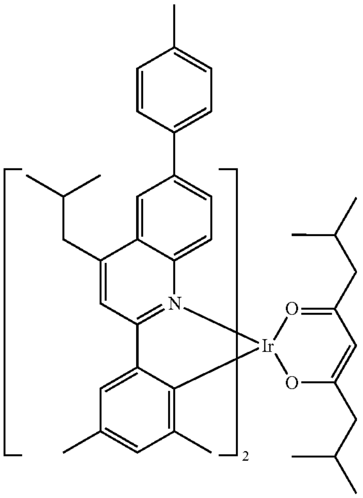
D-82
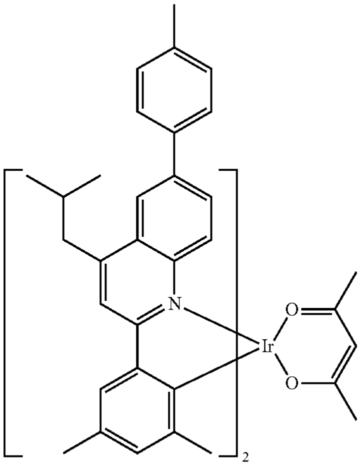
D-83
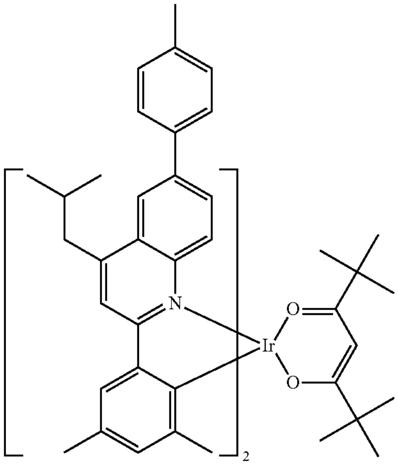
-continued
D-84
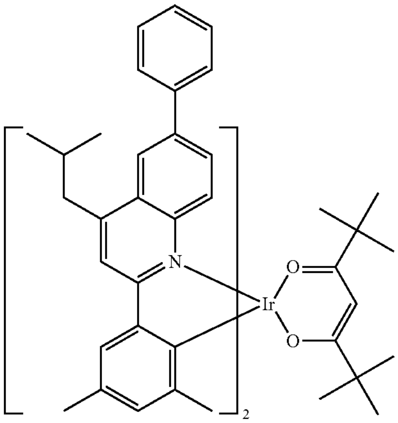
D-85
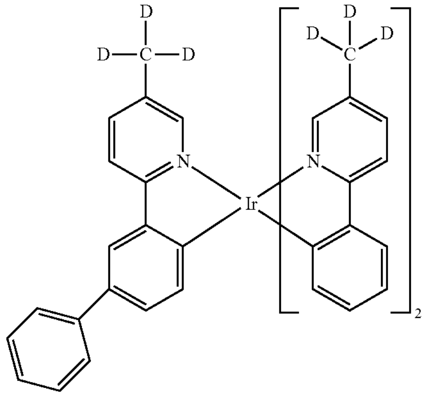
D-86
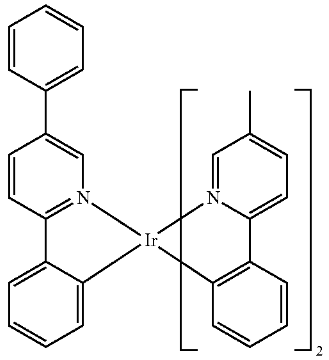
D-87
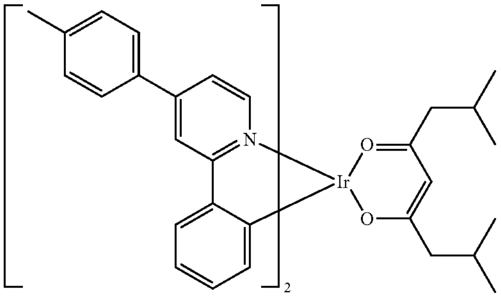

-continued
D-88
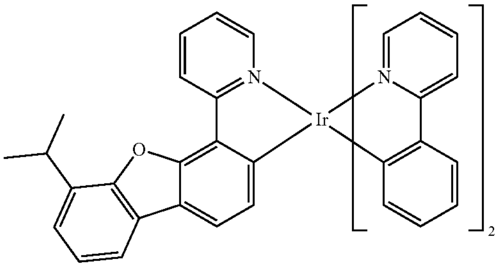
D-89
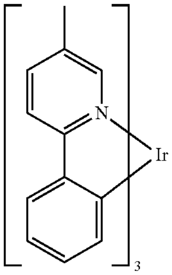
D-90
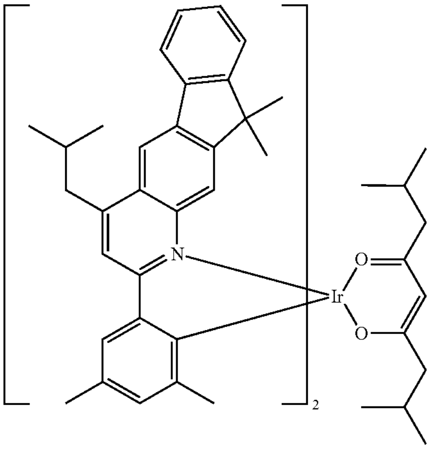
D-91
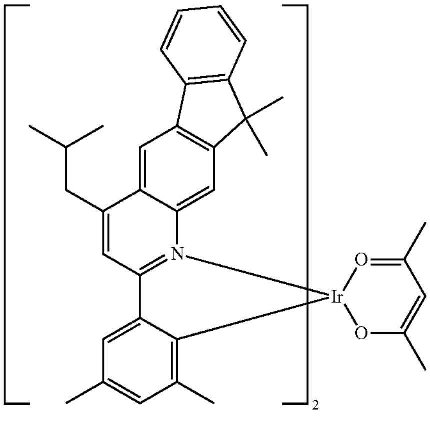
-continued
D-92
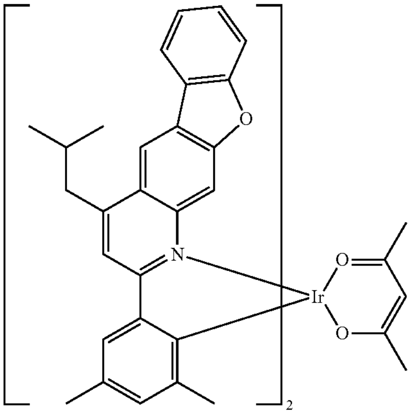
D-93
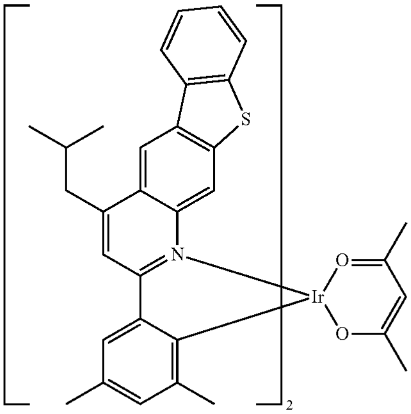
D-94
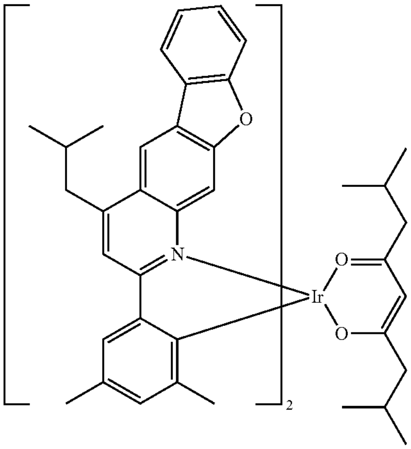

-continued
D-95
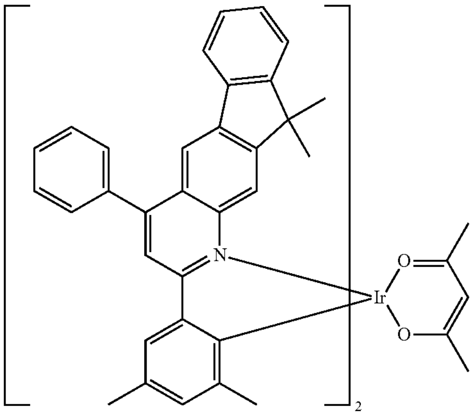
D-96
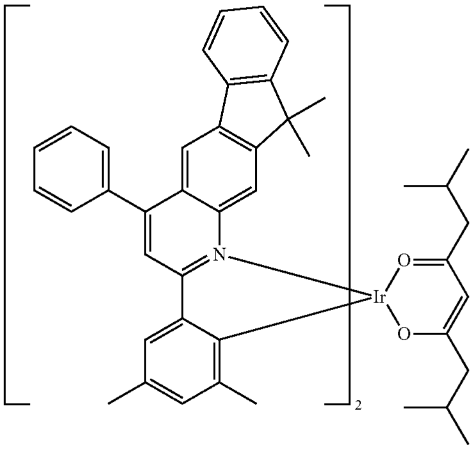
D-97
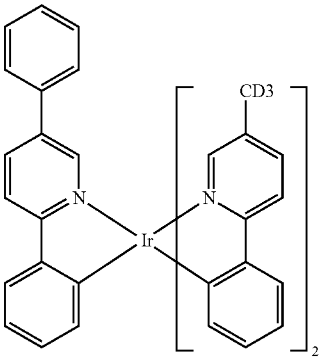
D-98
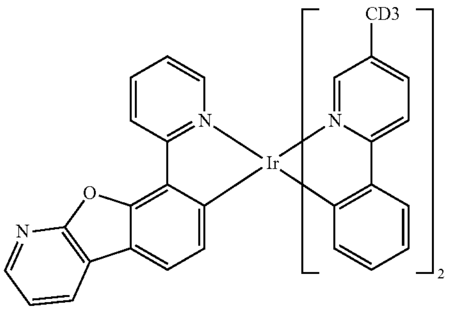
-continued
D-99
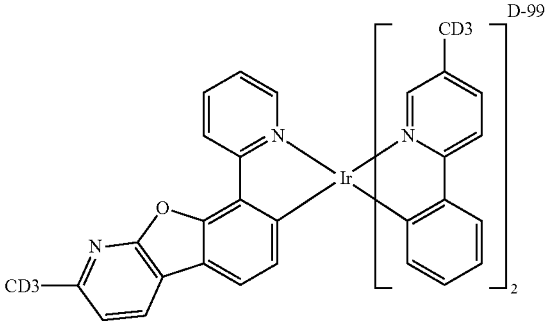
D-100
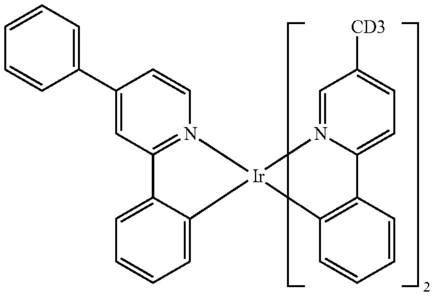
D-101
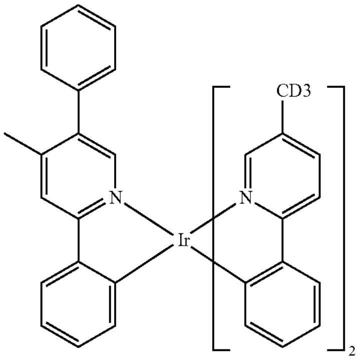
D-102
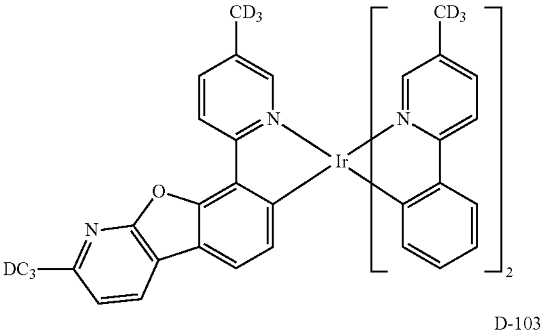
D-103
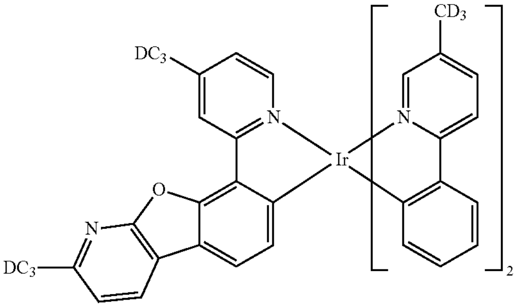

D-104
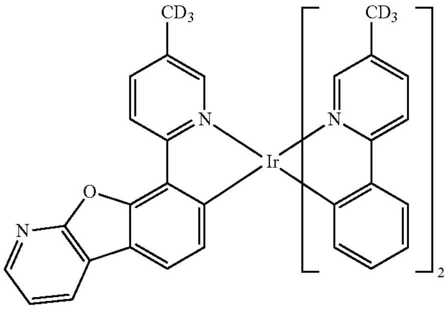
D-105
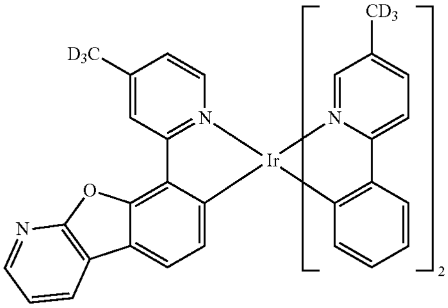
D-106
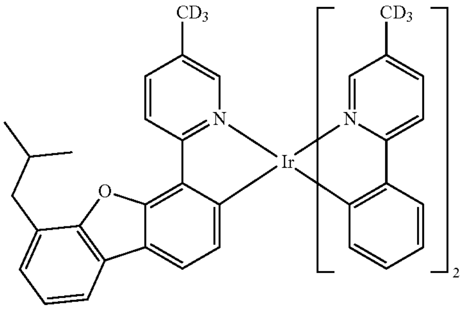
D-107
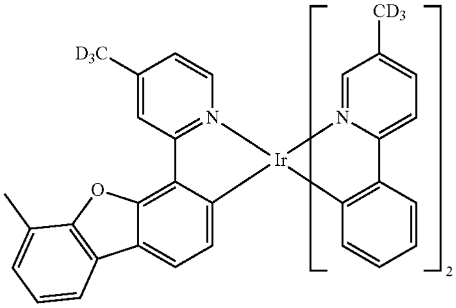
D-108
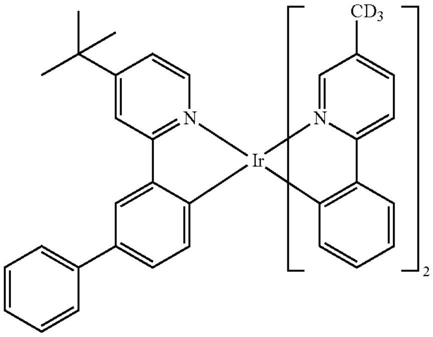
D-109
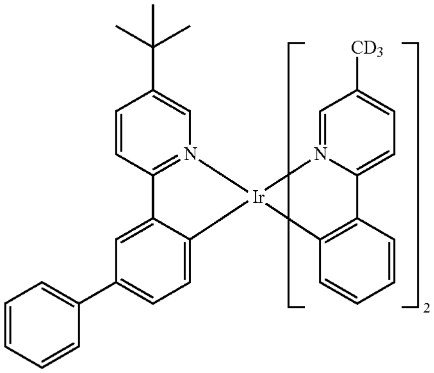
D-110
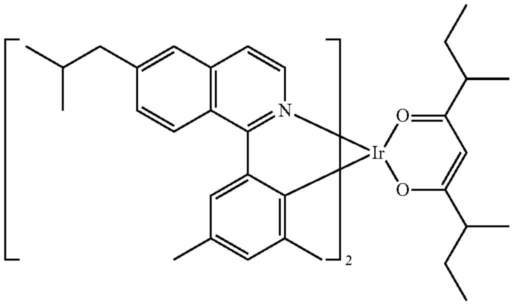
D-111
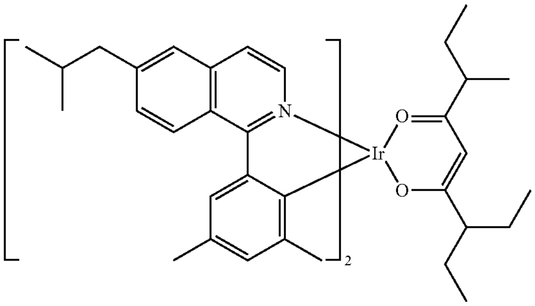
D-112
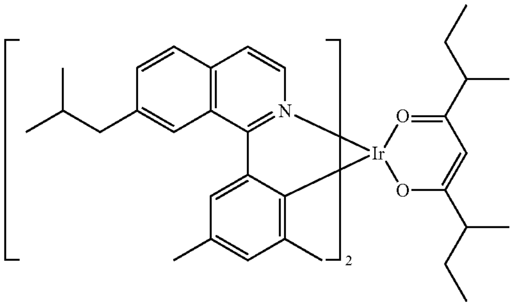

-continued
D-113
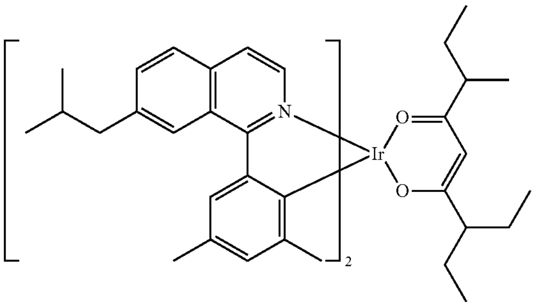
D-114
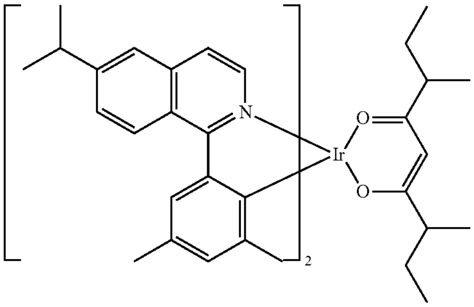
D-115
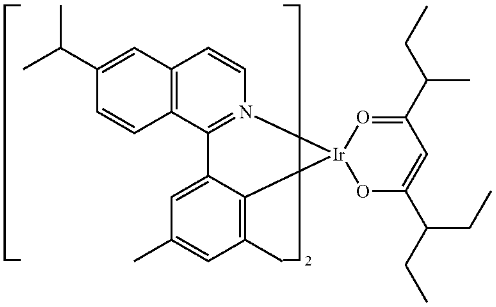
D-116
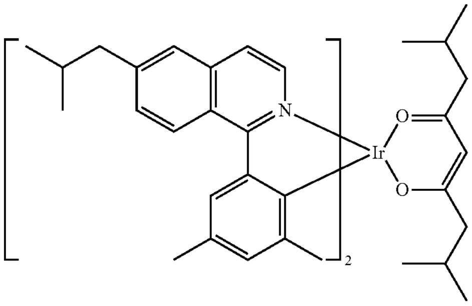
D-117
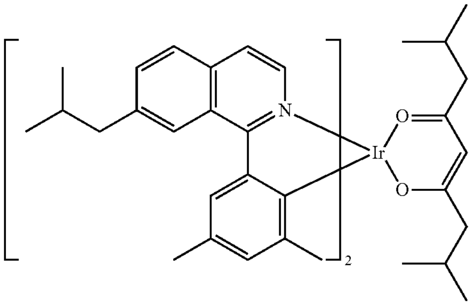
-continued
D-118
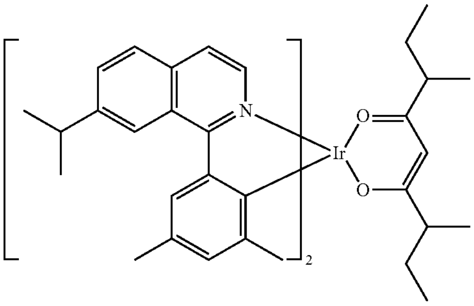
D-119
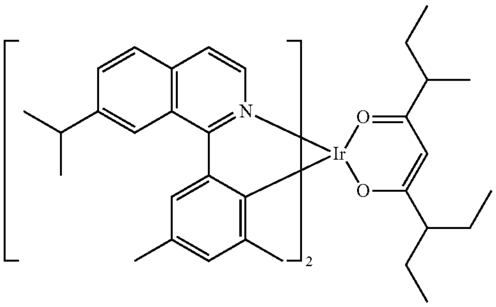
D-120
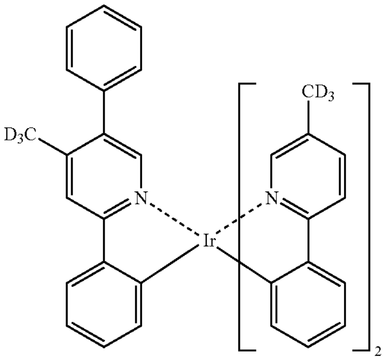
D-121
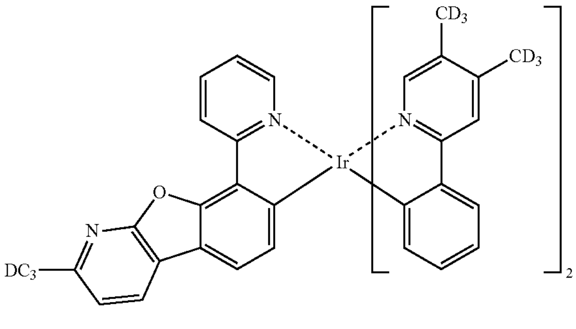

-continued
D-122
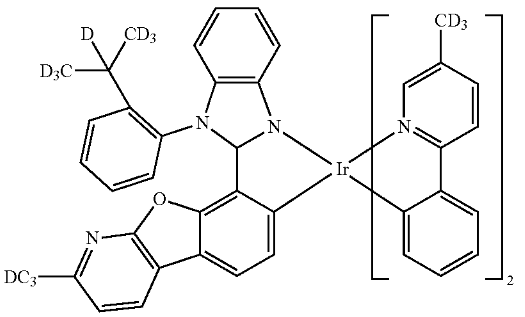
D-123
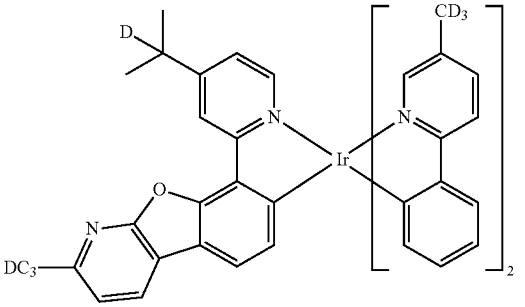
D-124
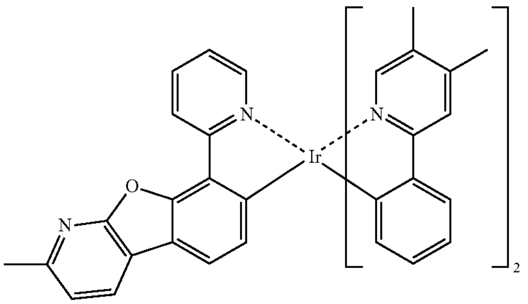
D-125
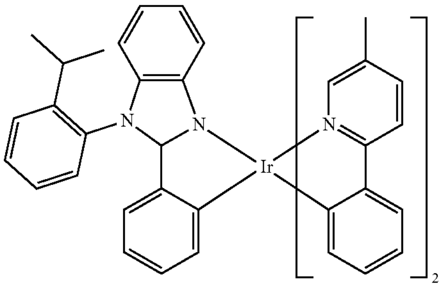
D-126
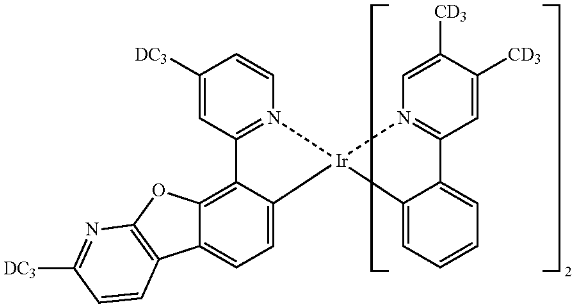
-continued
D-127
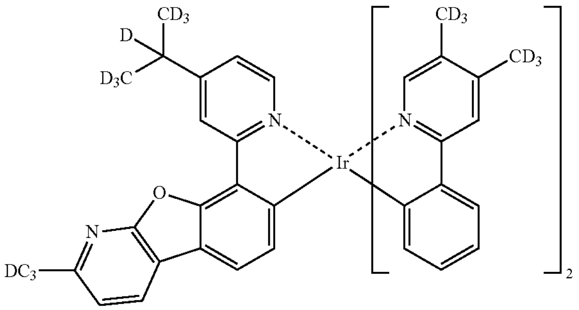
D-128
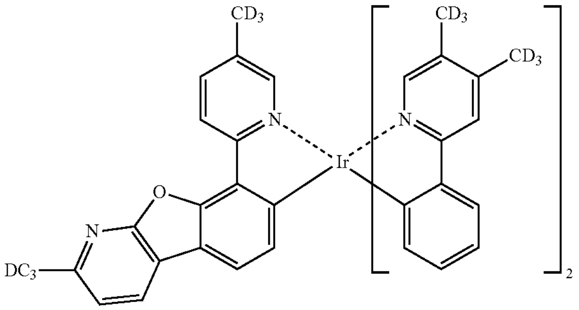
D-129
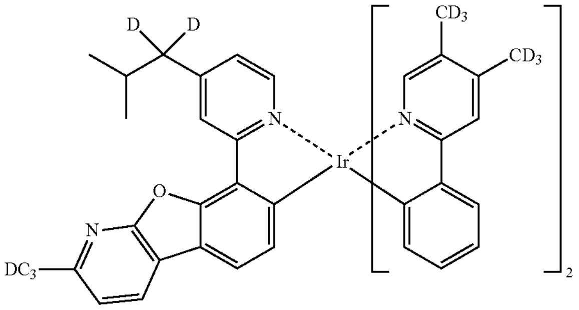
D-130
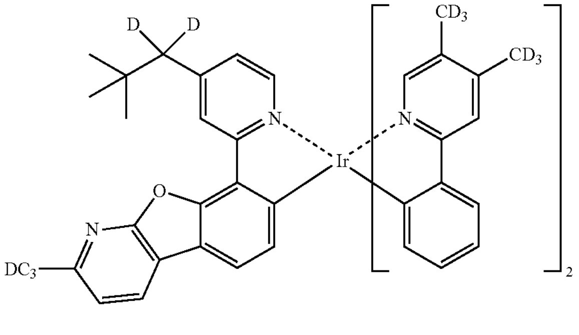

-continued
D-131
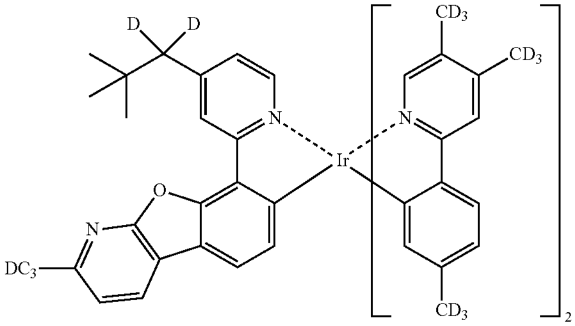
D-132
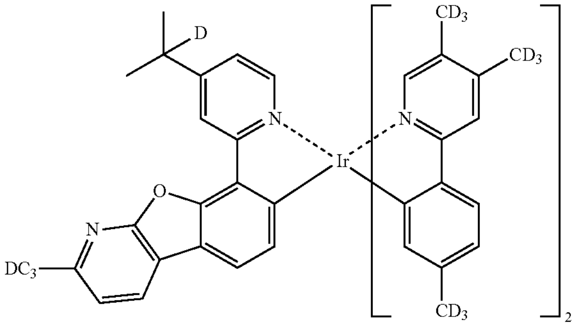
D-133
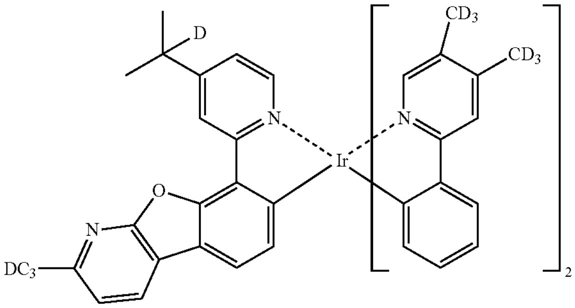
D-134
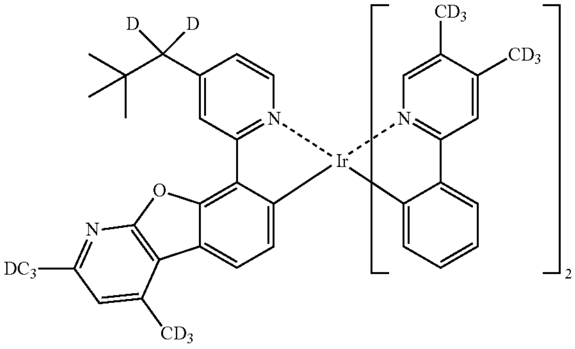
-continued
D-135
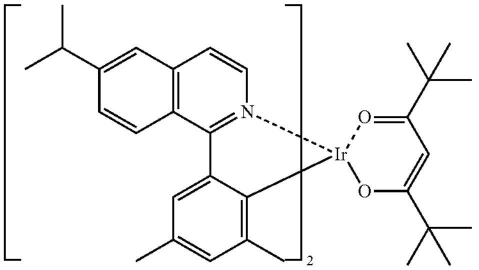
D-136
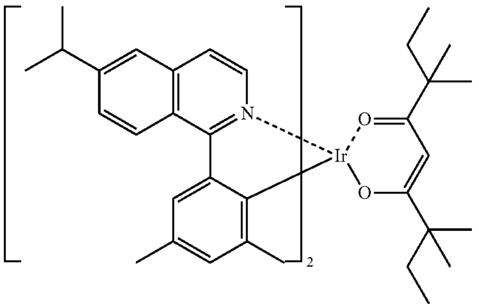
D-137
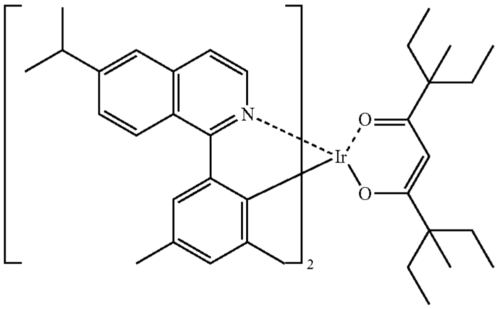
D-138
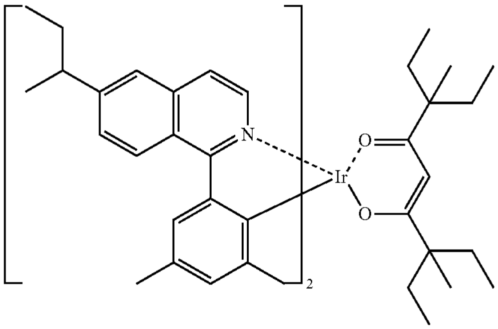
D-139
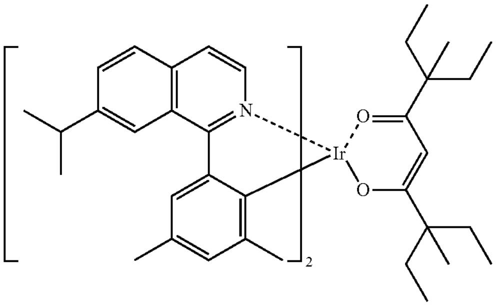

-continued
D-140
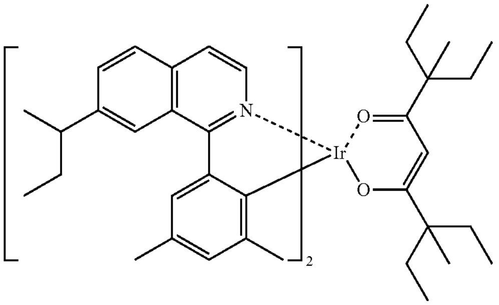
D-141
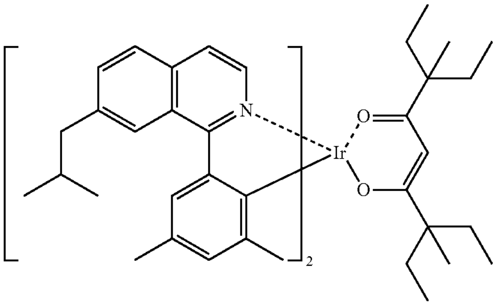
D-142
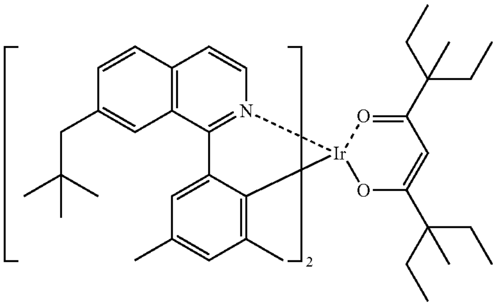
D-143
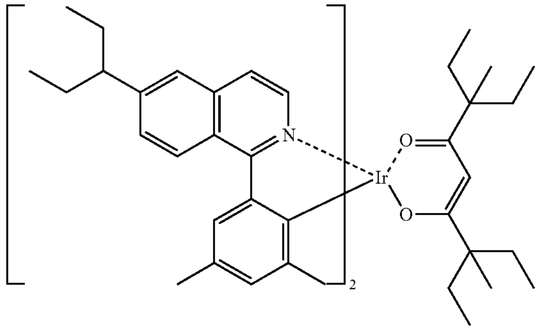
D-144
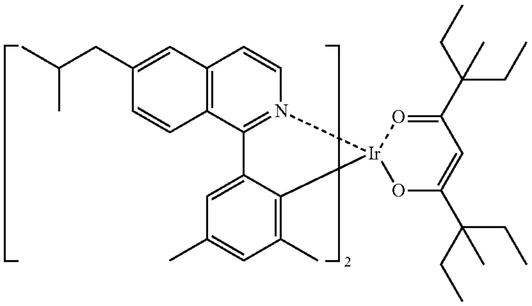
-continued
D-145
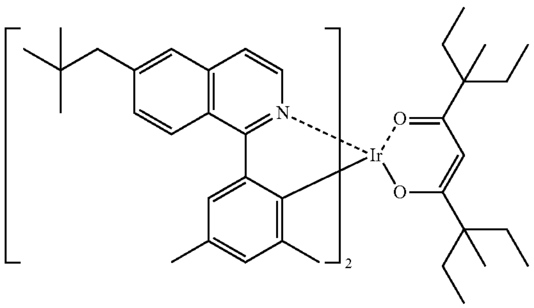
D-146
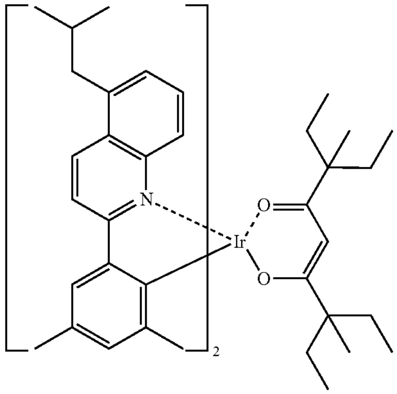
D-147
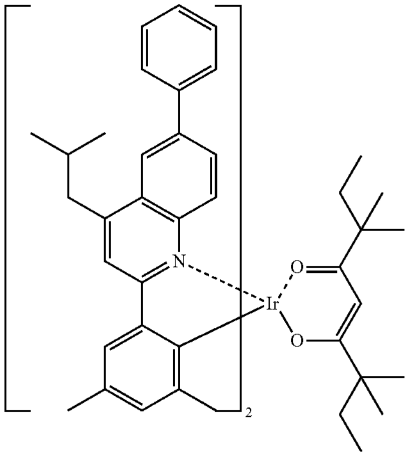
D-148
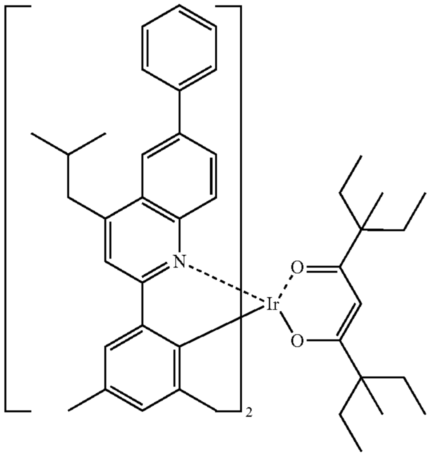

-continued

D-149

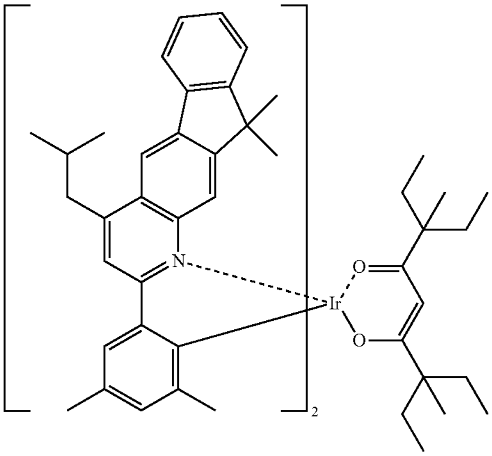

In the organic electroluminescent device of the present disclosure, a hole injection layer, a hole transport layer, or an electron blocking layer, or a combination thereof may be used between the anode and the light-emitting layer. The hole injection layer may be multilayers in order to lower the hole injection barrier (or hole injection voltage) from the anode to the hole transport layer or the electron blocking layer, wherein each of the multilayers may use two compounds simultaneously. The hole transport layer or the electron blocking layer may also be multilayers.

In addition, an electron buffer layer, a hole blocking layer, an electron transport layer, or an electron injection layer, or a combination thereof may be used between the light-emitting layer and the cathode. The electron buffer layer may be multilayers in order to control the injection of the electrons and improve the interfacial properties between the light-emitting layer and the electron injection layer, wherein each of the multilayers may use two compounds simultaneously. The hole blocking layer or the electron transport layer may also be multilayers, wherein each of the multilayers may use a plurality of compounds.

In order to form each layer of the organic electroluminescent device of the present disclosure, dry film-forming methods such as vacuum evaporation, sputtering, plasma, and ion plating methods, or wet film-forming methods such as ink jet printing, nozzle printing, slot coating, spin coating, dip coating, and flow coating methods can be used.

When using a solvent in a wet film-forming method, a thin film can be formed by dissolving or diffusing materials forming each layer into any suitable solvent such as ethanol, chloroform, tetrahydrofuran, dioxane, etc. The solvent can be any solvent where the materials forming each layer can be dissolved or diffused, and where there are no problems in film-formation capability.

In addition, the first host compound and the second host compound may be film-formed in the above-listed methods, commonly by a co-evaporation process or a mixture-evaporation process. The co-evaporation is a mixed deposition method in which two or more materials are placed in a respective individual crucible source and an electric current is applied to both cells at the same time to evaporate the materials. The mixture-evaporation is a mixed deposition method in which two or more materials are mixed in one crucible source before evaporating them, and an electric current is applied to the cell to evaporate the materials. Also, when the first and second host compounds are present in the same layer or different layers in the organic electroluminescent device, the two host compounds can be individually deposited. For example, the first host compound may be deposited, and then the second host compound may be deposited.

The present disclosure may provide a display system by using a plurality of host materials comprising the compound represented by formula 1, and the compound represented by formula 2. That is, it is possible to produce a display system or a lighting system by using the plurality of host materials of the present disclosure. Specifically, it is possible to produce a display system, e.g., a display system for smartphones, tablets, notebooks, PCs, TVs, or cars, or a lighting system, e.g., an outdoor or indoor lighting system, by using the plurality of host materials of the present disclosure.

Hereinafter, the preparation method of the compound of the present disclosure will be explained in detail. However, the present disclosure is not limited to the following examples.

Example 1: Preparation of Compound H-1-38

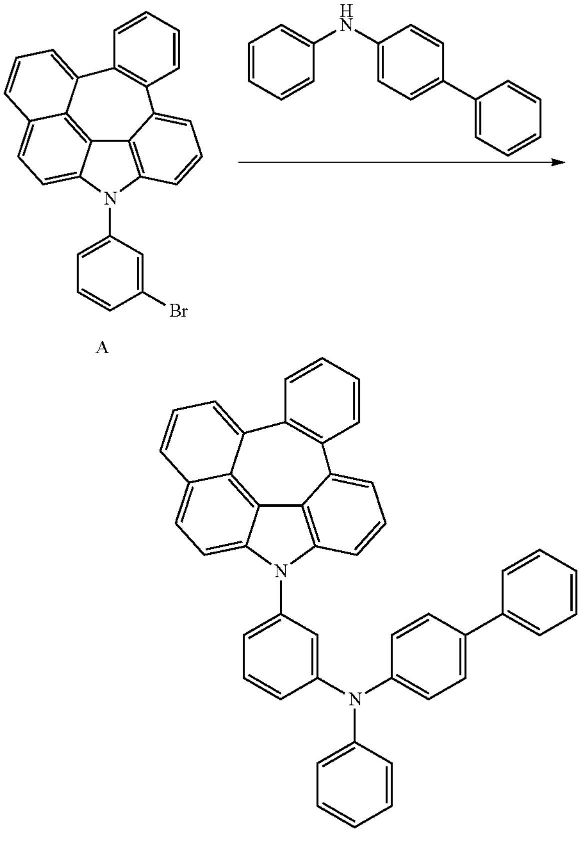

A

H-1-38

5.0 g of compound A (11.2 mmol), 3.0 g of N-phenyl-[1, 1'-biphenyl]-4-amine (12.3 mmol), 0.5 g of $Pd_2(dba)_3$ (0.56 mmol), 0.46 g of s-phos (1.12 mmol), and 2.7 g of NaOtBu (28 mmol) were added to 60 mL of toluene, and the mixture was stirred under reflux for 6 hours. After completion of the reaction, the reaction mixture was cooled to room temperature, and stirred at room temperature, and then MeOH was added thereto. The resultant solid was filtered under reduced pressure, and then separated by column chromatography with MC/Hex to obtain 2.3 g of compound H-1-38 (yield: 34%).

| | MW | M.P. |
|---|---|---|
| H-1-38 | 610.8 | 132° C. |

Example 2: Preparation of Compound H-1-58

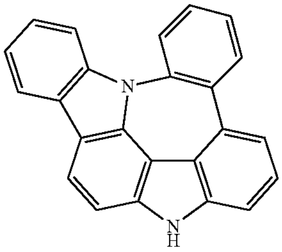

+

B

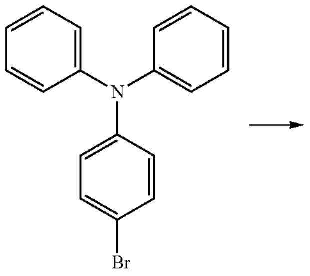

-continued

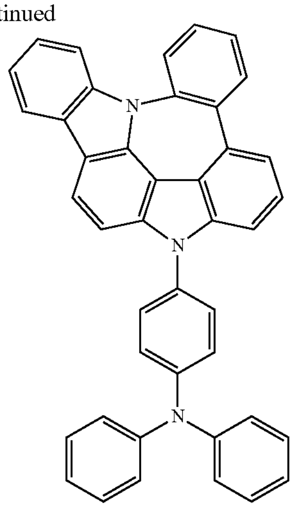

H-1-58

5.0 g of compound B (15.2 mmol), 5.4 g of 4-bromo-N, N-diphenylaniline (16.7 mmol), 0.7 g of $Pd_2(dba)_3$ (0.76 mmol), 0.6 g of s-phos (1.52 mmol), and 2.9 g of NaOtBu (30.4 mmol) were added to 80 mL of o-xylene, and the mixture was stirred under reflux for 4 hours. After completion of the reaction, the mixture was cooled to room temperature, and stirred at room temperature, and then MeOH was added thereto. The resultant solid was filtered under reduced pressure, and then separated by column chromatography with MC/Hex to obtain 4.0 g of compound H-1-58 (yield: 46%).

| | MW | M.P. |
|---|---|---|
| H-1-58 | 573.7 | 317° C. |

Example 3: Preparation of Compound C-230

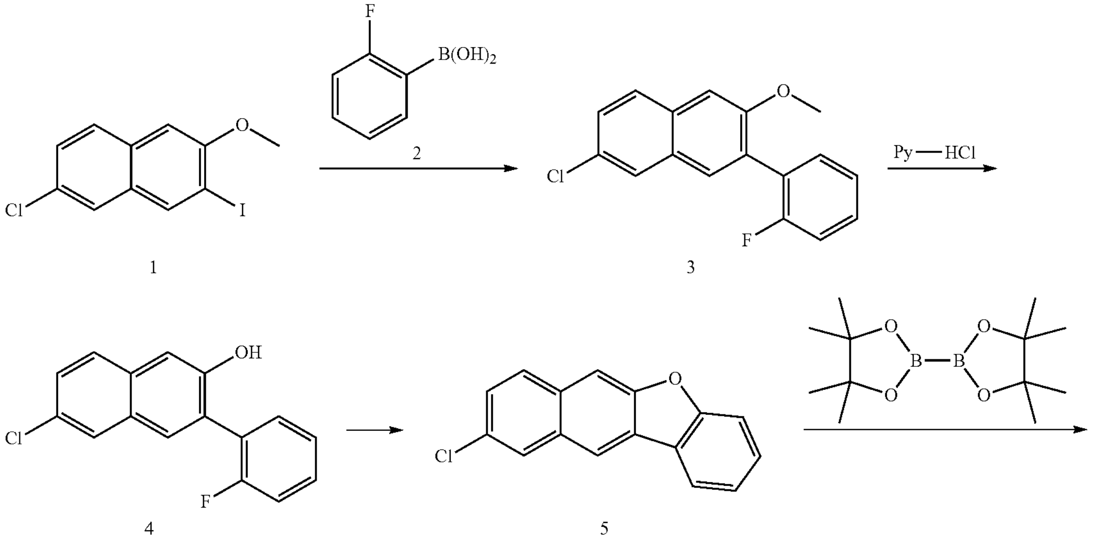

-continued

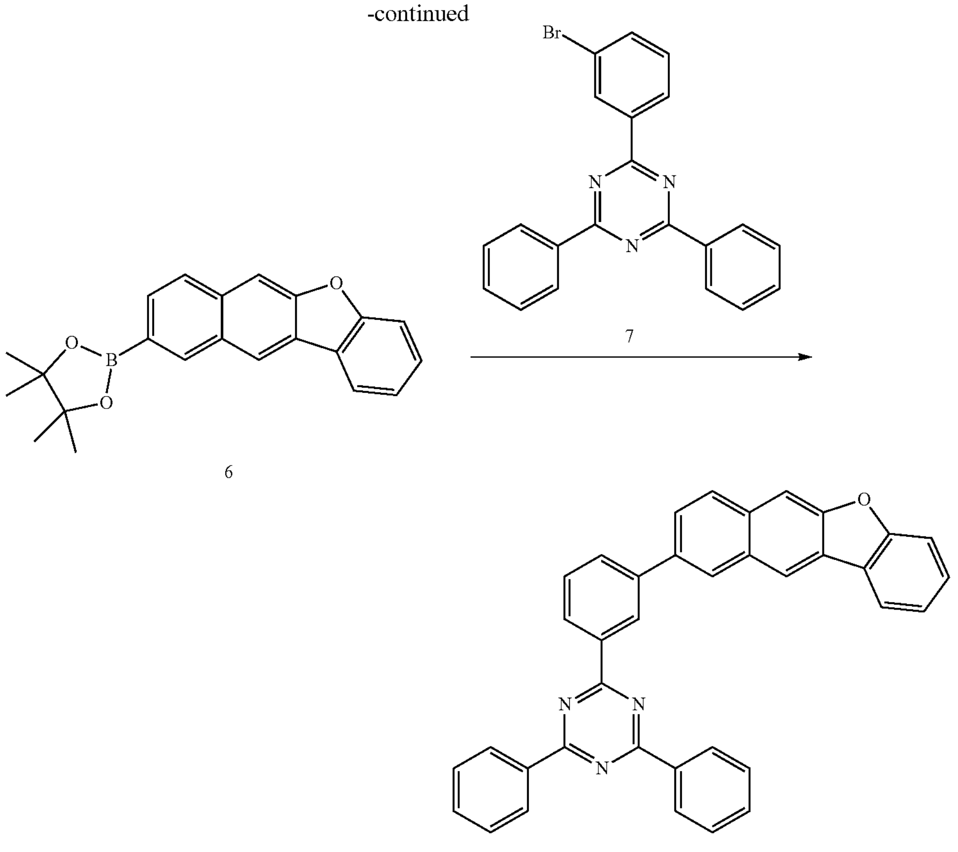

6

7

C-230

1) Synthesis of Compound 3

In a flask, 30 g of compound 1 (94.19 mmol), 13.1 g of compound 2 (94.19 mmol), 5.4 g of tetrakis(triphenylphosphine)palladium(0) (4.709 mmol), and 39 g of potassium carbonate (282.5 mmol) were dissolved in 580 mL of toluene, 145 mL, of ethanol and 145 mL of water, and the mixture was stirred under reflux for 4 hours. After completion of the reaction, the mixture was cooled to room temperature, and extracted with ethyl acetate, and then separated by column chromatography to obtain 18.5 g of compound 3 (yield: 68%).

2) Synthesis of Compound 4

18.5 g of compound 3 (64.52 mmol) and 112 g of pyridine hydrochloride (967.9 mmol) were added to a flask, and the mixture was stirred under reflux at 230° C. for 3 hours. After completion of the reaction, the mixture was cooled to room temperature, and extracted with dimethyl chloride. The extracted organic layer was distilled under reduced pressure, and hexane was added dropwise. The resultant was filtered to obtain 14.8 g of compound 4 (yield: 84%).

3) Synthesis of Compound 5

14.8 g of compound 4 (54.27 mmol), 3.75 g of potassium carbonate (27.13 mmol), and 360 mL of dimethylformamide were added to a flask, and the mixture was stirred under reflux for 1 hour. After completion of the reaction, the mixture was cooled to room temperature, and water was added dropwise. The resultant was filtered to obtain 13 g of compound 5 (yield: 94%).

4) Synthesis of Compound 6

10 g of compound 5 (39.57 mmol), 12 g of bis(pinacolato) diboron (47.48 mmol), 1.4 g of tris(dibenzylideneacetone) dipalladium(0) (1.582 mmol), 1.3 g of 2-dicyclohexylphosphino-2',6'-dimethoxybiphenyl (3.165 mmol), 11.6 g of potassium acetate (118.7 mmol), and 200 mL of 1,4-dioxane were added to a flask, and the mixture was stirred under reflux for 3 hours. After completion of the reaction, the mixture was extracted with ethyl acetate, and then separated by column chromatography to obtain 7.8 g of compound 6 (yield: 54%).

5) Synthesis of Compound C-230

4.5 g of compound 6 (13.07 mmol), 5 g of compound 7 (13.07 mmol), 0.75 g of tetrakis(triphenylphosphine)palladium(0) (0.653 mmol), 5.4 g of potassium carbonate (39.22 mmol), 80 mL of toluene, 20 mL of ethanol, and 20 mL of water were added to a flask, and the mixture was stirred under reflux for 2 hours. After completion of the reaction, the mixture was cooled to room temperature, and methanol was added dropwise. The resultant was filtered, and dissolved in dimethyl chloride, and then separated by column chromatography to obtain 3.7 g of compound C-230 (yield: 53%).

| | MW | M.P. |
|---|---|---|
| C-230 | 525.6 | 272° C. |

Example 4: Preparation of Compound C-167

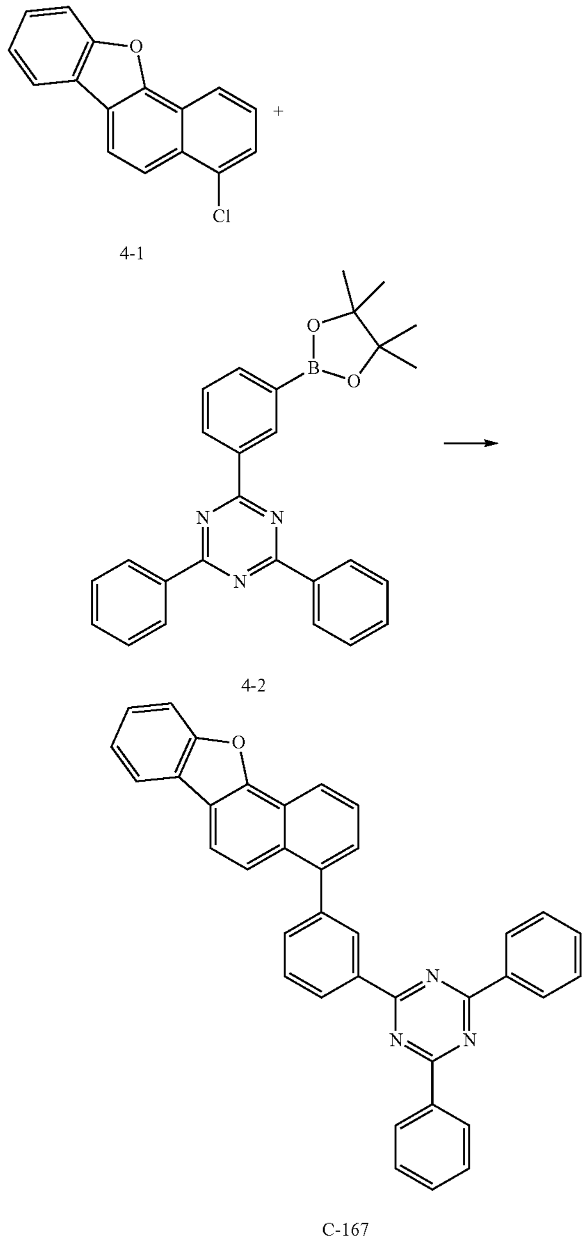

4-1

4-2

C-167

In a flask, 5 g of compound 4-1 (19.03 mmol), 9.1 g of compound 4-2 (20.94 mmol), 0.88 g of tris(dibenzylideneacetone)dipalladium(0) (0.97 mmol), 0.79 g of 2-dicyclohexylphosphino-2',6'-dimethoxybiphenyl (1.93 mmol), and 4.63 g of sodium tert-butoxide (48.3 mmol) were dissolved in 100 mL of o-xylene, and the mixture was stirred under reflux for 4 hours. After completion of the reaction, the mixture was extracted with ethyl acetate, and then separated by column chromatography to obtain 5 g of compound C-167 (yield: 50%).

| | MW | M.P. |
|---|---|---|
| C-167 | 525.61 | 252.6° C. |

Example 5: Preparation of Compound C-489

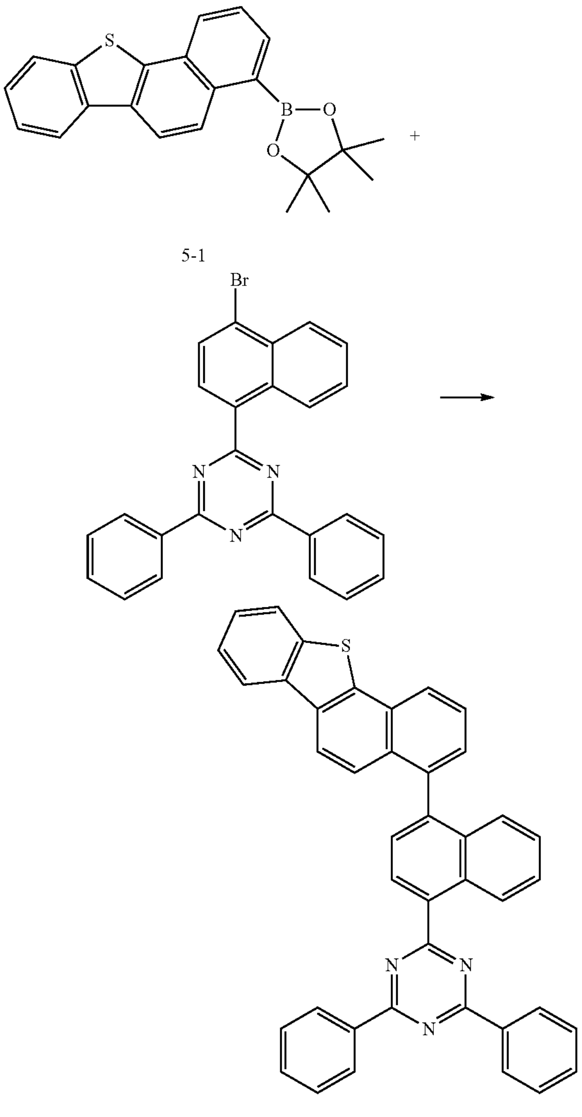

5-1

C-489

5.0 g of compound 5-1 (13.9 mmol), 6.1 g of 2-(4-bromonaphthalen-1-yl)-4,6-diphenyl-1,3,5-triazine (13.9 mmol), 0.8 g of tetrakis(triphenylphosphine)palladium(0) (0.7 mmol), 3.9 g of potassium carbonate (27.8 mmol), 30 mL of toluene, 10 mL of ethanol and 14 mL of distilled water were added to a reaction vessel, and the mixture was stirred at 130° C. for 5 hours. After completion of the reaction, the precipitated solid was washed with distilled water and methanol, and then purified by column chromatography to obtain 3.6 g of compound C-489 (yield: 44%).

| | MW | M.P. |
|---|---|---|
| C-489 | 591.7 | 282.5° C. |

Example 6: Preparation of Compound C-585

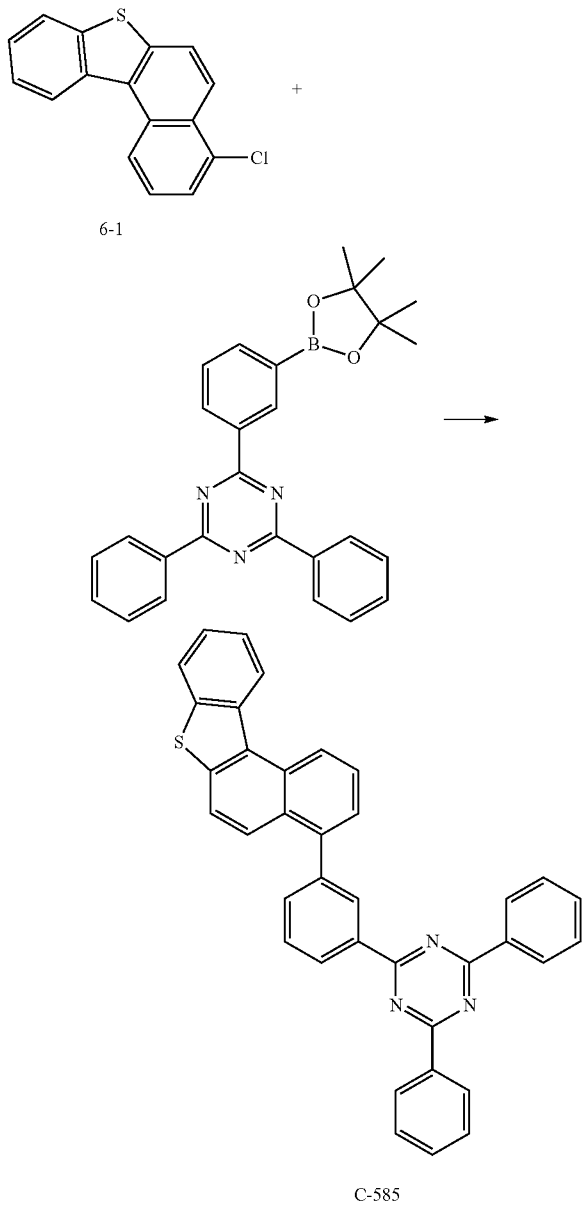

6-1

C-585

4.0 g of compound 6-1 (14.9 mmol), 7.1 g of 2,4-diphenyl-6-(3-(4,4,5,5-tetramethyl-1,3,2-dioxaborolan-2-yl)phenyl)-1,3,5-triazine (16.4 mmol), 0.7 g of tris(dibenzylideneacetone)dipalladium(0) (0.74 mmol), 0.6 g of 2-dicyclohexylphosphino-2',6'-dimethoxybiphenyl (s-phos) (1.49 mmol), 3.5 g of sodium tert-butoxide (37.3 mmol), and 80 mL of o-xylene were added to a reaction vessel, and the mixture was stirred at 165° C. for 5 hours. After completion of the reaction, the mixture was cooled to room temperature, and extracted with ethyl acetate. The extracted organic layer was dried with magnesium sulfate, and the solvent was removed by a rotary evaporator. The residue was purified by column chromatography to obtain 4.2 g of compound C-585 (yield: 81%).

| | MW | M.P. |
|---|---|---|
| C-585 | 541.7 | 283° C. |

Example 7: Preparation of Compound C-174

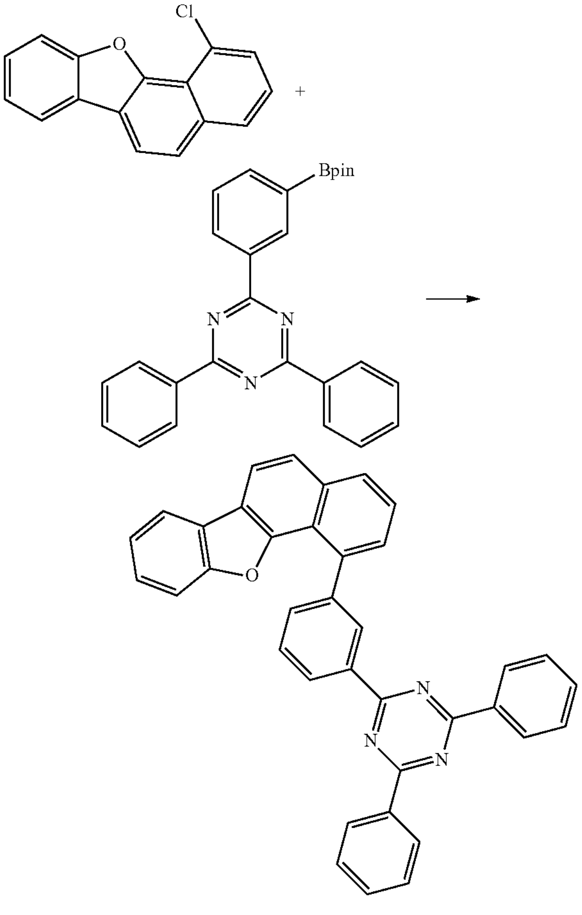

C-174

6.0 g of 1-chloro naphtho[1,2-b]benzofuran (23.7 mmol), 11.4 g of 2,4-diphenyl-6-(3-(4,4,5,5-tetramethyl-1,3,2-dioxaborolan-2-yl)phenyl)-1,3,5-triazine (26.1 mmol), 1.1 g of tris(dibenzylideneacetone)dipalladium(0) (1.2 mmol), 0.98 g of 2-dicyclohexylphosphino-2',6'-dimethoxybiphenyl (s-phos) (2.4 mmol), 12.6 g of potassium phosphate (59.3 mmol) and 120 mL of o-xylene were added to a reaction vessel, and the mixture was stirred at 165° C. for 5 hours. After completion of the reaction, the mixture was cooled to room temperature, and an organic layer was extracted with ethyl acetate. The extracted organic layer was dried with magnesium sulfate, and the solvent was removed by a rotary evaporator. The residue was purified by column chromatography to obtain 4.0 g of compound C-174 (yield: 32%).

| | MW | M.P. |
|---|---|---|
| C-174 | 525.6 | 244° C. |

Example 8: Preparation of Compound C-520

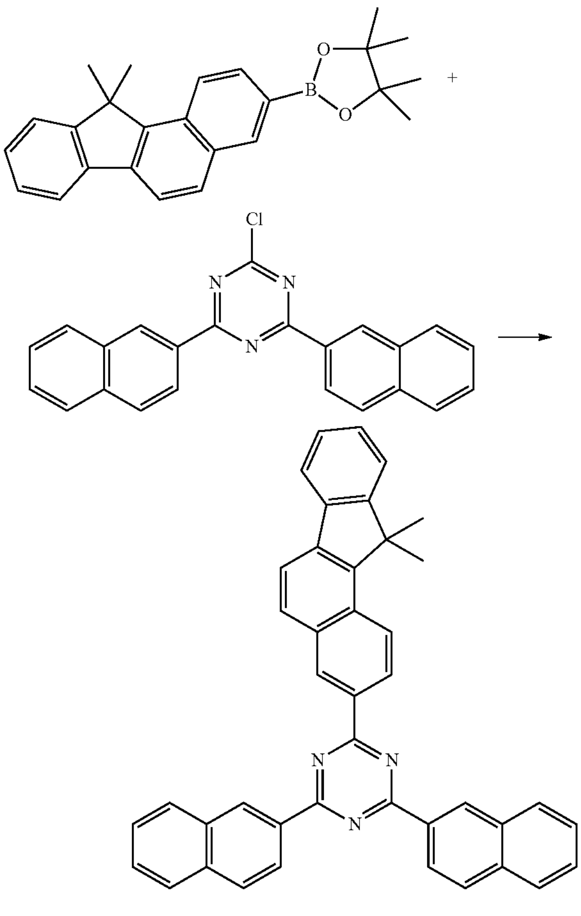

C-520

4.23 g of 2-(11,11-dimethyl-11H-benzo[a]fluoren-3-yl)-4,4,5,5-tetramethyl-1,3,2-dioxaborolane (11.4 mmol), 5.04 g of 2-chloro-4,6-di(naphthalen-2-yl)-1,3,5-triazine (13.7 mmol), 0.66 g of tetrakis(triphenylphosphine)palladium(0) (0.57 mmol), 3.15 g of potassium carbonate (22.8 mmol), 35 mL of toluene, 7 mL of ethanol, and 11 mL of distilled water were added to a reaction vessel, and the mixture was stirred at 130° C. for 15 hours. After completion of the reaction, the precipitated solid was washed with distilled water and methanol, and then separated by column chromatography to obtain 4.5 g of compound C-520 (yield: 69%).

| | MW | M.P. |
|---|---|---|
| C-520 | 575.7 | 293° C. |

Example 9: Preparation of Compound C-584

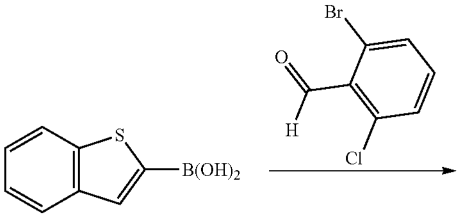

C

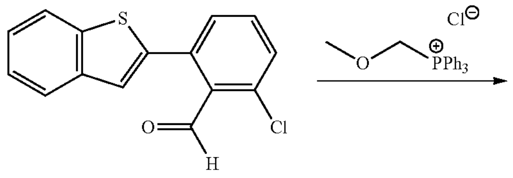

1-1

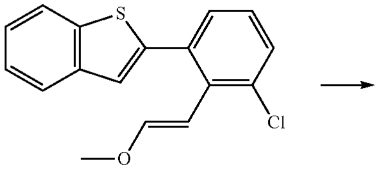

1-2

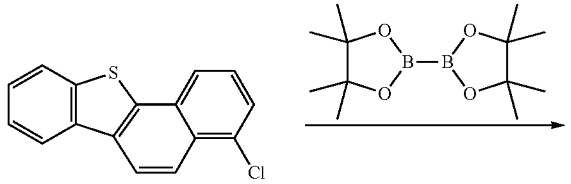

1-3

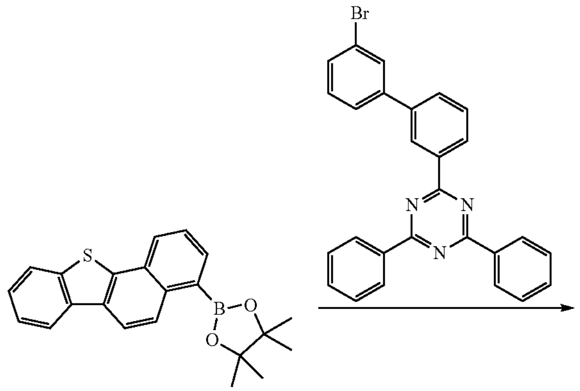

1-4

-continued

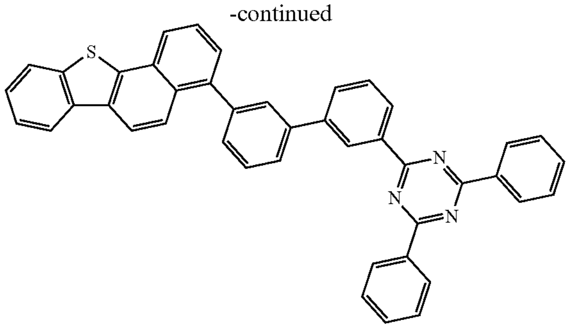

C-584

1) Synthesis of Compound 1-1

37 g of compound C (205.05 mmol), 30 g of 2-bromo-6-chlorobenzaldehyde (136.7 mmol), 4.7 g of tetrakis(triphenylphosphine)palladium(0) (4.1 mmol), 47.2 g of potassium carbonate (341.75 mmol), 400 mL of tetrahydrofuran, and 100 mL of distilled water were added to a reaction vessel, and the mixture was stirred at 100° C. for 4 hours. After completion of the reaction, the reaction mixture was washed with distilled water, and an organic layer was extracted with ethyl acetate. The extracted organic layer was dried with magnesium sulfate and the solvent was removed by a rotary evaporator. The residue was purified by column chromatography to obtain 35 g of compound 1-1 (yield: 94%).

2) Synthesis of Compound 1-2

35 g of compound 1-1 (128.32 mmol), 66 g of (methoxymethyl)triphenylphosphonium chloride (192.48 mmol) and 350 mL of tetrahydrofuran were added to a reaction vessel, and then 193 mL of 1M potassium tert-butoxide was added dropwise at 0° C. After completion of the dropwise addition, the reaction temperature was gradually raised to room temperature, and the mixture was further stirred for 2 hours. After completion of the reaction, an organic layer was extracted with ethyl acetate. The extracted organic layer was dried with magnesium sulfate and the solvent was removed by a rotary evaporator. The residue was purified by column chromatography to obtain 31 g of compound 1-2 (yield: 80%).

3) Synthesis of Compound 1-3

In a reaction vessel, 31 g of compound 1-2 (103.06 mmol) was dissolved in chlorobenzene, and 3.1 mL of Eaton's reagent was slowly added dropwise. After completion of the dropwise addition, the mixture was further stirred at room temperature for 2 hours. After completion of the reaction, the reaction mixture was washed with distilled water, and an organic layer was extracted with ethyl acetate. The extracted organic layer was dried with magnesium sulfate and the solvent was removed by a rotary evaporator. The residue was purified by column chromatography to obtain 24.4 g of compound 1-3 (yield: 88%).

4) Synthesis of Compound 1-4

9.0 g of compound 1-3 (29.77 mmol), 9.1 g of bis(pinacolato)diboron (35.72 mmol), 1.1 g of tris(dibenzylideneacetone)dipalladium(0) (1.19 mmol), 1.0 g of 2-dicyclohexylphosphino-2',6'-dimethoxybiphenyl (s-phos) (2.38 mmol), 8.8 g of potassium acetate (89.31 mmol) and 150 mL of 1,4-dioxane were added to a reaction vessel, and the mixture was stirred under reflux at 130° C. for 6 hours. After completion of the reaction, the reaction mixture was cooled to room temperature, and an organic layer was extracted with ethyl acetate. The extracted organic layer was dried with magnesium sulfate and the solvent was removed by a rotary evaporator. The residue was purified by column chromatography to obtain 9.0 g of compound 1-4 (yield: 84%).

5) Synthesis of Compound C-584

4.5 g of compound 1-4 (12.49 mmol), 6.6 g of 2-(3'-bromo-[1,1'-biphenyl]-3-yl)-4,6-diphenyl-1,3,5-triazine (14.20 mmol), 0.4 g of tetrakis(triphenylphosphine)palladium(0) (0.34 mmol), 3.0 g of sodium carbonate (28.38 mmol), 55 mL of toluene, 14 mL of ethanol, and 14 mL of distilled water were added to a reaction vessel, and the mixture was stirred at 130° C. for 4 hours. After completion of the reaction, the precipitated solid was washed with distilled water and methanol. The residue was purified by column chromatography to obtain 3.9 g of compound C-584 (yield: 51%).

| | MW | M.P. |
|---|---|---|
| C-584 | 617.7 | 268° C. |

Hereinafter, the properties of an OLED according to the present disclosure will be explained in detail. However, the following examples merely illustrate the properties of an OLED according to the present disclosure in detail, but the present disclosure is not limited to the following examples.

Device Examples 1-1 to 1-4: Producing an OLED Deposited with a First Host Compound and a Second Host Compound According to the Present Disclosure as Hosts An OLED according to the present disclosure was produced as follows: A transparent electrode indium tin oxide (ITO) thin film (10 Ω/sq) on a glass substrate for an OLED (GEOMATEC CO., LTD., Japan) was subjected to an ultrasonic washing with acetone, trichloroethylene, acetone, ethanol and distilled water, sequentially, and then was stored in isopropanol. The ITO substrate was mounted on a substrate holder of a vacuum vapor deposition apparatus. Compound HI-1 was introduced into a cell of the vacuum vapor deposition apparatus, and the pressure in the chamber of the apparatus was then controlled to $10^{-6}$ torr. Thereafter, an electric current was applied to the cell to evaporate the above-introduced material, thereby forming a first hole injection layer having a thickness of 80 nm on the ITO substrate. Next, compound HI-2 was introduced into another cell of the vacuum vapor deposition apparatus and was evaporated by applying an electric current to the cell, thereby forming a second hole injection layer having a thickness of 5 nm on the first hole injection layer. Compound HT-1 was then introduced into another cell of the vacuum vapor deposition apparatus and was evaporated by applying an electric current to the cell, thereby forming a first hole transport layer having a thickness of 10 nm on the second hole injection layer. Compound HT-2 was then introduced into another cell of the vacuum vapor deposition apparatus and was evaporated by applying an electric current to the cell, thereby forming a second hole transport layer having a thickness of 60 nm on the first hole transport layer. After forming the hole injection layers and the hole transport layers, a light-emitting layer was formed thereon as follows: The first host compound and the second host compound shown in Table 1 were introduced into two cells of the vacuum vapor depositing apparatus, respectively, as hosts and compound D-39 was introduced into another cell as a dopant. The two host materials were evaporated at a rate of 1:1, and at the same time the dopant material was evaporated at different rates to be deposited in a doping amount of 3 wt % based on the total amount of the hosts and dopant to form a light-emitting layer having a thickness of 40 nm on the second hole transport layer. Next, compound ET-1 and compound EI-1 were evaporated at a rate of 1:1 in two other cells to deposit an electron transport layer having a thickness of 35 nm on the light-emitting layer. After depositing compound EI-1 as an electron injection layer having a thickness of 2 nm on the electron transport layer, an Al cathode having a thickness of 80 nm was deposited on the electron injection layer by another vacuum vapor deposition apparatus. Thus, an OLED was produced.

Device Examples 2-1 and 2-2: Producing an OLED Deposited with a First Host Compound and a Second Host Compound According to the Present Disclosure as Hosts An OLED was produced in the same manner as in Device Example 1-1, except that the second hole transport layer was deposited to a thickness of 45 nm using compound HT-3, and compound EB-1 was deposited to a thickness of 15 nm as an electron blocking layer thereon, and the first host compound and the second host compound shown in Table 1 below were used.

Comparative Examples 1-1 to 1-4: Producing an OLED Comprising Comparative Compound as a Host(s)

An OLED was produced in the same manner as in Device Example 1-1, except that only the second host compound shown in Table 1 below was used in Comparative Examples 1-1 and 1-2, and the first host compound and the second host compound shown in Table 1 were used in Comparative Examples 1-3 and 1-4.

The power efficiency at a luminance of 1,000 nit, and the time taken for luminance to decrease from 100% to 95% (lifetime; T95) at a luminance of 5,000 nit of the OLEDs produced in the Device Examples and the Comparative Examples are provided in Table 1 below.

TABLE 1

| | First Host | Second Host | Power Efficiency [lm/W] | Lifetime T95 [hr] |
|---|---|---|---|---|
| Device Example 1-1 | H-1-61 | C-5 | 31.2 | 387 |
| Device Example 1-2 | H-1-61 | C-146 | 30.6 | 261 |
| Device Example 1-3 | H-1-91 | C-489 | 28.9 | 136 |
| Device Example 1-4 | H-1-58 | C-489 | 32.3 | 169 |
| Device Example 2-1 | H-1-57 | C-491 | 32.1 | 100 |
| Device Example 2-2 | H-1-39 | C-13 | 32.0 | 285 |
| Comparative Example 1-1 | — | C-146 | 28.7 | 11 |
| Comparative Example 1-2 | — | C-491 | 25.9 | 19 |
| Comparative Example 1-3 | A-1 | C-146 | 29.4 | 76 |
| Comparative Example 1-4 | A-2 | C-146 | 29.5 | 14 |

From Table 1, it can be confirmed that the OLEDs comprising a specific combination of compounds according to the present disclosure as a host material exhibit an equivalent or improved level of power efficiency and significantly improved lifetime compared to the conventional OLEDs.

Device Examples 3 to 7: Producing a Red OLED Deposited with a First Host Compound and a Second Host Compound According to the Present Disclosure as Hosts An OLED according to the present disclosure was produced as follows: An OLED according to the present disclosure was produced as follows: A transparent electrode indium tin oxide (ITO) thin film (10 Ω/sq) on a glass substrate for an OLED (GEOMATEC CO., LTD., Japan) was subjected to an ultrasonic washing with acetone and isopropyl alcohol, sequentially, and then was stored in isopropyl alcohol. The ITO substrate was mounted on a substrate holder of a vacuum vapor deposition apparatus. Compound HI-3 was introduced into a cell of the vacuum vapor deposition apparatus, and compound HT-1 was introduced into another cell of the vacuum vapor deposition apparatus. The two materials were evaporated at different rates and compound HI-3 was deposited in a doping amount of 3 wt % based on the total amount of compound HI-3 and compound HT-1 to form a hole injection layer having a thickness of 10 nm on the ITO substrate. Next, compound HT-1 was deposited on the first hole injection layer to form a first hole transport layer having a thickness of 80 nm. Subsequently, compound HT-2 was then introduced into another cell of the vacuum vapor deposition apparatus and was evaporated by applying an electric current to the cell, thereby forming a second hole transport layer having a thickness of 60 nm on the first hole transport layer. After forming the hole injection layer and the hole transport layers, a light-emitting layer was formed thereon as follows: The first and second host compounds shown in Table 2 below were introduced into two cells of the vacuum vapor depositing apparatus as hosts, and compound D-39 was introduced into another cell. The two host materials were evaporated at a rate of 1:1 and the dopant material was simultaneously evaporated at a different rate and the dopant was deposited in a doping amount of 3 wt % based on the total amount of the hosts and dopant to form a light-emitting layer having a thickness of 40 nm on the second hole transport layer. Next, compound ET-1 and compound EI-1 as electron transport materials were evaporated at a weight ratio of 50:50 to deposit an electron transport layer having a thickness of 35 nm on the light-emitting layer. After depositing compound EI-1 as an electron injection layer having a thickness of 2 nm on the electron transport layer, an Al cathode having a thickness of 80 nm was deposited on the electron injection layer by another vacuum vapor deposition apparatus. Thus, an OLED was produced. Each compound was used after purification by vacuum sublimation under $10^{-6}$ torr for each material.

Comparative Examples 2 and 3: Producing an OLED Comprising Comparative Compound as a Host An OLED was produced in the same manner as in Device Example 3, except that only the second host compound shown in Table 2 below was used as a host material.

The driving voltage, the luminous efficiency, and the emission color at a luminance of 1,000 nit, and the time taken for luminance to decrease from 100% to 95% (lifetime; T95) at a luminance of 5,000 nit of the OLEDs produced in Device Examples 3 to 7 and Comparative Examples 2 and 3 are provided in Table 2 below.

TABLE 2

| | First Host | Second Host | Driving Voltage [V] | Luminous Efficiency [cd/A] | Emission Color | Lifetime T95 [hr] |
|---|---|---|---|---|---|---|
| Device Example 3 | H-1-91 | C-254 | 3.1 | 35.8 | Red | 356 |
| Device Example 4 | H-1-58 | C-254 | 3.2 | 32.6 | Red | 113 |
| Device Example 5 | H-1-91 | C-263 | 3.1 | 34.5 | Red | 393 |
| Device Example 6 | H-1-58 | C-263 | 3.0 | 34.5 | Red | 346 |
| Device Example 7 | H-1-39 | C-588 | 2.9 | 32.1 | Red | 385 |
| Comparative Example 2 | — | C-263 | 3.5 | 27.9 | Red | 38.2 |
| Comparative Example 3 | — | C-588 | 3.4 | 23.9 | Red | 19.5 |

From Table 2, it can be confirmed that the OLED comprising a specific combination of compounds according to the present disclosure as a plurality of host materials have significantly improved driving voltage, luminous efficiency and/or lifetime properties compared to the conventional OLEDs.

The compounds used in the Device Examples and the Comparative Examples are shown in Table 3 below.

TABLE 3

| | |
|---|---|
| Hole Injection Layer/ Hole Transport Layer | 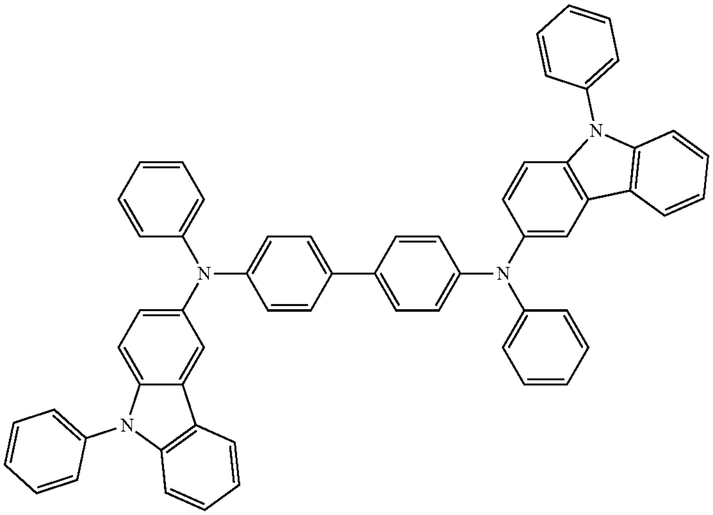 HI-1 |

TABLE 3-continued
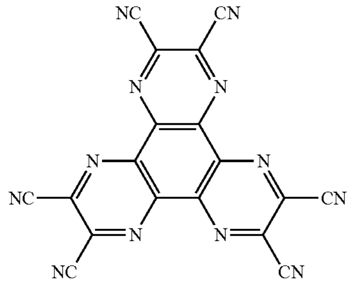
HI-2
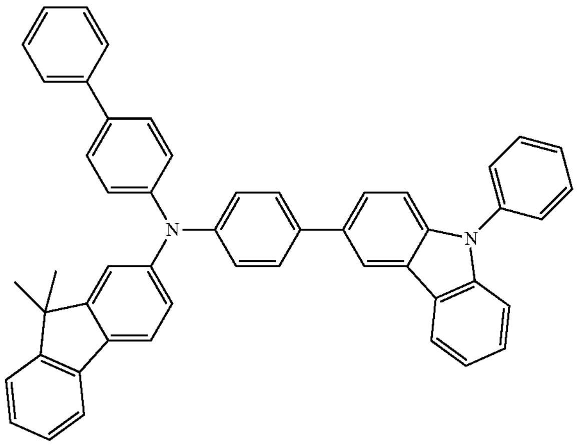
HT-1
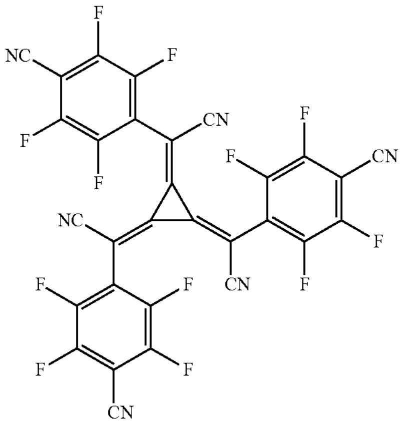
HI-1

TABLE 3-continued
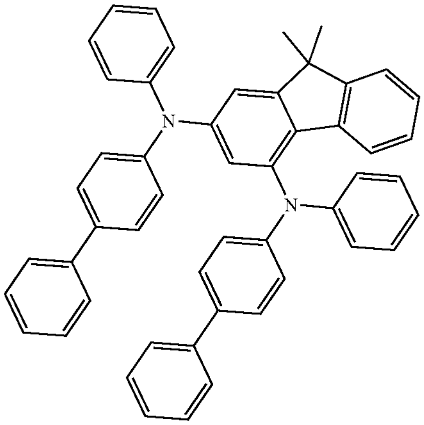
HT-2
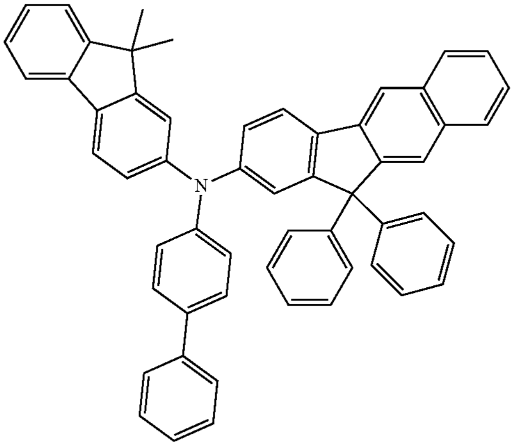
HT-3
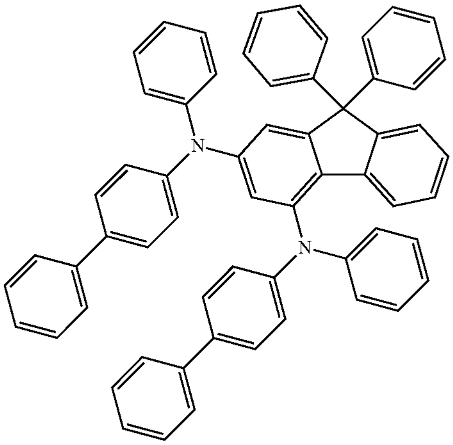
EB-1

TABLE 3-continued
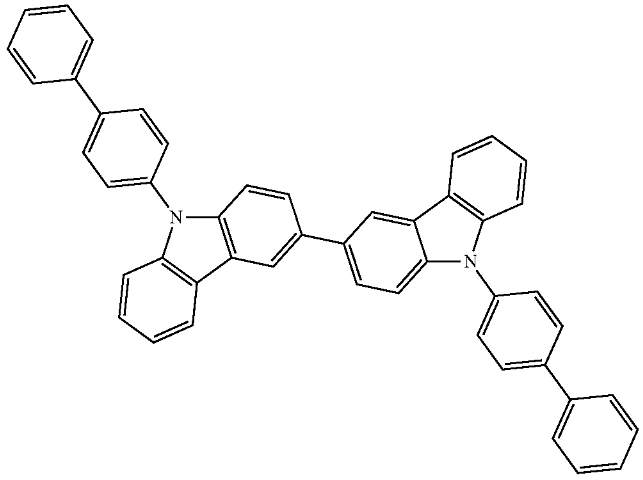
A-1
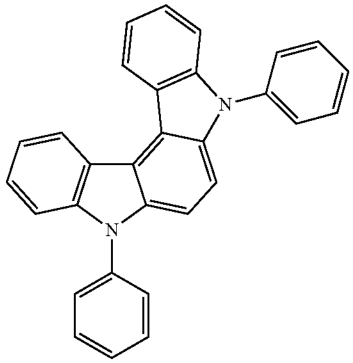
A-2
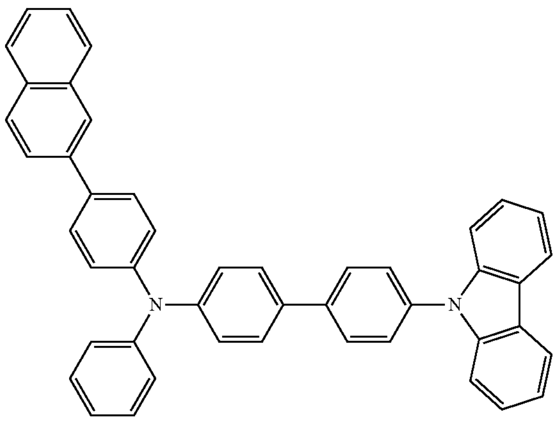
H-1-61

TABLE 3-continued
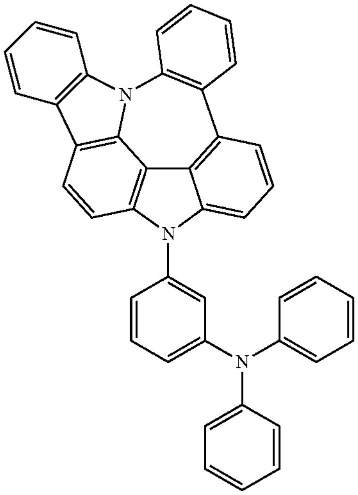 [SMILES: c1ccc(N(c2ccccc2)c2cccc(-n3c4cccc5c6ccccc6n6c7ccccc7c7ccc3c(c54)c76)c2)cc1]
H-1-57
Light-Emitting Layer
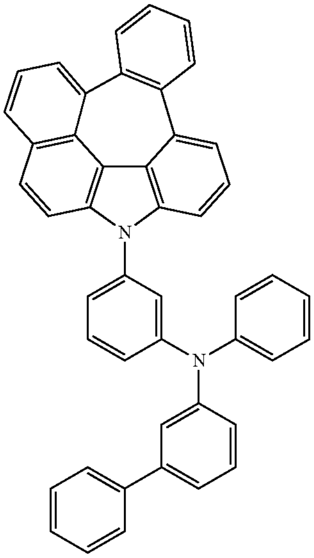 [SMILES: c1ccc(-c2cccc(N(c3ccccc3)c3cccc(-n4c5cccc6c5c5c7c(cccc7ccc54)-c4ccccc4-6)c3)c2)cc1]
H-1-91
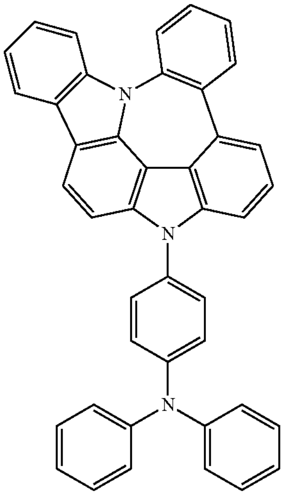 [SMILES: c1ccc(N(c2ccccc2)c2ccc(-n3c4cccc5c6ccccc6n6c7ccccc7c7ccc3c(c54)c76)cc2)cc1]
H-1-58

TABLE 3-continued
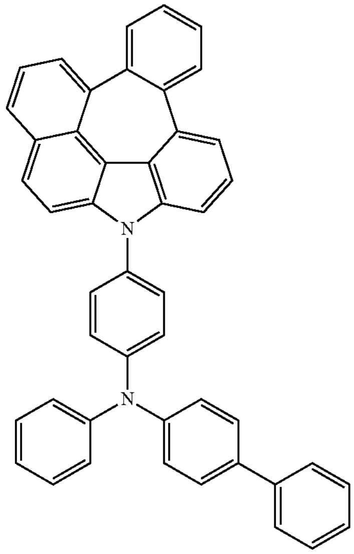 [SMILES: c1ccc(-c2ccc(N(c3ccccc3)c3ccc(-n4c5cccc6c5c5c7c(cccc7ccc54)-c4ccccc4-6)cc3)cc2)cc1]
H-1-39
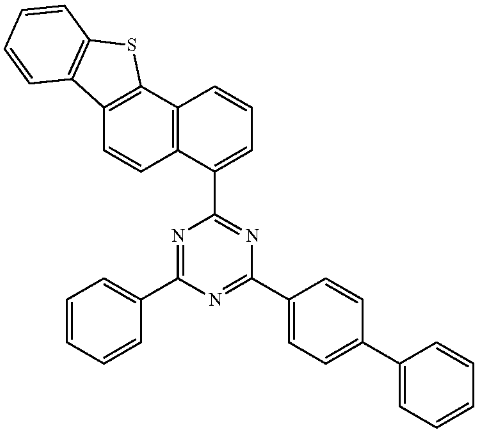 [SMILES: c1ccc(-c2ccc(-c3nc(-c4ccccc4)nc(-c4cccc5c4ccc4c6ccccc6sc54)n3)cc2)cc1]
C-5
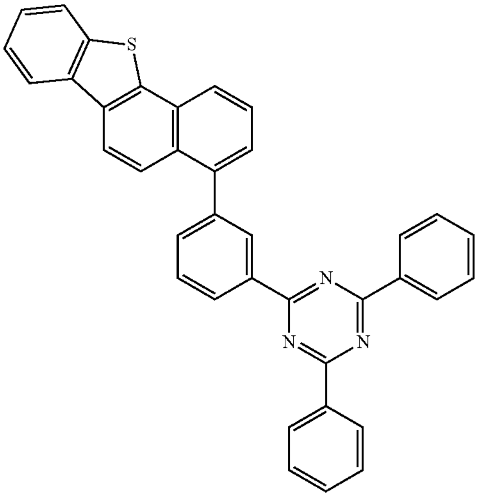 [SMILES: c1ccc(-c2nc(-c3ccccc3)nc(-c3cccc(-c4cccc5c4ccc4c6ccccc6sc54)c3)n2)cc1]
C-146

TABLE 3-continued
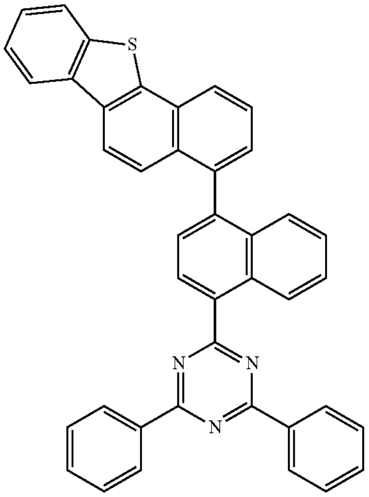 [SMILES: c1ccc(-c2nc(-c3ccccc3)nc(-c3ccc(-c4cccc5c4ccc4c6ccccc6sc54)c4ccccc34)n2)cc1]
C-489
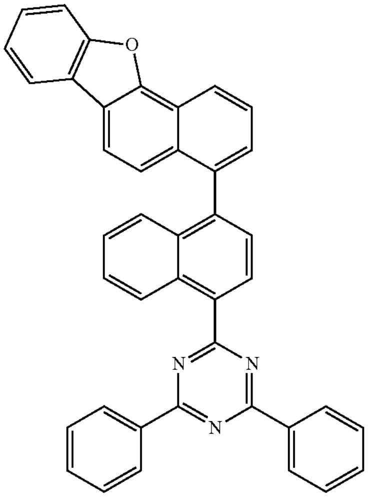 [SMILES: c1ccc(-c2nc(-c3ccccc3)nc(-c3ccc(-c4cccc5c4ccc4c6ccccc6oc54)c4ccccc34)n2)cc1]
C-491
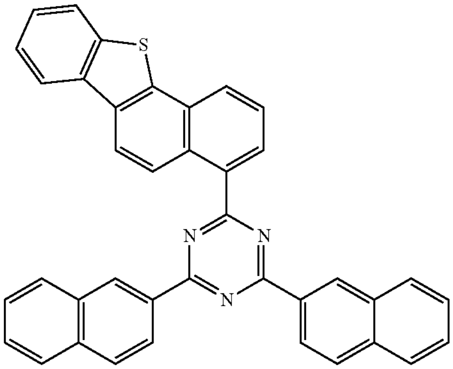 [SMILES: c1ccc2cc(-c3nc(-c4ccc5ccccc5c4)nc(-c4cccc5c4ccc4c6ccccc6sc54)n3)ccc2c1]
C-13

TABLE 3-continued
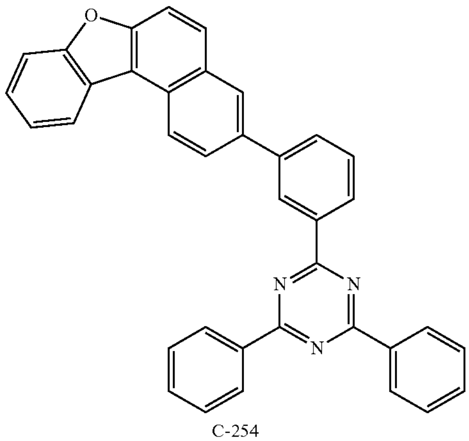
C-254
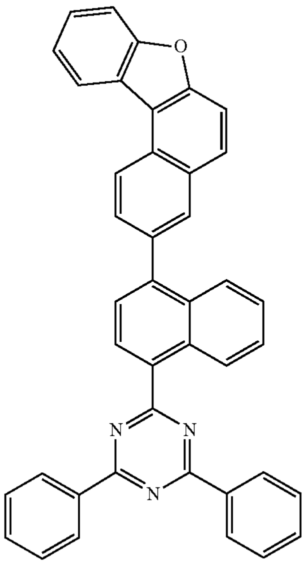 [SMILES: c1ccc(-c2nc(-c3ccccc3)nc(-c3ccc(-c4ccc5c(ccc6oc7ccccc7c65)c4)c4ccccc34)n2)cc1]
C-263
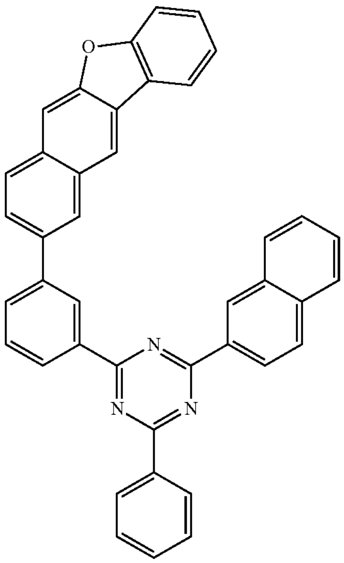 [SMILES: c1ccc(-c2nc(-c3cccc(-c4ccc5cc6oc7ccccc7c6cc5c4)c3)nc(-c3ccc4ccccc4c3)n2)cc1]
C-588

TABLE 3-continued

| | |
|---|---|
| | 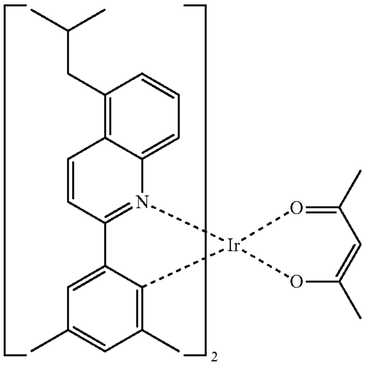 D-39 |
| Electron Transport Layer/Electron Injection Layer | 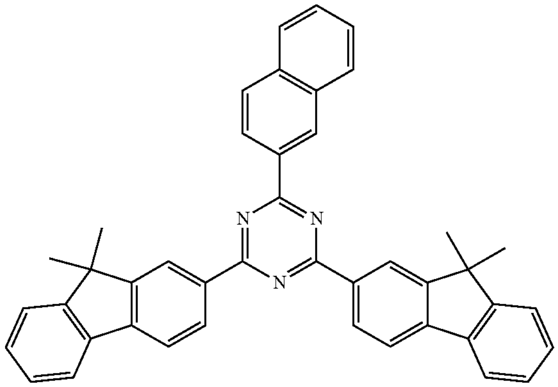 [SMILES: CC1(C)c2ccccc2-c2ccc(-c3nc(-c4ccc5c(c4)C(C)(C)c4ccccc4-5)nc(-c4ccc5ccccc5c4)n3)cc21] ET-1 |
| | 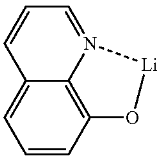 EI-1 |

The invention claimed is:

1. A plurality of host materials comprising a first host material and a second host material, wherein the first host material comprises a compound represented by the following formula 1-10:

(1-10)

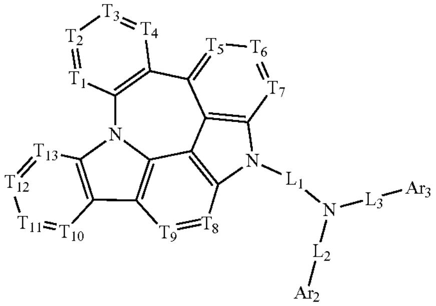

wherein, $L_1$ to $L_3$, each independently, represent a single bond, a substituted or unsubstituted (C6-C30)arylene, or a substituted or unsubstituted (3- to 30-membered)heteroarylene;

$Ar_2$ and $Ar_3$, each independently, represent a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino;

$T_1$ to $T_{13}$ each independently, represent N or $CV_1$;

$V_1$ represents hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino; or $R_4$ and $R_5$ may be linked to each other to form a ring(s); or at least two of adjacent $R_7$ to $R_{11}$ may be linked to each other to form a ring(s); or at least two of adjacent $V_1$'s may be linked to each other to form a ring(s);

the second host material comprises a compound represented by the following formula 2-1:

(2-1)

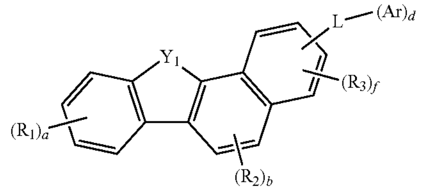

wherein, $Y_1$ represents O, S, $CR_{11}R_{12}$, or $NR_{13}$;

$R_{11}$ and $R_{12}$, each independently, represent hydrogen, deuterium, a halogen, a cyano, a substituted or unsubstituted (C1-C30)alkyl, a substituted or unsubstituted (C3-C30)cycloalkyl, a substituted or unsubstituted (C3-C30)cycloalkenyl, a substituted or unsubstituted (3- to 7-membered)heterocycloalkyl, a substituted or unsubstituted (C6-C30)aryl, or a substituted or unsubstituted (3- to 30-membered)heteroaryl; or $R_{11}$ and $R_{12}$ may be linked to each other to form a spiro ring;

$R_{13}$, each independently, represents hydrogen, deuterium, a halogen, a cyano, a substituted or unsubstituted (C1-C30)alkyl, a substituted or unsubstituted (C3-C30)cycloalkyl, a substituted or unsubstituted (C3-C30)cycloalkenyl, a substituted or unsubstituted (3- to 7-membered)heterocycloalkyl, a substituted or unsubstituted (C6-C30)aryl, or a substituted or unsubstituted (3- to 30-membered)heteroaryl;

$R_1$, each independently, represents hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino; or at least two of adjacent $R_1$'s may be linked to each other to form a ring(s);

$R_2$ and $R_3$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino;

L represents a single bond, a substituted or unsubstituted (C6-C30)arylene, or a substituted or unsubstituted (3- to 30-membered)heteroarylene;

Ar, each independently, represents a substituted or unsubstituted nitrogen-containing (3- to 30-membered)heteroaryl;

a and d, each independently, represent an integer of 1 to 4; where a and d, each independently, are an integer of 2 or more, each of $R_1$, and each of Ar may be the same or different;

b, independently, represents an integer of 1 or 2; where b is an integer of 2, each of $R_2$ may be the same or different; and f, independently, represents an integer of 1 to 3; where f is an integer of 2 or more, each of $R_3$ may be the same or different.

2. The plurality of host materials according to claim 1, wherein the substituents of the substituted alkyl, the substituted aryl, the substituted arylene, the substituted heteroaryl, the substituted heteroarylene, the substituted cycloalkyl, the substituted cycloalkenyl, the substituted heterocycloalkyl, the substituted alkoxy, the substituted trialkylsilyl, the substituted dialkylarylsilyl, the substituted alkyldiarylsilyl, the substituted triarylsilyl, the substituted mono- or di-alkylamino, the substituted mono- or di-arylamino, and the substituted alkylarylamino, each independently, are at least one selected from the group consisting of deuterium; a halogen; a cyano; a carboxyl; a nitro; a hydroxyl; a (C1-C30)alkyl; a halo(C1-C30)alkyl; a (C2-C30)alkenyl; a (C2-C30)alkynyl; a (C1-C30)alkoxy; a (C1-C30)alkylthio; a (C3-C30)cycloalkyl; a (C3-C30)cycloalkenyl; a (3- to 7-membered)heterocycloalkyl; a (C6-C30)aryloxy; a (C6-C30)arylthio; a (3- to 30-membered)heteroaryl unsubstituted or substituted with a (C6-C30)aryl(s); a (C6-C30)aryl unsubstituted or substituted with at least one of a (C1-C30)alkyl(s) and a (3- to 30-membered)heteroaryl(s); a tri(C1-C30)alkylsilyl; a tri(C6-C30)arylsilyl; a di(C1-C30)alkyl(C6-C30)arylsilyl; a (C1-C30)alkyldi(C6-C30)arylsilyl; an amino; a mono- or di-(C1-C30)alkylamino; a mono- or di-(C6-C30)arylamino; a (C1-C30)alkyl(C6-C30)arylamino; a (C1-C30)alkylcarbonyl; a (C1-C30)alkoxycarbonyl; a (C6-C30)arylcarbonyl; a di(C6-C30)arylboronyl; a di(C1-C30)alkylboronyl; a (C1-C30)alkyl(C6-C30)arylboronyl; a (C6-C30)aryl(C1-C30)alkyl; and a (C1-C30)alkyl(C6-C30)aryl.

3. The plurality of host materials according to claim 1, wherein the compound represented by formula 1-10 is at least one selected from the group consisting of the following compounds:

-continued
H-1-47
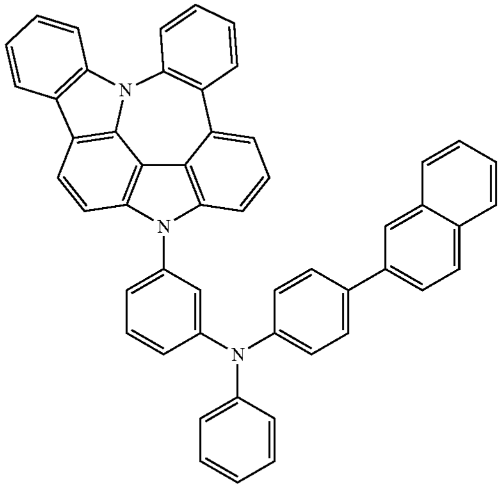
H-1-48
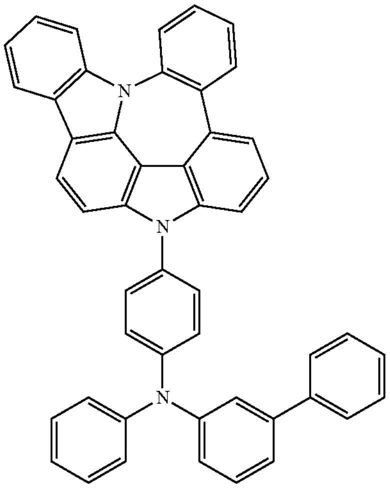
H-1-49
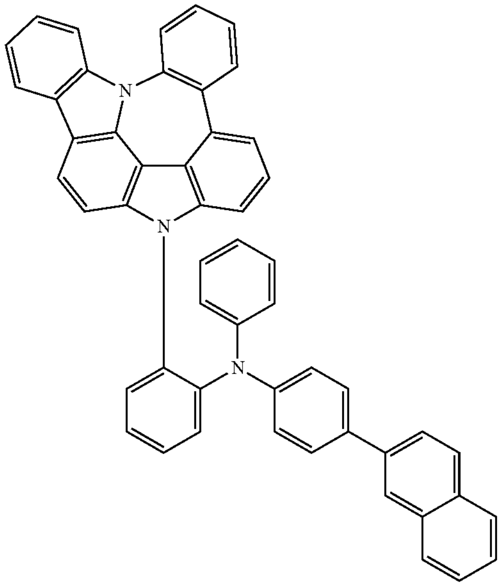
H-1-51
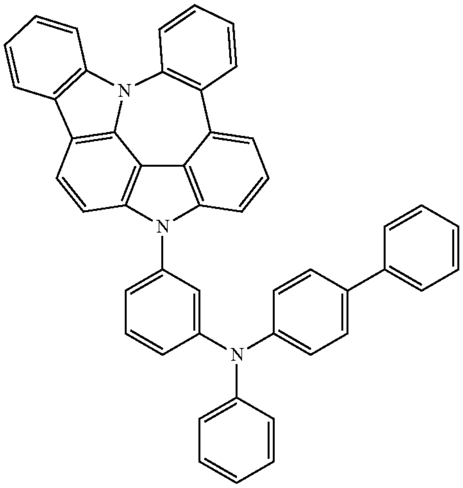
H-1-52
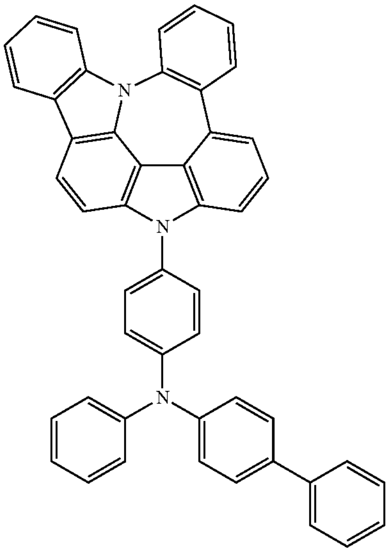
H-1-53
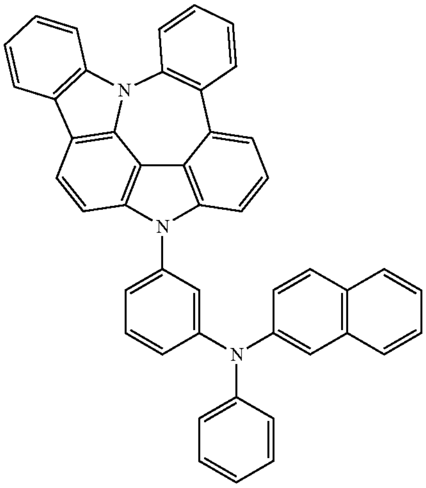

-continued
H-1-54
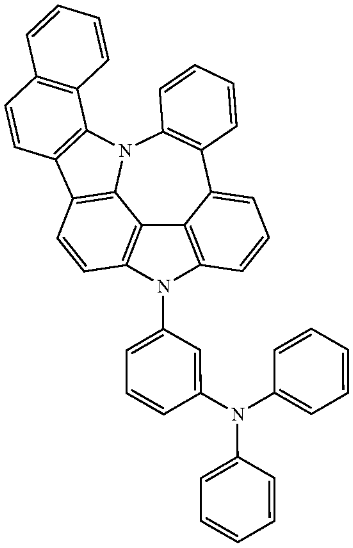
H-1-55
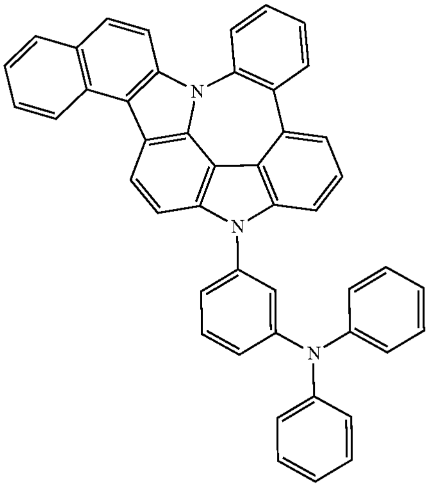
H-1-56
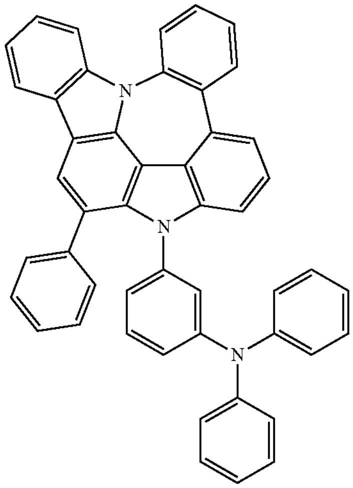
-continued
H-1-57
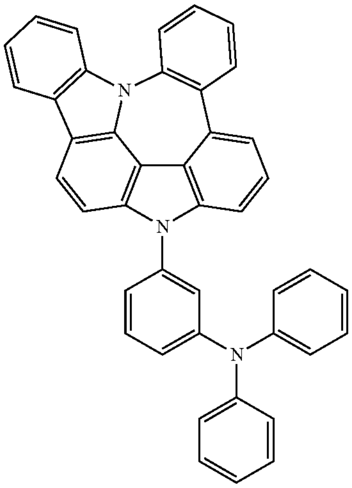
and
H-1-58
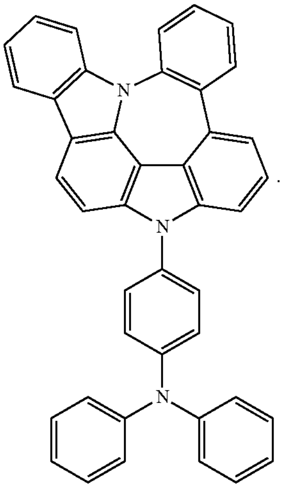
.
4. The plurality of host materials according to claim 1, wherein the compound represented by formula 2-1 is at least one selected from the group consisting of the following compounds:
C-1
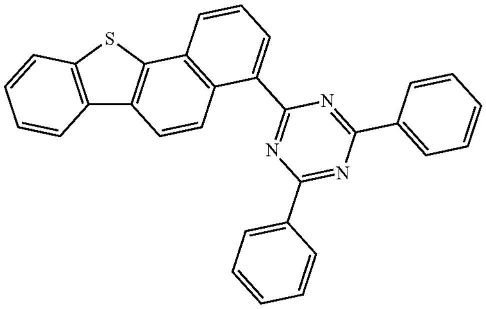

-continued
C-2
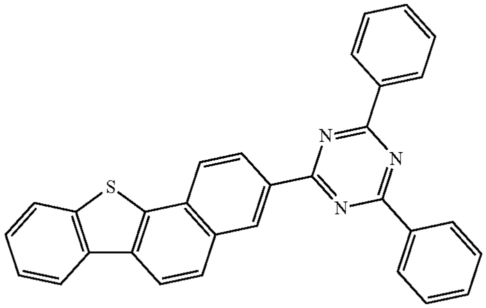
C-3
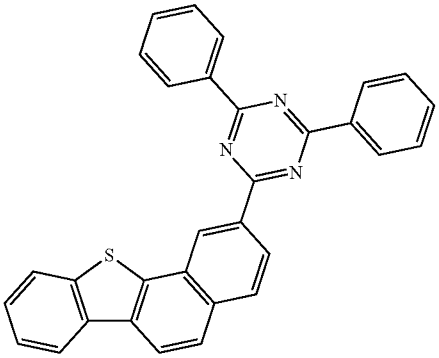
C-4
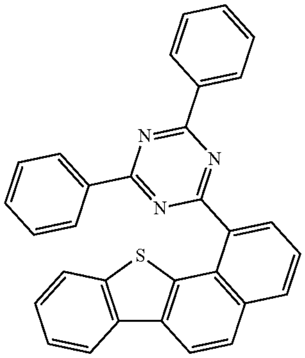
C-5
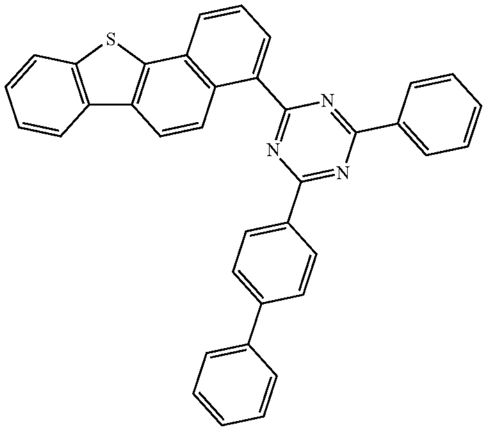
-continued
C-6
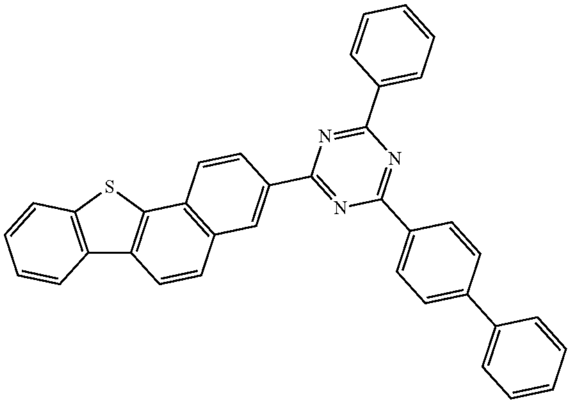
C-7
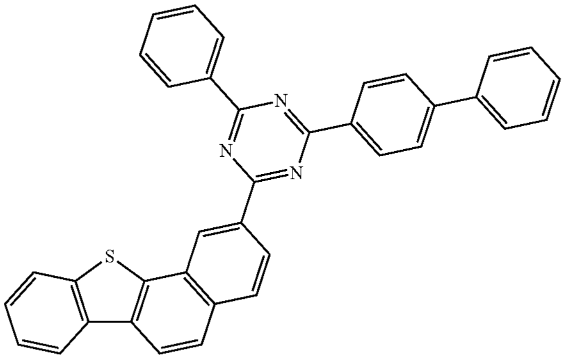
C-8
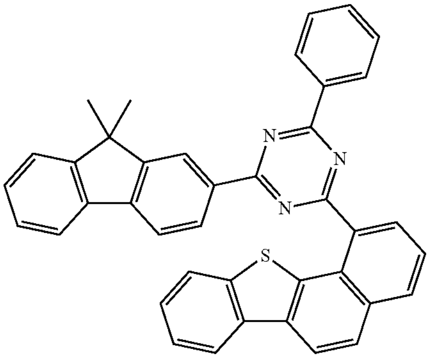
C-9
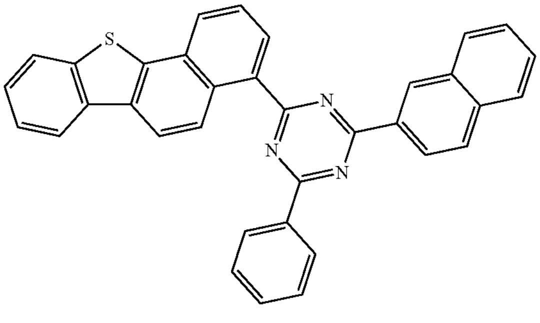

-continued
C-10
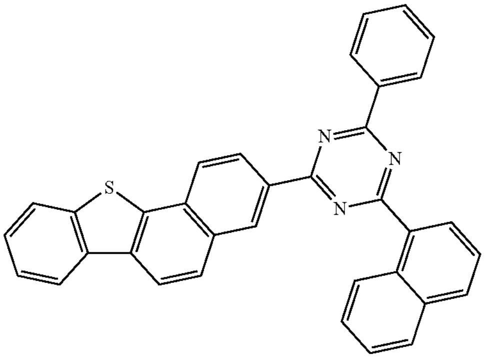
C-11
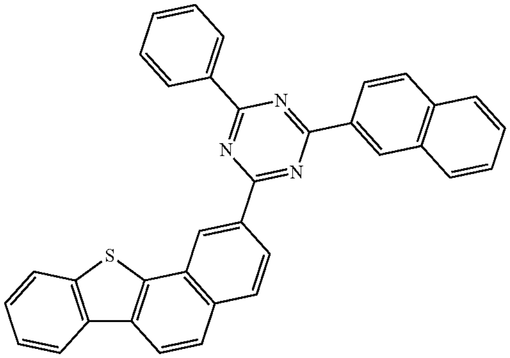
C-12
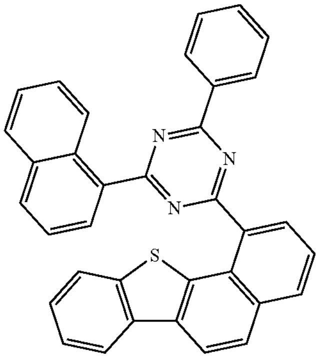
C-13
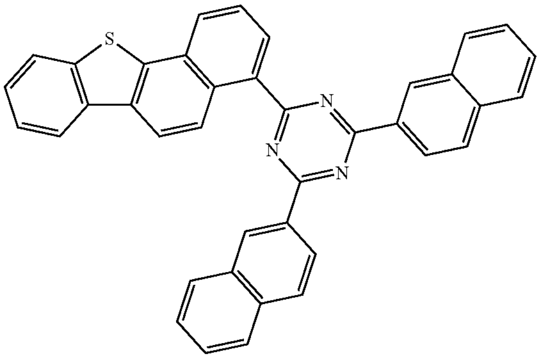
-continued
C-14
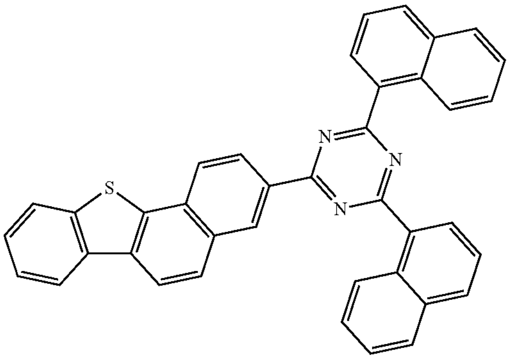
C-15
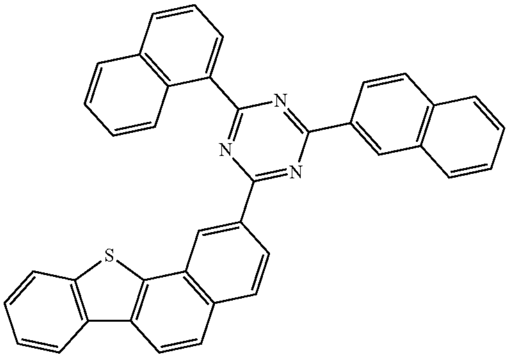
C-16
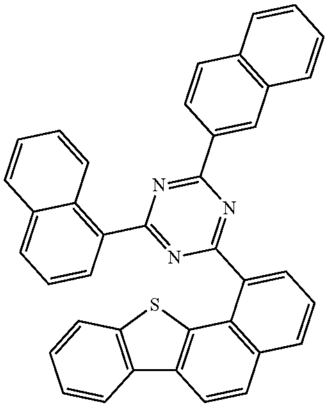
C-17
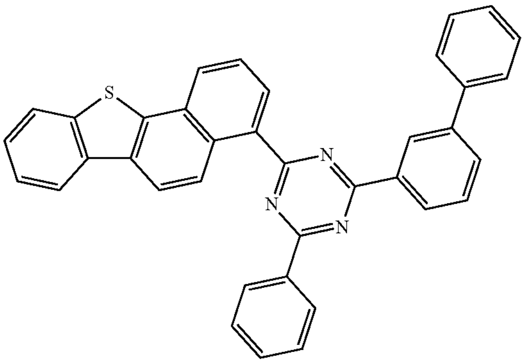

-continued
C-18
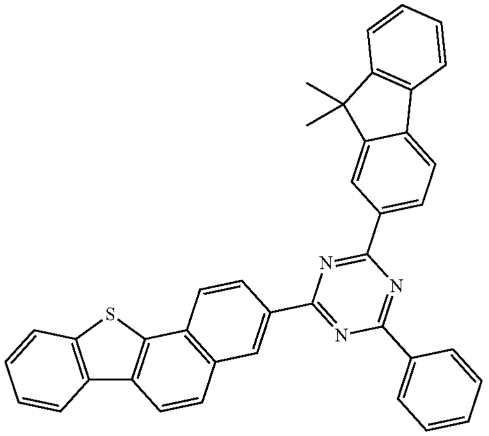
C-19
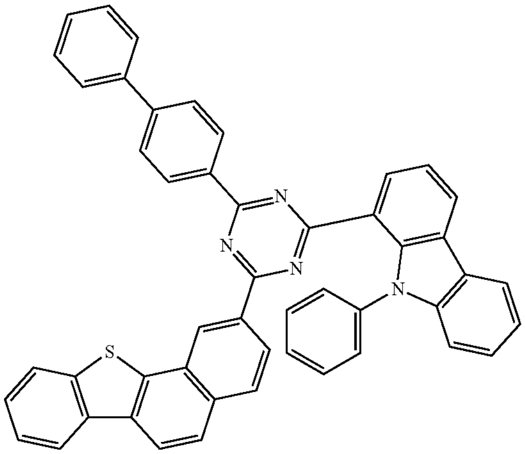
C-20
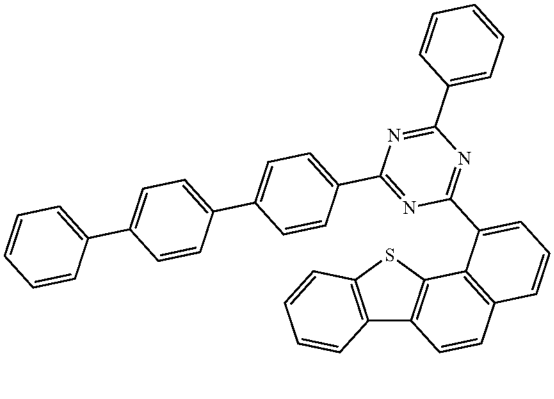
-continued
C-21
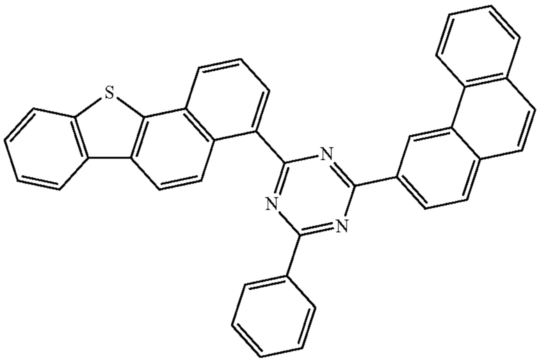
C-22
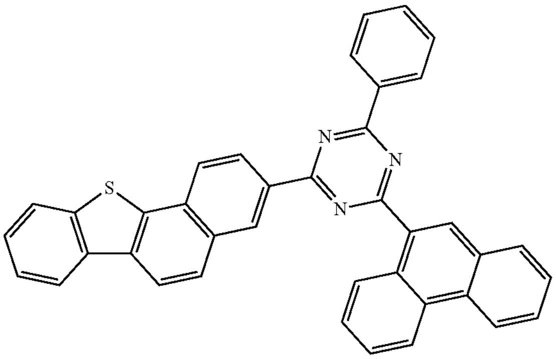
C-23
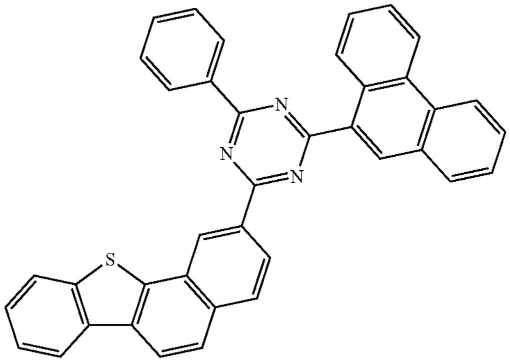
C-24
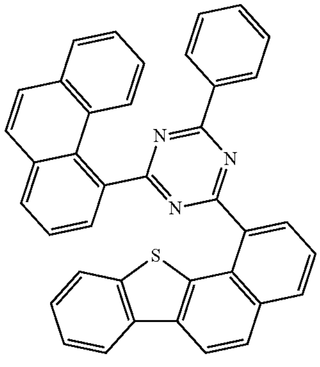

-continued
C-25
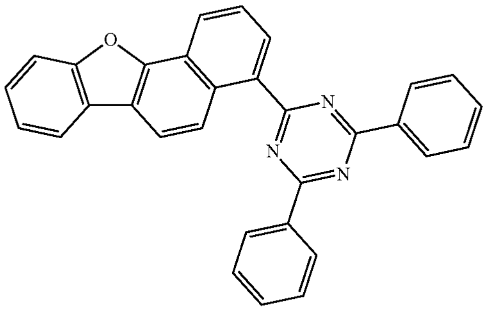
C-26
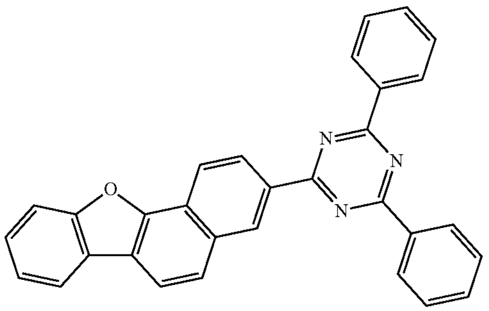
C-27
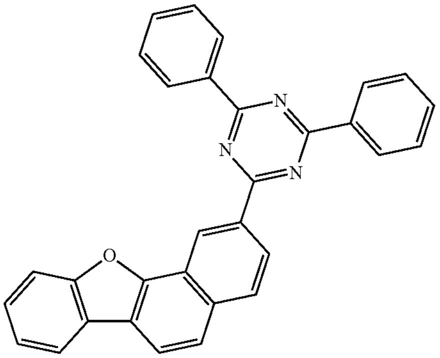
C-28
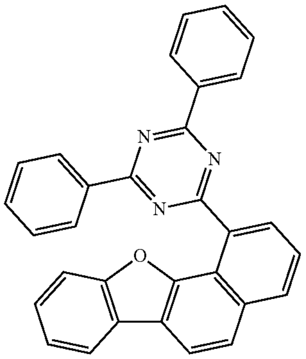
-continued
C-29
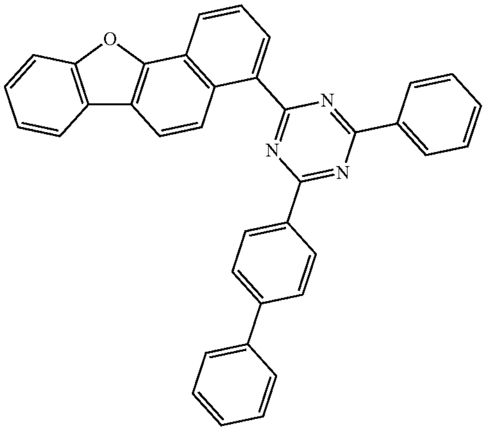
C-30
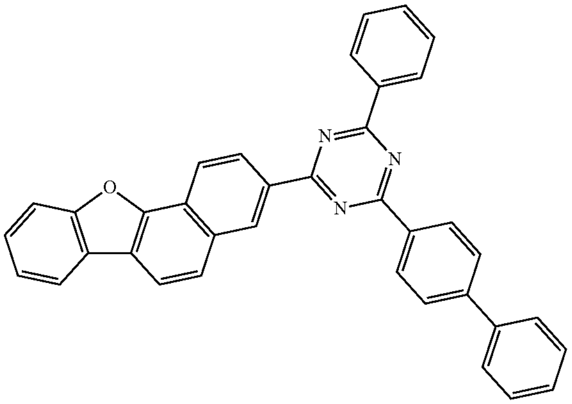
C-31
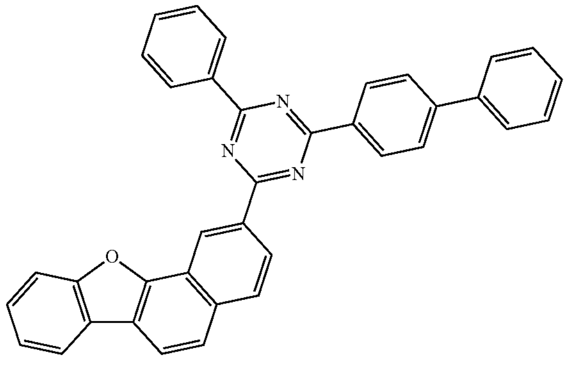
C-32
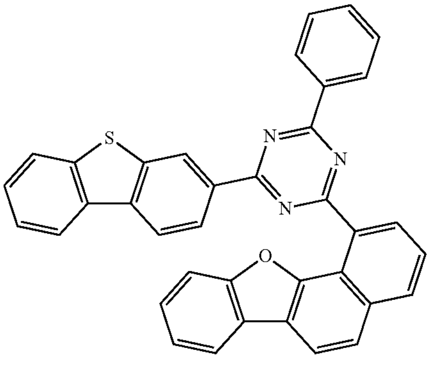

-continued
C-33
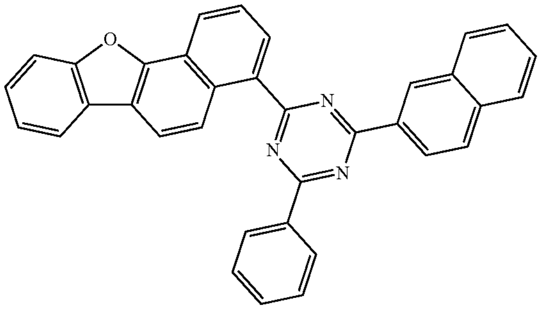
C-34
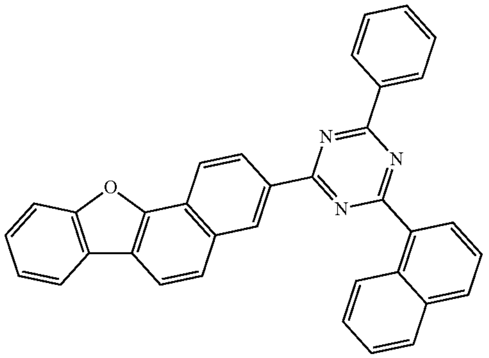
C-35
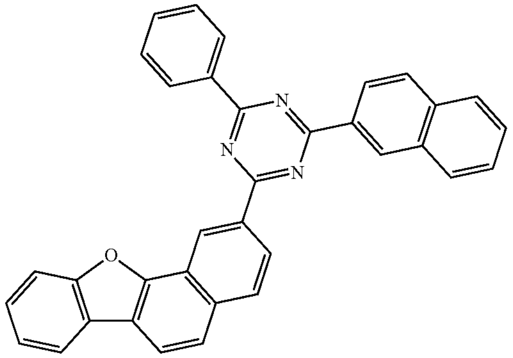
C-36
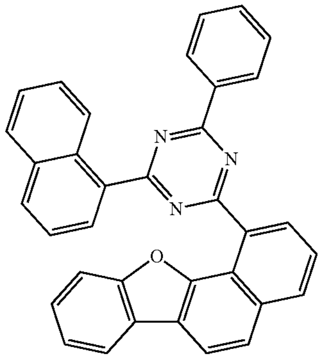
-continued
C-37
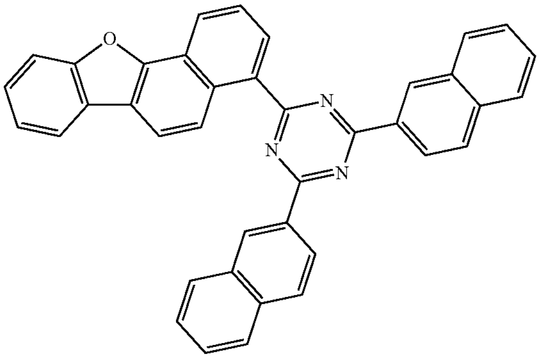
C-38
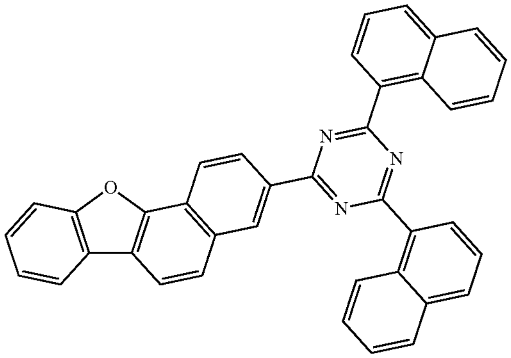
C-39
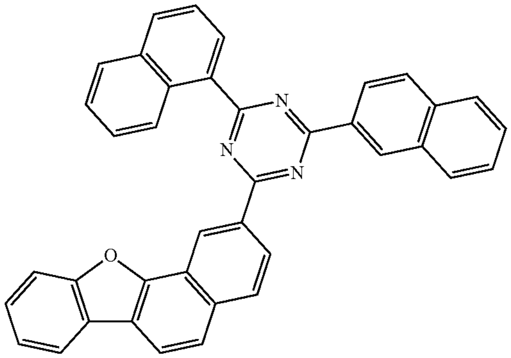
C-40
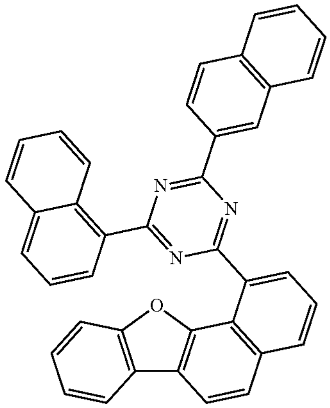

-continued
C-41
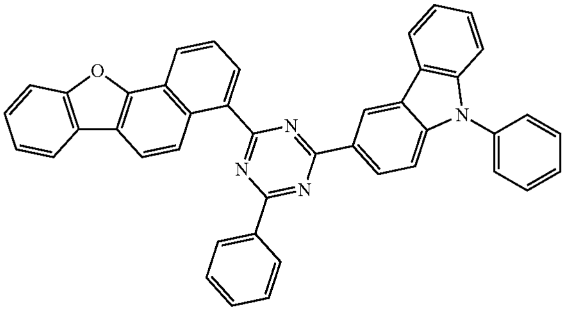
C-42
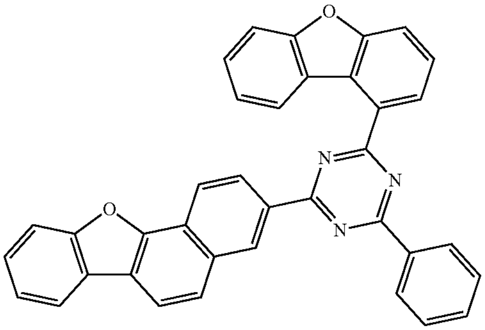
C-43
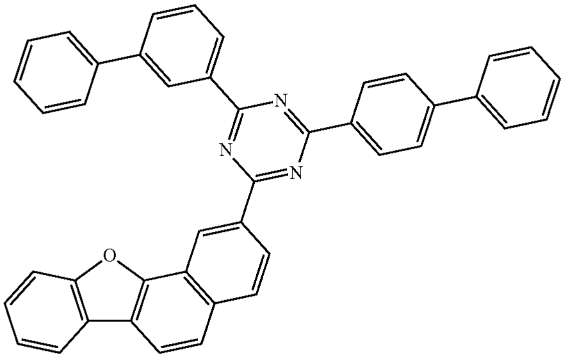
C-44
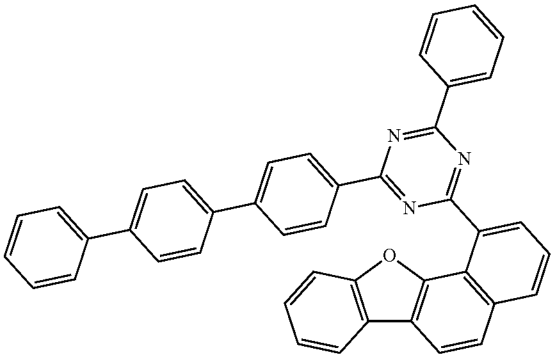
-continued
C-45
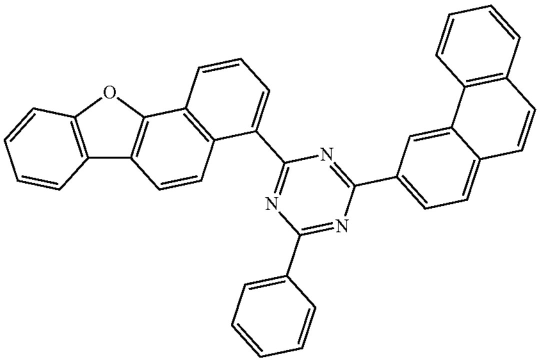
C-46
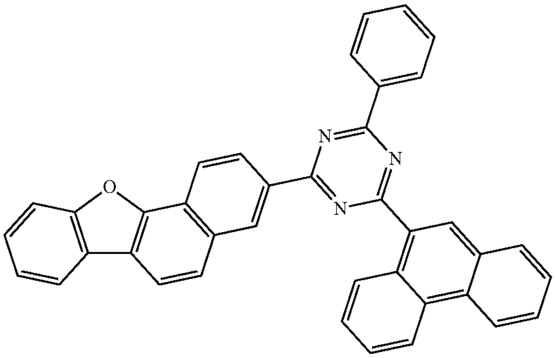
C-47
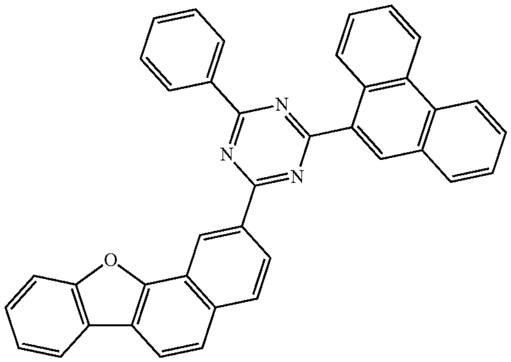
C-48
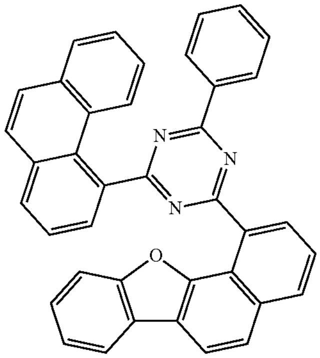

-continued
C-145
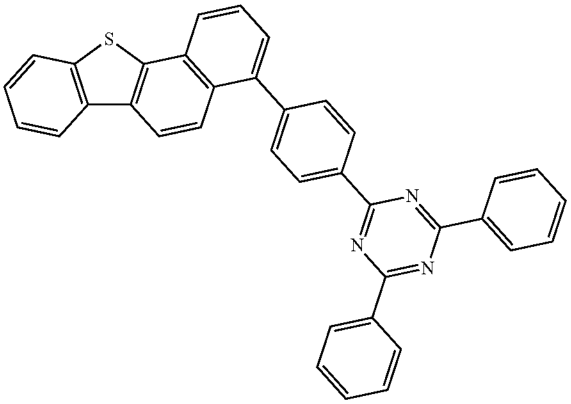
C-146
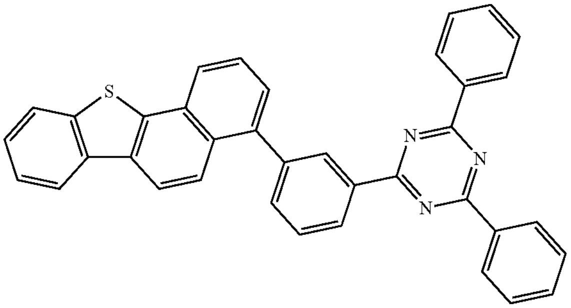
C-147
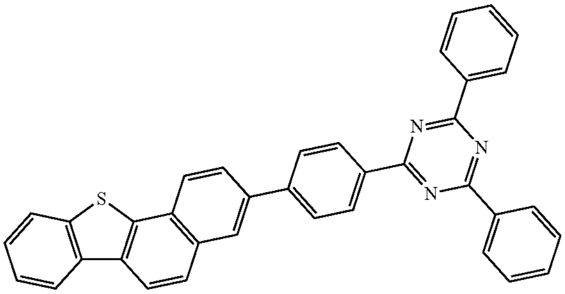
C-148
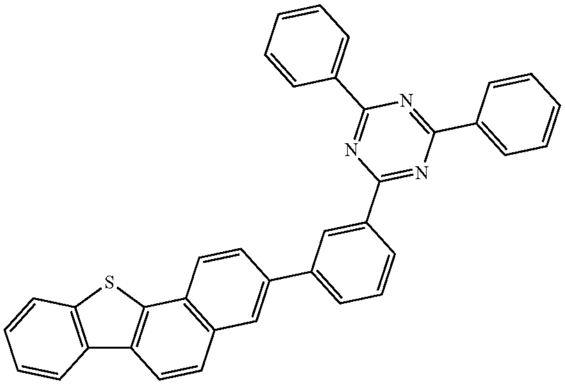
-continued
C-149
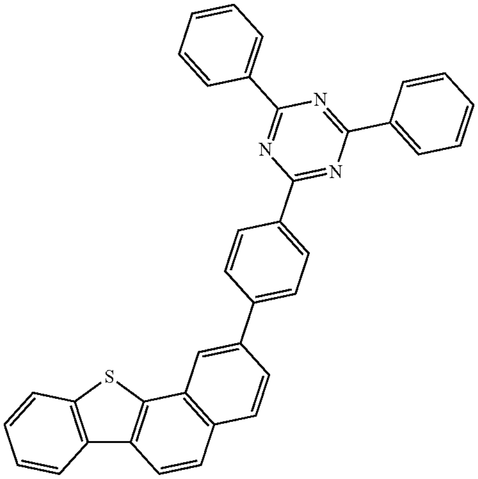
C-150
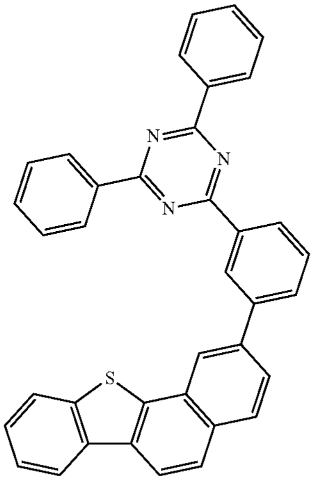
C-151
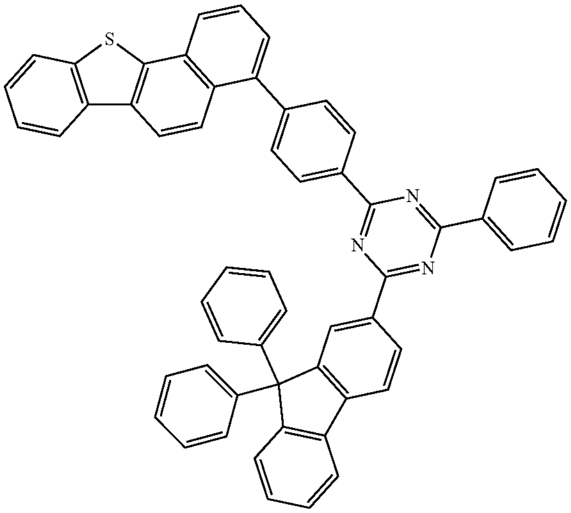

-continued
C-152
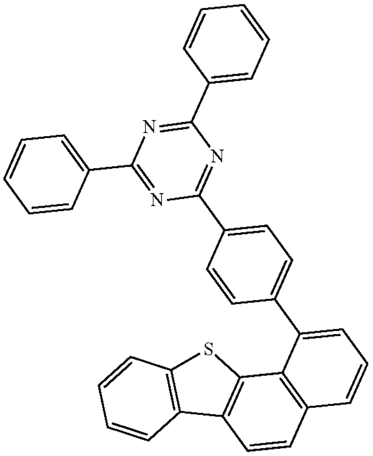
C-153
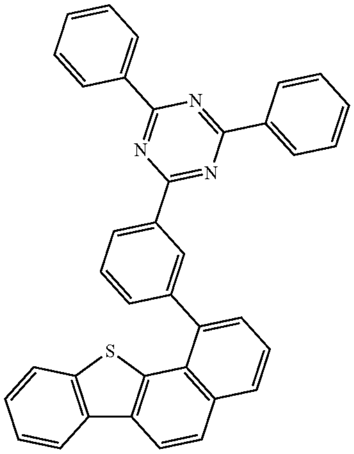
C-154
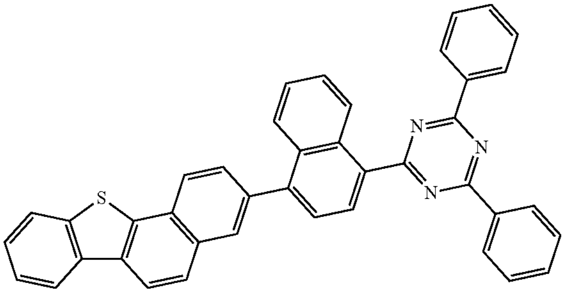
-continued
C-155
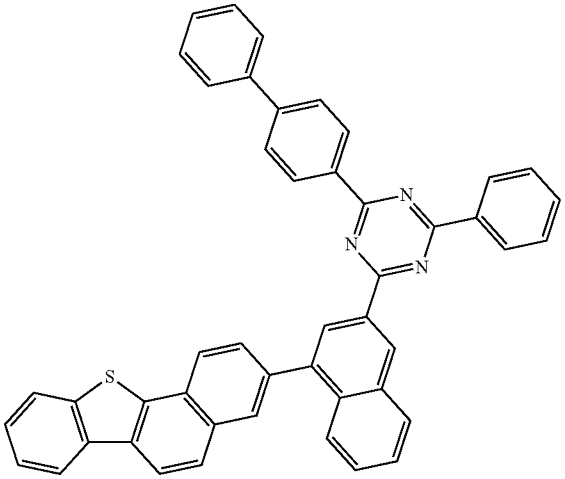
C-156
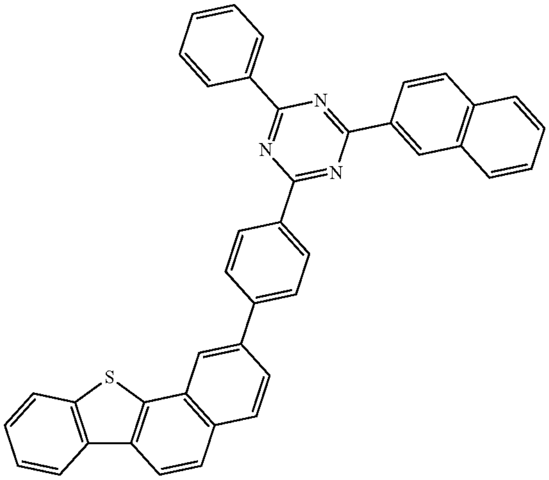
C-157
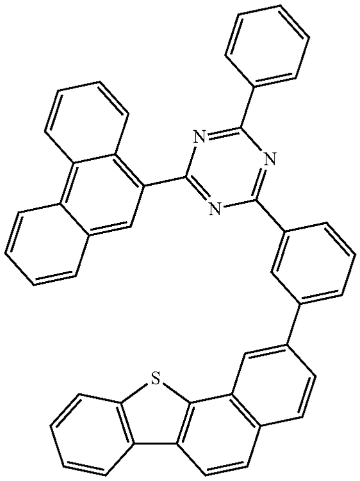

-continued
C-158
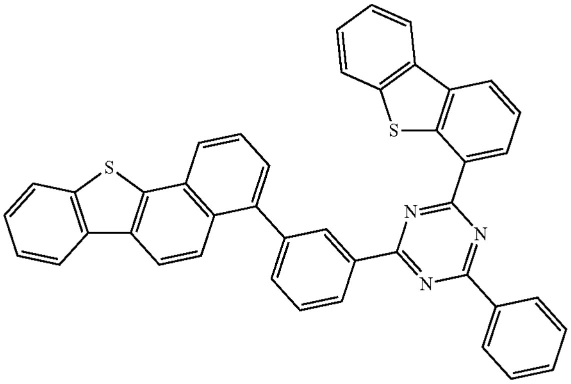
C-159
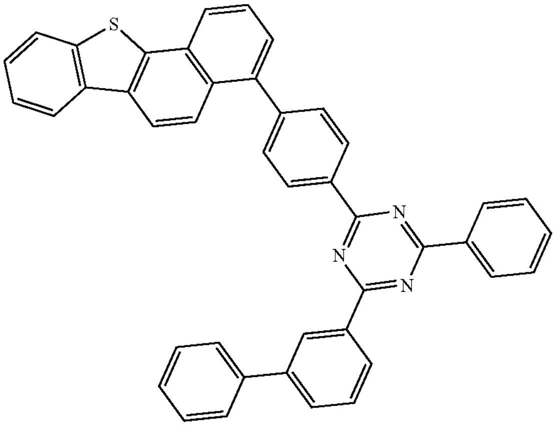
C-160
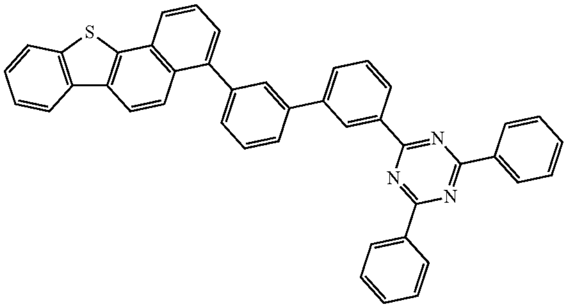
-continued
C-161
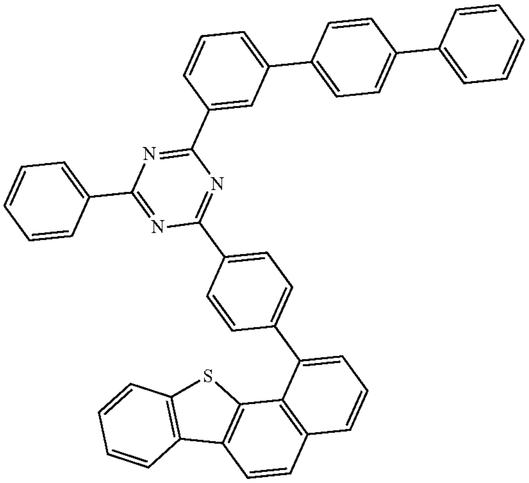
C-162
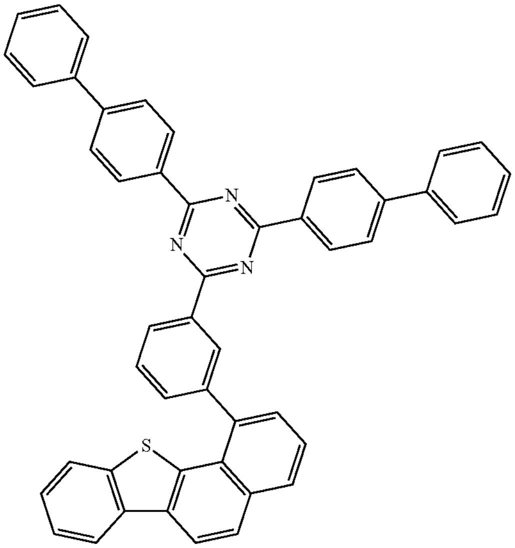
C-163
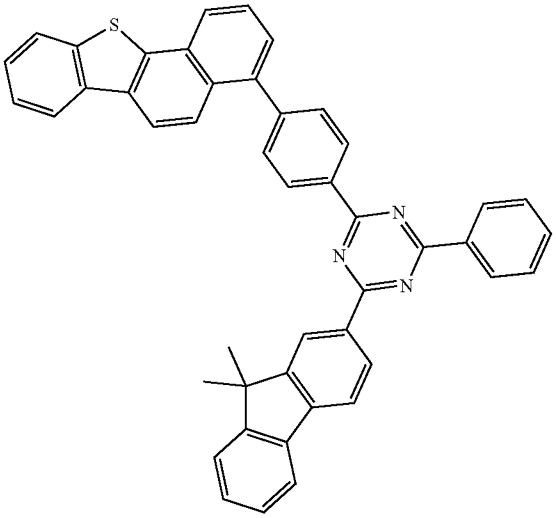

-continued
C-164
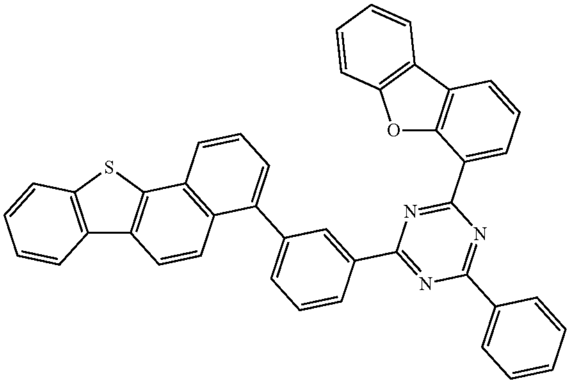
C-165
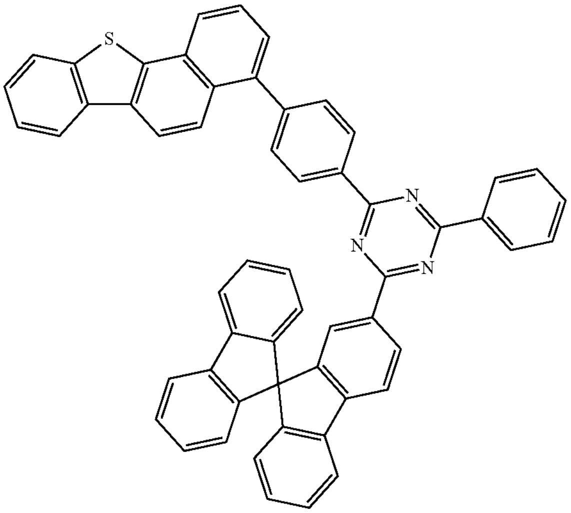
C-166
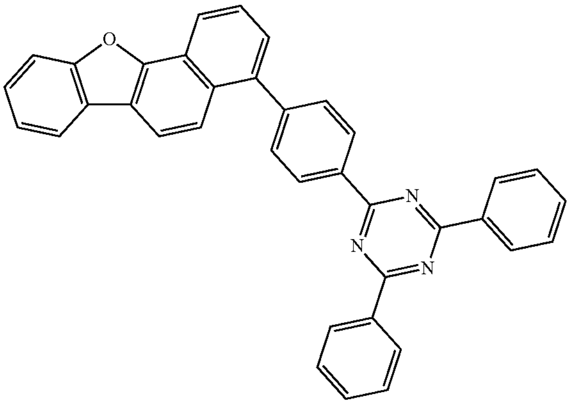
-continued
C-167
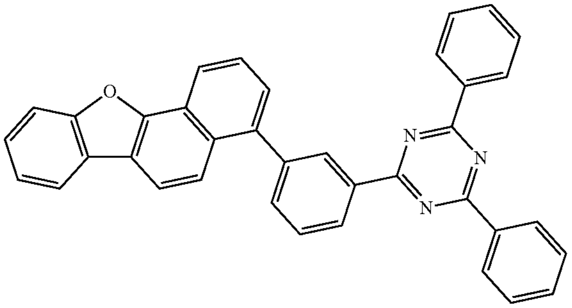
C-168
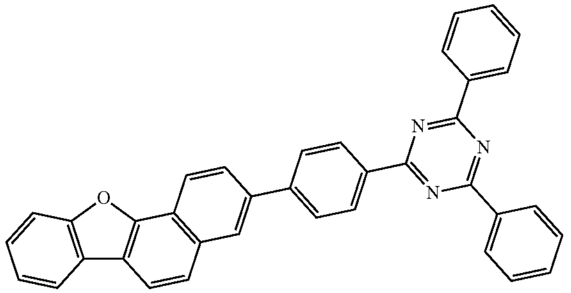
C-169
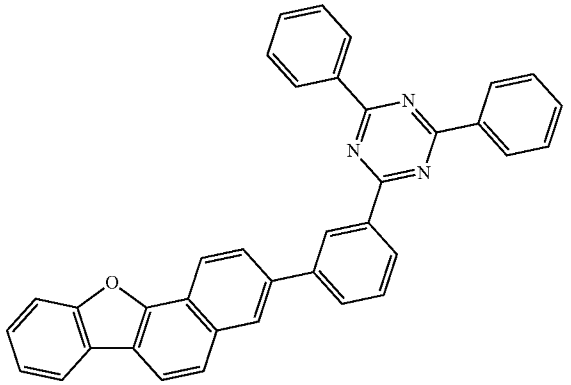
C-170
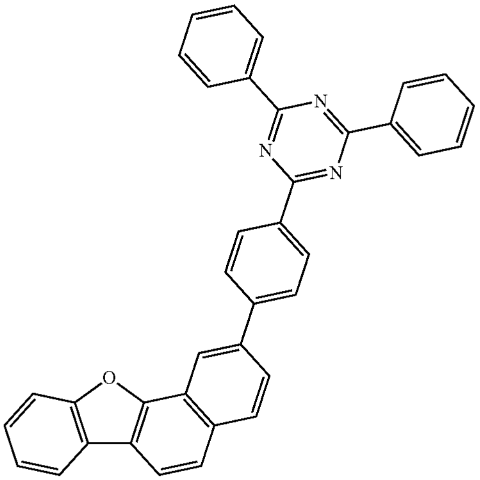

-continued
C-171
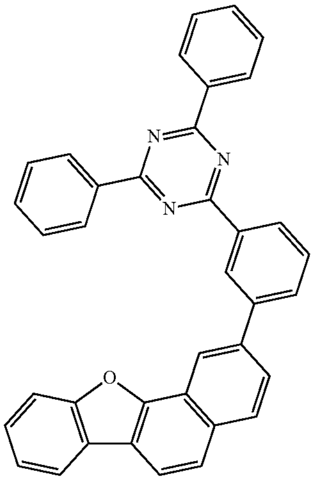
C-172
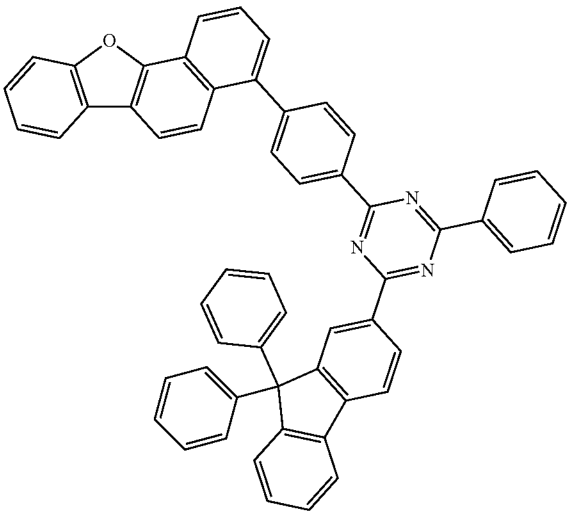
C-173
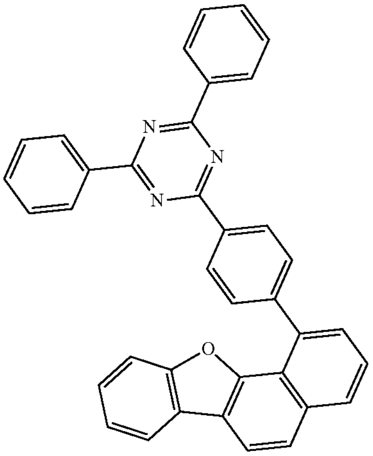
-continued
C-174
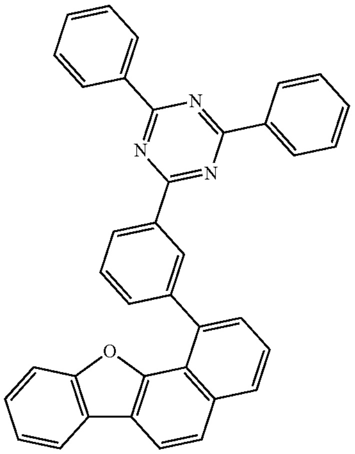
C-175
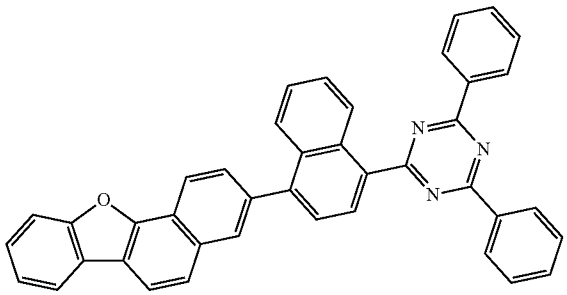
C-176
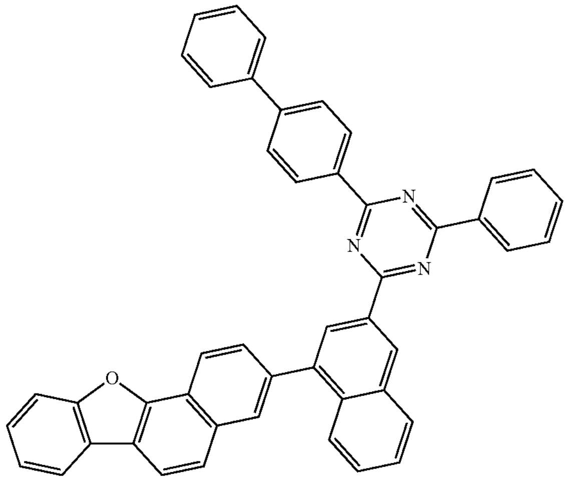

C-177
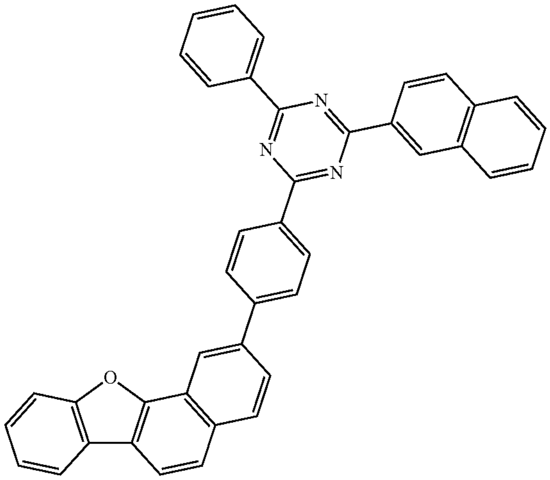
C-178
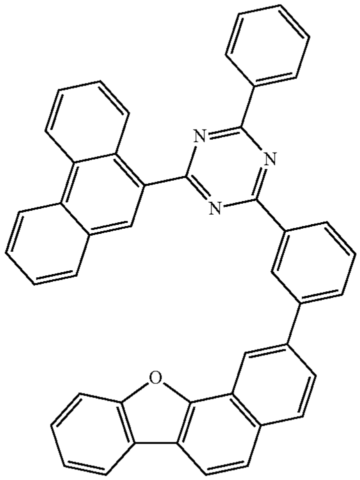
C-179
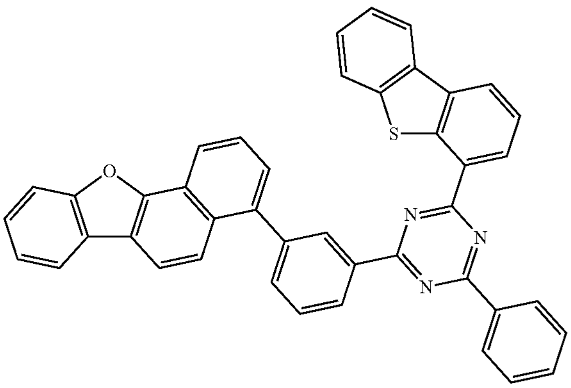
C-180
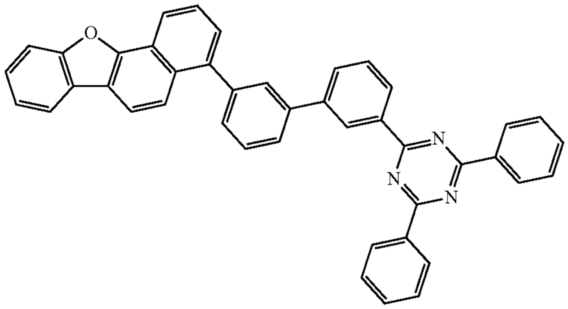
C-181
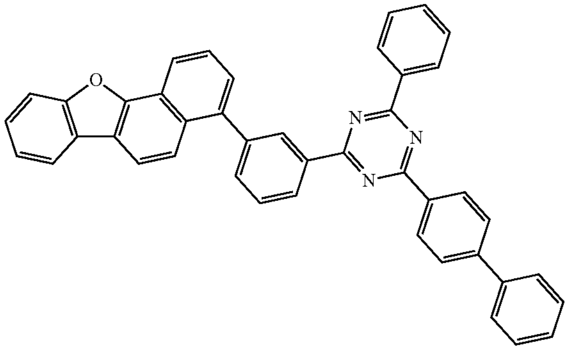
C-182
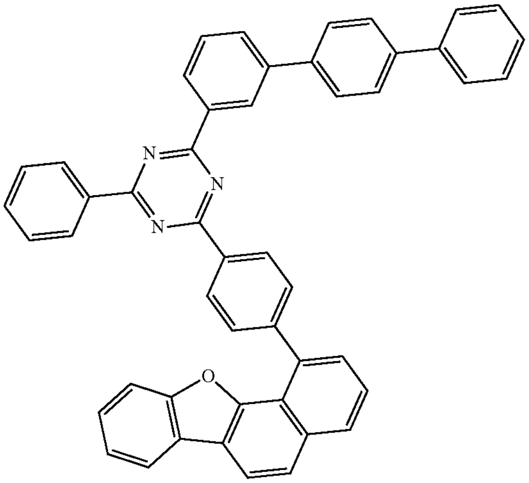

C-183
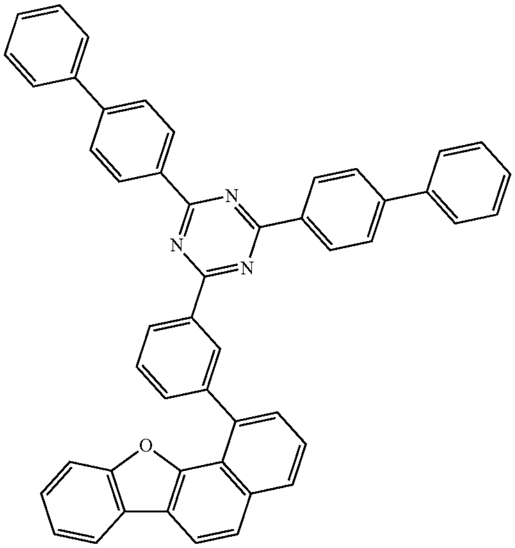
C-184
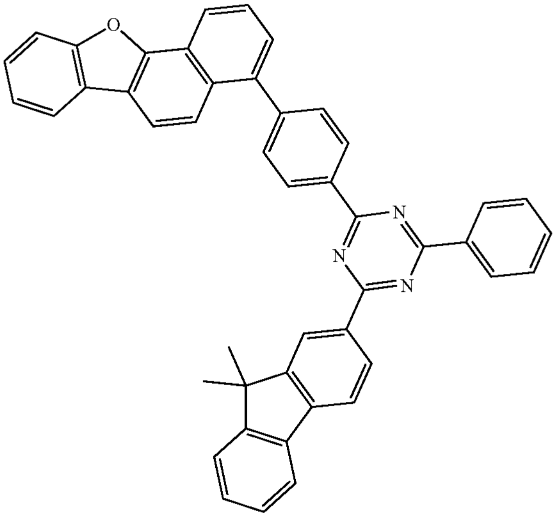
C-185
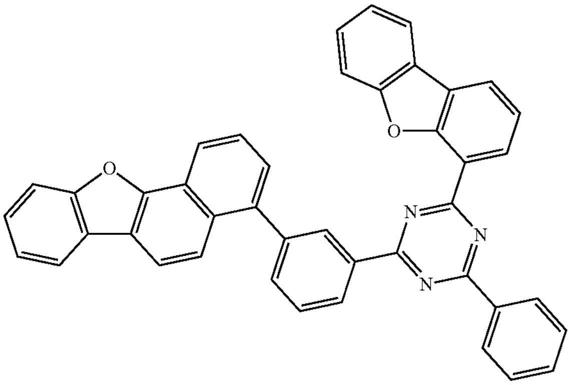
C-186
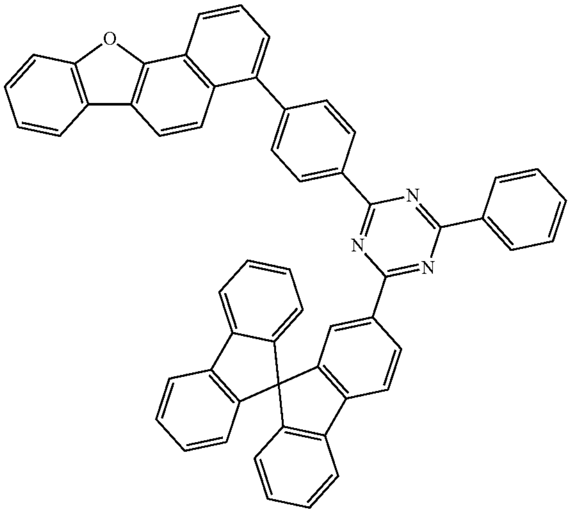
C-187
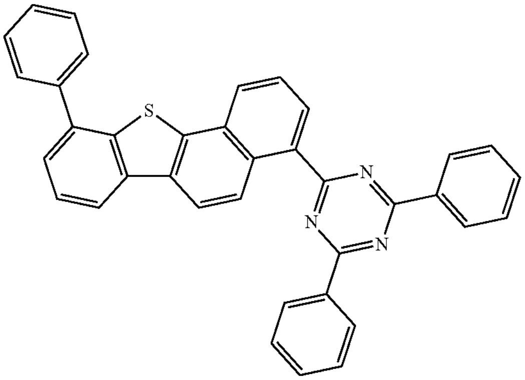
C-188
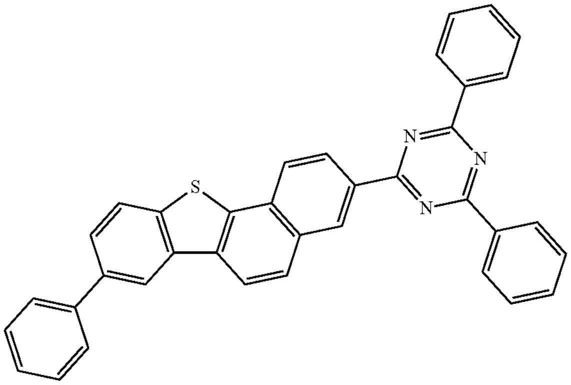

-continued
C-189
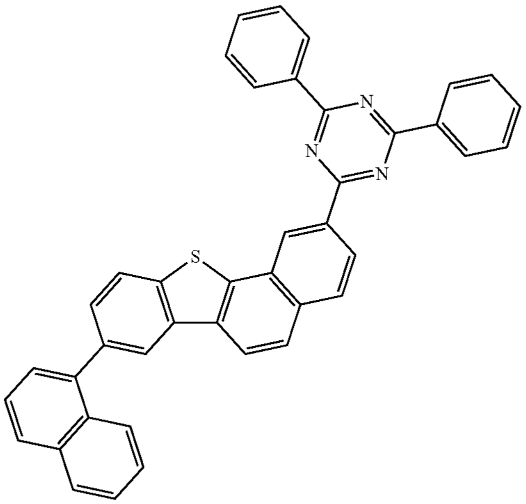
C-190
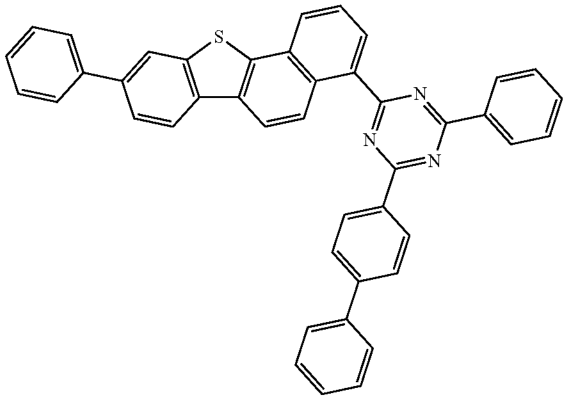
C-191
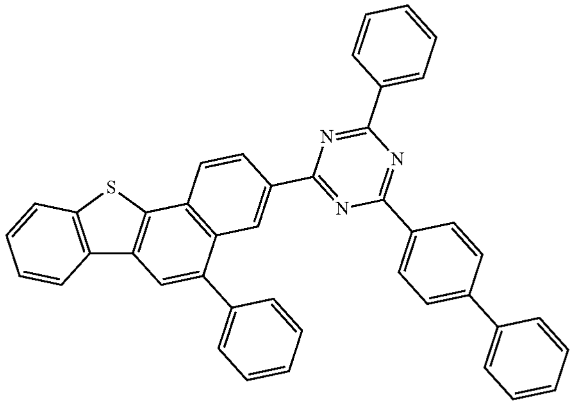
-continued
C-192
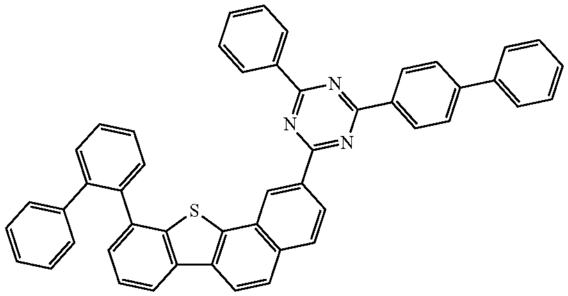
C-193
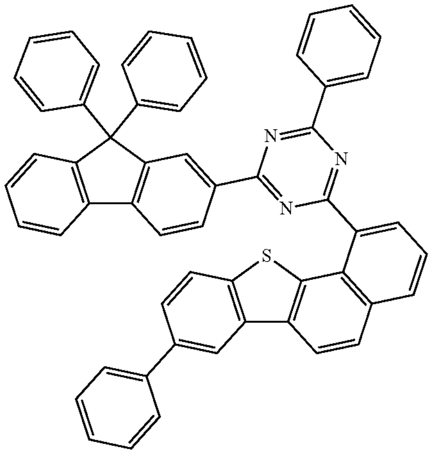
C-194
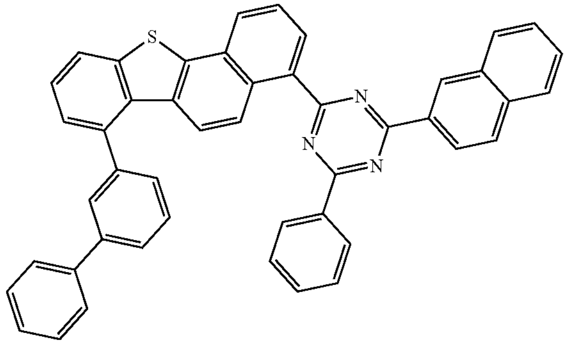
C-195
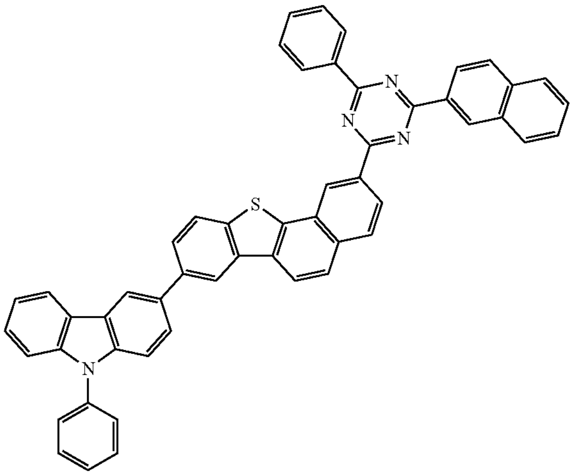

-continued
C-196
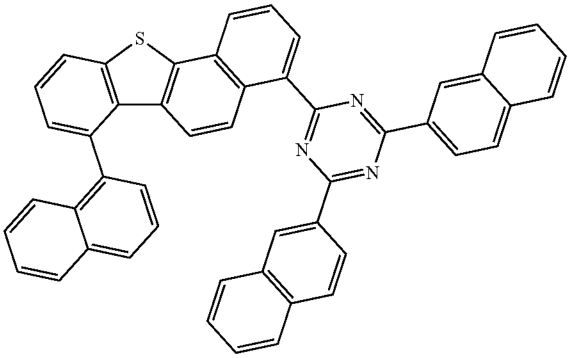
C-197
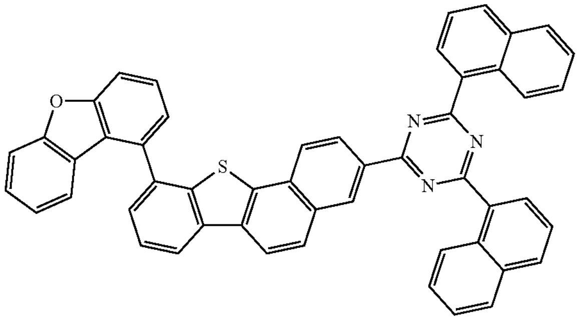
C-198
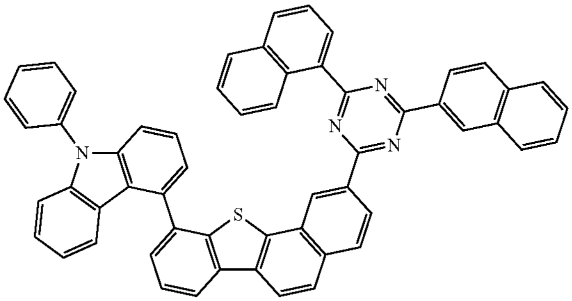
C-199
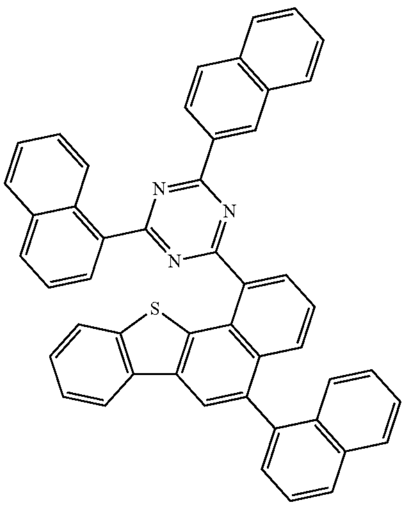
-continued
C-200
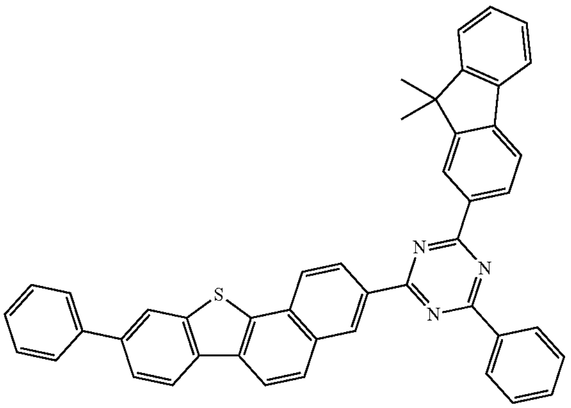
C-201
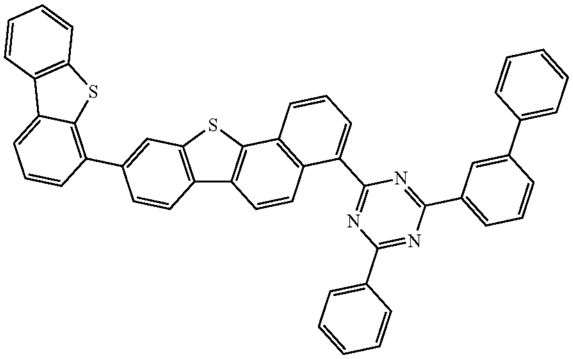
C-202
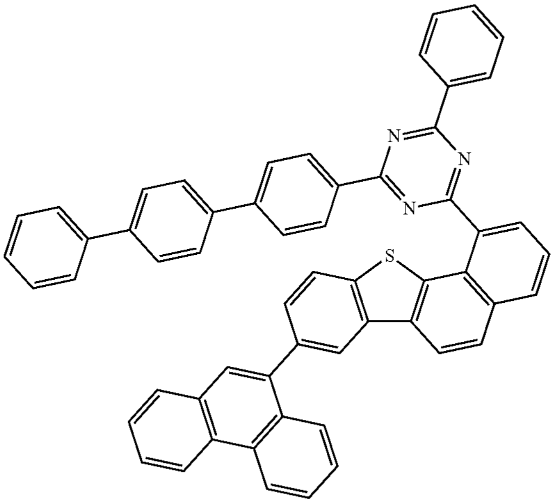

-continued
C-203
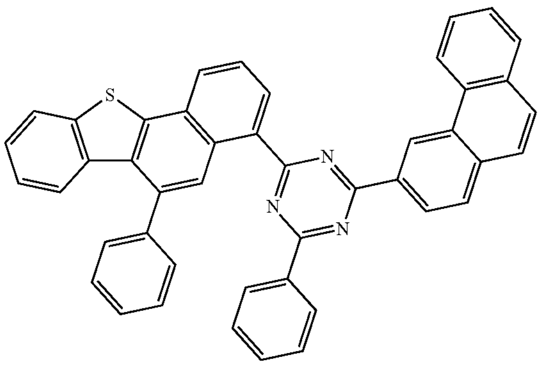
C-204
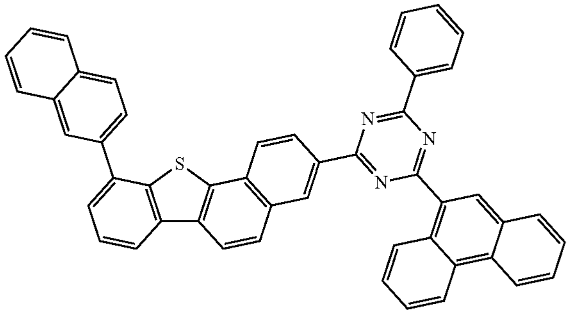
C-205
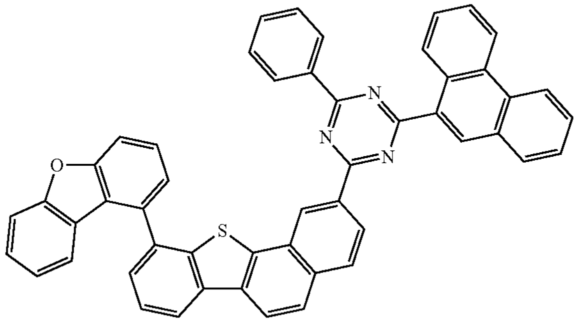
C-206
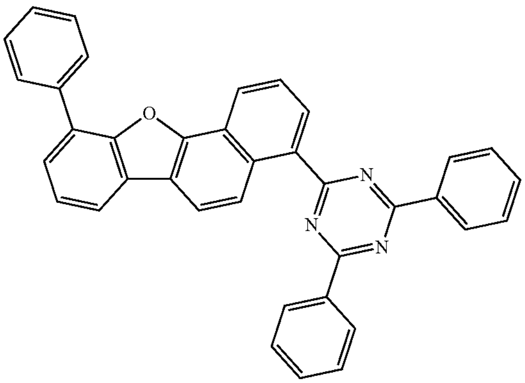
-continued
C-207
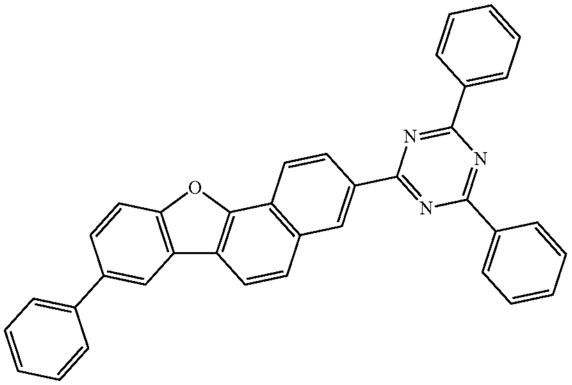
C-208
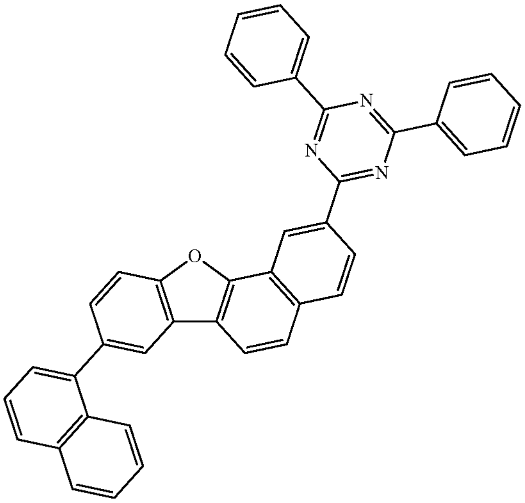
C-209
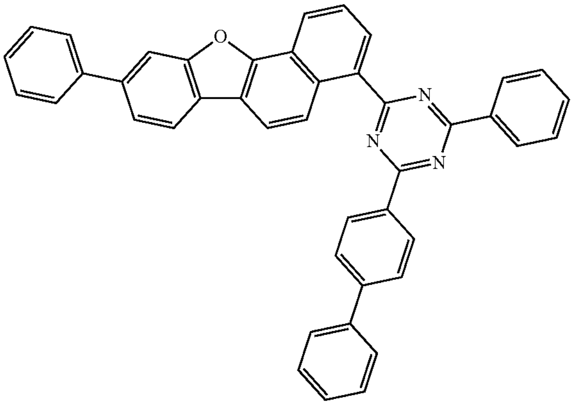

-continued
C-210
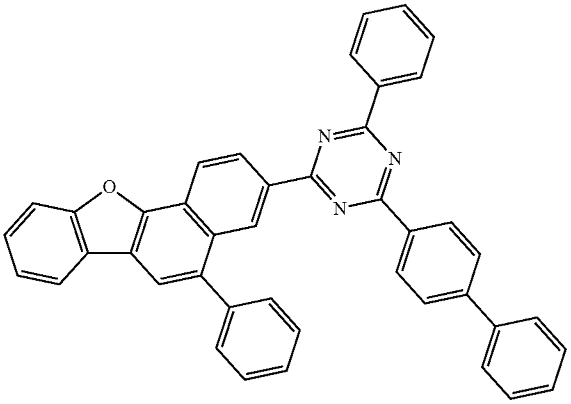
C-211
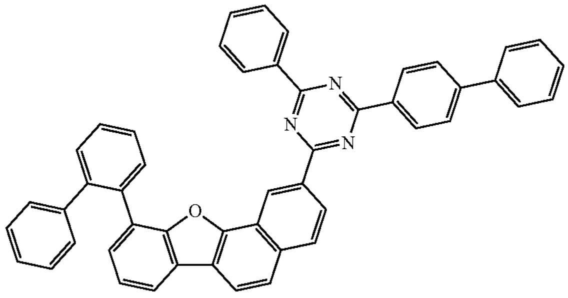
C-212
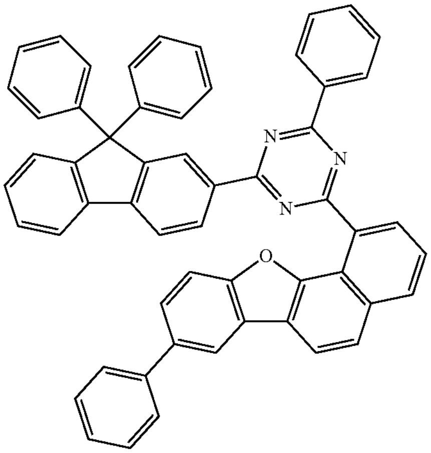
C-213
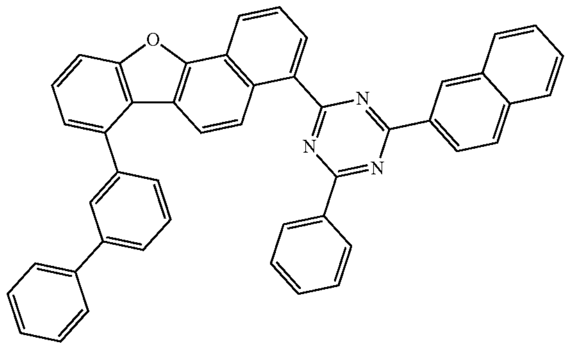
-continued
C-214
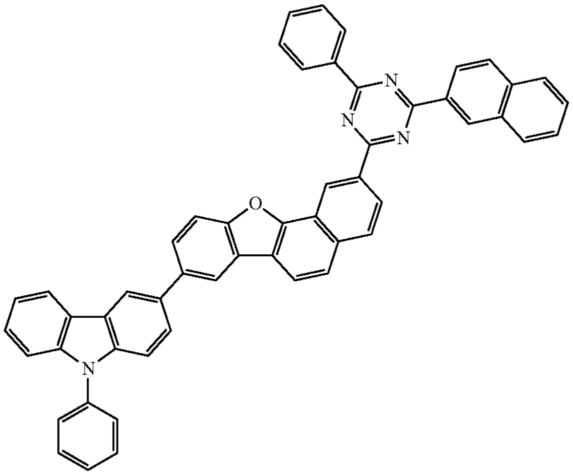
C-215
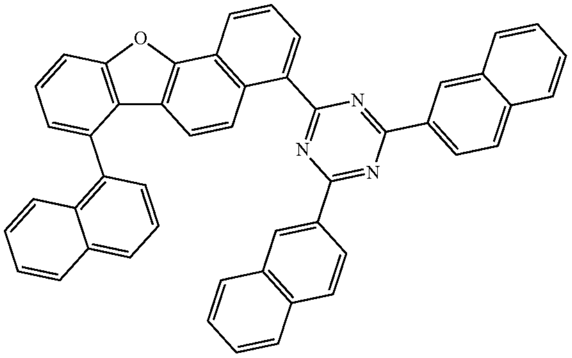
C-216
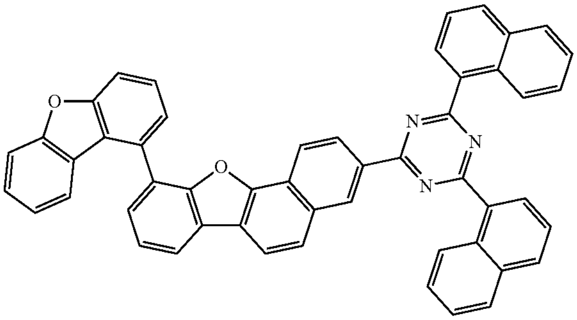
C-217
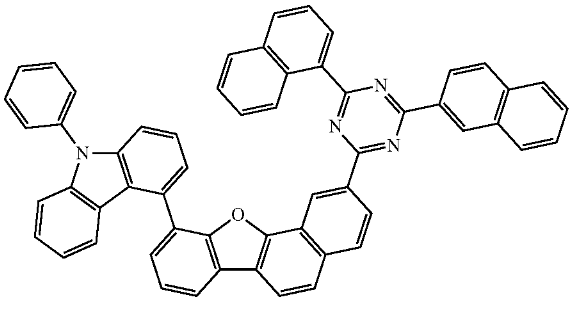

-continued
C-218
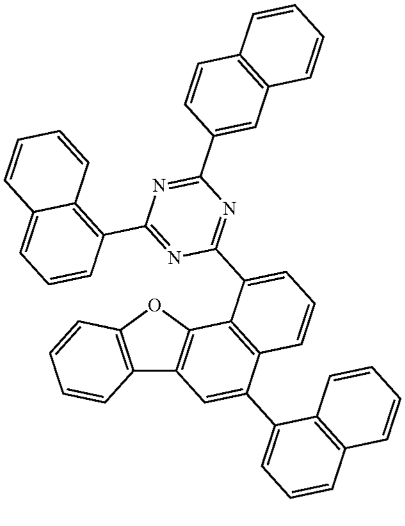
C-219
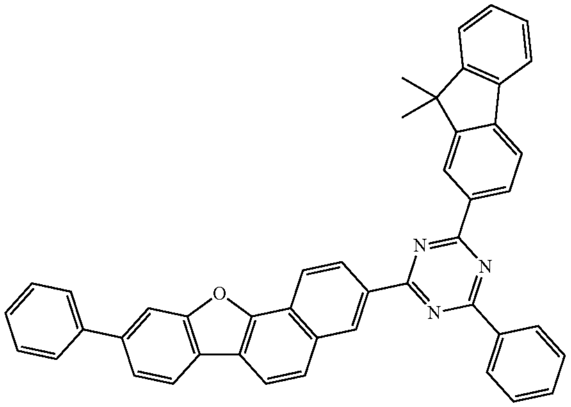
C-220
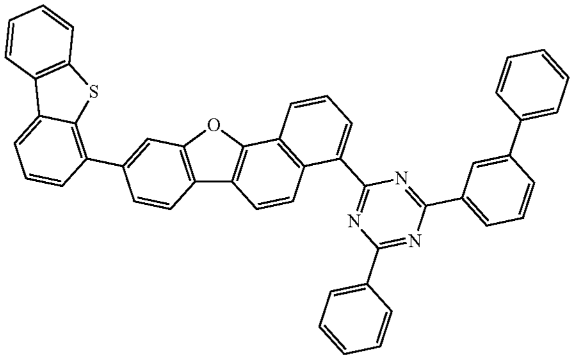
-continued
C-221
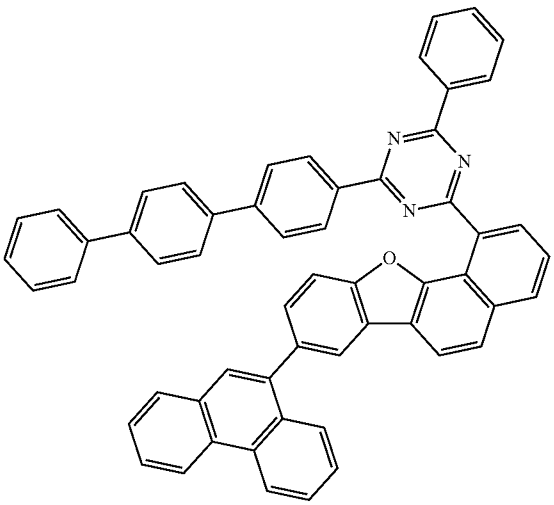
C-222
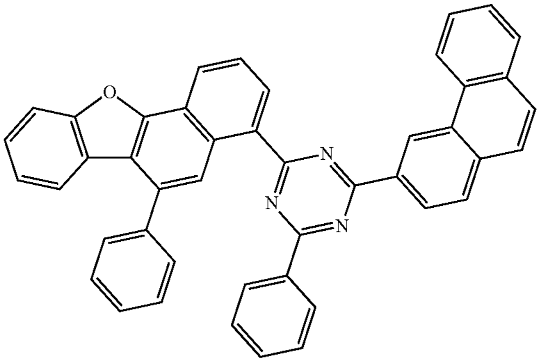
C-223
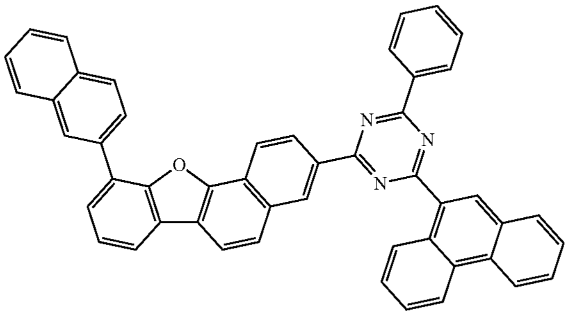
C-224
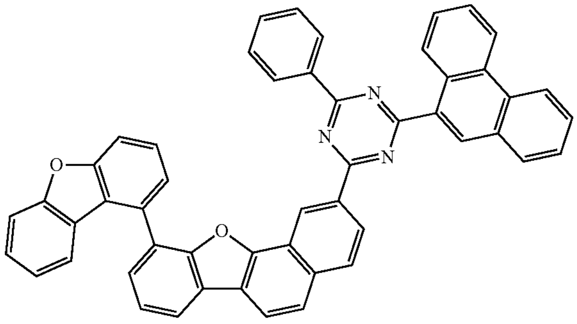

-continued
C-273
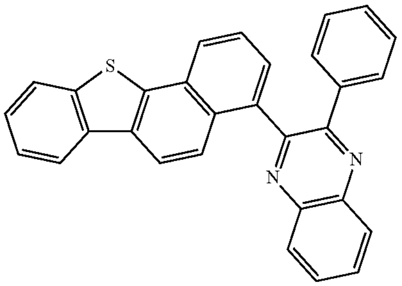
C-274
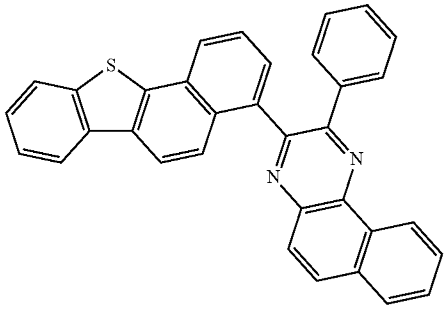
C-275
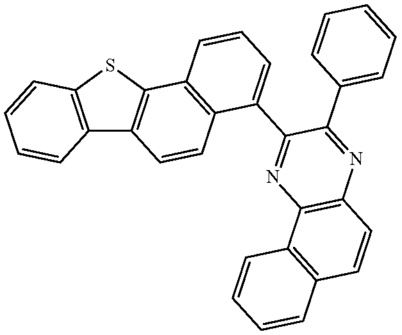
C-276
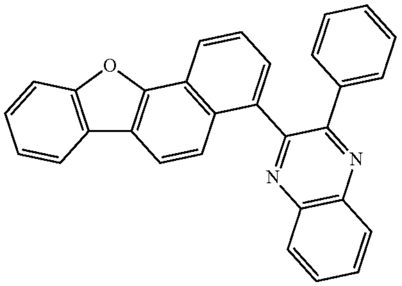
C-277
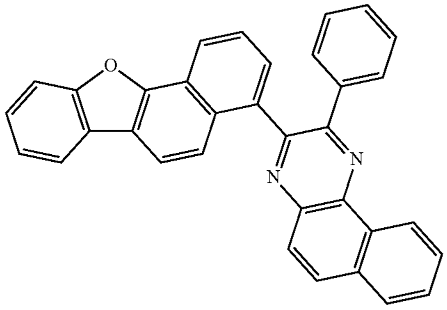
-continued
C-278
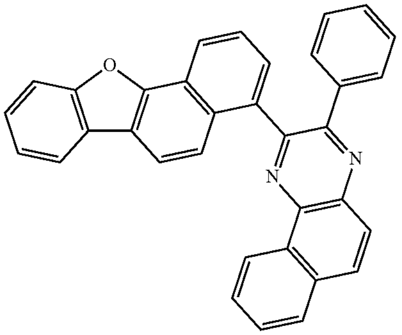
C-291
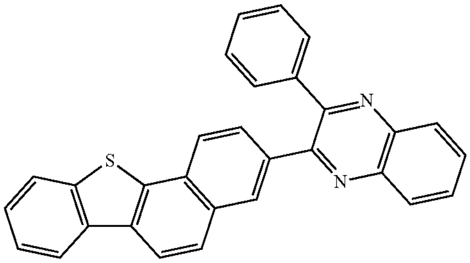
C-292
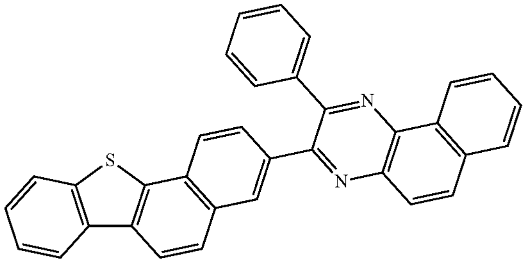
C-293
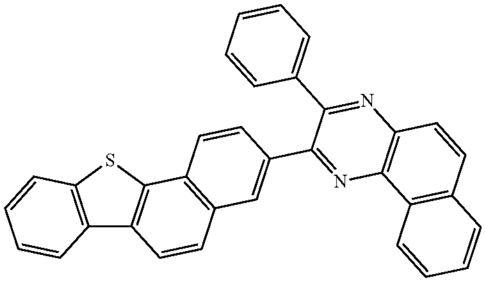
C-294
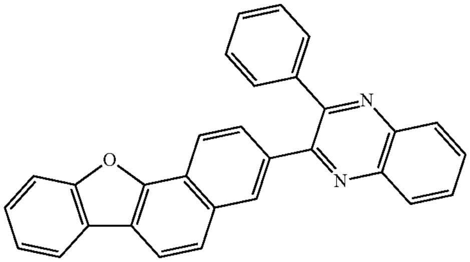

C-295
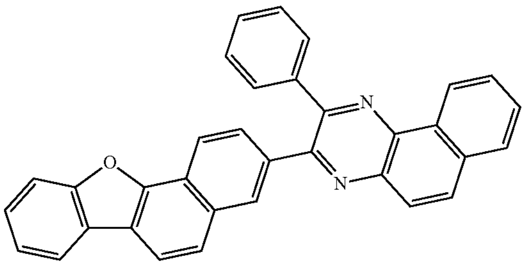
C-296
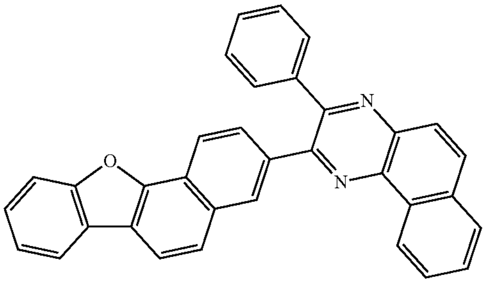
C-309
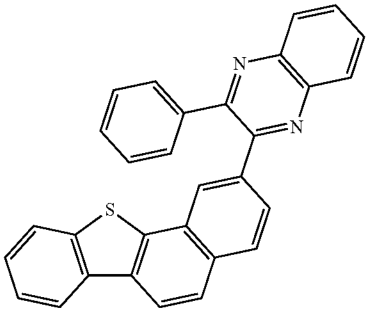
C-310
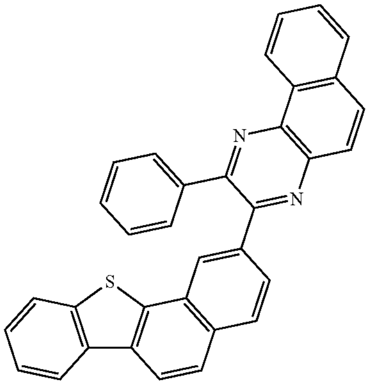
C-311
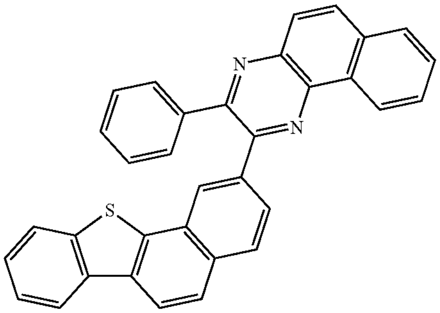
C-312
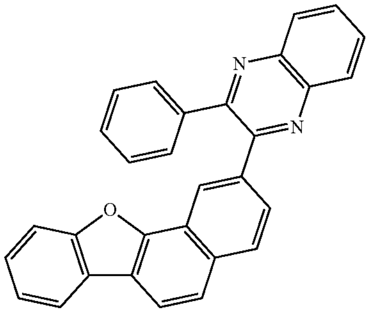
C-313
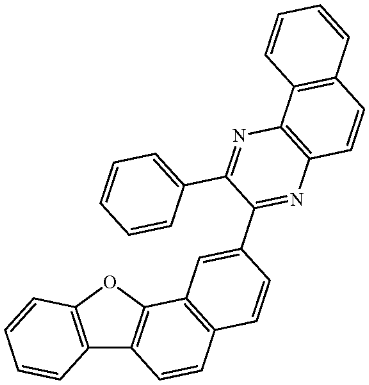
C-314
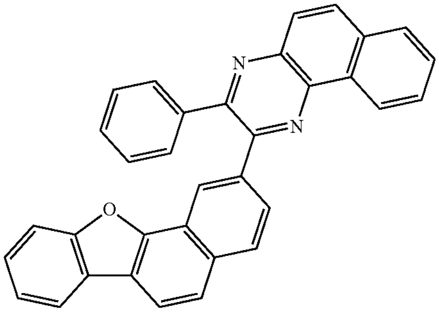
C-327
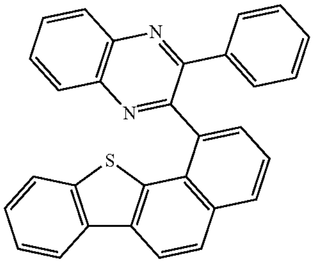
C-328
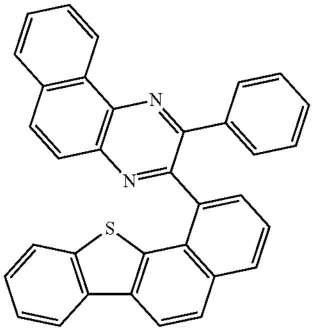

-continued
C-329
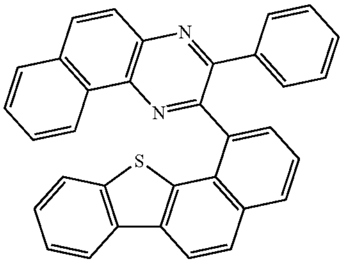
C-330
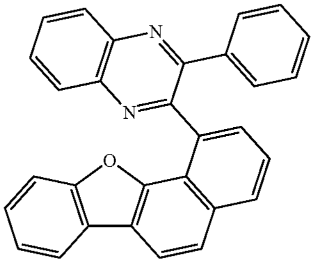
C-331
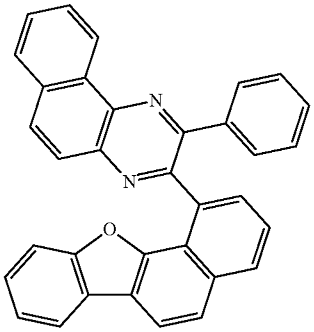
C-332
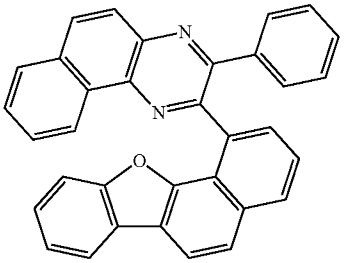
C-345
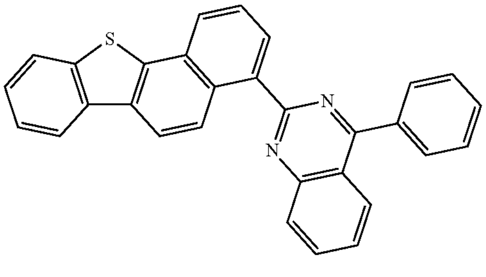
-continued
C-346
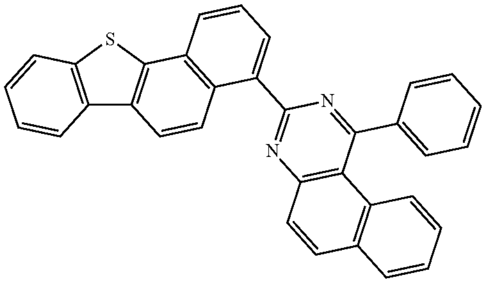
C-347
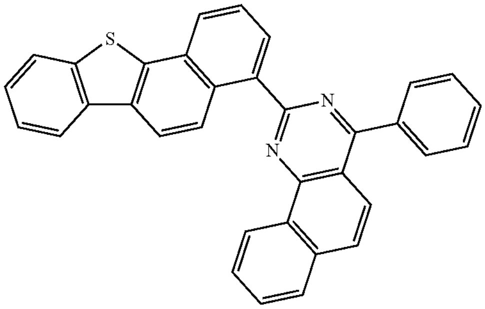
C-348
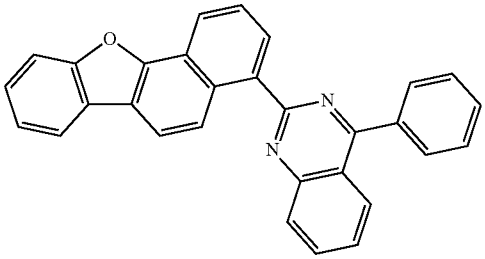
C-349
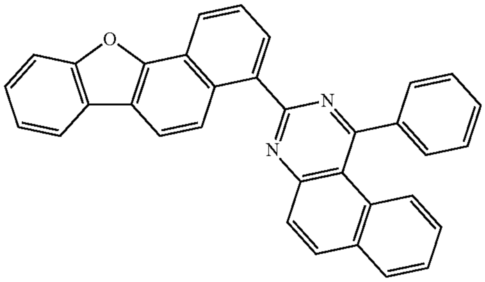
C-350
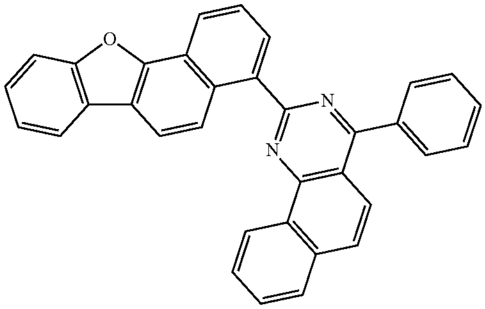

-continued
C-363
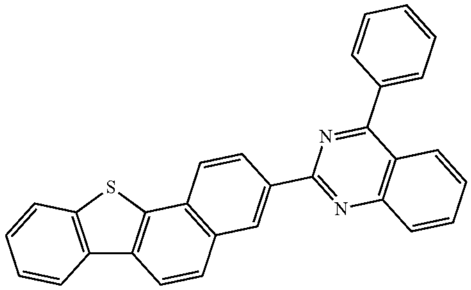
C-364
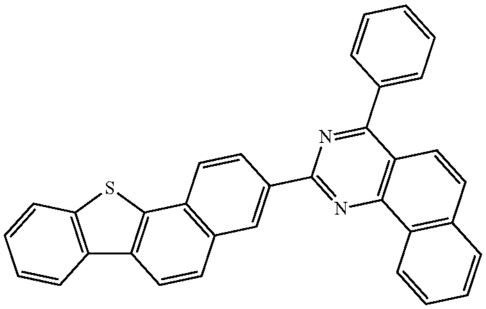
C-365
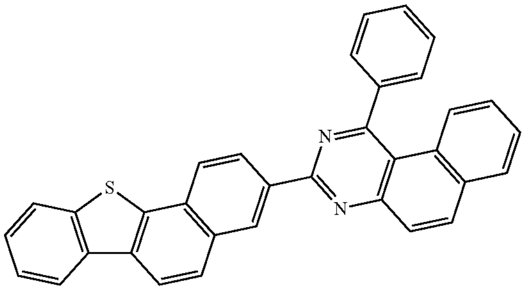
C-366
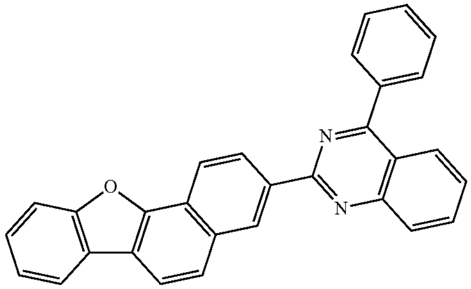
C-367
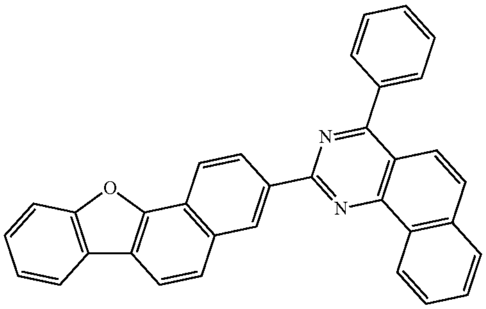
-continued
C-368
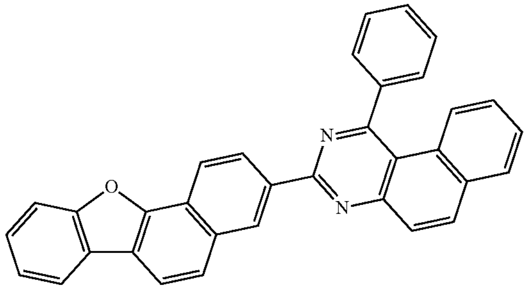
C-381
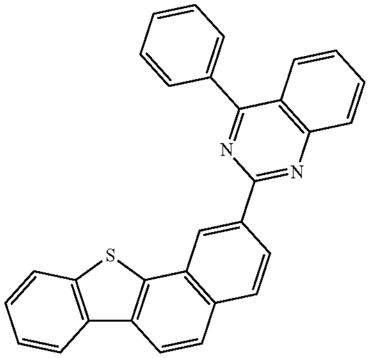
C-382
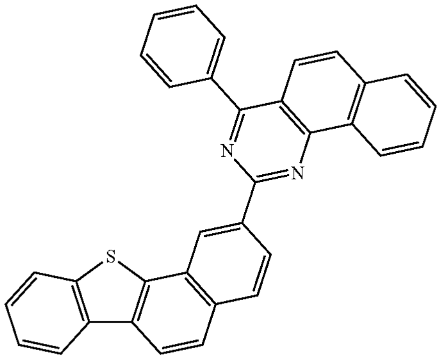
C-383
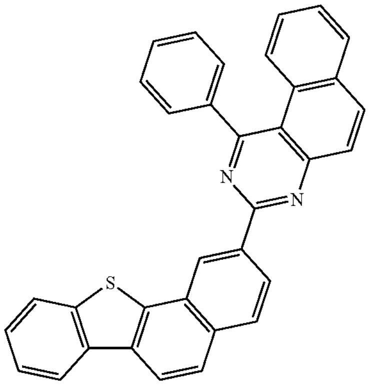

-continued
C-384
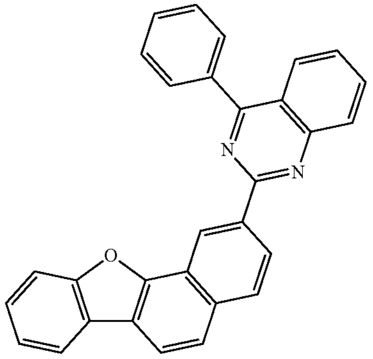
C-385
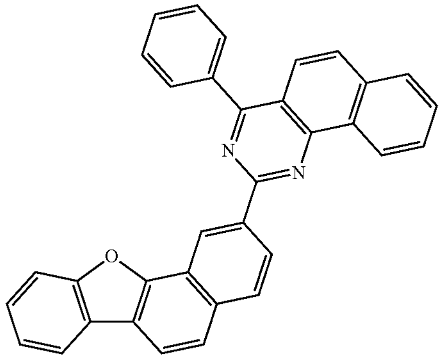
C-386
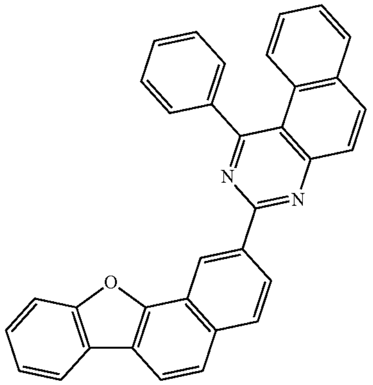
C-399
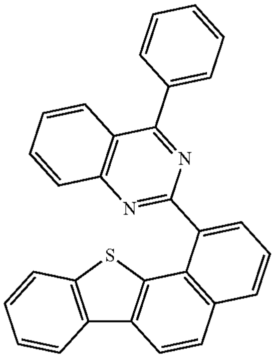
-continued
C-400
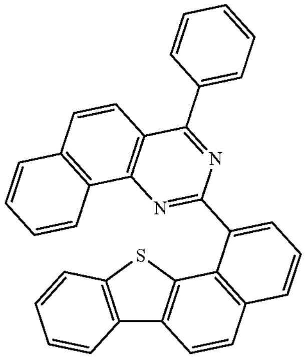
C-401
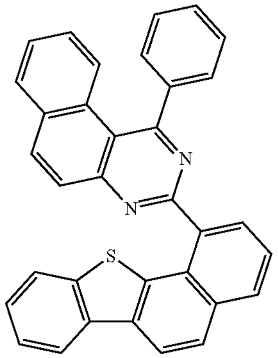
C-402
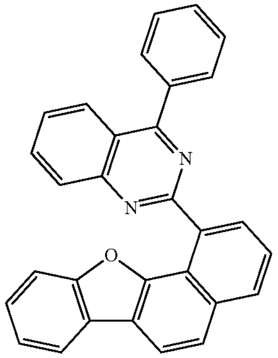
C-403
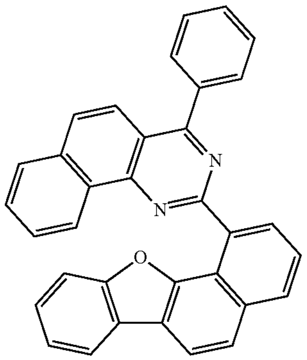

-continued
C-404
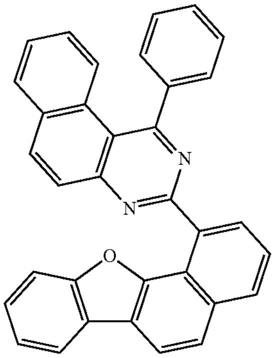
C-417
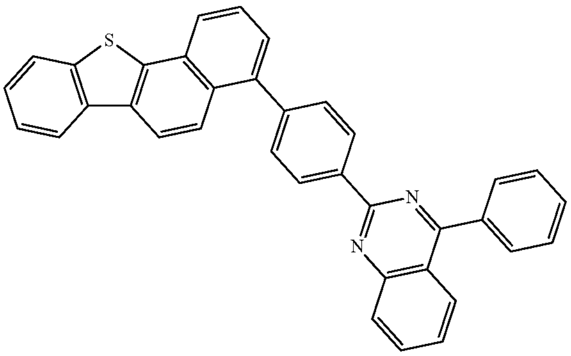
C-418
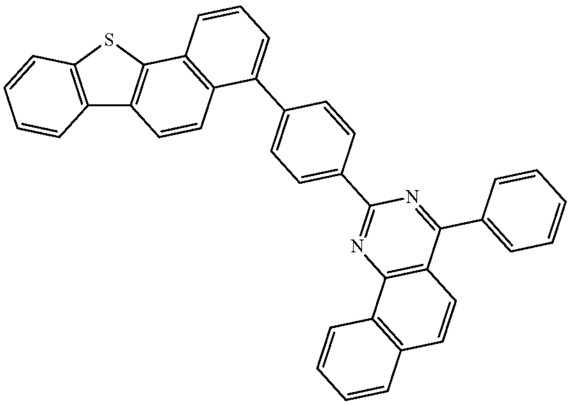
C-419
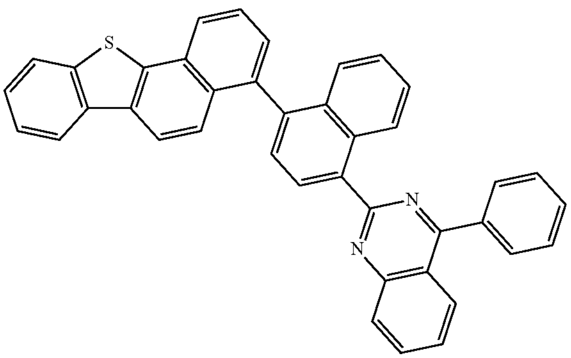
-continued
C-420
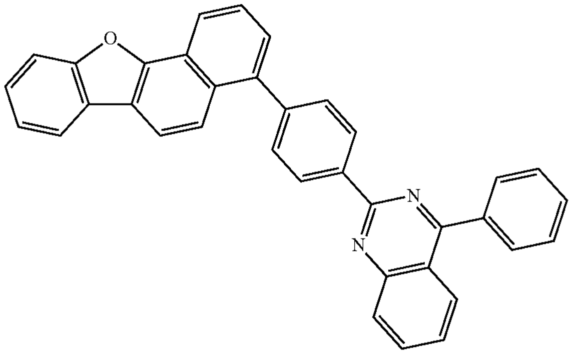
C-421
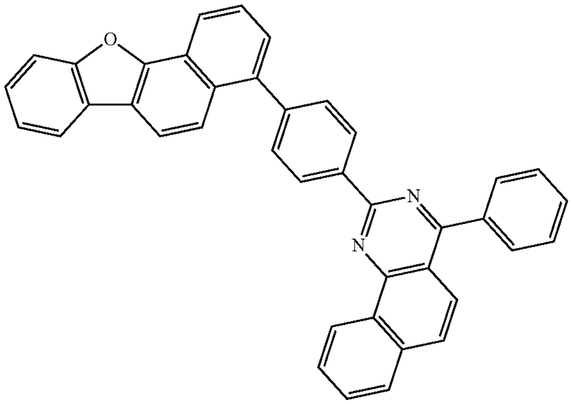
C-422
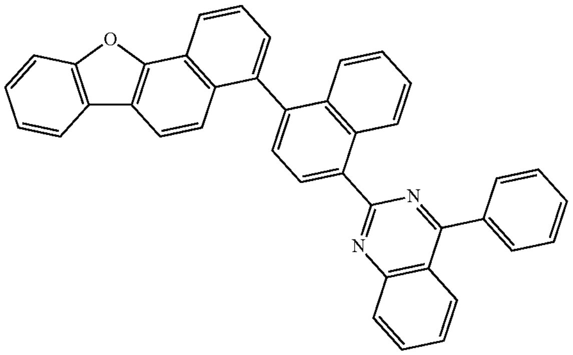
C-435
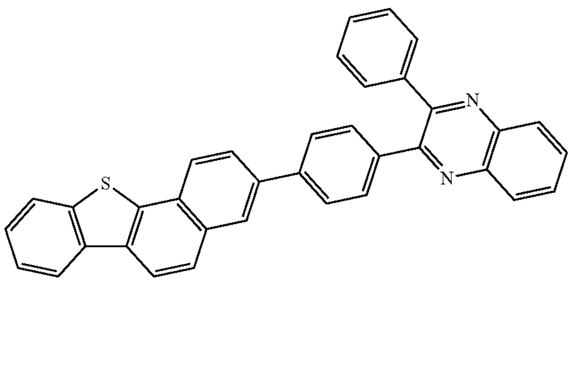

-continued
C-436
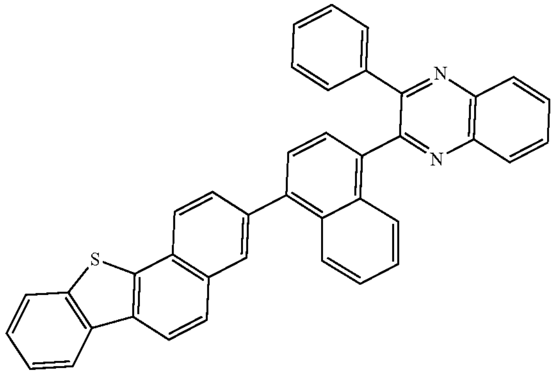
C-437
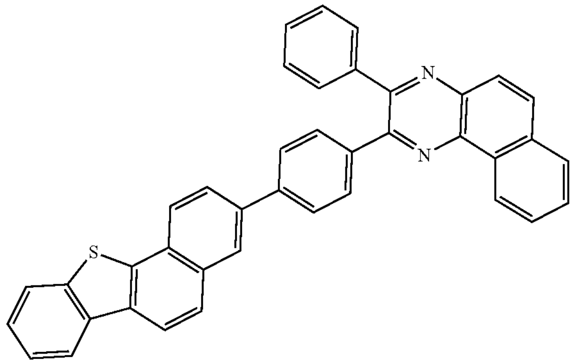
C-438
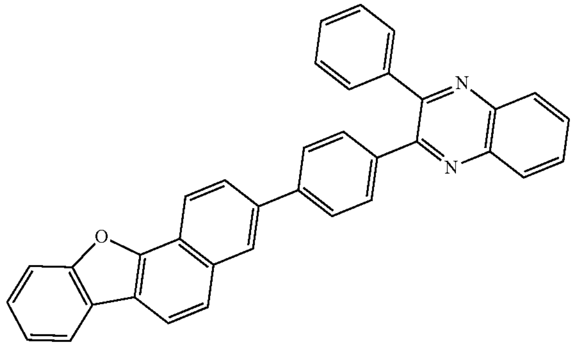
C-439
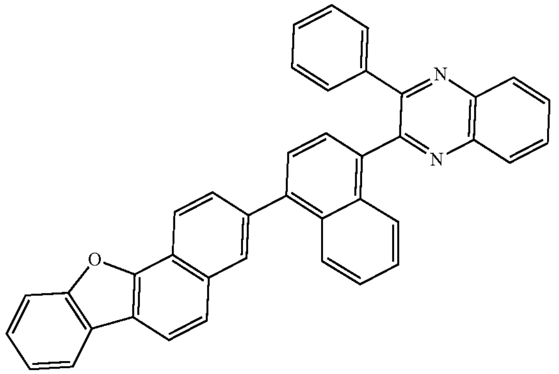
-continued
C-440
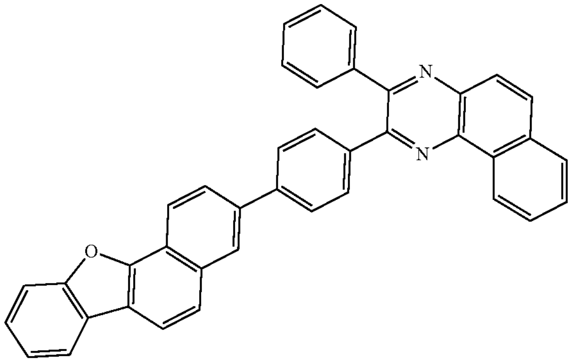
C-453
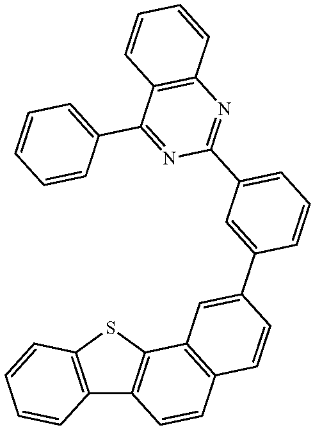
C-454
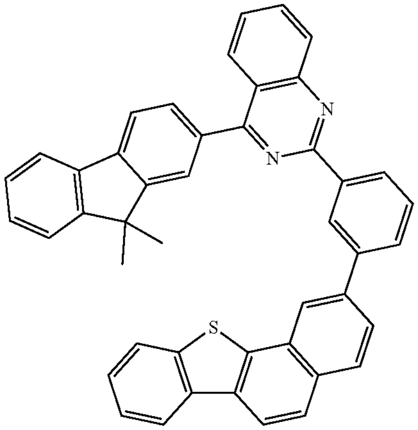

-continued
C-455
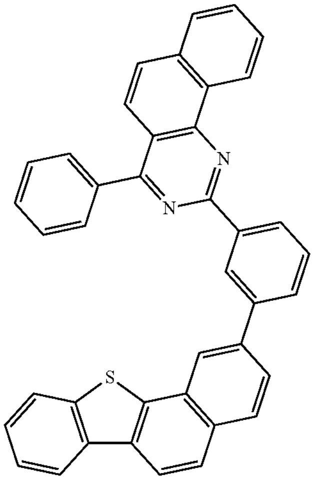
C-456
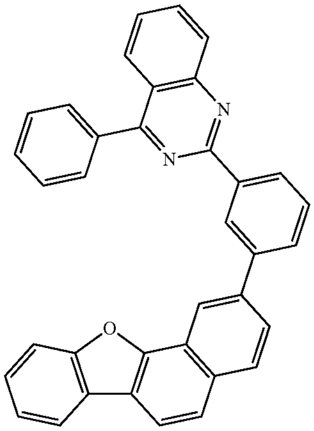
C-457
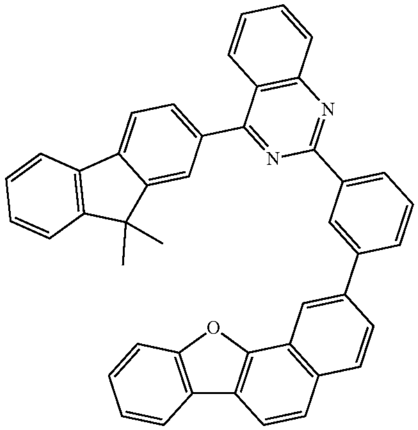
-continued
C-458
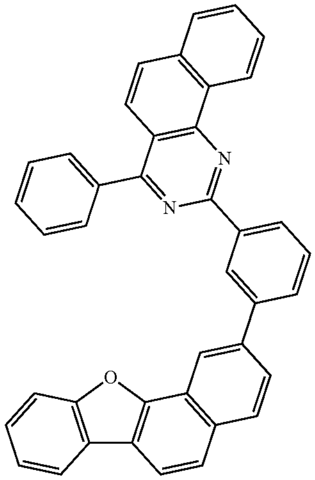
C-471
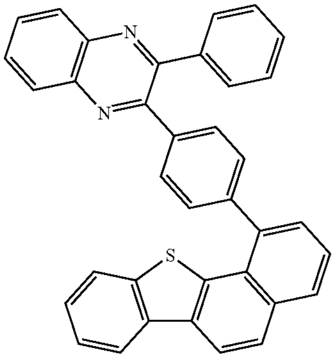
C-472
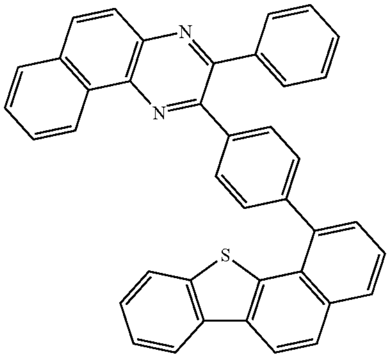
C-473
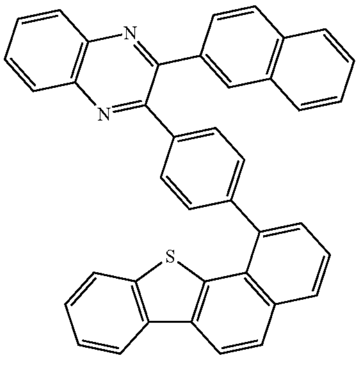

-continued
C-474
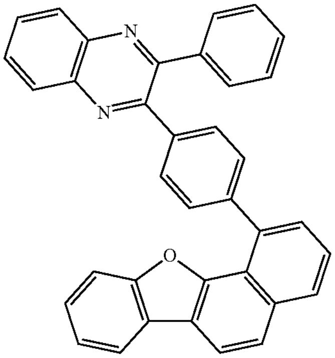
C-475
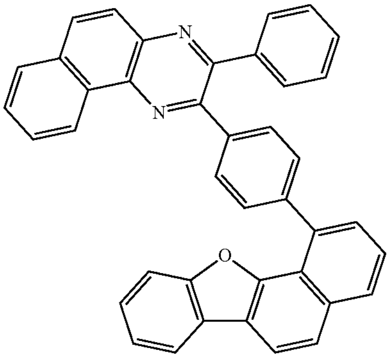
C-476
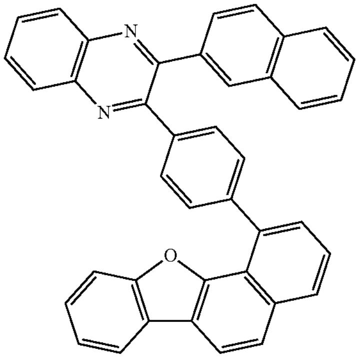
C-489
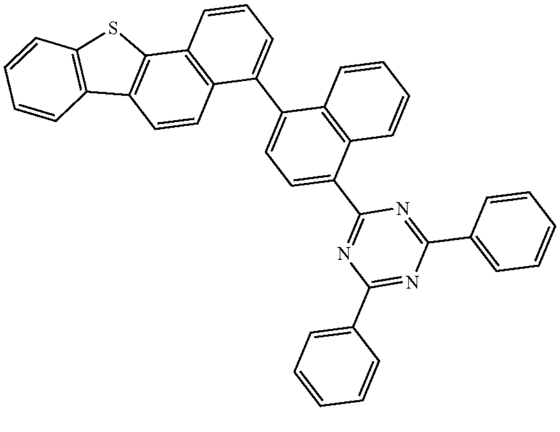
-continued
C-490
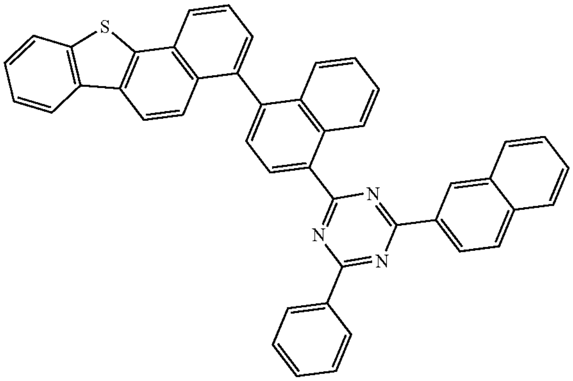
C-491
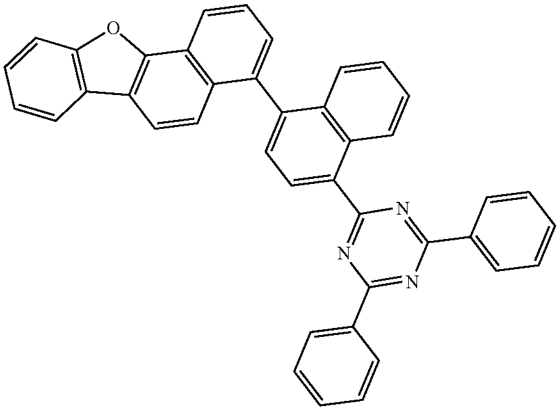
C-492
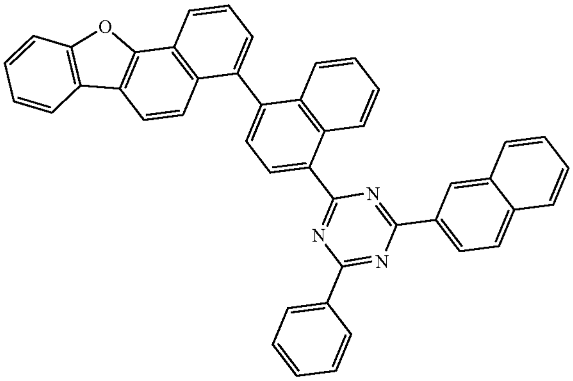

C-493
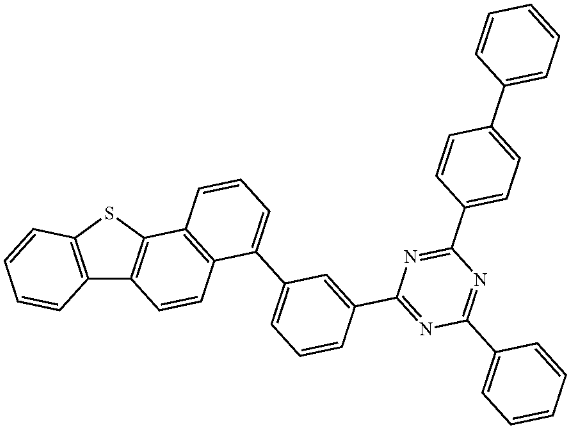
C-494
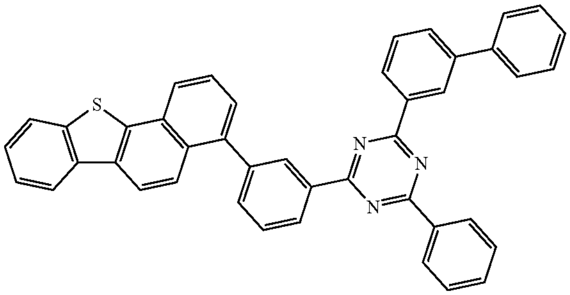
C-495
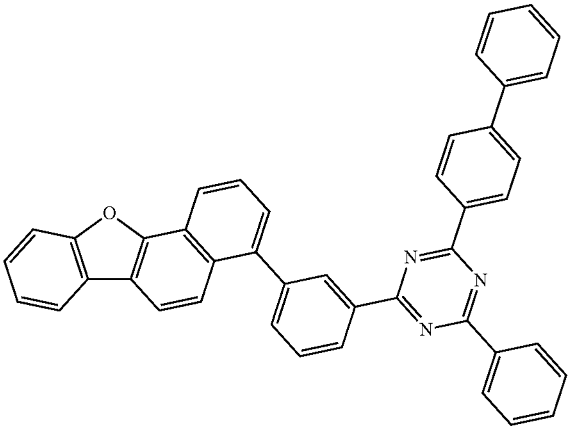
C-496
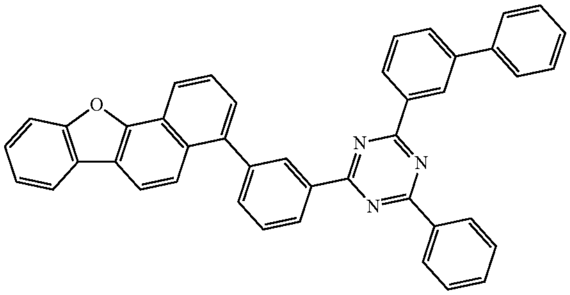
C-497
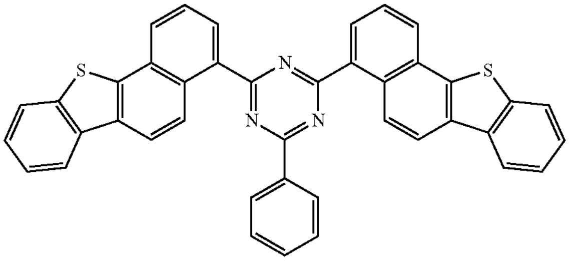
C-498
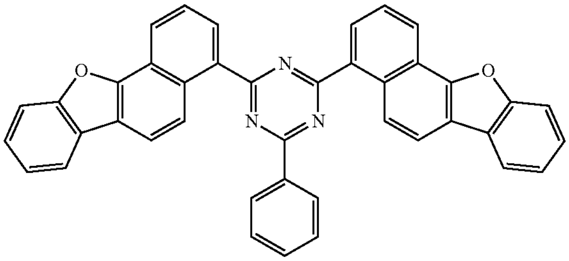
C-499
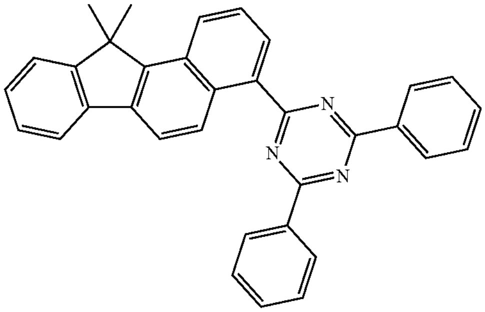
C-500
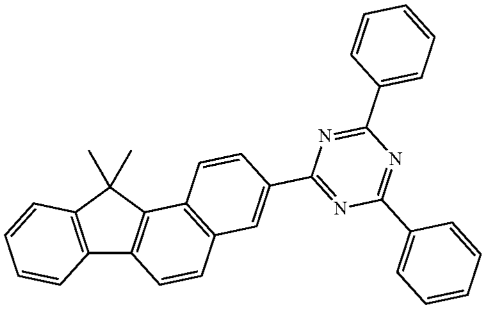
C-501
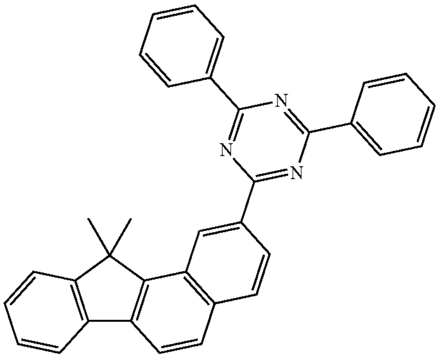

C-502
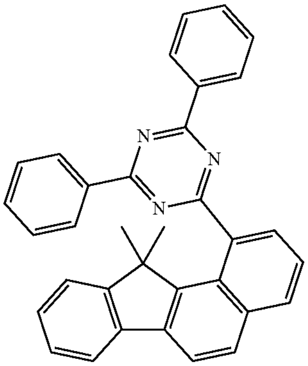
C-503
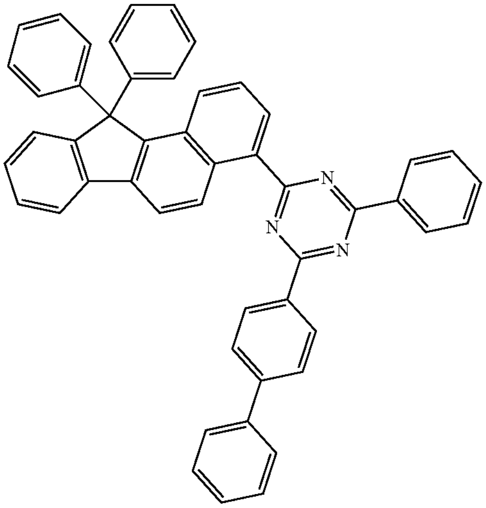
C-504
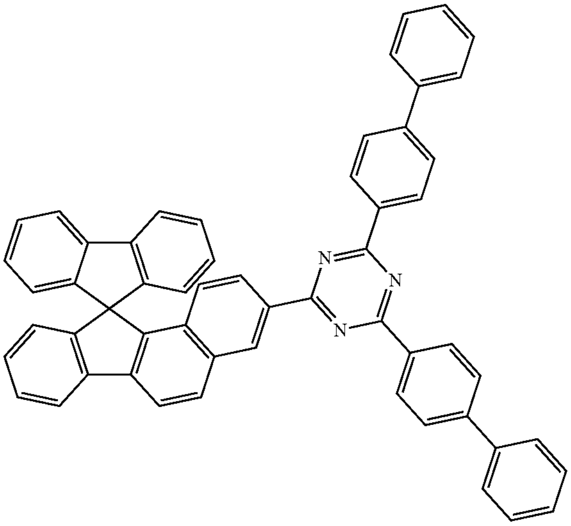
C-505
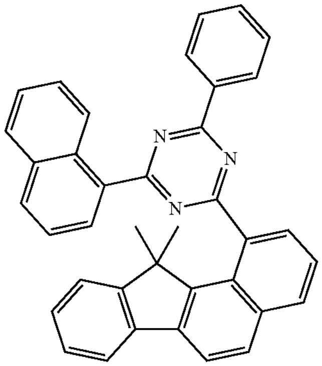
C-506
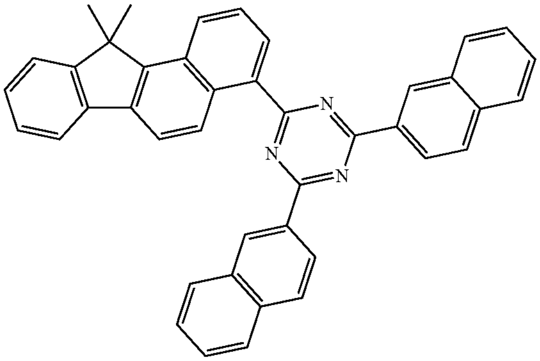
C-507
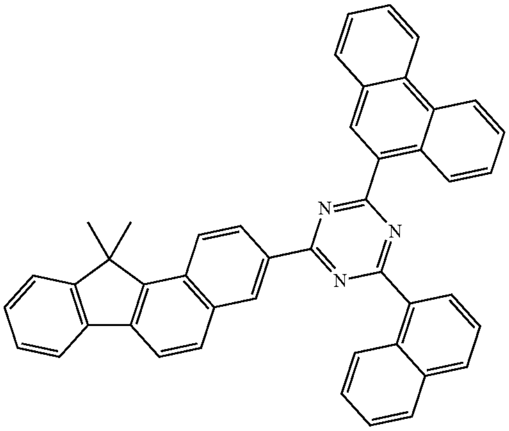
C-508
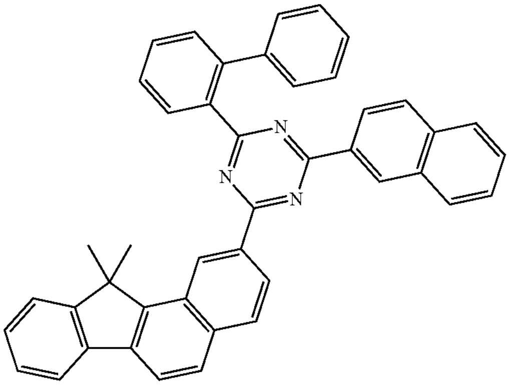

-continued
C-509
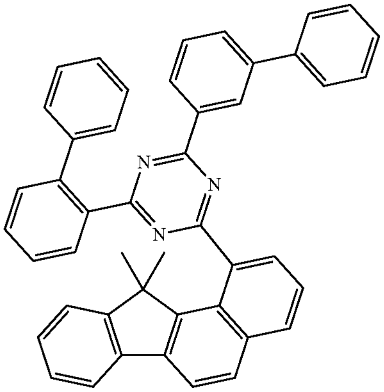
C-510
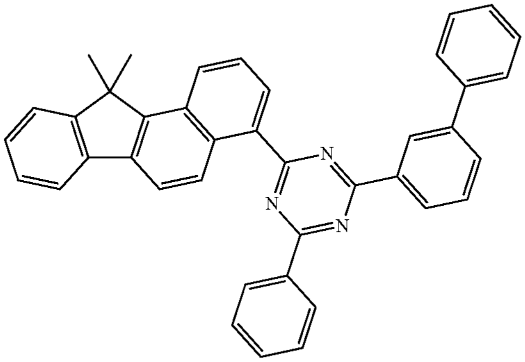
C-517
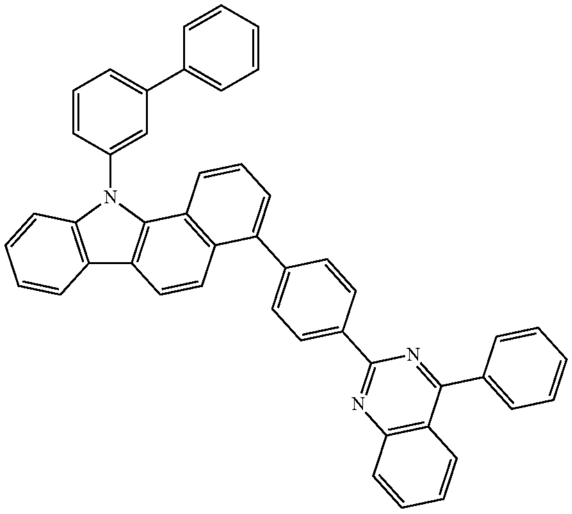
-continued
C-518
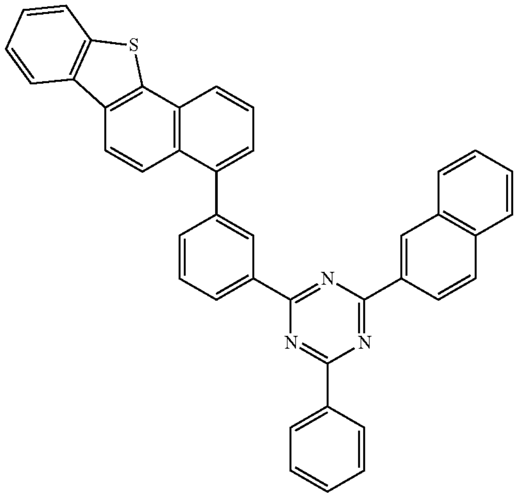
C-519
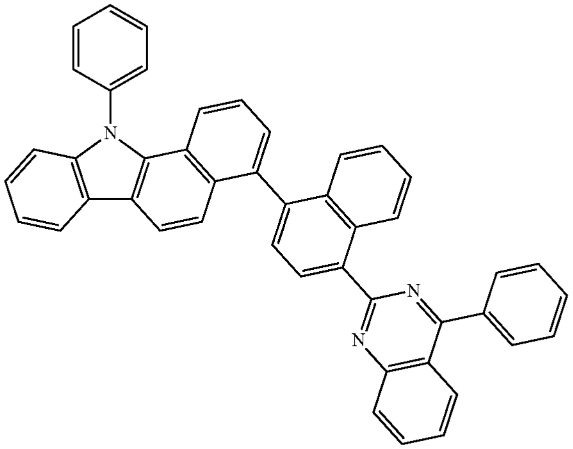
C-520
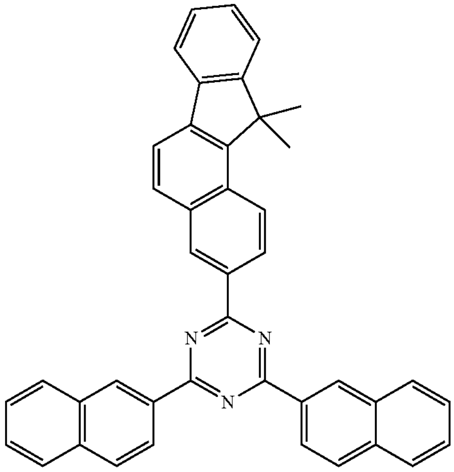

-continued
C-525
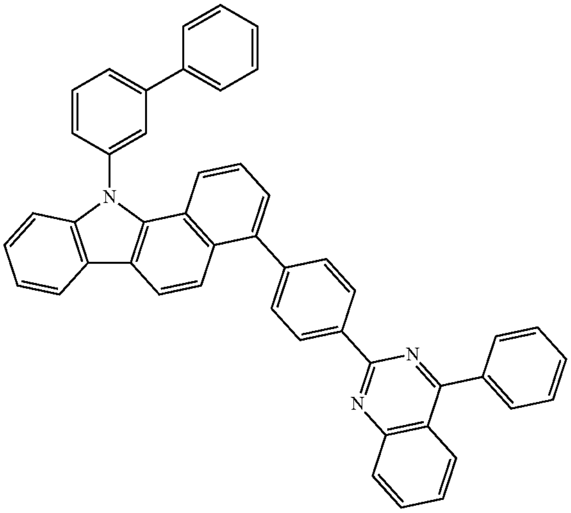
C-527
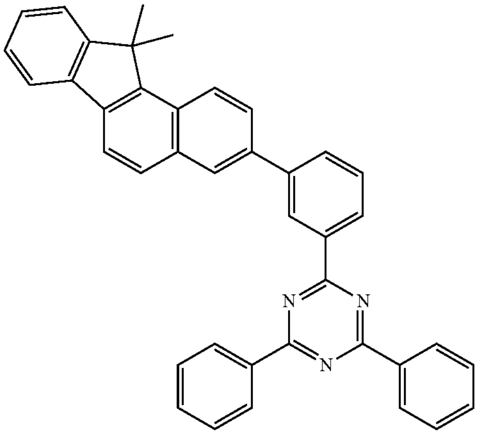
C-529
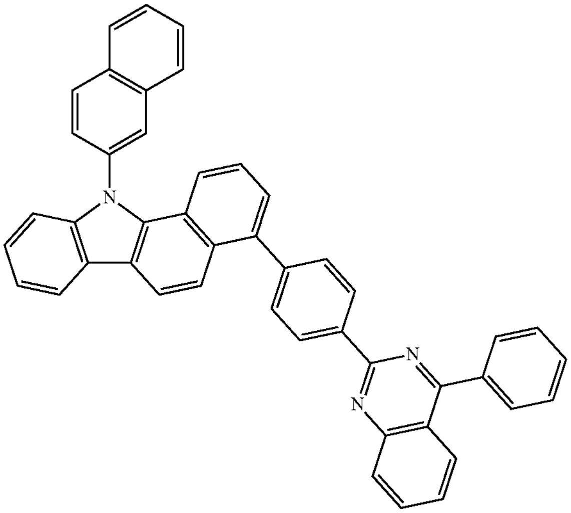
-continued
C-530
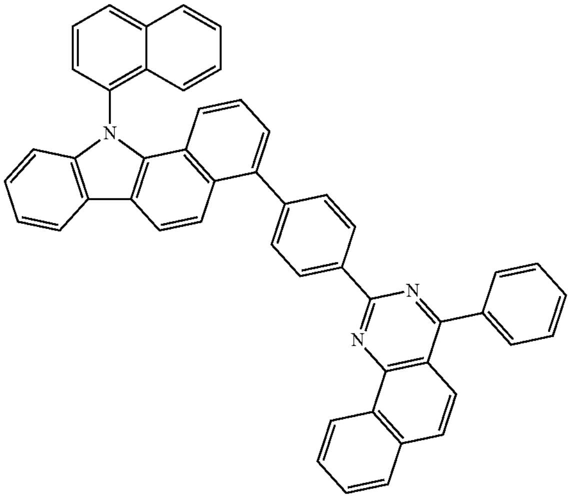
C-532
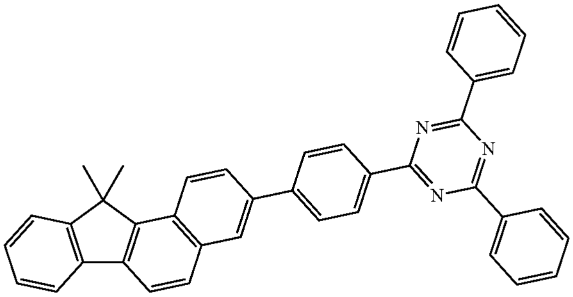
C-533
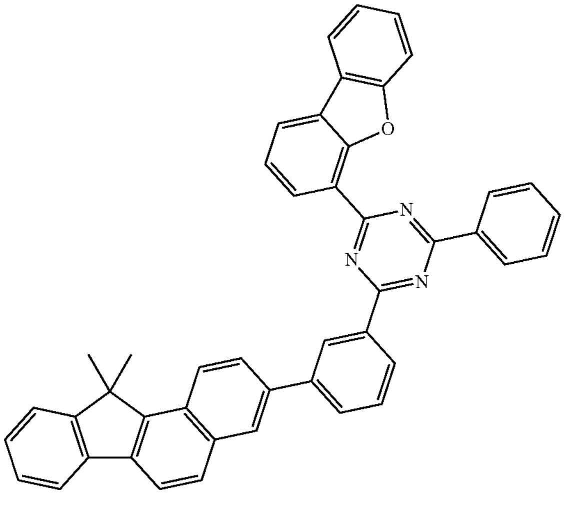

-continued
C-534
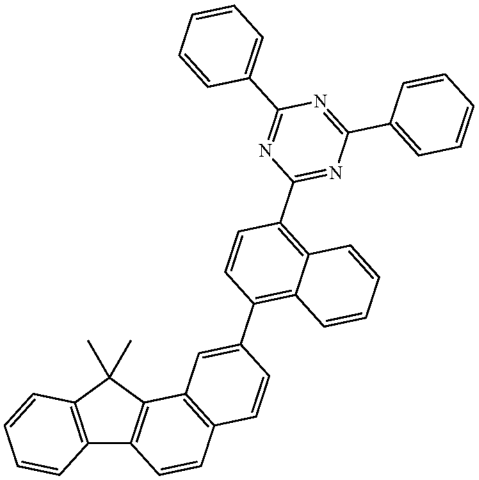
C-535
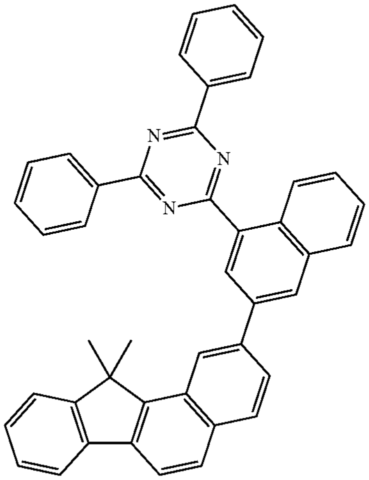
C-536
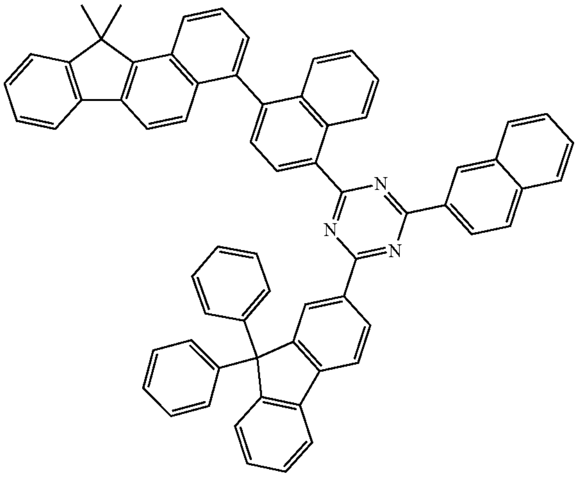
-continued
C-548
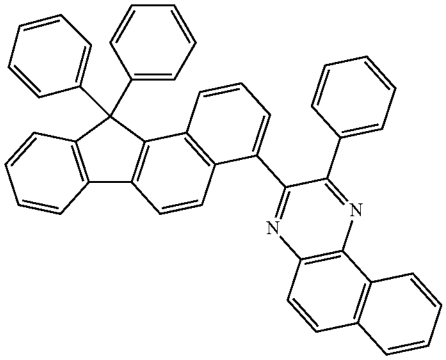
C-551
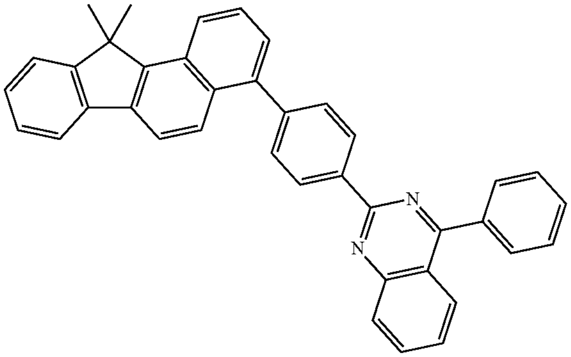
C-552
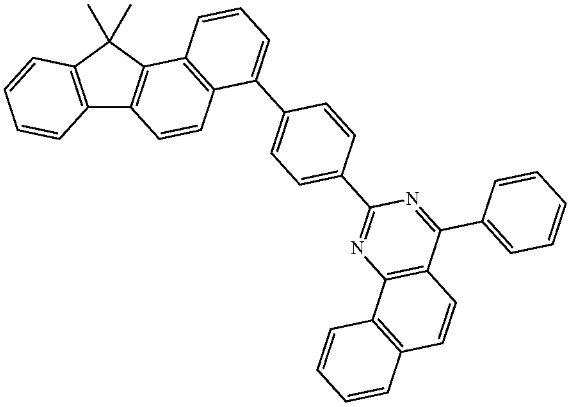
C-553
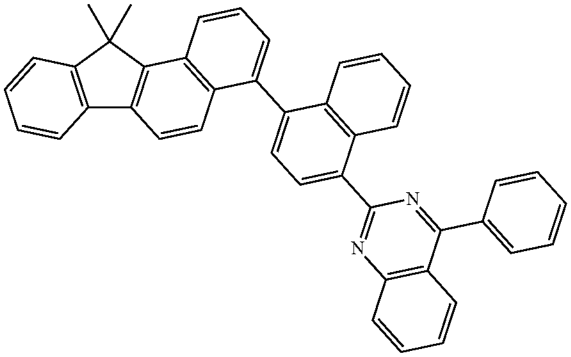

-continued
C-554
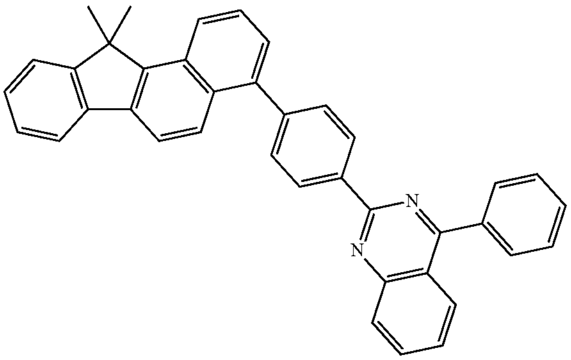
C-567
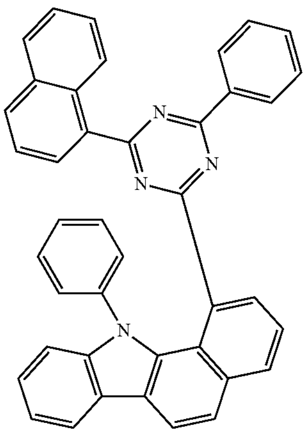
C-568
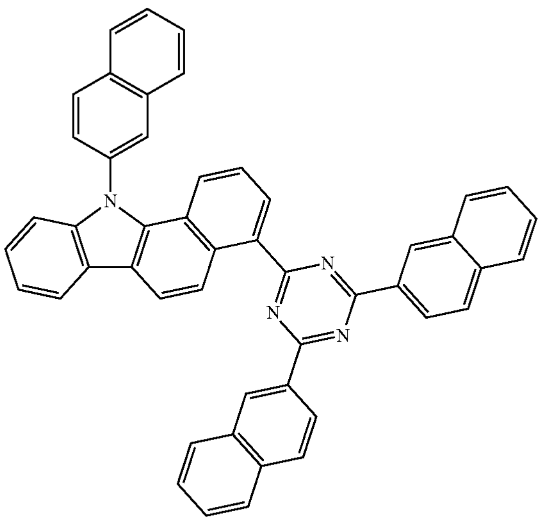
-continued
C-569
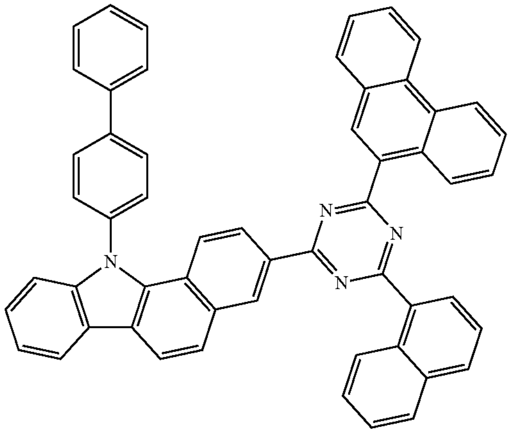
C-570
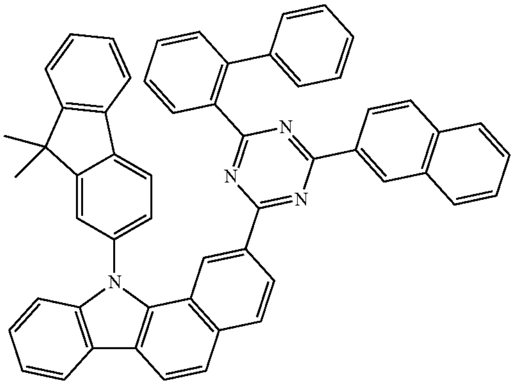
C-572
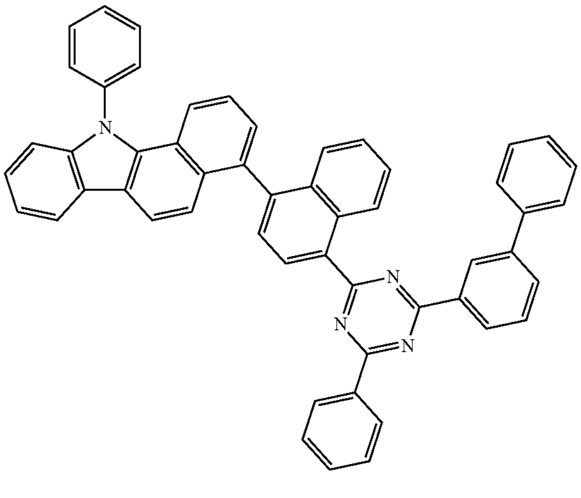

-continued

C-584

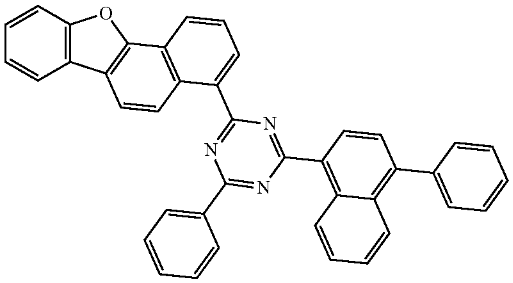

and

C-585

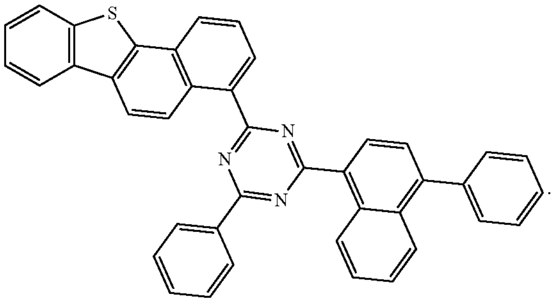

.

5. An organic electroluminescent device comprising an anode, a cathode, and at least one light-emitting layer between the anode and the cathode, wherein at least one layer of the light-emitting layers comprises the plurality of host materials according to claim 1.

6. The plurality of host materials according to claim 1, wherein, $L_1$ to $L_3$, each independently, represent a single bond or a substituted or unsubstituted (C6-C30)arylene;

$Ar_2$ and $Ar_3$, each independently, represent a substituted or unsubstituted (C6-C30)aryl or a substituted or unsubstituted (3- to 30-membered)heteroaryl;

$V_1$, each independently, represents hydrogen, deuterium, or a substituted or unsubstituted (C6-C30)aryl.

7. The plurality of host materials according to claim 1, wherein

Ar, each independently, represents a substituted or unsubstituted triazinyl, a substituted or unsubstituted quinoxalinyl, a substituted or unsubstituted quinazolinyl, a substituted or unsubstituted benzoquinoxalinyl, or a substituted or unsubstituted benzoquinazolinyl.

* * * * *